(12) United States Patent
Kimura et al.

(10) Patent No.: US 10,033,371 B2
(45) Date of Patent: Jul. 24, 2018

(54) SEMICONDUCTOR DEVICE

(71) Applicant: Semiconductor Energy Laboratory Co., Ltd., Atsugi-shi, Kanagawa-ken (JP)

(72) Inventors: Hajime Kimura, Kanagawa (JP); Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/679,244

(22) Filed: Aug. 17, 2017

(65) Prior Publication Data
US 2018/0019745 A1 Jan. 18, 2018

Related U.S. Application Data

(62) Division of application No. 14/976,201, filed on Dec. 21, 2015, now Pat. No. 9,755,633.

(30) Foreign Application Priority Data

Dec. 26, 2014 (JP) .................................. 2014-265396

(51) Int. Cl.
*H03B 1/00* (2006.01)
*H03K 3/00* (2006.01)
(Continued)

(52) U.S. Cl.
CPC .................................. *H03K 17/145* (2013.01)

(58) Field of Classification Search
CPC ............. H01L 27/1255; H01L 27/1225; H01L 27/124; H01L 27/3262; H01L 27/14609;
(Continued)

(56) References Cited

U.S. PATENT DOCUMENTS 6,229,508 B1   5/2001   Kane
6,618,030 B2   9/2003   Kane et al.
(Continued)

FOREIGN PATENT DOCUMENTS

JP   11-219146 A    8/1999
JP   2003-022054 A  1/2003
(Continued)

OTHER PUBLICATIONS

Yoon.J et al., "55-inch OLED TV using Optimal Driving Method for Large-Size Panel based on InGaZnO TFTs", SID Digest '14 : SID International Symposium Digest of Technical Papers, Jun. 3, 2014, pp. 849-852.

*Primary Examiner* — Brandon S Cole

(74) *Attorney, Agent, or Firm* — Fish & Richardson P.C.

(57) ABSTRACT

To provide a semiconductor device in which external correction can be performed, the area occupied by a read circuit is reduced, and power consumption is reduced. One embodiment of the semiconductor device includes a pixel and a read circuit. The pixel includes a transistor and a display element. The read circuit includes a function selection portion and an operational amplifier. The transistor is electrically connected to the function selection portion through a wiring. The operational amplifier is electrically connected to the function selection portion. The function selection portion includes at least one switch. The function selection portion can select a function of the read circuit by controlling the switch.

9 Claims, 71 Drawing Sheets

(51) Int. Cl.
*G09G 3/36* (2006.01)
*G06F 3/038* (2013.01)
*G09G 5/00* (2006.01)
*H03K 17/14* (2006.01)

(58) Field of Classification Search
CPC .... H01L 27/3276; G09G 3/3233; G09G 3/30; G09G 3/32; G09G 3/3291; G09G 2300/0819; G09G 2300/0852; G09G 2300/0861; G09G 2300/0262
USPC .................................................. 315/160–176
See application file for complete search history.

(56) References Cited

U.S. PATENT DOCUMENTS

| | | | |
|---|---|---|---|
| 6,977,635 B2 | 12/2005 | Ogawa et al. | |
| 7,088,052 B2 | 8/2006 | Kimura | |
| 7,429,985 B2 | 9/2008 | Kimura et al. | |
| 7,768,485 B2 | 8/2010 | Uchino et al. | |
| 8,487,841 B2 | 7/2013 | Kimura et al. | |
| 8,710,749 B2* | 4/2014 | Kimura | G09G 3/3233 315/169.3 |
| 8,803,768 B2* | 8/2014 | Kimura | H01L 27/1225 345/76 |
| 8,896,506 B2 | 11/2014 | Kimura et al. | |
| 8,947,328 B2 | 2/2015 | Kimura | |
| 9,041,627 B2 | 5/2015 | Uchino et al. | |
| 9,171,493 B2* | 10/2015 | Kimura | G09G 3/3233 |
| 2002/0050972 A1 | 5/2002 | Udo et al. | |
| 2003/0016190 A1 | 1/2003 | Kondo | |
| 2005/0104819 A1* | 5/2005 | Shimoda | G09G 3/3283 345/76 |
| 2006/0092114 A1 | 5/2006 | Izumikawa et al. | |
| 2007/0085847 A1* | 4/2007 | Shishido | G09G 3/3233 345/204 |
| 2007/0120785 A1* | 5/2007 | Kimura | G09G 3/3233 345/82 |
| 2008/0238833 A1 | 10/2008 | Hioki et al. | |
| 2009/0244049 A1 | 10/2009 | Yamamoto et al. | |
| 2010/0013526 A1 | 1/2010 | Saeki | |
| 2012/0248435 A1* | 10/2012 | Koyama | H01L 27/1225 257/43 |
| 2012/0287025 A1* | 11/2012 | Inoue | G09G 3/3233 345/76 |
| 2013/0120180 A1 | 5/2013 | Kawahito | |
| 2014/0008544 A1 | 1/2014 | Kameshima et al. | |
| 2014/0176622 A1 | 6/2014 | Jung et al. | |
| 2014/0192098 A1 | 7/2014 | Kimura et al. | |
| 2014/0361916 A1 | 12/2014 | Wolfs | |
| 2015/0179095 A1 | 6/2015 | Kimura | |
| 2015/0187818 A1 | 7/2015 | Miyake et al. | |
| 2016/0118971 A1 | 4/2016 | Sugiyama et al. | |
| 2016/0155850 A1 | 6/2016 | Yamazaki | |
| 2016/0232834 A1 | 8/2016 | Kimura et al. | |

FOREIGN PATENT DOCUMENTS

| | | |
|---|---|---|
| JP | 2003-195813 A | 7/2003 |
| JP | 2007-310311 A | 11/2007 |
| JP | 2008-233933 A | 10/2008 |
| JP | 2009-053382 A | 3/2009 |
| JP | 2014-126873 A | 7/2014 |

\* cited by examiner

SEMICONDUCTOR DEVICE

CROSS-REFERENCE TO RELATED APPLICATIONS

This application is a divisional of U.S. application Ser. No. 14/976,201, filed Dec. 21, 2015, now allowed, which claims the benefit of a foreign priority application filed in Japan as Serial No. 2014-265396 on Dec. 26, 2014, both of which are incorporated by reference.

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, a method for manufacturing any of them, a method for inspecting any of them, or a system of any of them.

2. Description of the Related Art

In recent years, display devices have been used for various electronic devices such as television receivers, personal computers, and smart phones, and higher performance of the display devices in various aspects such as higher definition and lower power consumption has been achieved.

As such display devices, active matrix display devices in each of which a plurality of pixels are arranged in a matrix and is controlled by transistors provided in the pixels have been often used. In the active matrix display device, each pixel is controlled by a transistor, so that variation in transistor characteristics among pixels or deterioration in transistor characteristics causes variation in display among the pixels. Thus, display unevenness and image burn-in may be caused.

In an active matrix display device in which a light-emitting element is used as a display element, a driving transistor which controls current to be supplied to the light-emitting element in accordance with a video signal is provided. If at least one of the threshold voltage, the mobility, the channel length, the channel width, and the like of the driving transistor varies among pixels, luminance of a light-emitting element varies among the pixels.

As a method for preventing such variation in luminance of light-emitting elements, a method for correcting variation in the threshold voltages of driving transistors in pixels (hereinafter referred to as internal correction) has been suggested (Patent Document 1 and Patent Document 2).

Furthermore, a method has been suggested in which the characteristics of a driving transistor is read out to the outside of a pixel and a signal for correcting variation in the characteristics of the driving transistor is input (hereinafter also referred to as external correction) (Patent Document 3 and Patent Document 4).

A data signal (also referred to as a video signal, a source signal, or the like) is supplied from a data driver (also referred to as a video signal line driver circuit, a source signal line driver circuit, or the like) to a pixel. In that case, a voltage follower circuit using an operational amplifier is used in a data driver in some cases (Patent Document 5).

REFERENCES

Patent Documents

[Patent Document 1] Japanese Published Patent Application No. 2003-195813
[Patent Document 2] Japanese Published Patent Application No. 2007-310311
[Patent Document 3] Japanese Published Patent Application No. 2008-233933
[Patent Document 4] Japanese Published Patent Application No. 2014-126873
[Patent Document 5] Japanese Published Patent Application No. 2003-22054

SUMMARY OF THE INVENTION

In the case of performing external correction, there is a case where a current flowing through a driving transistor is output to the outside of a pixel. Alternatively, there is a case where a potential of a terminal of a driving transistor is output to the outside of a pixel. When external correction is performed, there is a case where a circuit for reading current-voltage characteristics of a transistor (such a circuit is hereinafter also referred to as a read circuit) from the output current or the output potential is provided in the outside of a pixel, e.g., a driver circuit portion. As the read circuit, there is a case where a circuit called an operational amplifier is used, for example. In general, an operational amplifier is formed of extremely many circuit components.

A circuit for supplying a video signal to a pixel, e.g., a buffer circuit (an impedance converter circuit or an amplifier circuit) is provided in the driver circuit portion. In that case, there is a case where a voltage follower circuit is used in the circuit. The voltage follower circuit includes an operational amplifier in some cases, for example.

When the driver circuit portion includes both the operational amplifier for the read circuit and the operational amplifier for the voltage follower circuit, the area occupied by the driver circuit portion is significantly increased in some cases. Such an increase in the area occupied by the driver circuit portion enlarges the frame of a display device in some cases. Note that the term "frame of a display device" in this specification refers to a plurality of circuits in the periphery of a pixel portion in the display device. The plurality of circuits includes a driver circuit, an external correction circuit, and/or a read circuit, for example. In particular, in this specification, reducing the area of the plurality of circuits is also referred to as "narrowing a frame".

In the case of providing a plurality of operational amplifiers, power consumption for driving all of the operational amplifiers is significantly increased.

An object of one embodiment of the present invention is to provide a novel display device, a novel semiconductor device, a driving method thereof, or the like.

An object of one embodiment of the present invention is to provide a display device or the like which can perform external correction and in which the area occupied by a read circuit is reduced. An object of one embodiment of the present invention is to provide a display device or the like in which the area occupied by a driver circuit portion is reduced and which has a narrow frame. An object of one embodiment of the present invention is to provide a display device or the like in which circuit elements in a read circuit are reduced. An object of one embodiment of the present invention is to provide a display device or the like in which circuit elements in a driver circuit are reduced. An object of one embodiment of the present invention is to provide a display device or the like in which circuit elements are reduced and power consumption is reduced. An object of one embodiment of the present invention is to provide a display device with small display unevenness. An object of one embodiment of the present invention is to provide a display device capable of performing clear display. An object of one embodiment of the present invention is to provide a semiconductor device in which adverse effects due to variation in transistor characteristics are reduced. An object of one embodiment of the present invention is to provide a semiconductor device in which adverse effects due to variation in the threshold voltages of transistors are reduced. An object of one embodiment of the present invention is to provide a semiconductor device in which adverse effects due to variation in the mobilities of transistors are reduced.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

In one embodiment of the present invention, an operational amplifier in a read circuit is shared between circuits having different functions to reduce the area occupied by the read circuit. In particular, an operational amplifier is shared between a read circuit and a buffer circuit in a driver circuit portion to reduce the area occupied by the read circuit or reduce power consumption of a semiconductor device.

(1) One embodiment of the present invention is a semiconductor device including a first wiring, a second wiring, a third wiring, a first switch, a second switch, a third switch, a fourth switch, and an operational amplifier. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is connected between the second wiring and the non-inverting input terminal of the operational amplifier. An inverting input terminal of the operational amplifier is electrically connected to the output terminal of the operational amplifier.

(2) One embodiment of the present invention is a semiconductor device including a first wiring, a second wiring, a first switch, a second switch, a third switch, a fourth switch, an operational amplifier, and a capacitor. The first switch is electrically connected between an inverting input terminal of the operational amplifier and an output terminal of the operational amplifier. The second switch is electrically connected between the first wiring and the output terminal of the operational amplifier. The third switch is electrically connected between the second wiring and the output terminal of the operational amplifier. The fourth switch is electrically connected between the first wiring and the inverting input terminal of the operational amplifier. The capacitor is electrically connected between the inverting input terminal of the operational amplifier and the output terminal of the operational amplifier (3) One embodiment of the present invention is a semiconductor device including a first wiring, a second wiring, a third wiring, a fourth wiring, a first switch, a second switch, a third switch, a fourth switch, a fifth switch, a sixth switch, a seventh switch, an operational amplifier, and a capacitor. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is electrically connected between the second wiring and the non-inverting input terminal of the operational amplifier. The fifth switch is electrically connected between the output terminal of the operational amplifier and an inverting input terminal of the operational amplifier. The sixth switch is electrically connected between one of electrodes of the capacitor and the output terminal of the operational amplifier. The seventh switch is electrically connected between the fourth wiring and the inverting input terminal of the operational amplifier. The other of the electrodes of the capacitor is electrically connected to the inverting input terminal of the operational amplifier.

(4) One embodiment of the present invention is a semiconductor device including a first wiring, a second wiring, a third wiring, a first switch, a second switch, a third switch, a fourth switch, a fifth switch, a sixth switch, an operational amplifier, and a capacitor. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is connected between the second wiring and the non-inverting input terminal of the operational amplifier. The fifth switch is electrically connected between the second wiring and an inverting input terminal of the operational amplifier. The sixth switch is electrically connected between the inverting input terminal of the operational amplifier and the output terminal of the operational amplifier. The capacitor is electrically connected between the inverting input terminal of the operational amplifier and the output terminal of the operational amplifier.

(5) One embodiment of the present invention is a semiconductor device including a first wiring, a second wiring, a third wiring, a fourth wiring, a first switch, a second switch, a third switch, a fourth switch, a fifth switch, a sixth switch, a seventh switch, an eighth switch, an operational amplifier, and a capacitor. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is connected between the second wiring and the non-inverting input terminal of the operational amplifier. The fifth switch is electrically connected between the second wiring and an inverting input terminal of the operational amplifier. The sixth switch is electrically connected between the inverting input terminal of the operational amplifier and the output terminal of the operational amplifier. The seventh switch is electrically connected between one of electrodes of the capacitor and the output terminal of the operational amplifier. The eighth switch is electrically connected between the fourth wiring and the inverting input terminal of the operational amplifier. The other of the electrodes of the capacitor is electrically connected to the inverting input terminal of the operational amplifier.

(6) One embodiment of the present invention is a semiconductor device including a first wiring, a second wiring, a third wiring, a fourth wiring, a fifth wiring, a sixth wiring, a first switch, a second switch, a third switch, a fourth switch, a fifth switch, a sixth switch, and an operational amplifier. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is connected between the fourth wiring and the non-inverting input terminal of the operational amplifier. The fifth switch is electrically connected between the fourth wiring and the fifth wiring. The sixth switch is electrically connected between the second wiring and the sixth wiring. An inverting input terminal of the operational amplifier is electrically connected to the output terminal of the operational amplifier.

(7) One embodiment of the present invention is a semiconductor device including a first wiring, a second wiring, a third wiring, a fourth wiring, a first switch, a second switch, a third switch, a fourth switch, a fifth switch, an operational amplifier, and a capacitor. The first switch is electrically connected between an inverting input terminal of the operational amplifier and an output terminal of the operational amplifier. The second switch is electrically connected between the first wiring and the output terminal of the operational amplifier. The third switch is electrically connected between the second wiring and the output terminal of the operational amplifier. The fourth switch is electrically connected between the third wiring and the inverting input terminal of the operational amplifier. The fifth switch is electrically connected between the third wiring and the fourth wiring. The capacitor is electrically connected between the inverting input terminal of the operational amplifier and the output terminal of the operational amplifier.

(8) One embodiment of the present invention is a semiconductor device including a first wiring, a second wiring, a third wiring, a fourth wiring, a fifth wiring, a first switch, a second switch, a third switch, a fourth switch, a fifth switch, a sixth switch, a seventh switch, an operational amplifier, and a capacitor. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is electrically connected between the fourth wiring and an inverting input terminal of the operational amplifier. The fifth switch is electrically connected between the fourth wiring and the fifth wiring. The sixth switch is connected between the inverting input terminal of the operational amplifier and the output terminal of the operational amplifier. The seventh switch is electrically connected between the fifth wiring and the non-inverting input terminal of the operational amplifier. The capacitor is electrically connected between the inverting input terminal of the operational amplifier and the output terminal of the operational amplifier.

(9) One embodiment of the present invention is a semiconductor device including a first wiring, a second wiring, a third wiring, a fourth wiring, a fifth wiring, a sixth wiring, a first switch, a second switch, a third switch, a fourth switch, a fifth switch, a sixth switch, a seventh switch, an eighth switch, a ninth switch, an operational amplifier, and a capacitor. The first switch is electrically connected between the first wiring and a non-inverting input terminal of the operational amplifier. The second switch is electrically connected between the second wiring and an output terminal of the operational amplifier. The third switch is electrically connected between the third wiring and the output terminal of the operational amplifier. The fourth switch is electrically connected between the fourth wiring and an inverting input terminal of the operational amplifier. The fifth switch is electrically connected between the fourth wiring and the fifth wiring. The sixth switch is connected between the inverting input terminal of the operational amplifier and the output terminal of the operational amplifier. The seventh switch is electrically connected between the fifth wiring and the non-inverting input terminal of the operational amplifier. The eighth switch is electrically connected between the fourth wiring and the non-inverting input terminal of the operational amplifier. The ninth switch is electrically connected between the second wiring and the sixth wiring. The capacitor is electrically connected between the inverting input terminal of the operational amplifier and the output terminal of the operational amplifier.

(10) One embodiment of the present invention is the semiconductor device of any one of (2), (3), (4), (6), (7), and (8) which has a structure where the capacitor is replaced with a resistor.

Note that other embodiments of the present invention will be described in the following embodiments with reference to the drawings.

According to one embodiment of the present invention, a novel display device, a novel semiconductor device, a driving method thereof, or the like can be provided.

One embodiment of the present invention can provide a display device or the like which can perform external correction and in which the area occupied by a read circuit is reduced. One embodiment of the present invention can provide a display device or the like in which the area occupied by a driver circuit portion is reduced and which has a narrow frame. One embodiment of the present invention can provide a display device or the like in which circuit elements in a read circuit are reduced. One embodiment of the present invention can provide a display device or the like in which circuit elements in a driver circuit are reduced. One embodiment of the present invention can provide a display device or the like in which circuit elements are reduced and power consumption is reduced. One embodiment of the present invention can provide a display device with small display unevenness. One embodiment of the present invention can provide a display device capable of performing clear display. One embodiment of the present invention can provide a semiconductor device in which adverse effects due to variation in transistor characteristics are reduced. One embodiment of the present invention can provide a semiconductor device in which adverse effects due to variation in the threshold voltages of transistors are reduced. One embodiment of the present invention can provide a semiconductor device in which adverse effects due to variation in the mobilities of transistors are reduced.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

DETAILED DESCRIPTION OF THE INVENTION

Figure 1A:
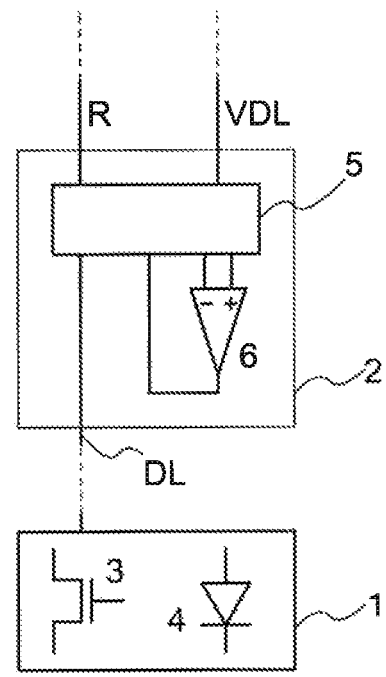
FIGS. 1A and 1B are block diagrams showing examples of a semiconductor device of one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be referred to without the ordinal number in other embodiments or claims.

In the drawings, the same components, components having similar functions, components formed of the same material, or components formed at the same time are denoted by the same reference numerals in some cases, and description thereof is not repeated in some cases.

Embodiment 1

In this embodiment, a configuration of a semiconductor device or a display device of one embodiment of the disclosed invention and a driving method thereof will be described.

Configuration Example of Read Circuit

FIG. 1A shows a configuration example of a pixel and a read circuit in a display device of one embodiment of the disclosed invention. Note that the read circuit has, for example, a function of reading out data from a pixel (e.g., a potential or a current). Note that the read circuit may have another function. For example, the read circuit has a function of supplying (or transmitting) a video signal to a pixel. Alternatively, the read circuit has a function of operating as a buffer circuit, an impedance converter circuit, or an amplifier circuit. Alternatively, the read circuit has a function of operating as part of a driver circuit. Alternatively, the read circuit has a function of supplying (or transmitting) an initialization signal to a pixel. Alternatively, the read circuit has a function of supplying (or transmitting) a predetermined potential to a pixel in some cases. Alternatively, the read circuit has a function of holding data in some cases. Alternatively, the read circuit has a function of converting an analog signal into a digital signal in some cases. Thus, the read circuit is simply referred to as a circuit in some cases. For example, the read circuit is referred to as a first circuit, a second circuit, or the like in some cases.

As illustrated in FIG. 1A, the display device of this embodiment includes a pixel 1 and a read circuit 2, for example. The pixel 1 is electrically connected to the read circuit 2. The pixel 1 includes, for example, a transistor 3 and a display element (e.g., a light-emitting element 4). The read circuit 2 includes, for example, a function selection portion 5 and an operational amplifier 6. The transistor 3 of the pixel 1 is electrically connected to the function selection portion 5 through a wiring DL. The function selection portion 5 is electrically connected to the operational amplifier 6. The function selection portion 5 is electrically connected to a wiring R. The function selection portion 5 is electrically connected to a wiring VDL.

The function selection portion 5 has, for example, a function of switching or selecting the function. Note that the function selection portion 5 may have another function. Thus, the function selection portion 5 is simply referred to as a circuit in some cases. For example, the function selection portion 5 is referred to as a first circuit, a second circuit, or the like in some cases.

The wiring R is connected to, for example, an A/D converter circuit or a memory circuit. By utilizing a current value, a voltage value, or the like which is read, variation in current characteristics of the transistor 3 in the pixel 1 can be corrected.

Note that the wiring VDL is connected to, for example, a D/A converter circuit, a buffer circuit, or the like. A video signal, a precharge signal, an initialization signal, or the like is supplied (or transmitted) through the wiring VDL.

Figure 1B:
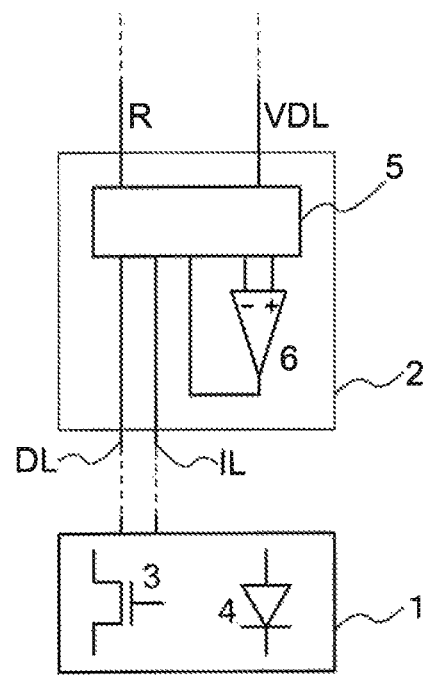

Note that in FIG. 1A, the pixel 1 and the read circuit 2 are connected to each other by only one wiring DL, but one embodiment of the present invention is not limited thereto. The number of wirings for connecting the pixel 1 and the read circuit 2 is more than one in some cases depending on the configurations of the pixel 1 and the read circuit 2. For example, in some cases, two wirings including a wiring IL are provided to connect the pixel 1 and the read circuit 2 as shown in FIG. 1B.

The transistor 3 functions, for example, as a transistor for supplying a current to the light-emitting element 4 (hereinafter referred to as a driving transistor in some cases). In addition to the transistor 3, another transistor may be included in the pixel 1. In the pixel 1, the transistor such as the transistor 3 has, for example, a function of driving a display element such as the light-emitting element 4. The transistor such as the transistor 3 has, for example, a function of controlling the amount of current flowing through a display element such as the light-emitting element 4. The transistor such as the transistor 3 has, for example, a function of supplying (or transmitting) current depending on the video signal to a display element such as the light-emitting element 4. The transistor such as the transistor 3 has, for example, another function in some cases. Thus, the transistor such as the transistor 3 is simply referred to as a transistor in some cases. For example, the transistor such as the transistor 3 is referred to as a first transistor, a second transistor, or the like in some cases.

The read circuit 2 has a function of reading data on current characteristics of the transistor 3 in the pixel 1. Alternatively, the read circuit 2 has a function of detecting characteristics of the pixel 1. Alternatively, the read circuit 2 has a function of retaining characteristics of the pixel 1. Alternatively, the read circuit 2 has a function of amplifying a video signal. Alternatively, the read circuit 2 has a function of supplying (or transmitting) a video signal to the pixel 1. Alternatively, the read circuit has, for example, a function of operating as a buffer circuit, an impedance converter circuit, or an amplifier circuit. Alternatively, the read circuit has, for example, a function of operating as part of a driver circuit. Examples of the current characteristics include a value of a current flowing through a predetermined driving transistor, the threshold voltage of a driving transistor, and a voltage based on the threshold voltage of the driving transistor at the time when a predetermined voltage is supplied to the driving transistor. The transistor from which data on current characteristics can be read out by the read circuit 2 is not limited to the driving transistor. The read circuit 2 may read out data on current characteristics of another transistor included in the pixel 1. Note that the read circuit 2 may read out data on current characteristics of the display element such as the light-emitting element 4 included in the pixel 1.

The function selection portion 5 includes at least one switch. By switching the switch, i.e., controlling the conduction of the switch, the function of the read circuit 2 can be changed or selected.

That is, the operation or function of the read circuit 2 can be changed by the function selection portion 5. For example, the read circuit 2 in a first state can read data on the current characteristics of the transistor 3 included in the pixel 1, in which case the read circuit 2 has a function as a read circuit. The read circuit 2 in a second state can output a video signal to the pixel 1, in which case the read circuit 2 has a function as a buffer circuit, a source line driver circuit, or the like.

In such a circuit that reads out data such as a current or a voltage, or in a buffer circuit, an operational amplifier is used in many cases, for example. Instead of an operational amplifier, another circuit, e.g., a differential circuit may be used. An operational amplifier and the like are formed of an extremely large number of circuit components. Therefore, when a circuit including operational amplifiers corresponding to kinds of their functions is placed, the area occupied by the read circuit 2 might be increased dramatically. Furthermore, the area of a driver circuit portion where the read circuit 2 is provided is also increased; thus, the size of a circuit in the display device might be increased. Because a steady-state current flows through operational amplifiers, the power consumption may be increased when a large number of operational amplifiers are provided.

Therefore, in the display device described in this embodiment, one operational amplifier is shared between, for example, a buffer circuit for performing amplification of a video signal (or impedance conversion) and a circuit for reading data. That is, one operational amplifier is configured to achieve both reading of data from the pixel and outputting of data such as a video signal to the pixel. In order to achieve this, a configuration in which electrical contacts between circuit components, wirings, and the like other than the operational amplifier can be controlled in the function selection portion 5 is employed. Thus, one operational amplifier can function as a variety of circuits. As a result, the read circuit 2 can perform data reading and writing to and from the pixel without increasing the number of operational amplifiers.

Thus, correction of variation in the driving transistor and outputting of a video signal to the pixel can be achieved with little increase in the area occupied by the read circuit 2. Since the area occupied by the driver circuit portion where the read circuit 2 is provided can be reduced, the scale of a circuit included in the display device can be reduced, so that the frame of the display device can be narrowed.

Among transistors provided in the operational amplifier, there is a transistor through which a current always flows; therefore, the power consumption of the operational amplifier is large in some cases. Moreover, a transistor provided in the operational amplifier needs measures such as an increase in channel length of the transistor so that a drain current can be stable in a saturated region even when the drain voltage becomes high. Even in such a case, in the display device described in this embodiment, the number of operational amplifiers can be reduced as compared to the case where operational amplifiers corresponding to kinds of circuit functions are simply provided; thus, an increase in such a problem caused by increasing the number of kinds of circuit functions can be prevented. In addition, since the number of operational amplifiers can be reduced, low power consumption can be achieved.

With the above-described configuration, the display device described in this embodiment which can perform external correction and in which the area occupied by the read circuit is reduced can be provided. With the above-described configuration, a display device in which the area occupied by a driver circuit portion can be reduced and whose frame is narrowed can be provided. With the above-described configuration, a display device with less display unevenness can be provided. With the above-described configuration, a display device capable of performing clear display can be provided. With the above-described configuration, a semiconductor device capable of reducing adverse effects due to variation in transistor characteristics can be provided. With the above-described configuration, a semiconductor device capable of reducing adverse effects due to variation in the threshold voltages of transistors can be provided. With the above-described configuration, a semiconductor device capable of reducing adverse effects due to variation in the mobilities of transistors can be provided. With the above-described configuration, a semiconductor device with low power consumption can be provided.

A circuit which reads out data such as a current or a voltage is formed of an operational amplifier and a passive element (e.g., a resistor, a capacitor, or a coil) in many cases. The function selection portion 5 desirably includes at least one passive element, for example.

Configuration Example 1

Next, a specific example of the configuration of the read circuit 2 will be described.

Figure 2:
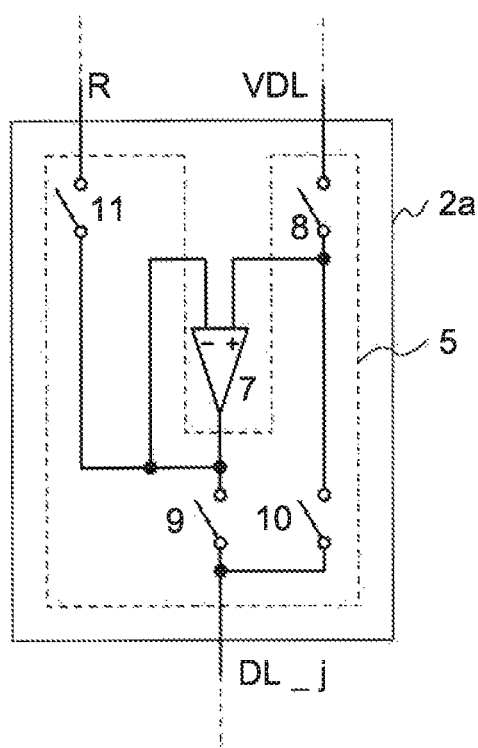
FIG. 2 is a circuit diagram showing an example of a semiconductor device of one embodiment of the present invention.

First, a read circuit in FIG. 2 is described. A read circuit 2a in FIG. 2 includes an operational amplifier 7 and the function selection portion 5. The function selection portion 5 includes a switch 8, a switch 9, a switch 10, and a switch 11. An inverting input terminal of the operational amplifier 7 is electrically connected to an output terminal of the operational amplifier 7. A non-inverting input terminal of the operational amplifier 7 is electrically connected to the wiring VDL through the switch 8. The non-inverting input terminal of the operational amplifier 7 is electrically connected to a wiring DL_j through the switch 10. The output terminal of the operational amplifier 7 is electrically connected to the wiring DL_j through the switch 9. The output terminal of the operational amplifier 7 is electrically connected to the wiring R through the switch 11.

The wiring DL_j is electrically connected to the pixel 1 as shown in FIG. 1A, and the transistor 3 included in the pixel 1 is electrically connected to the wiring DL_j.

The read circuit 2a can operate in the following manner, for example. For example, the switches 8 and 9 can be in an on state and the switches 10 and 11 can be in an off state. In such a case, a potential of the wiring VDL is supplied (transmitted) to the non-inverting input terminal of the operational amplifier 7 in the read circuit 2a. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2a operates as a voltage follower circuit, and therefore, the output terminal of the operational amplifier 7 outputs a potential of the wiring VDL. Thus, the potential of the wiring VDL is supplied to the pixel 1 or the wiring DL_j. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2a can function as an impedance converter circuit. Alternatively, since the operational amplifier 7 has high current drive capability, the read circuit 2a can function as a buffer circuit or an amplifier circuit. The read circuit 2a functioning as described above can charge the pixel 1 or the wiring DL_j at high speed. That is, a signal can be written into the pixel 1 or the wiring DL_j at high speed by the read circuit 2a.

Note that the precharge signal is a signal for setting a potential of a wiring or a pixel to a predetermined potential in advance before a video signal is supplied, for example. The initialization signal is a signal for setting one of a source and a drain of the transistor to a predetermined potential in the case where the threshold voltage of a transistor is obtained, for example.

In another operation state, for example, the switch 8 and the switch 9 can be in an off state and the switch 10 and the switch 11 can be in an on state. In such a case, a potential of the wiring DL_j or a potential of the transistor 3 included in the pixel 1 is supplied (transmitted) to the non-inverting input terminal of the operational amplifier 7 in the read circuit 2a. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2a operates as a voltage follower circuit, and therefore, the output terminal of the operational amplifier 7 outputs the potential of the wiring DL_j or the transistor 3 included in the pixel 1. Thus, the potential of the wiring DL_j or the transistor 3 included in the pixel 1 is supplied to the wiring R. In that case, data on the current characteristics of the transistor 3, e.g., a voltage depending on the threshold voltage of the transistor 3, is supplied from the pixel 1. Therefore, data on the pixel 1 can be read from the pixel 1 to the wiring R. Since the operational amplifier 7 has high input impedance and low output impedance, the read circuit 2a can function as an impedance converter circuit. Alternatively, since the operational amplifier 7 has high current drive capability, the read circuit 2a can function as a buffer circuit or an amplifier circuit. The read circuit 2a functioning as described above enables a potential of the pixel 1 or the wiring DL_j to be output to the wiring R without adversely affecting the potential of the pixel 1 or the wiring DL_j. That is, a signal can be read from the pixel 1 or the wiring DL_j at high speed by the read circuit 2a.

Figure 3A:
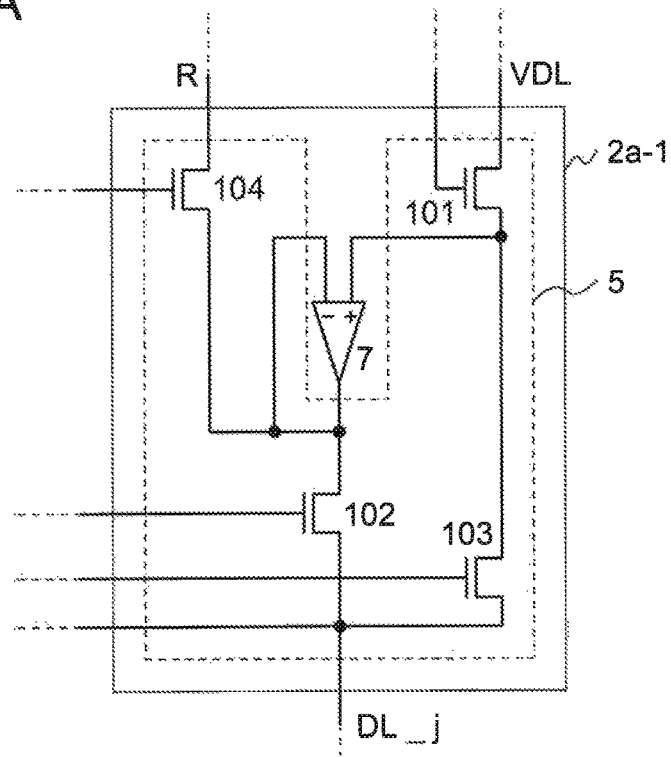
FIGS. 3A and 3B are circuit diagrams showing examples of a semiconductor device of one embodiment of the present invention.
Figure 3B:
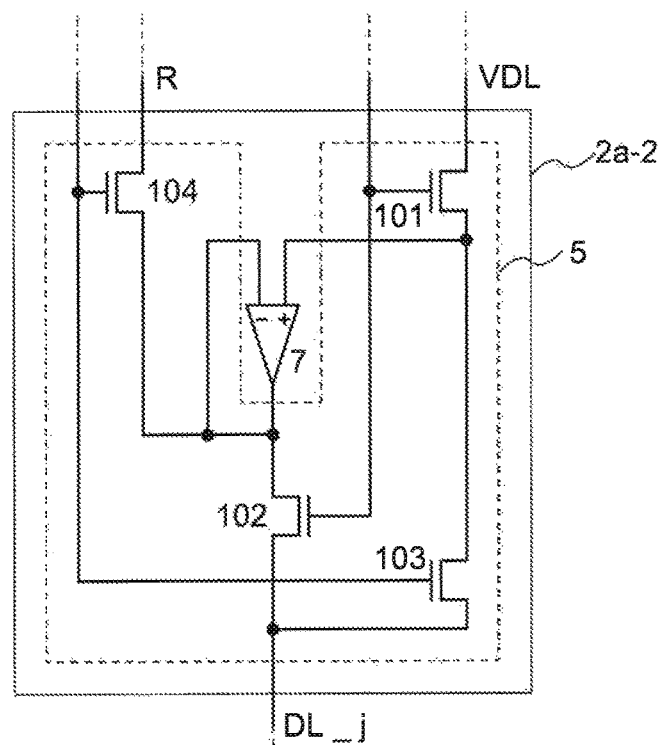

As switches such as the switches 8, 9, 10, and 11, electrical switches, mechanical switches, MEMS elements, or the like may be used. For example, transistors described later are preferably used as electrical switches. FIGS. 3A and 3B are circuit diagrams in the case where transistors are used.

A read circuit 2a-1 in FIG. 3A is the read circuit 2a in FIG. 2 in which a transistor 101, a transistor 102, a transistor 103, and a transistor 104 are used as the switch 8, the switch 9, the switch 10, and the switch 11, respectively.

A read circuit 2a-2 in FIG. 3B is the read circuit 2a-1 in FIG. 3A in which a gate of the transistor 101 and a gate of the transistor 102 are electrically connected to each other and a gate of the transistor 103 and a gate of the transistor 104 are electrically connected to each other. Thus, the read circuit 2a-2 can operate such that the transistor 101 and the transistor 102 operate in synchronization with each other and the transistor 103 and the transistor 104 operate in synchronization with each other.

Figure 4A:
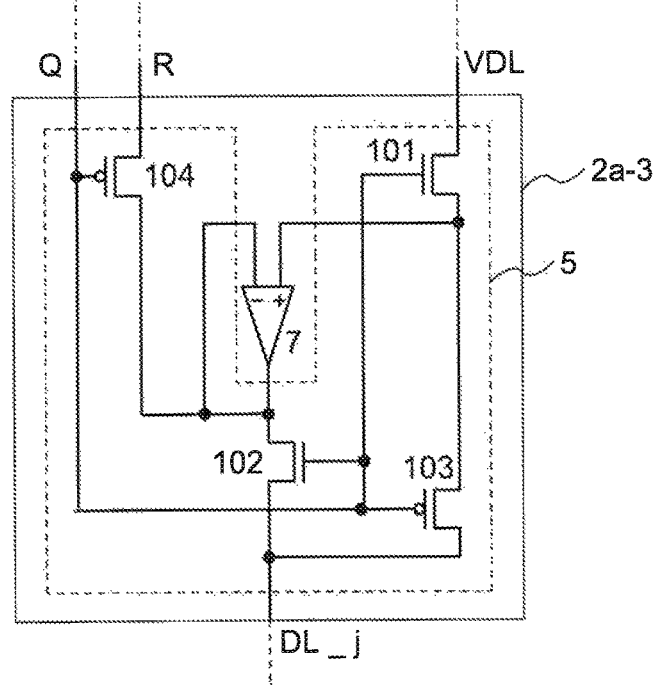
FIGS. 4A and 4B are circuit diagrams showing examples of a semiconductor device of one embodiment of the present invention.
Figure 4B:
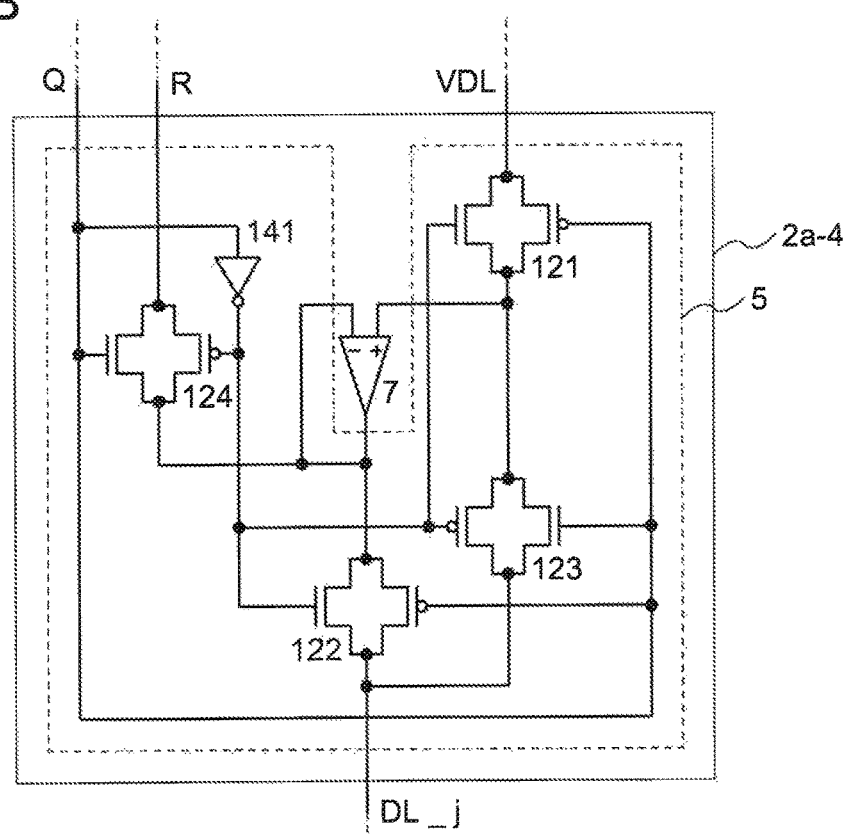

By selecting the polarities of the transistors, a complementary metal oxide semiconductor (CMOS) structure may be formed. FIGS. 4A and 4B and the like illustrate examples of that case.

A read circuit 2a-3 in FIG. 4A is the read circuit 2a-1 in FIG. 3A in which the transistors 101 and 102 are n-channel transistors and the transistors 103 and 104 are p-channel transistors. A wiring Q is electrically connected to the gates of the transistors 101 to 104. Thus, the read circuit 2a-3 can operate by collectively controlling switching of the transistors 101 to 104 using a signal transmitted through the wiring Q. For example, the read circuit 2a-3 can operate such that, in a pair of the transistors 101 and 102 and a pair of the transistors 103 and 104, one of the pairs is in an off state while the other pair is in an on state. Note that the transistors 101 and 102 may be p-channel transistors and the transistors 103 and 104 may be n-channel transistors.

A read circuit 2a-4 in FIG. 4B is the read circuit 2a in FIG. 2 in which an analog switch 121, an analog switch 122, an analog switch 123, and an analog switch 124 are used as the switch 8, the switch 9, the switch 10, and the switch 11, respectively. The analog switches 121 to 124 each have a configuration where a source and a drain of an n-channel transistor and a source and a drain of a p-channel transistor are connected in parallel. The wiring Q is electrically connected to a gate of the p-channel transistor of the analog switch 121, a gate of the p-channel transistor of the analog switch 122, a gate of the n-channel transistor of the analog switch 123, and a gate of the n-channel transistor of the analog switch 124. These gates are electrically connected to a gate of the n-channel transistor of the analog switch 121, a gate of the n-channel transistor of the analog switch 122, a gate of the p-channel transistor of the analog switch 123, and a gate of the p-channel transistor of the analog switch 124 through an inverter 141. With the above-described configuration, the read circuit 2a-4 can operate by collectively controlling switching of the analog switches 121 to 124 using a signal transmitted through the wiring Q. For example, the read circuit 2a-4 can operate such that, in a pair of the analog switches 121 and 122 and a pair of the analog switches 123 and 124, one of the pairs is in an off state while the other pair is in an on state.

Note that the read circuits 2a-3 in FIG. 4A and the read circuit 2a-4 in FIG. 4B are not limited thereto; for example, the polarities of the transistors can be changed as appropriate, if necessary.

Next, a circuit configuration that can serve the functions of the read circuit 2a is described. The read circuit 2a has a plurality of functions. The circuit configuration of the read circuit 2a varies depending on which function is carried out. In other words, by controlling on/off states of the switches in the function selection portion 5, the read circuit 2a can perform a plurality of functions.

Figure 5A:
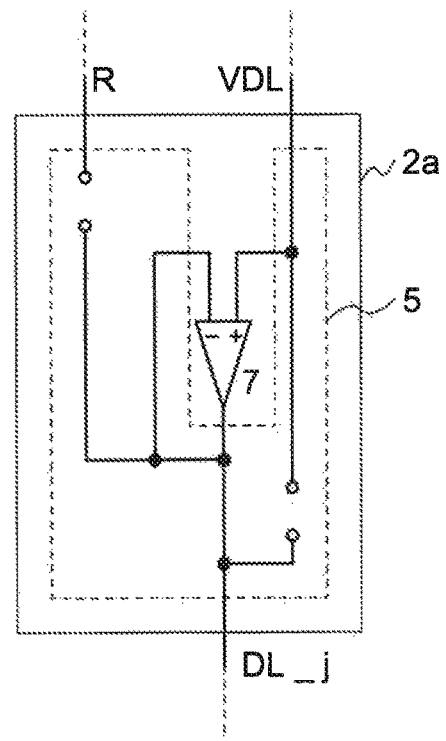
FIGS. 5A and 5B are circuit diagrams showing examples of a semiconductor device of one embodiment of the present invention.

For example, a circuit configuration in a certain operation state in FIG. 2 is illustrated in FIG. 5A. In the configuration, a potential of the wiring VDL can be supplied (or transmitted) to the pixel 1 or the wiring DL_j. With such a configuration, the read circuit 2a can function as a buffer circuit or the like.

Figure 5B:
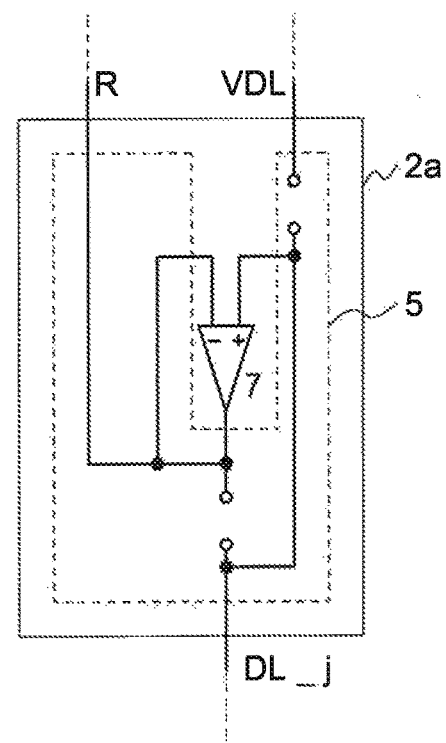

A circuit configuration in another certain operation state in FIG. 2 is illustrated in FIG. 5B. In the configuration, a potential of the pixel 1 or the wiring DL_j can be supplied (or transmitted) to the wiring R. For example, in the case where a potential based on the threshold voltage of the transistor 3 is output from the pixel 1 to the wiring DL_j, the potential of the wiring DL_j, i.e., the potential based on the threshold voltage of the transistor 3, can be read out by the read circuit 2a. With such a configuration, the read circuit 2a can function as a read out circuit or the like.

There is a case where a potential of the transistor 3 is initialized to a predetermined potential before a potential based on the threshold voltage of the transistor 3 is read out. In that case, a circuit configuration shown in FIG. 5A is employed, and control is performed so that the wiring VDL has a potential for initialization. Thus, the potential for initialization can be supplied (or transmitted) to the pixel 1 or the wiring DL_j.

Note that transistors such as switches (e.g., the switch 8, the switch 9, the switch 10, the switch 11, and the like) included in the read circuit 2a are not necessarily provided to have the connection relations illustrated in FIG. 2, FIG. 3A, FIG. 3B, FIG. 4A, FIG. 4B, or the like. The operation of the transistors is also not limited to the aforementioned method. Any connection relation or method may be used, as long as the circuit configuration in FIG. 5A and the circuit configuration in FIG. 5B are obtained depending on an operation state or the function of a circuit. That is, a switch or a transistor is provided as appropriate so that the circuit configuration in FIG. 5A or the circuit configuration in FIG. 5B can be selected by controlling on/off states of the switch or the transistor.

Figure 6A:
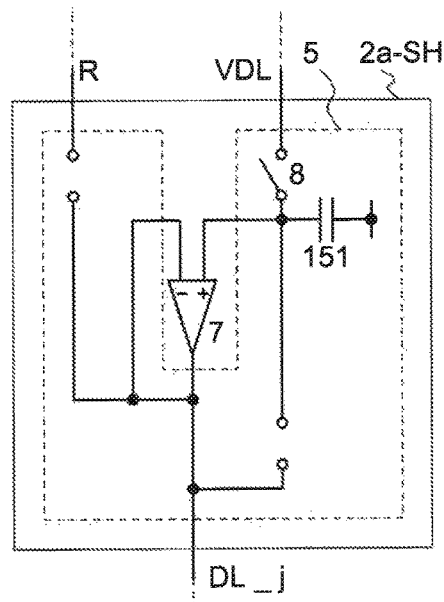
FIGS. 6A to 6C are circuit diagrams showing examples of a semiconductor device of one embodiment of the present invention.
Figure 6B:
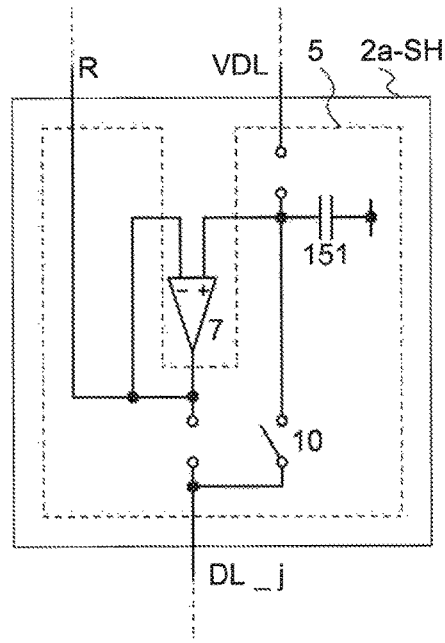
Figure 6C:
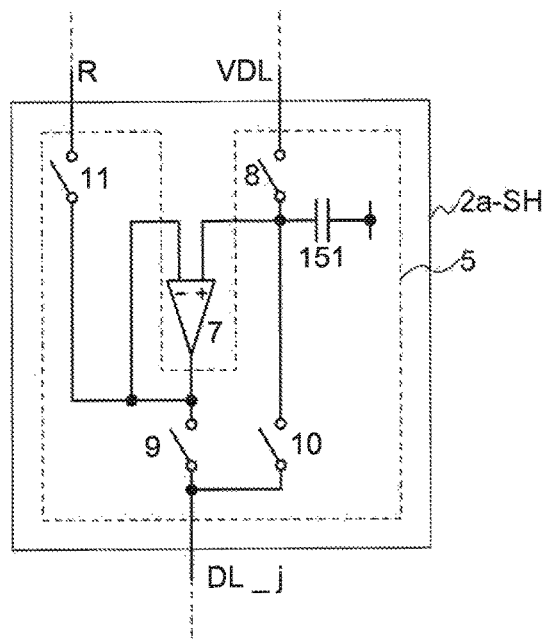

A circuit which samples and holds the potential of the wiring DL_j or the potential of the wiring VDL may be provided. A circuit configuration in the case where such a circuit is provided in FIG. 5A is shown in FIG. 6A as a read circuit 2a-SH. The switch 8 is turned on, and the potential of the wiring VDL is held in a capacitor 151. Then, the switch 8 is turned off. Consequently, the potential of the wiring VDL can be sampled and held. Thus, even when the potential of the wiring VDL is changed after the sample-and-hold operation, the operational amplifier 7 can operate without any problem. Similarly, a configuration in the case where such a circuit is provided in FIG. 5B is shown in FIG. 6B as the read circuit 2a-SH. The switch 10 is turned on, and the potential of the wiring DL_j is held in the capacitor 151. Then, the switch 10 is turned off. Consequently, the potential of the wiring DL_j can be sampled and held. Thus, even when the potential of the wiring DL_j is changed after the sample-and-hold operation, the operational amplifier 7 can operate without any problem. In the case of FIG. 2, the capacitor 151 is added as shown in the read circuit 2a-SH in FIG. 6C. Note that in the case where parasitic capacitance in the non-inverting input terminal of the operational amplifier 7 is large, the capacitor 151 is not necessarily provided. In the case where the capacitor 151 is provided, one of terminals of the capacitor 151 is connected to the non-inverting input terminal of the operational amplifier 7 and the other of the terminals of the capacitor 151 is connected to a dedicated wiring. Note that the other of the terminals of the capacitor 151 may be connected to another wiring.

Configuration Example 2

Next, an example of a read circuit of a case different from that of FIG. 2 will be described with reference to FIG. 7. A read circuit 2b in FIG. 7 includes the operational amplifier 7 and the function selection portion 5. The function selection portion 5 includes the switch 9, the switch 11, a switch 12, a switch 13, and a capacitor 14. The non-inverting input terminal of the operational amplifier 7 is electrically connected to the wiring VDL. The inverting input terminal of the operational amplifier 7 is electrically connected to the output terminal of the operational amplifier 7 through the switch 12. The inverting input terminal of the operational amplifier 7 is electrically connected to the output terminal of the operational amplifier 7 through the capacitor 14. The inverting input terminal of the operational amplifier 7 is electrically connected to the wiring DL_j through the switch 13. The output terminal of the operational amplifier 7 is electrically connected to the wiring DL_j through the switch 9. The output terminal of the operational amplifier 7 is electrically connected to the wiring R through the switch 11.

The wiring DL_j is electrically connected to the pixel 1 as shown in FIG. 1A, and the transistor 3 included in the pixel 1 is electrically connected to the wiring DL_j.

The read circuit 2b can operate in the following manner, for example. For example, the switches 9 and 12 can be in an on state and the switches 11 and 13 can be in an off state. In such a case, a potential of the wiring VDL is supplied (transmitted) to the non-inverting input terminal of the operational amplifier 7 in the read circuit 2b. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2b operates as a voltage follower circuit, and therefore, the output terminal of the operational amplifier 7 outputs a potential of the wiring VDL. Thus, the potential of the wiring VDL is supplied to the pixel 1 or the wiring DL_j. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2b can function as an impedance converter circuit. Alternatively, since the operational amplifier 7 has high current drive capability, the read circuit 2b can function as a buffer circuit or an amplifier circuit. The read circuit 2b functioning as described above can charge the pixel 1 or the wiring DL_j at high speed. That is, a signal can be written into the pixel 1 or the wiring DL_j at high speed by the read circuit 2b.

In another operation state, for example, the switch 9 and the switch 12 can be in an off state, and the switch 11 and the switch 13 can be in an on state. In that case, the read circuit 2b has a configuration of a feedback circuit. Due to the connections between the operational amplifier 7 and the capacitor 14, the read circuit 2b operates as an integrator circuit. Thus, the circuit operates so that the potential of the inverting input terminal of the operational amplifier 7 is equal to the potential of the non-inverting input terminal of the operational amplifier 7. Thus, the potential of the wiring DL_j is approximately equal to the potential of the wiring VDL. A current flowing through the wiring DL_j is accumulated in the capacitor 14 as charges based on the measurement time, and a potential difference is generated between electrodes of the capacitor 14 in accordance with the accumulated charges. In other words, a voltage of the output terminal of the operational amplifier 7 which is supplied to the wiring R can be obtained by integrating the current flowing through the wiring DL_j with respect to the measurement time. Consequently, the total amount of the current flowing through the wiring DL_j can be read out. In that case, data on the current characteristics of the transistor 3, e.g., a current flowing through the transistor 3, is supplied from the pixel 1. Therefore, data on the pixel 1 can be read from the pixel 1 to the wiring R. Then, the level of the video signal to be supplied to the pixel 1 is corrected on the basis of the data read from the pixel 1. As a result, variation in transistor 3 in the pixel 1 or adverse effects due to deterioration can be reduced. That is, the use of the pixel 1 can achieve display of an image with less image retention or unevenness.

Note that in the case where the read circuit 2b operates as an integrator circuit, the potential of the wiring DL_j can be controlled by controlling the potential of the wiring VDL. Thus, the pixel 1 connected to the wiring DL_j or the potential of the transistor 3 connected to the DL_j can also be controlled by controlling the potential of the wiring VDL, in a period in which the read circuit 2b operates as an integrator circuit. Therefore, an operation state for the case where a current flows through the pixel 1 or the transistor 3 can be brought into an appropriate state by controlling the potential of the wiring VDL. For example, the potential of the light-emitting element 4 is controlled so that a current does not flow through the light-emitting element 4, by controlling the potential of the wiring VDL in a period in which the read circuit 2b operates as an integrator circuit.

Note that in the case where the read circuit 2b operates as an integrator circuit, the switch 12 may be turned on to reset or initialize charges stored in the capacitor 14. For example, the switch 12 may be turned on immediately before the amount of current is measured in the case where the read circuit 2b operates as an integrator circuit.

One embodiment of the present invention is not limited to the above-described switching. For example, the switch 9 is in an off state and the switches 12 and 13 are in an on state in the case where a reading operation is not performed. In such a case, the potential of the wiring VDL can be supplied to the wiring DL_j. That is, the read circuit 2b can operate as a voltage follower circuit.

Figure 8A:
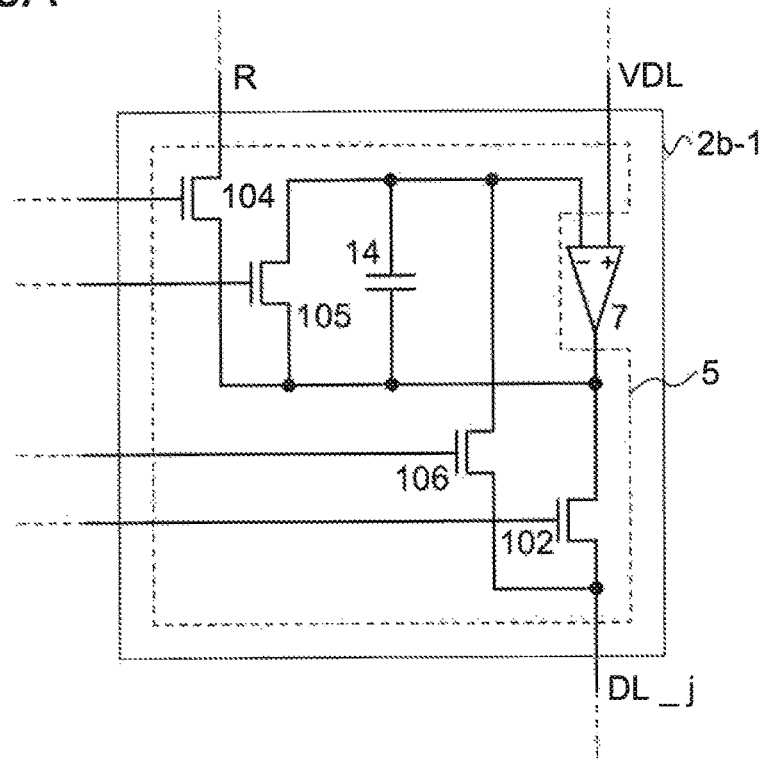
FIGS. 8A and 8B are circuit diagrams showing examples of a semiconductor device of one embodiment of the present invention.
Figure 8B:
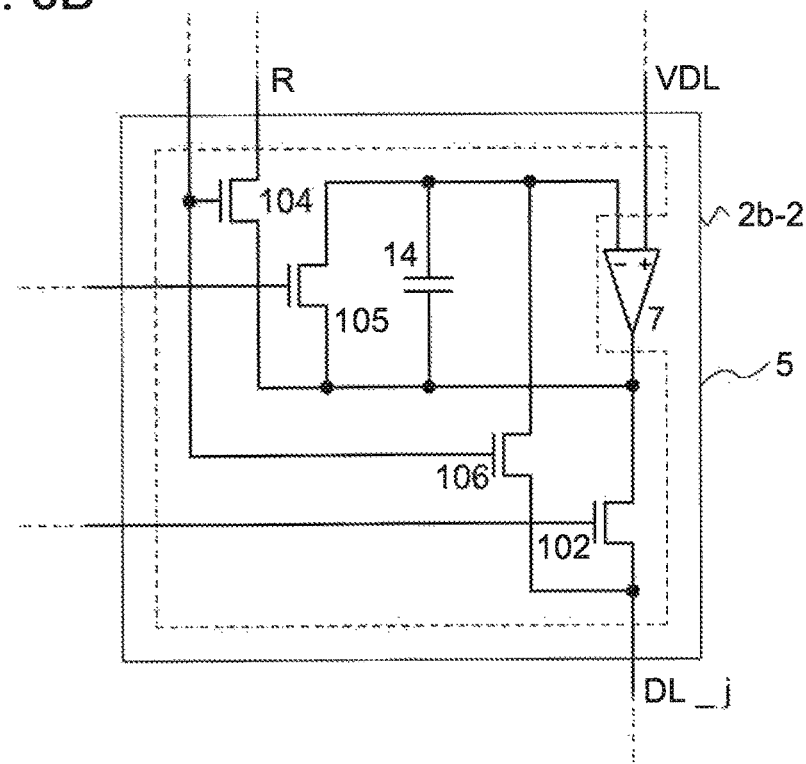

As switches such as the switches 9, 11, 12, and 13, electrical switches, mechanical switches, MEMS elements, or the like may be used. For example, transistors described later are preferably used as electrical switches. FIGS. 8A and 8B are circuit diagrams in the case where transistors are used.

Figure 7:
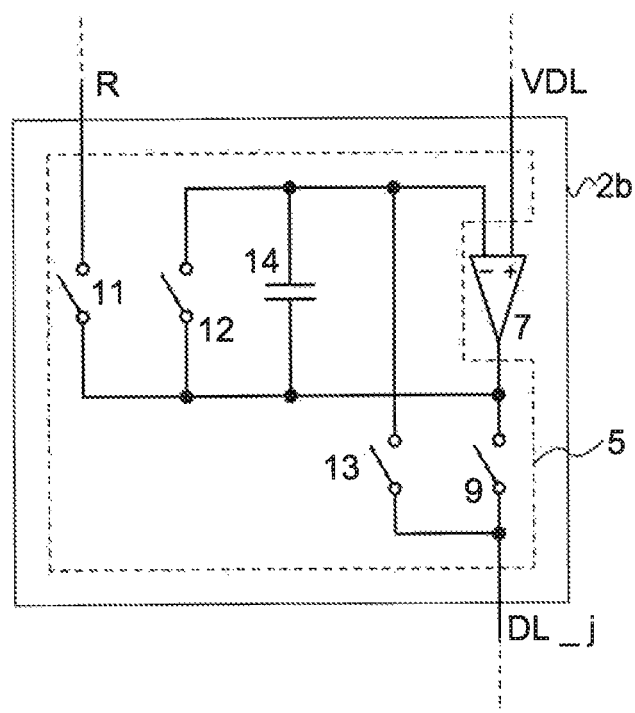
FIG. 7 is a circuit diagram showing an example of a semiconductor device of one embodiment of the present invention.

A read circuit 2b-1 in FIG. 8A is the read circuit 2b in FIG. 7 in which the transistor 102, the transistor 104, a transistor 105, and a transistor 106 are used as the switch 9, the switch 11, the switch 12, and the switch 13, respectively.

A read circuit 2b-2 in FIG. 8B is the read circuit 2b-1 in FIG. 8A in which the gate of the transistor 104 and a gate of the transistor 106 are electrically connected to each other. Thus, the read circuit 2b-2 can operate such that the transistor 104 and the transistor 106 operate in synchronization with each other.

Figure 9A:
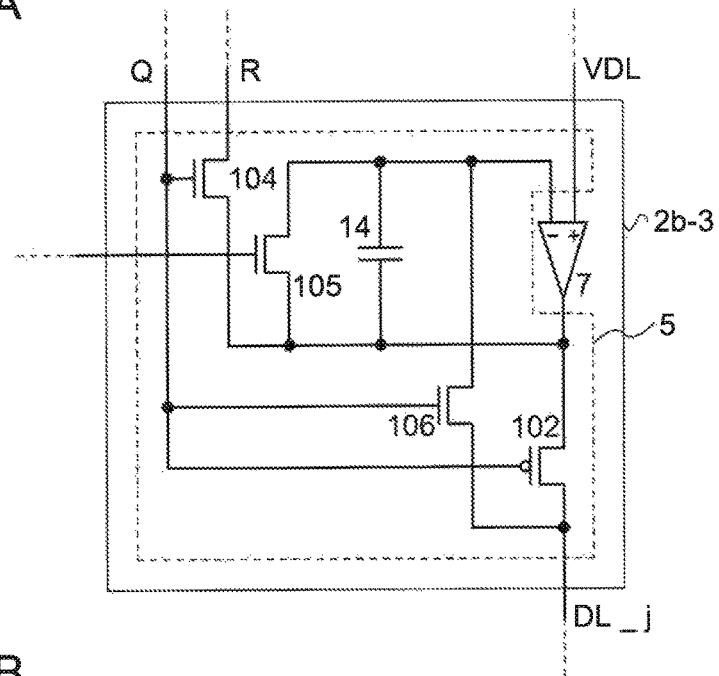
FIGS. 9A and 9B are circuit diagrams showing examples of a semiconductor device of one embodiment of the present invention.
Figure 9B:
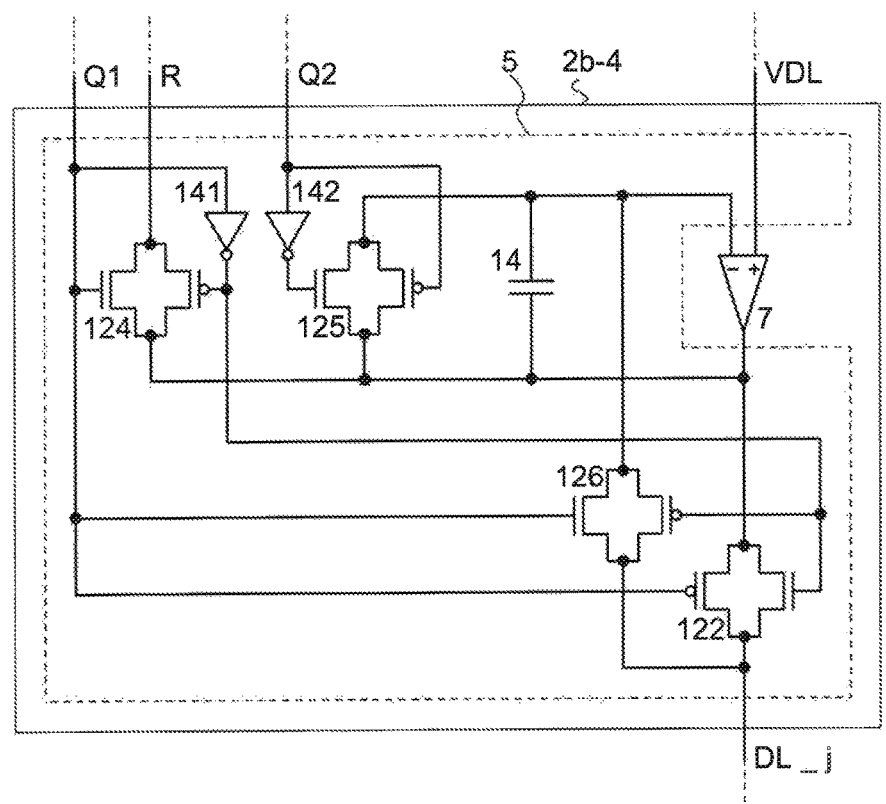

By selecting the polarities of the transistors, a CMOS structure may be formed. FIGS. 9A and 9B and the like illustrate examples of that case.

A read circuit 2b-3 in FIG. 9A is the read circuit 2b-1 in FIG. 8A in which the transistors 104, 105, and 106 are n-channel transistors and the transistor 102 is a p-channel transistor. A wiring Q is electrically connected to the gate of the transistor 102, the gate of the transistor 104, and the gate of the transistor 106. Thus, the read circuit 2b-3 can operate by collectively controlling switching of the transistors 102, 104, and 106 using a signal transmitted through the wiring Q. For example, the read circuit 2b-3 can operate such that, in the transistor 102 and a pair of the transistors 104 and 106, one of the transistor 102 and the pair is in an off state while the other is in an on state. Note that the polarity of the transistor 105 is not limited. The transistors 104 and 106 may be p-channel transistors and the transistor 102 may be an n-channel transistor.

A read circuit 2b-4 in FIG. 9B is the read circuit 2b in FIG. 7 in which the analog switch 122, the analog switch 124, an analog switch 125, and an analog switch 126 are used as the switch 9, the switch 11, the switch 12, and the switch 13, respectively. The analog switches 122, 124, 125, and 126 each have a configuration where a source and a drain of an n-channel transistor and a source and a drain of a p-channel transistor are connected in parallel. A wiring Q1 is electrically connected to the gate of the p-channel transistor of the analog switch 122, the gate of the n-channel transistor of the analog switch 124, and a gate of the n-channel transistor of the analog switch 126. These gates are electrically connected to the gate of the n-channel transistor of the analog switch 122, the gate of the p-channel transistor of the analog switch 124, and a gate of the p-channel transistor of the analog switch 126 through the inverter 141. A wiring Q2 is electrically connected to a gate of the p-channel transistor of the analog switch 125, and the gate of the p-channel transistor of the analog switch 125 is electrically connected to a gate of the n-channel transistor of the analog switch 125 through an inverter 142. With the above-described configuration, the read circuit 2b-4 can operate by collectively controlling switching of the analog switches 122, 124, and 126 using a signal transmitted through the wiring Q1. For example, the read circuit 2b-4 can operate such that, in the analog switch 122 and a pair of the analog switches 124 and 126, one of the analog switch 122 and the pair is in an off state while the other is in an on state. Furthermore, the on/off states of the analog switch 125 can be controlled using a signal transmitted through the wiring Q2, regardless of the on/off states of the analog switches 122, 124, and 126.

Note that the read circuits 2b-3 in FIG. 9A and the read circuit 2b-4 in FIG. 9B are not limited thereto; for example, the polarities of the transistors can be changed as appropriate, if necessary.

Next, a circuit configuration that can serve the functions of the read circuit 2b is described. The read circuit 2b has a plurality of functions. The circuit configuration of the read circuit 2b varies depending on which function is carried out.

In other words, by controlling on/off states of the switches in the function selection portion 5, the read circuit 2b can perform a plurality of functions.

Figure 10A:
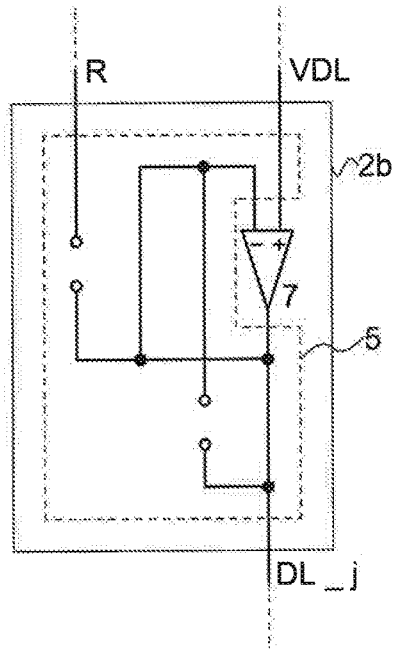
FIGS. 10A to 10C are circuit diagrams showing examples of a semiconductor device of one embodiment of the present invention.
Figure 10B:
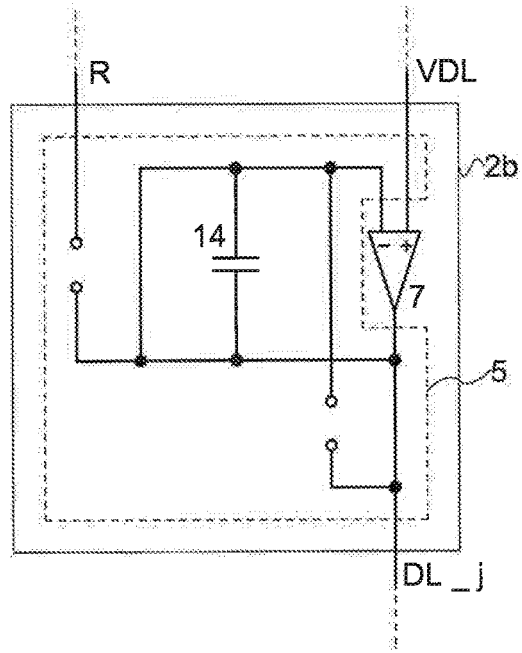

For example, circuit configurations in certain operation states in FIG. 7 are illustrated in FIGS. 10A and 10B. In the configurations, a potential of the wiring VDL can be supplied (or transmitted) to the pixel 1 or the wiring DL_j. With such a configuration, the read circuit 2b can function as a buffer circuit or the like.

Figure 10C:
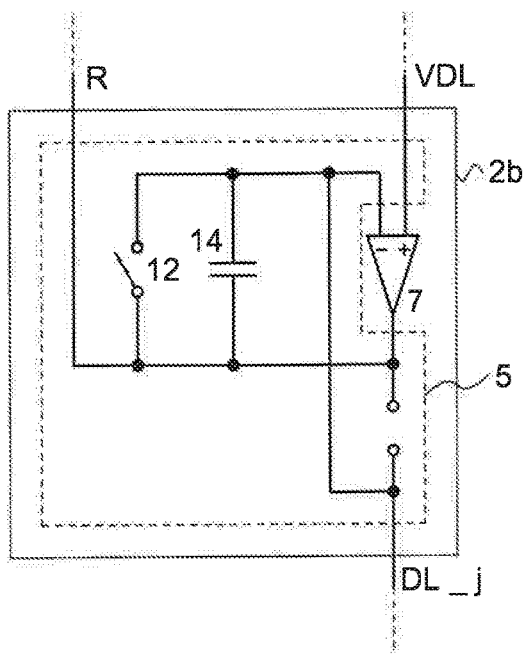

A circuit configuration in another certain operation state in FIG. 7 is illustrated in FIG. 10C. In the configuration, a current from the pixel 1 or the wiring DL_j can be integrated, and a potential based on it can be supplied (or transmitted) to the wiring R. For example, in the case where a current flows from the transistor 3 in the pixel 1 to the wiring DL_j, a current flowing through the wiring DL_j, i.e., a current flowing through the transistor 3 can be integrated and read out by the read circuit 2b. With this configuration, the read circuit 2b can function as a read out circuit or the like.

Note that transistors such as switches (e.g., the switches 9, 11, 12, and 13 and the like) included in the read circuit 2b are not necessarily provided to have the connection relations illustrated in FIG. 7, FIG. 8A, FIG. 8B, FIG. 9A, FIG. 9B, or the like. The operation of the transistors is also not limited to the aforementioned method. Any connection relation or method may be used, as long as the circuit configurations in FIGS. 10A and 10B and the circuit configuration in FIG. 10C are obtained depending on an operation state or the function of a circuit. That is, a switch or a transistor is provided as appropriate so that the circuit configurations in FIGS. 10A and 10B or the circuit configuration in FIG. 10C can be selected by controlling on/off states of the switch or the transistor.

Figure 11A:
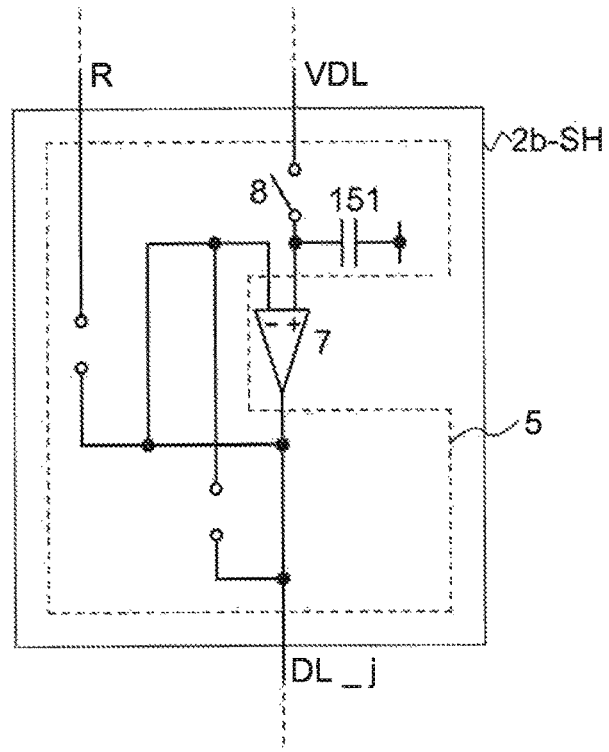
FIGS. 11A and 11B are circuit diagrams showing examples of a semiconductor device of one embodiment of the present invention.
Figure 11B:
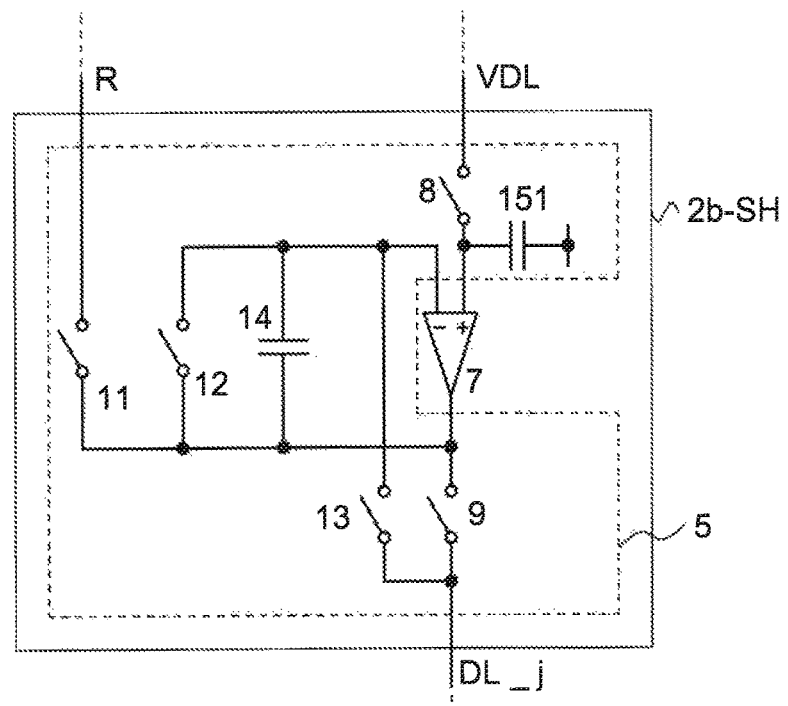

A circuit which samples and holds the potential of the wiring VDL may be provided. A circuit configuration in the case where such a circuit is provided in FIG. 10A is shown in FIG. 11A as a read circuit 2b-SH. The switch 8 is turned on, and the potential of the wiring VDL is held in a capacitor 151. Then, the switch 8 is turned off. Consequently, the potential of the wiring VDL can be sampled and held. Thus, even when the potential of the wiring VDL is changed after the sample-and-hold operation, the operational amplifier 7 can operate without any problem. In the case of providing such a circuit in FIG. 7, the capacitor 151 and the switch 8 are added as shown in the read circuit 2b-SH in FIG. 11B. Note that in the case where parasitic capacitance in the non-inverting input terminal of the operational amplifier 7 is large, the capacitor 151 is not necessarily provided. In the case where the capacitor 151 is provided, one of terminals of the capacitor 151 is connected to the non-inverting input terminal of the operational amplifier 7 and the other of the terminals of the capacitor 151 is connected to a dedicated wiring. Note that the other of the terminals of the capacitor 151 may be connected to another wiring.

Figure 12A:
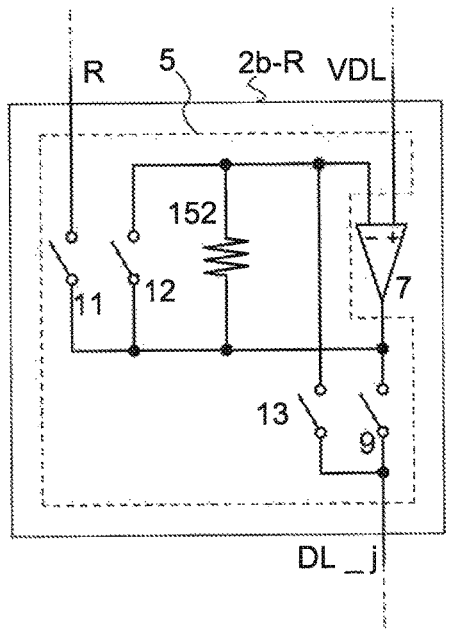
FIGS. 12A to 12D are circuit diagrams showing examples of a semiconductor device of one embodiment of the present invention.
Figure 12B:
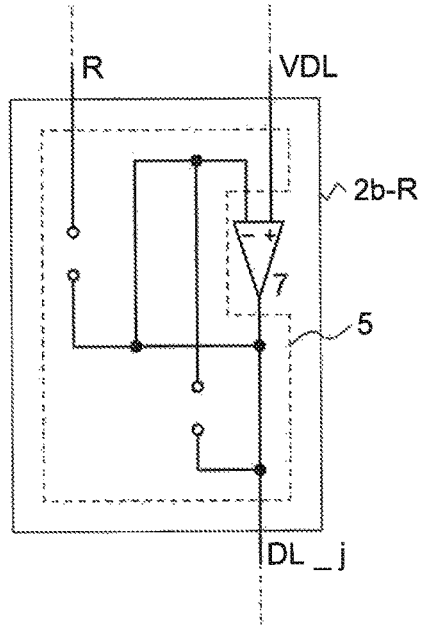
Figure 12C:
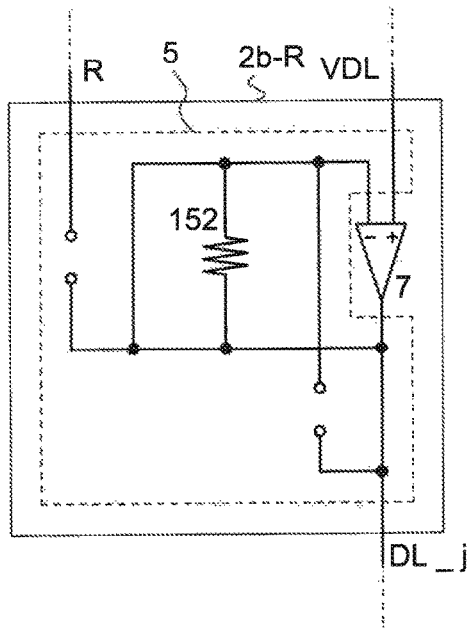
Figure 12D:
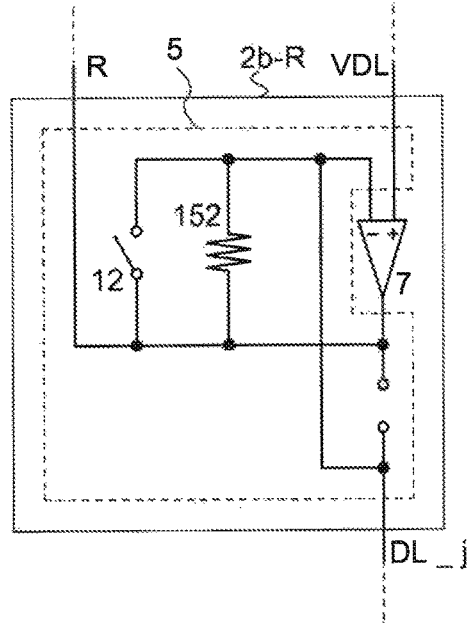

The example of the read circuit including the capacitor 14 to operate as an integrator circuit is described, but one embodiment of the present invention is not limited thereto. A passive element other than the capacitor, e.g., a resistor may be provided. An example of the case where a resistor 152 is provided instead of the capacitor 14 in FIG. 7 is shown as a read circuit 2b-R in FIG. 12A. Similarly, an example of the case in FIG. 10A is shown as the read circuit 2b-R in FIG. 12B, an example of the case in FIG. 10B is shown as the read circuit 2b-R in FIG. 12C, and an example of the case in FIG. 10C is shown as the read circuit 2b-R in FIG. 12D. By the replacement of the capacitor 14 with the resistor 152 as described above, a current-voltage conversion circuit can be formed.

Note that, not only in FIG. 7 but also in other drawings, the capacitor 14 can be replaced with the resistor 152, so that a current-voltage conversion circuit can be formed.

Figure 13:
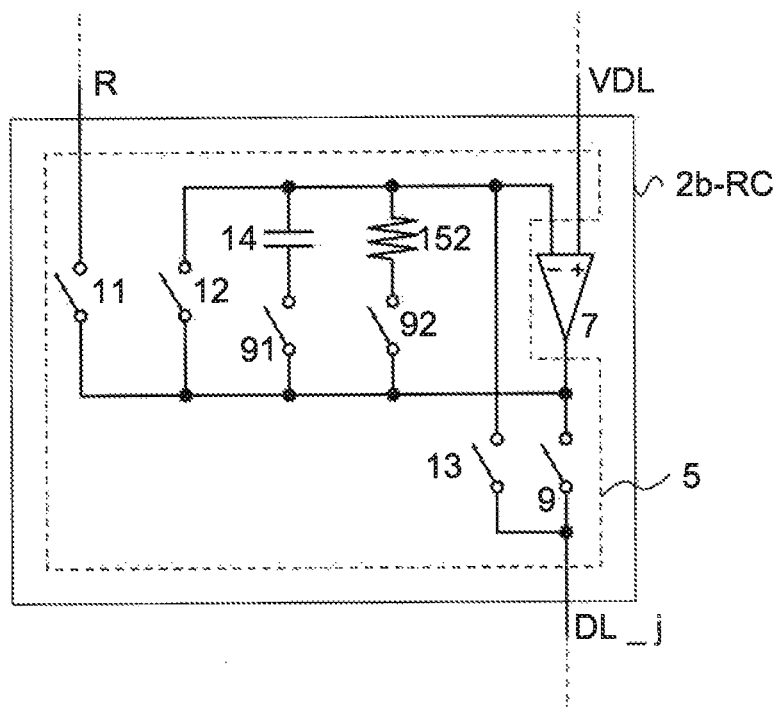
FIG. 13 is a circuit diagram showing an example of a semiconductor device of one embodiment of the present invention.

Note that instead of replacing the capacitor 14 with the resistor 152, both the capacitor 14 and the resistor 152 may be provided; in that case, they operate by switching. FIG. 13 shows a read circuit including both the capacitor 14 and the resistor 152. A switch 91 is electrically connected between the capacitor 14 and the output terminal of the operational amplifier 7. A switch 92 is electrically connected between the resistor 152 and the output terminal of the operational amplifier. The switch 91 and the capacitor 14 are connected in series, and the switch 92 and the resistor 152 are connected in series. By controlling on/off states of the switches 91 and 92, a read circuit 2b-RC in FIG. 13 can operate with the same function as the read circuit 2b in FIG. 7 or the read circuit 2b-R in FIG. 12A. For example, in the case where the switch 91 is in an on state and the switch 92 is in an off state, the read circuit 2b-RC in FIG. 13 has a configuration similar to the read circuit 2b in FIG. 7. In the case where the switch 91 is off and the switch 92 is on, the read circuit 2b-RC in FIG. 13 has a configuration similar to the read circuit 2b-R in FIG. 12A.

As described above, the capacitor 14 can be replaced with the resistor 152, or the capacitor 14 can be replaced with the resistor 152 and the switch. Alternatively, the resistor 152 may be provided and connected in parallel to the capacitor 14, or the resistor 152, the switch, and the like may be provided and connected in parallel to the capacitor 14, for example.

Configuration Example 3

Next, an example of a read circuit of a case different from cases of FIG. 2 and FIG. 7 will be described with reference to FIG. 14. A read circuit 2c in FIG. 14 includes the operational amplifier 7 and the function selection portion 5. The function selection portion 5 includes the switch 8, the switch 9, the switch 10, the switch 11, the switch 12, the switch 91, a switch 93, and the capacitor 14. The non-inverting input terminal of the operational amplifier 7 is electrically connected to the wiring VDL through the switch 8. The non-inverting input terminal of the operational amplifier is electrically connected to the wiring DL_j through the switch 10. The inverting input terminal of the operational amplifier 7 is electrically connected to the output terminal of the operational amplifier 7 through the switch 12. The inverting input terminal of the operational amplifier 7 is electrically connected to one of electrodes of the capacitor 14. The other of the electrodes of the capacitor 14 is electrically connected to the output terminal of the operational amplifier 7 through the switch 91. The inverting input terminal of the operational amplifier 7 is electrically connected to a wiring Vref through the switch 93. The output terminal of the operational amplifier 7 is electrically connected to the wiring DL_j through the switch 9. The output terminal of the operational amplifier 7 is electrically connected to the wiring R through the switch 11.

The wiring DL_j is electrically connected to the pixel 1 as shown in FIG. 1A, and the transistor 3 included in the pixel 1 is electrically connected to the wiring DL_j.

The read circuit 2c can operate in the following manner, for example. For example, the switches 8, 9, and 12 can be in an on state and the switches 10, 11 and 93 can be in an off state. In such a case, a potential of the wiring VDL is supplied (transmitted) to the non-inverting input terminal of the operational amplifier 7 in the read circuit 2c. Note that the switch 91 may be in either an on state or an off state. The operational amplifier 7 has a configuration of a negative feedback circuit and therefore operates so that a potential of the non-inverting input terminal is equal to a potential of the inverting input terminal. That is, the read circuit 2c operates as a voltage follower circuit, and therefore, the output terminal of the operational amplifier 7 outputs a potential of the wiring VDL. Thus, the potential of the wiring VDL is supplied to the pixel 1 or the wiring DL_j. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2c can function as an impedance converter circuit. Alternatively, since the operational amplifier 7 has high current drive capability, the read circuit 2c can function as a buffer circuit or an amplifier circuit. The read circuit 2c functioning as described above can charge the pixel 1 or the wiring DL_j at high speed. That is, a signal can be written into the pixel 1 or the wiring DL_j at high speed by the read circuit 2c.

In another operation state, for example, the switches 8, 9, 12, and 91 can be in an off state and the switches 10, 11, and 93 can be in an on state. In such a case, the operational amplifier 7 is not a feedback circuit in the read circuit 2c. Therefore, the operational amplifier 7 functions as a comparator circuit. In other words, the potential of the wiring Vref which is electrically connected to the non-inverting input terminal of the operational amplifier 7 and the potential of the wiring DL_j which is electrically connected to the non-inverting input terminal of the operational amplifier 7 are compared in height, and in accordance with the comparison result, a signal is output from the output terminal of the operational amplifier 7. Here, by controlling the potential of the wiring Vref, the read circuit 2c can function as an analog-digital (A/D) converter circuit. For example, A/D conversion can be performed by changing the potential of the wiring Vref to a sawtooth wave shape, a step-like wave shape, a triangular wave shape, or the like. In this case, in order to prevent formation of a feedback circuit, the capacitor 14 and the switch 91 may be connected in series.

Next, a circuit configuration that can serve the functions of the read circuit 2c is described. The read circuit 2c has a plurality of functions. The circuit configuration of the read circuit 2c varies depending on which function is carried out. In other words, by controlling on/off states of the switches in the function selection portion 5, the read circuit 2c can perform a plurality of functions.

Figure 14:
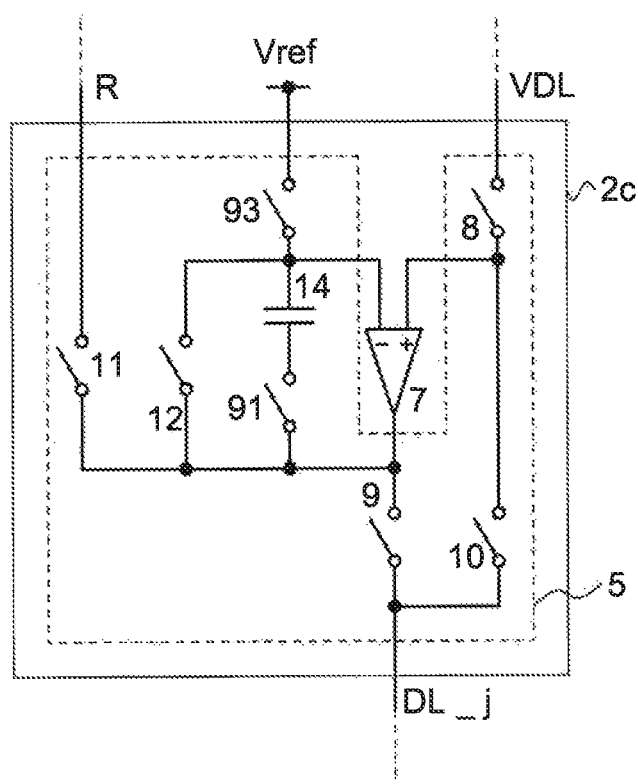
FIG. 14 is a circuit diagram showing an example of a semiconductor device of one embodiment of the present invention.
Figure 15A:
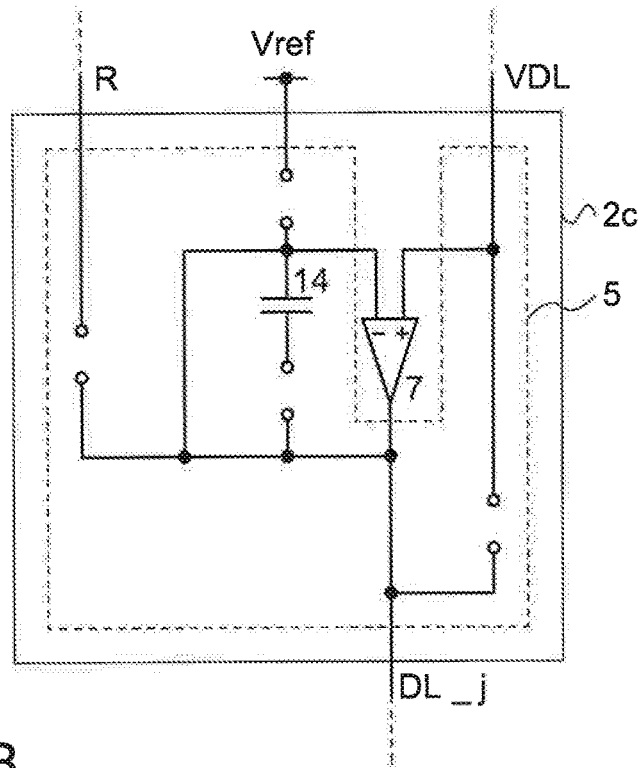
FIGS. 15A and 15B are circuit diagrams showing examples of a semiconductor device of one embodiment of the present invention.

For example, a circuit configuration in a certain operation state in FIG. 14 is illustrated in FIG. 15A. In the configuration, a potential of the wiring VDL can be supplied (or transmitted) to the pixel 1 or the wiring DL_j. With such a configuration, the read circuit 2c can function as a buffer circuit or the like.

Figure 15B:
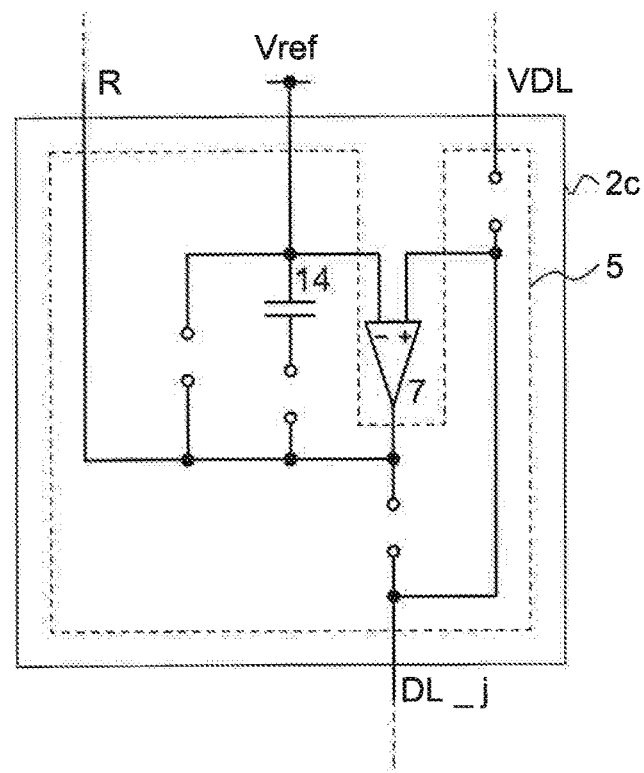

A circuit configuration in another certain operation state in FIG. 14 is illustrated in FIG. 15B. In the configuration, a potential of the wiring DL_j and a potential of the wiring Vref are compared in height, and the comparison result can be supplied (or transmitted) to the wiring R. For example, in the case where a potential based on the threshold voltage of the transistor 3 is output from the pixel 1 to the wiring DL_j, the potential of the wiring DL_j, i.e., the potential based on the threshold voltage of the transistor 3, and the potential of the wiring Vref are compared in height, and the comparison result can be read out by the read circuit 2c. With this configuration, the read circuit 2c can function as a comparator circuit, an A/D converter circuit, or the like.

There is a case where a potential of the transistor 3 is initialized to a predetermined potential before a potential based on the threshold voltage of the transistor 3 is read out. In that case, a circuit configuration shown in FIG. 15A is employed, and control is performed so that the wiring VDL has a potential for initialization. Thus, the potential for initialization can be supplied (or transmitted) to the pixel 1 or the wiring DL_j.

Note that transistors such as switches (e.g., the switch 8, the switch 9, the switch 10, the switch 11, the switch 12, the switch 91, the switch 93, and the like) included in the read circuit 2c are not necessarily provided to have the connection relations illustrated in FIG. 14 or the like. The operation of the transistors is also not limited to the aforementioned method. Any connection relation or method may be used, as long as the circuit configuration in FIG. 15A and the circuit configuration in FIG. 15B are obtained depending on an operation state or the function of a circuit. That is, a switch or a transistor is provided as appropriate so that the circuit configuration in FIG. 15A or the circuit configuration in FIG. 15B can be selected by controlling on/off states of the switch or the transistor.

Figure 16A:
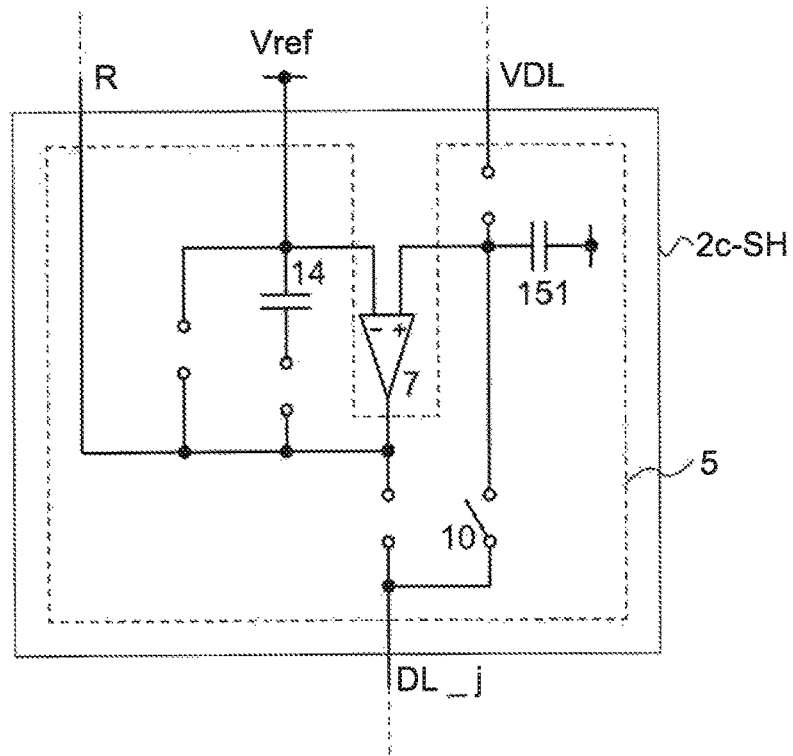
FIGS. 16A and 16B are circuit diagrams showing examples of a semiconductor device of one embodiment of the present invention.
Figure 16B:
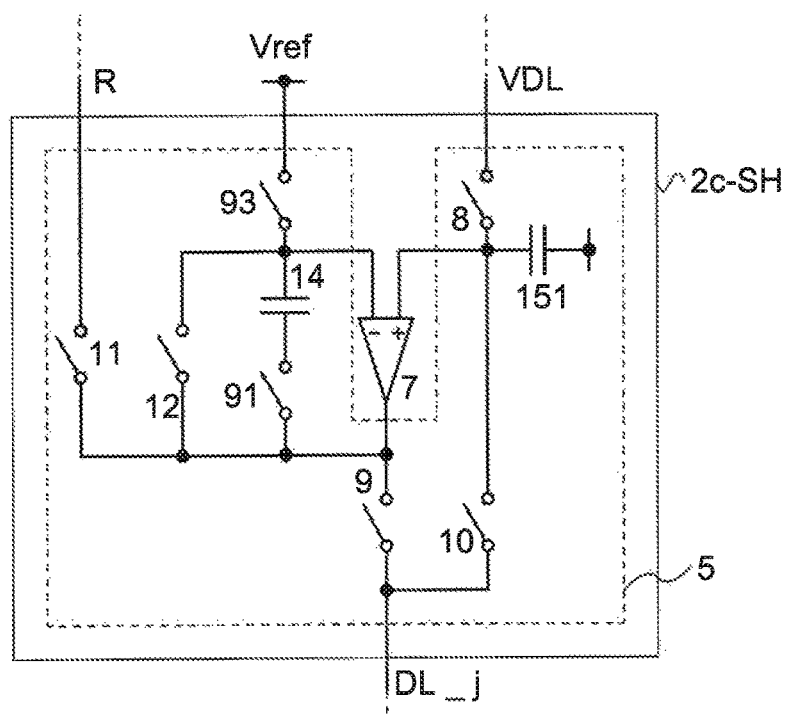

A sample-and-hold circuit may be provided also in the case of the read circuit 2c. For example, the capacitor 151 may be used as a sample-and-hold capacitor. A circuit configuration of the read circuit 2c in that case is shown in FIG. 16A as a read circuit 2c-SH. The switch 10 is turned on, and the potential of the wiring DL_j is held in the capacitor 151. Then, the switch 10 is turned off. Consequently, the potential of the wiring DL_j can be sampled and held. Thus, even when the potential of the wiring DL_j is changed after the sample-and-hold operation, the operational amplifier 7 can operate without any problem. In the case of FIG. 14, the capacitor 151 is added as shown in the read circuit 2c-SH in FIG. 16B. Note that in the case where parasitic capacitance in the non-inverting input terminal of the operational amplifier 7 is large, the capacitor 151 is not necessarily provided. In the case where the capacitor 151 is provided, one of terminals of the capacitor 151 is connected to the non-inverting input terminal of the operational amplifier 7 and the other of the terminals of the capacitor 151 is connected to a dedicated wiring. Note that the other of the terminals of the capacitor 151 may be connected to another wiring.

Configuration Example 4

The examples of the circuit configuration are shown in FIG. 2, FIG. 7, FIG. 14, and the like, but one embodiment of the present invention is not limited thereto. For example, the circuit diagrams described so far can be combined to form another circuit configuration. In the case where data is read from the pixel 1, a plurality of pieces of data may be read, or a voltage and a current may each be read from the pixel 1, for example.

Figure 17A:
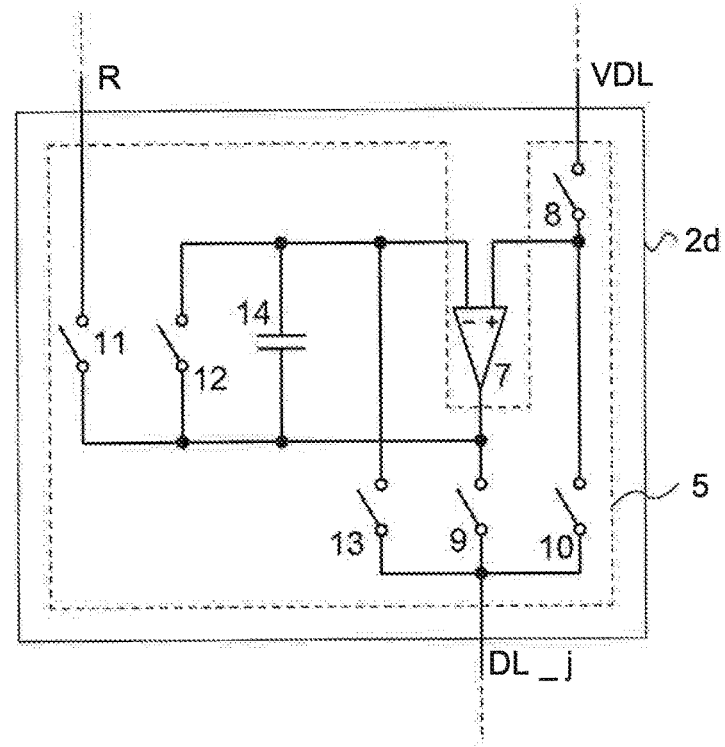
FIGS. 17A and 17B are circuit diagrams showing examples of a semiconductor device of one embodiment of the present invention.

A read circuit shown in FIG. 17A is described as an example of a circuit diagram of the case where FIG. 2 and FIG. 7 are combined. A read circuit 2d in FIG. 17A includes the operational amplifier 7 and the function selection portion 5. The function selection portion 5 includes the switch 8, the switch 9, the switch 10, the switch 11, the switch 12, the switch 13, and the capacitor 14. The non-inverting input terminal of the operational amplifier 7 is electrically connected to the wiring VDL through the switch 8. The inverting input terminal of the operational amplifier 7 is electrically connected to the output terminal of the operational amplifier 7 through the switch 12. The inverting input terminal of the operational amplifier 7 is electrically connected to the output terminal of the operational amplifier 7 through the capacitor 14. The non-inverting input terminal of the operational amplifier 7 is electrically connected to the wiring DL_j through the switch 10. The output terminal of the operational amplifier 7 is electrically connected to the wiring DL_j through the switch 9. The output terminal of the operational amplifier 7 is electrically connected to the wiring R through the switch 11.

The wiring DL_j is electrically connected to the pixel 1 as shown in FIG. 1A, and the transistor 3 included in the pixel 1 is electrically connected to the wiring DL_j.

The read circuit 2d can operate in the following manner, for example. For example, the switch 8, the switch 9 (or the switch 13), and the switch 12 can be in an on state, and the switch 10, the switch 11, and the switch 13 (or the switch 9) can be in an off state. Note that both the switch 9 and the switch 13 may be in an on state. In such a case, a potential of the wiring VDL is supplied (transmitted) to the non-inverting input terminal of the operational amplifier 7 in the read circuit 2d. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2d operates as a voltage follower circuit, and therefore, the output terminal of the operational amplifier 7 outputs a potential of the wiring VDL. Thus, the potential of the wiring VDL is supplied to the pixel 1 or the wiring DL_j. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2d can function as an impedance converter circuit. Alternatively, since the operational amplifier 7 has high current drive capability, the read circuit 2d can function as a buffer circuit or an amplifier circuit. The read circuit 2d functioning as described above can charge the pixel 1 or the wiring DL_j at high speed. That is, a signal can be written into the pixel 1 or the wiring DL_j at high speed by the read circuit 2d.

In another operation state, for example, the switch 8, the switch 9, and the switch 13 can be in an off state and the switch 10, the switch 11, and the switch 12 can be in an on state. In such a case, a potential of the transistor 3 included in the pixel 1 is supplied (transmitted) to the non-inverting input terminal of the operational amplifier 7 in the read circuit 2d. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2d operates as a voltage follower circuit, and therefore, the output terminal of the operational amplifier 7 outputs the potential of the wiring DL_j or the transistor 3 included in the pixel 1. Thus, the potential of the wiring DL_j or the transistor 3 included in the pixel 1 is supplied to the wiring R. In that case, data on the current characteristics of the transistor, e.g., a voltage depending on the threshold voltage of the transistor, is supplied from the pixel 1. Therefore, data on the pixel 1 can be read from the pixel 1 to the wiring R. Since the operational amplifier 7 has high input impedance and low output impedance, the read circuit 2d can function as an impedance converter circuit. Alternatively, since the operational amplifier 7 has high current drive capability, the read circuit 2d can function as a buffer circuit or an amplifier circuit. The read circuit 2d functioning as described above enables a potential of the pixel 1 or the wiring DL_j to be output to the wiring R without adversely affecting the potential of the pixel 1 or the wiring DL_j. That is, a signal can be read from the pixel 1 or the wiring DL_j at high speed by the read circuit 2d.

In another operation state, for example, the switch 9, the switch 10, and the switch 12 can be in an off state, and the switch 8, the switch 11, and the switch 13 can be in an on state. In that case, the read circuit 2d has a configuration of a feedback circuit. Due to the connections between the operational amplifier 7 and the capacitor 14, the read circuit 2d operates as an integrator circuit. Thus, the circuit operates so that the potential of the inverting input terminal of the operational amplifier 7 is equal to the potential of the non-inverting input terminal of the operational amplifier 7. Thus, the potential of the wiring DL_j is approximately equal to the potential of the wiring VDL. A current flowing through the wiring DL_j is accumulated in the capacitor 14 as charges based on the measurement time, and a potential difference is generated between electrodes of the capacitor 14 in accordance with the accumulated charges. In other words, a voltage of the output terminal of the operational amplifier 7 which is supplied to the wiring R can be obtained by integrating the current flowing through the wiring DL_j with respect to the measurement time. Consequently, the total amount of the current flowing through the wiring DL_j can be read out. In that case, data on the current characteristics of the transistor 3, e.g., a current flowing through the transistor 3, is supplied from the pixel 1. Therefore, data on the pixel 1 can be read from the pixel 1 to the wiring R. Then, the level of the video signal to be supplied to the pixel 1 is corrected on the basis of the data read from the pixel 1. As a result, variation in transistor 3 in the pixel 1 or adverse effects due to deterioration can be reduced. That is, the use of the pixel 1 can achieve display of an image with less image retention or unevenness.

Note that in the case where the read circuit 2d operates as an integrator circuit, the potential of the wiring DL_j can be controlled by controlling the potential of the wiring VDL. Thus, the pixel 1 connected to the wiring DL_j or the potential of the transistor 3 connected to the DL_j can also be controlled by controlling the potential of the wiring VDL, in a period in which the read circuit 2d operates as an integrator circuit. Therefore, an operation state for the case where a current flows through the pixel 1 or the transistor 3 can be brought into an appropriate state by controlling the potential of the wiring VDL. For example, the potential of the light-emitting element 4 is controlled so that a current does not flow through the light-emitting element 4, by controlling the potential of the wiring VDL in a period in which the read circuit 2d operates as an integrator circuit.

Note that in the case where the read circuit 2d operates as an integrator circuit, the switch 12 may be turned on to reset or initialize charges stored in the capacitor 14. For example, the switch 12 may be turned on immediately before the amount of current is measured in the case where the read circuit 2d operates as an integrator circuit.

Next, a circuit configuration that can serve the functions of the read circuit 2d is described. The read circuit 2d has a plurality of functions. The circuit configuration of the read circuit 2d varies depending on which function is carried out. In other words, by controlling on/off states of the switches in the function selection portion 5, the read circuit 2d can perform a plurality of functions.

For example, a circuit configuration in a certain operation state in FIG. 17A is illustrated in FIG. 5A, FIG. 10A, or FIG. 10B. In the configuration, a potential of the wiring VDL can be supplied (or transmitted) to the pixel 1 or the wiring DL_j. With such a configuration, the read circuit 2d can function as a buffer circuit or the like.

A circuit configuration in another certain operation state in FIG. 17A is illustrated in FIG. 5B. In the configuration, a potential of the pixel 1 or the wiring DL_j can be supplied (or transmitted) to the wiring R. For example, in the case where a potential based on the threshold voltage of the transistor 3 is output from the pixel 1 to the wiring DL_j, the potential of the wiring DL_j, i.e., the potential based on the threshold voltage of the transistor 3, can be read out by the read circuit 2d. With such a configuration, the read circuit 2d can function as a read out circuit or the like.

A circuit configuration in another certain operation state in FIG. 17A is illustrated in FIG. 10C. In the configuration, a current from the pixel 1 or the wiring DL_j can be integrated, and a potential based on it can be supplied (or transmitted) to the wiring R. For example, in the case where a current flows from the transistor 3 in the pixel 1 to the wiring DL_j, a current flowing through the wiring DL_j, i.e., a current flowing through the transistor 3 can be integrated and read out by the read circuit 2d. With this configuration, the read circuit 2d can function as a read out circuit or the like.

As described above, a plurality of pieces of data can be read from the pixel 1. As a result, current characteristics of the transistor 3 can be corrected more appropriately.

Note that transistors such as switches (e.g., the switches 8 to 13 and the like) included in the read circuit 2d are not necessarily provided to have the connection relations illustrated in FIG. 17A or the like. The operation of the transistors is also not limited to the aforementioned method. Any connection relation or method may be used, as long as the circuit configuration in FIG. 5A or the like, the circuit configuration in FIG. 5B, and the circuit configuration in FIG. 10C are obtained depending on an operation state or the function of a circuit. That is, a switch or a transistor is provided as appropriate so that the circuit configuration in FIG. 5A or the like, the circuit configuration in FIG. 5B, or the circuit configuration in FIG. 10C can be selected by controlling on/off states of the switch or the transistor.

Figure 17B:
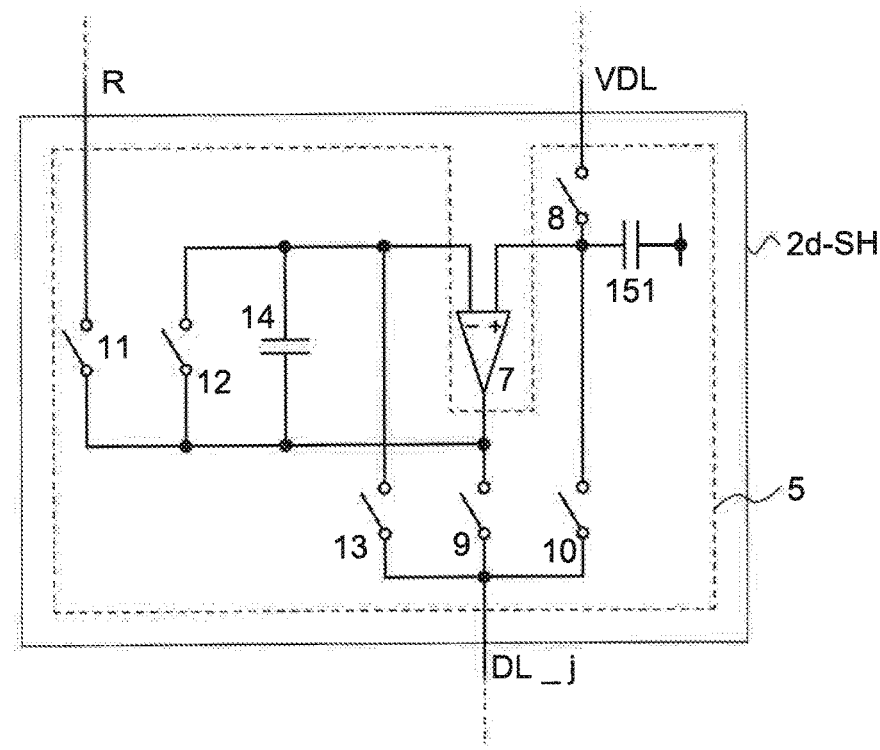

In FIG. 17A, a sample-and-hold capacitor may be provided as in FIGS. 6A to 6C, FIGS. 11A and 11B, and the like. A circuit diagram in that case is shown in FIG. 17B as a read circuit 2d-SH.

Configuration Example 5

In FIG. 17A, the example of the circuit diagram of the case where FIG. 2 and FIG. 7 are combined is shown. As another example, a circuit diagram of the case where FIG. 7 and FIG. 14 are combined can be provided. A read circuit shown in FIG. 18A will be described as an example of such a circuit diagram. A read circuit 2e in FIG. 18A includes the operational amplifier 7 and the function selection portion 5. The function selection portion 5 includes the switch 8, the switch 9, the switch 10, the switch 11, the switch 12, the switch 13, the switch 91, the switch 93, and the capacitor 14. The non-inverting input terminal of the operational amplifier 7 is electrically connected to the wiring VDL through the switch 8. The non-inverting input terminal of the operational amplifier 7 is electrically connected to the wiring DL_j through the switch 10. The inverting input terminal of the operational amplifier 7 is electrically connected to the output terminal of the operational amplifier 7 through the switch 12. The inverting input terminal of the operational amplifier 7 is electrically connected to the one of electrodes of the capacitor 14. The other of the electrodes of the capacitor 14 is electrically connected to the output terminal of the operational amplifier 7 through the switch 91. The inverting input terminal of the operational amplifier 7 is electrically connected to the wiring DL_j through the switch 13. The inverting input terminal of the operational amplifier 7 is electrically connected to the wiring Vref through the switch 93. The output terminal of the operational amplifier 7 is electrically connected to the wiring DL_j through the switch 9. The output terminal of the operational amplifier 7 is electrically connected to the wiring R through the switch 11.

The wiring DL_j is electrically connected to the pixel 1 as shown in FIG. 1A, and the transistor 3 included in the pixel 1 is electrically connected to the wiring DL_j.

The read circuit 2e can operate in the following manner, for example. For example, when the switches 8, 9, and 12 are on and the switches 10, 11, 13, and 93 are off, a potential of the wiring VDL is supplied (transmitted) to the non-inverting input terminal of the operational amplifier 7. Note that the switch 91 may be in either an on state or an off state. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2e operates as a voltage follower circuit, and therefore, the output terminal of the operational amplifier 7 outputs a potential of the wiring VDL. Thus, the potential of the wiring VDL is supplied to the pixel 1 or the wiring DL_j. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2e can function as an impedance converter circuit. Alternatively, since the operational amplifier 7 has high current drive capability, the read circuit 2e can function as a buffer circuit or an amplifier circuit. The read circuit 2e functioning as described above can charge the pixel 1 or the wiring DL_j at high speed. That is, a signal can be written into the pixel 1 or the wiring DL_j at high speed by the read circuit 2e.

In another operation state, for example, the switches 8, 9, 91, 12, and 13 can be in an off state and the switches 10, 11, and 93 can be in an on state. In such a case, the operational amplifier 7 is not a feedback circuit in the read circuit 2e. Therefore, the operational amplifier 7 functions as a comparator circuit. In other words, the potential of the wiring Vref which is electrically connected to the non-inverting input terminal of the operational amplifier 7 and the potential of the wiring DL_j which is electrically connected to the non-inverting input terminal of the operational amplifier 7 are compared in height, and in accordance with the comparison result, a signal is output from the output terminal of the operational amplifier 7. Here, by controlling the potential of the wiring Vref, the read circuit 2e can function as an A/D converter circuit. For example, A/D conversion can be performed by changing the potential of the wiring Vref to a sawtooth wave shape, a step-like wave shape, a triangular wave shape, or the like. In this case, in order to prevent formation of a feedback circuit, the capacitor 14 and the switch 91 may be connected in series.

In another operation state, for example, the switches 9, 10, 12, and 93 can be in an off state, and the switches 8, 11, 13, and 91 can be in an on state. In that case, the read circuit 2e has a configuration of a feedback circuit. Due to the connections between the operational amplifier 7 and the capacitor 14, the read circuit 2e operates as an integrator circuit. Thus, the circuit operates so that the potential of the inverting input terminal of the operational amplifier 7 is equal to the potential of the non-inverting input terminal of the operational amplifier 7. Thus, the potential of the wiring DL_j is approximately equal to the potential of the wiring VDL. A current flowing through the wiring DL_j is accumulated in the capacitor 14 as charges based on the measurement time, and a potential difference is generated between electrodes of the capacitor 14 in accordance with the accumulated charges. In other words, a voltage of the output terminal of the operational amplifier 7 which is supplied to the wiring R can be obtained by integrating the current flowing through the wiring DL_j with respect to the measurement time. Consequently, the total amount of the current flowing through the wiring DL_j can be read out. In that case, data on the current characteristics of the transistor 3, e.g., a current flowing through the transistor 3, is supplied from the pixel 1. Therefore, data on the pixel 1 can be read from the pixel 1 to the wiring R.

Note that in the case where the read circuit 2e operates as an integrator circuit, the switch 12 may be turned on to reset or initialize charges stored in the capacitor 14. For example, the switch 12 may be turned on immediately before the amount of current is measured in the case where the read circuit 2e operates as an integrator circuit.

Next, a circuit configuration that can serve the functions of the read circuit 2e is described. The read circuit 2e has a plurality of functions. The circuit configuration of the read circuit 2e varies depending on which function is carried out. In other words, by controlling on/off states of the switches in the function selection portion 5, the read circuit 2e can perform a plurality of functions.

Figure 18A:
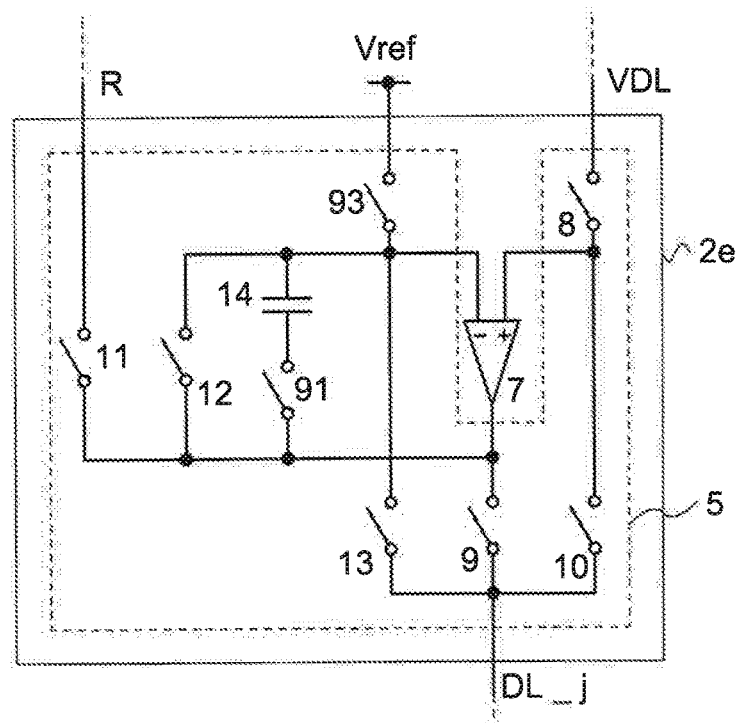
FIGS. 18A and 18B are circuit diagrams showing examples of a semiconductor device of one embodiment of the present invention.

For example, a circuit configuration in a certain operation state in FIG. 18A is illustrated in FIG. 5A, FIG. 10A, or FIG. 10B. In the configuration, a potential of the wiring VDL can be supplied (or transmitted) to the pixel 1 or the wiring DL_j. With such a configuration, the read circuit 2e can function as a buffer circuit or the like.

A circuit configuration in another certain operation state in FIG. 18A is illustrated in FIG. 10C. In the configuration, a current from the pixel 1 or the wiring DL_j can be integrated, and a potential based on it can be supplied (or transmitted) to the wiring R. For example, in the case where a current flows from the transistor 3 in the pixel 1 to the wiring DL_j, a current flowing through the wiring DL_j, i.e., a current flowing through the transistor 3 can be integrated and read out by the read circuit 2e. With this configuration, the read circuit 2e can function as a read out circuit or the like.

A circuit configuration in another certain operation state in FIG. 18A is illustrated in FIG. 15B. In the configuration, a potential of the wiring DL_j and a potential of the wiring Vref are compared in height, and the comparison result can be supplied (or transmitted) to the wiring R. For example, in the case where a potential based on the threshold voltage of the transistor 3 is output from the pixel 1 to the wiring DL_j, the potential of the wiring DL_j, i.e., the potential based on the threshold voltage of the transistor 3, and the potential of the wiring Vref are compared in height, and the comparison result can be read out by the read circuit 2e. With this configuration, the read circuit 2e can function as a comparator circuit, an A/D converter circuit, or the like.

There is a case where a potential of the transistor 3 is initialized to a predetermined potential before a potential based on the threshold voltage of the transistor 3 is read out. In that case, a circuit configuration shown in FIG. 15A is employed, and control is performed so that the wiring VDL has a potential for initialization. Thus, the potential for initialization can be supplied (or transmitted) to the pixel 1 or the wiring DL_j.

As described above, a plurality of pieces of data can be read from the pixel 1. As a result, current characteristics of the transistor 3 can be corrected more appropriately. In particular, in the case where current characteristics of a driving transistor are not current characteristics of a desired transistor, by obtaining a plurality of kinds of data, variation in current characteristics of the driving transistor can be corrected more accurately. An example of a desired transistor includes a transistor in which gradual channel approximation is made. For example, in the case where the transistor is a thin film transistor, the transistor does not have current characteristics of a desired transistor in many cases; therefore, the reading out method according to one embodiment of the present invention is useful.

Note that transistors such as switches (e.g., the switch 8, the switch 9, the switch 10, the switch 11, the switch 12, the switch 13, the switch 91, the switch 93, and the like) included in the read circuit 2e are not necessarily provided to have the connection relations illustrated in FIG. 18A or the like. The operation of the transistors is also not limited to the aforementioned method. Any connection relation or method may be used, as long as the circuit configuration in FIG. 5A or the like, the circuit configuration in FIG. 15B, and the circuit configuration in FIG. 10C are obtained depending on an operation state or the function of a circuit. That is, a switch or a transistor is provided as appropriate so that the circuit configuration in FIG. 5A or the like, the circuit configuration in FIG. 15B, or the circuit configuration in FIG. 10C can be selected by controlling on/off states of the switch or the transistor.

Figure 18B:
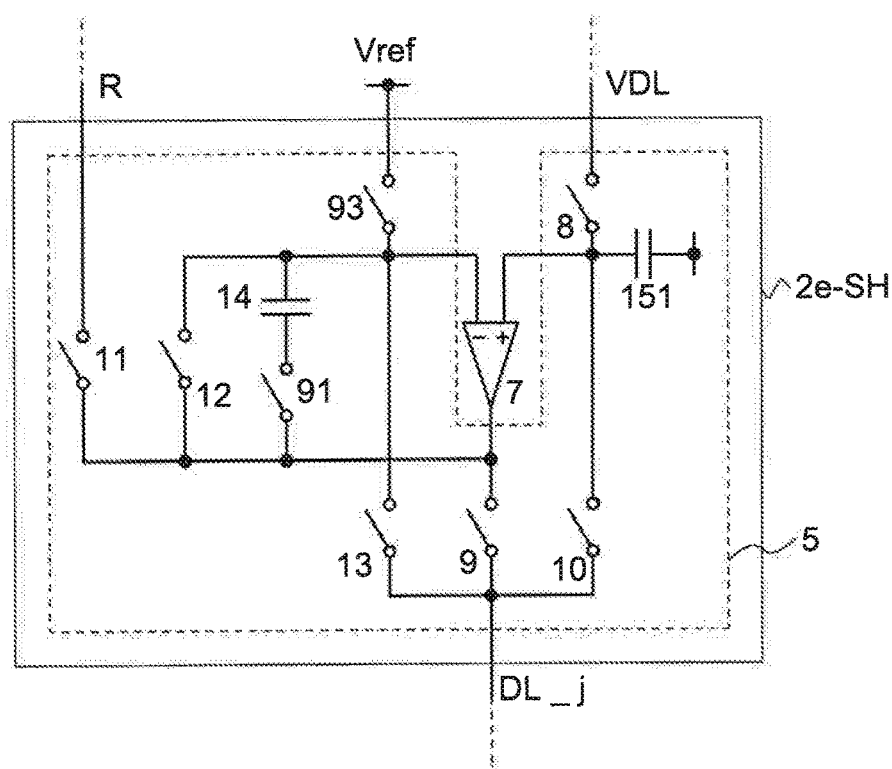

In FIG. 18A, a sample-and-hold capacitor may be provided as in FIGS. 6A to 6C, FIGS. 11A and 11B, and the like. A circuit diagram in that case is shown in FIG. 18B as a read circuit 2e-SH.

Configuration Example 6

In the examples described so far, the wiring DL_j is provided as shown in FIG. 1A. However, one embodiment of the present invention is not limited thereto. For example, the wiring DL_j and a wiring IL_j may be provided as shown in FIG. 1B. Examples of a read circuit of the case will be described.

Figure 19:
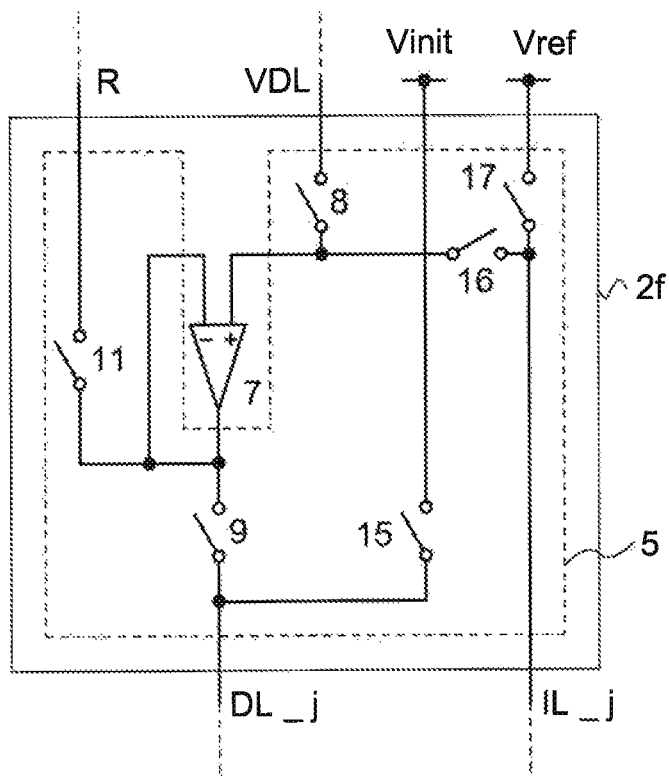
FIG. 19 is a circuit diagram showing an example of a semiconductor device of one embodiment of the present invention.

First, a read circuit in FIG. 19 is described. A read circuit 2f in FIG. 19 includes the operational amplifier 7 and the function selection portion 5. The function selection portion 5 includes the switch 8, the switch 9, the switch 11, and switches 15 to 17. The non-inverting input terminal of the operational amplifier 7 is electrically connected to the wiring VDL through the switch 8. The non-inverting input terminal of the operational amplifier 7 is electrically connected to the wiring IL_j through the switch 16. The inverting input terminal of the operational amplifier 7 is electrically connected to the output terminal of the operational amplifier 7. The output terminal of the operational amplifier 7 is electrically connected to the wiring DL_j through the switch 9. The output terminal of the operational amplifier 7 is electrically connected to the wiring R through the switch 11. The wiring DL_j is electrically connected to a wiring Vinit through the switch 15. The wiring IL_j is electrically connected to the wiring Vref through the switch 17.

As shown in FIG. 1B, the wiring DL_j and the wiring IL_j are electrically connected to the pixel 1, and the transistor 3 included in the pixel 1 is electrically connected to the wiring DL_j and the wiring IL_j. The wiring DL_j and the wiring IL_j are connected not to the same terminal of the transistor 3 but to different terminals thereof. In the case of the read circuit 2f in FIG. 19, the wiring DL_j is connected to a gate of the transistor 3, and the wiring IL_j is connected to a source or a drain of the transistor 3. The connection between the wiring DL_j, the wiring IL_j, and the transistor 3 is not limited to the above and may be changed as appropriate depending on a purpose, an operation, or the like.

The read circuit 2f can operate in the following manner, for example. For example, the switch 8, the switch 9, and the switch 17 can be in an on state, and the switch 11, the switch 15, and the switch 16 can be in an off state. In such a case, a potential of the wiring VDL is supplied (transmitted) to the non-inverting input terminal of the operational amplifier 7. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2f operates as a voltage follower circuit, and therefore, the output terminal of the operational amplifier 7 outputs a potential of the wiring VDL. Thus, the potential of the wiring VDL is supplied to the gate of the transistor 3 included in the pixel 1 or the wiring DL_j, and a potential of the wiring Vref is supplied to the wiring IL_j or a terminal of the source or the drain of the transistor 3 included in the pixel 1. For example, a potential of a video signal, an initialization signal, a precharge signal, or the like is supplied to the wiring VDL; hence, the potential of the video signal, the initialization signal, the precharge signal, or the like is supplied to the pixel 1. Since the operational amplifier 7 has high input impedance and low output impedance, the read circuit 2f can function as an impedance converter circuit. Since the operational amplifier 7 has high current drive capability, the read circuit 2f can function as a buffer circuit or an amplifier circuit. By the read circuit 2f functioning as described above, the wiring DL_j can be charged at high speed. That is, a signal can be written into the terminal in the pixel 1 connected to the wiring DL_j at high speed by the read circuit 2f. Note that the wiring Vref is supplied with a predetermined potential such as an initialization signal or a precharge potential.

In another operation state, for example, the switch 8, the switch 9, and the switch 17 can be in an off state and the switch 11, the switch 15, and the switch 16 can be in an on state. In such a case, a potential of the wiring IL_j or a terminal of the source or the drain of the transistor 3 included in the pixel 1 is supplied (transmitted) to the non-inverting input terminal of the operational amplifier 7, and a potential of the wiring Vinit is supplied (transmitted) to the wiring DL_j or the gate of the transistor 3 included in the pixel 1 in the read circuit 2f. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2f operates as a voltage follower circuit, and therefore, the output terminal of the operational amplifier 7 outputs the potential of the wiring IL_j or a terminal of the source or the drain of the transistor 3 included in the pixel 1. Thus, the potential of a terminal of the source or the drain of the transistor 3 included in the pixel 1 is supplied to the wiring R. In that case, data on the current characteristics of the transistor 3, e.g., a voltage depending on the threshold voltage of the transistor 3, is supplied from the pixel 1. Therefore, data on the pixel 1 can be read from the pixel 1 to the wiring R. Since the operational amplifier 7 has high input impedance and low output impedance, the read circuit 2f can function as an impedance converter circuit. Alternatively, since the operational amplifier 7 has high current drive capability, the read circuit 2f can function as a buffer circuit or an amplifier circuit. The read circuit 2f functioning as described above enables a potential of the pixel 1 or the wiring IL_j to be output to the wiring R without adversely affecting the potential of the pixel 1 or the wiring IL_j. That is, a signal can be read from the pixel 1 or the wiring IL_j at high speed by the read circuit 2f. Note that the wiring Vinit is supplied with a predetermined potential such as an initialization signal or a precharge potential.

There is a case where a potential of the transistor 3 is initialized to a predetermined potential before a potential based on the threshold voltage of the transistor 3 is read out. In the case of performing the initialization, the switch 15 and the switch 17 are in an on state and the switch 9 and the switch 16 are in an off state. When the switch 8 is in an off state, the switch 16 is in an on state. The switch 11 may be in either an on state or an off state. Then, control is performed so that the wiring Vinit and the wiring Vref each have a potential for initialization. Thus, the potential for initialization can be supplied (or transmitted) to each of the transistor 3 included in the pixel 1, the wiring DL_j, and the wiring IL_j. By the initialization, an absolute value of a voltage between the gate and the source of the transistor 3 included in the pixel 1 can be larger than an absolute value of the threshold voltage of the transistor 3, for example. That is, by the initialization, the transistor 3 included in the pixel 1 can be turned on, for example.

Figure 20A:
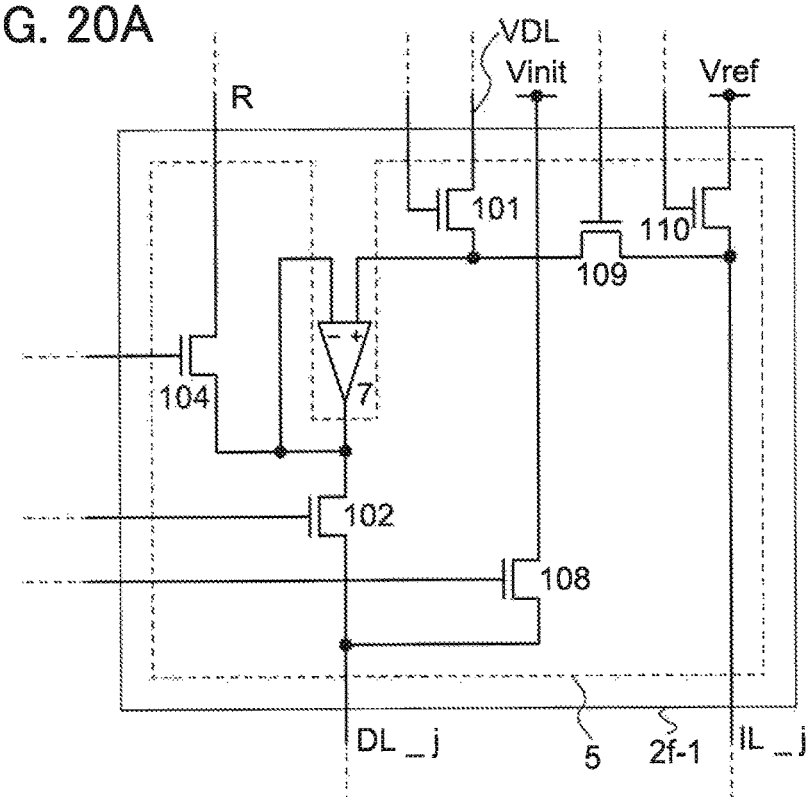
FIGS. 20A and 20B are circuit diagrams showing examples of a semiconductor device of one embodiment of the present invention.
Figure 20B:
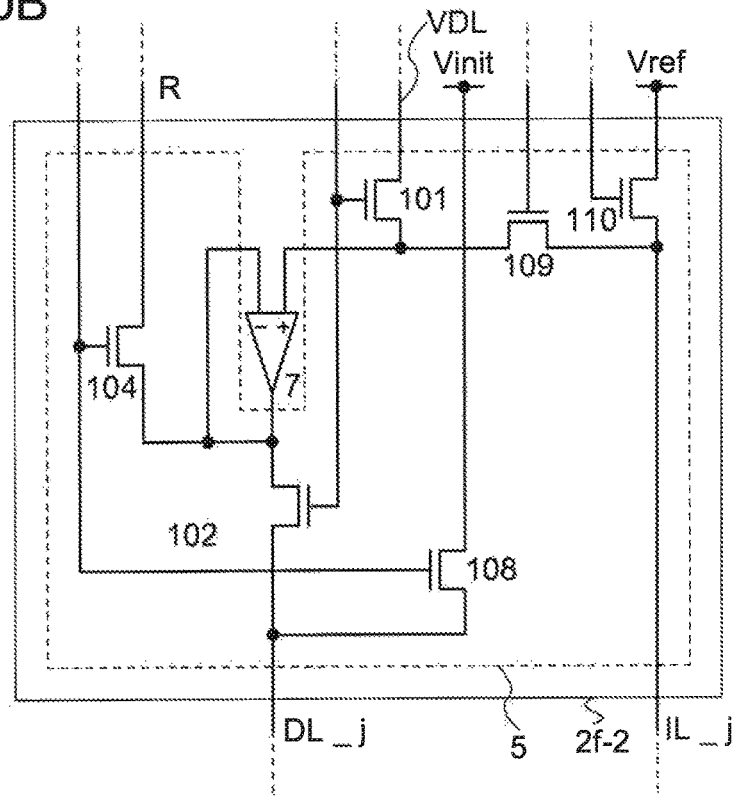

As switches such as the switches 8, 9, 11, 15, 16, and 17, electrical switches, mechanical switches, MEMS elements, or the like may be used. For example, transistors described later are preferably used as electrical switches. FIGS. 20A and 20B are circuit diagrams in the case where transistors are used.

A read circuit 2f-1 in FIG. 20A is the read circuit 2f in FIG. 19 in which the transistor 101, the transistor 102, the transistor 104, a transistor 108, a transistor 109, and a transistor 110 are used as the switch 8, the switch 9, the switch 11, the switch 15, the switch 16, and the switch 17, respectively.

A read circuit 2f-2 in FIG. 20B is the read circuit 2f-1 in FIG. 20A in which the gate of the transistor 101 and the gate of the transistor 102 are electrically connected to each other and the gate of the transistor 104 and a gate of the transistor 108 are electrically connected to each other. Thus, the read circuit 2f-2 can operate such that the transistor 101 and the transistor 102 operate in synchronization with each other and the transistor 104 and the transistor 108 operate in synchronization with each other.

Figure 21A:
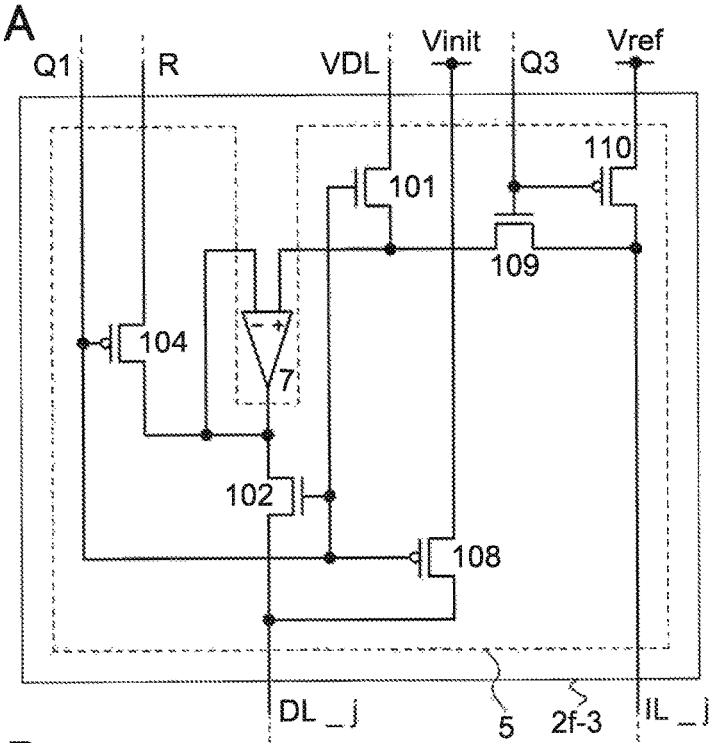
FIGS. 21A and 21B are circuit diagrams showing examples of a semiconductor device of one embodiment of the present invention.
Figure 21B:
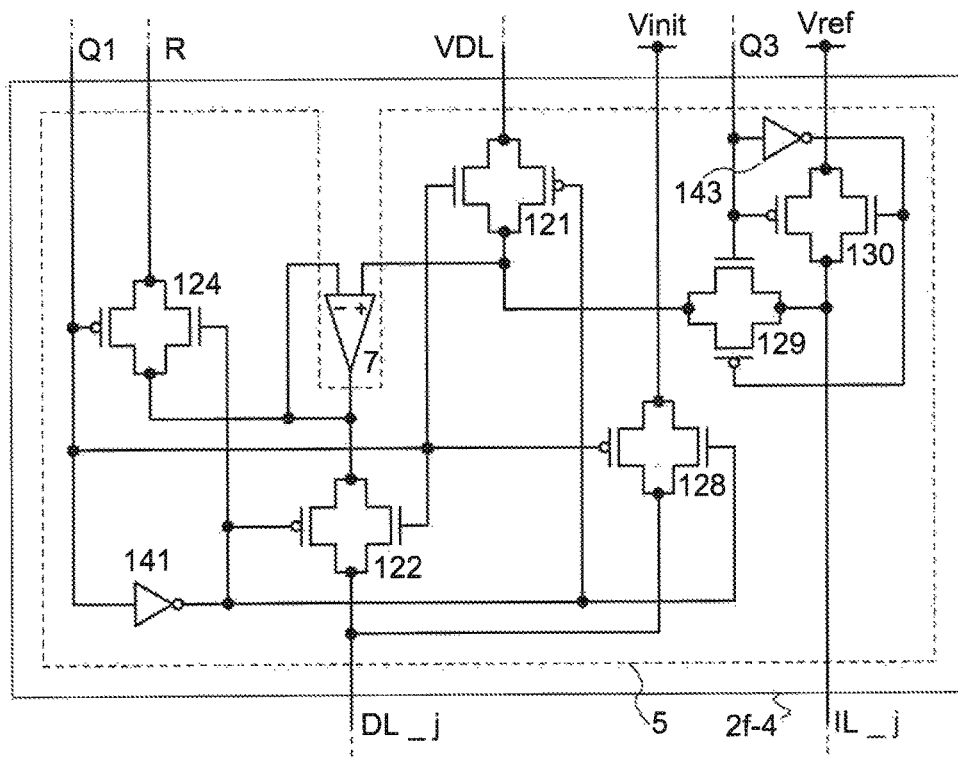

By selecting the polarities of the transistors, a CMOS structure may be employed. FIGS. 21A and 21B and the like illustrate an example of that case.

A read circuit 2f-3 in FIG. 21A is the read circuit 2f-1 in FIG. 20A in which the transistors 101, 102, and 109 are n-channel transistors and the transistors 104, 108, and 110 are p-channel transistors. The wiring Q1 is electrically connected to the gate of the transistor 101, the gate of the transistor 102, the gate of the transistor 104, and the gate of the transistor 108. A wiring Q3 is electrically connected to a gate of the transistor 109 and a gate of the transistor 110. Thus, the read circuit 2f-3 can operate by collectively controlling switching of the transistors 101, 102, 104, and 108 using a signal transmitted through the wiring Q1 and collectively controlling switching of the transistors 109 and 110 using a signal transmitted through the wiring Q3. For example, the read circuit 2f-3 can operate such that, in a pair of the transistors 101 and 102 and a pair of the transistors 104 and 108, one of the pairs is in an off state while the other pair is in an on state. Furthermore, the read circuit 2f-3 can operate such that one of the transistors 109 and 110 is in an off state while the other is in an on state, regardless of on/off states of the transistors 101, 102, 104, and 108.

A read circuit 2f-4 in FIG. 21B is the read circuit 2f in FIG. 19 in which the analog switch 121, the analog switch 122, the analog switch 124, an analog switch 128, an analog switch 129, and an analog switch 130 are used as the switch 8, the switch 9, the switch 11, the switch 15, the switch 16, and the switch 17, respectively. The analog switches 121, 122, 124, and 128 to 130 each have a configuration where a source and a drain of an n-channel transistor and a source and a drain of a p-channel transistor are connected in parallel. The wiring Q1 is electrically connected to the gate of the n-channel transistor of the analog switch 121, the gate of the n-channel transistor of the analog switch 122, the gate of the p-channel transistor of the analog switch 124, and a gate of the p-channel transistor of the analog switch 128. These gates are electrically connected to the gate of the p-channel transistor of the analog switch 121, the gate of the p-channel transistor of the analog switch 122, the gate of the n-channel transistor of the analog switch 124, and a gate of the n-channel transistor of the analog switch 128 through an inverter 141. A wiring Q3 is electrically connected to a gate of the n-channel transistor of the analog switch 129 and a gate of the p-channel transistor of the analog switch 130, and these gates are electrically connected to a gate of the p-channel transistor of the analog switch 129 and a gate of the n-channel transistor of the analog switch 130 through an inverter 143. With the above-described configuration, the read circuit 2f-4 can operate by collectively controlling switching of the analog switches 121, 122, 124, and 128 using a signal transmitted through the wiring Q1 and by collectively controlling switching of the analog switches 129 and 130 using a signal transmitted through the wiring Q3. For example, the read circuit 2f-4 can operate such that, in the pair of the analog switches 121 and 122 and a pair of the analog switches 124 and 128, one of the pairs is in an off state while the other pair is in an on state. Furthermore, the read circuit 2f-4 can operate such that one of the analog switches 129 and 130 is in an off state while the other is in an on state regardless of on/off states of the analog switches 121, 122, 124, and 128.

Note that the read circuits 2f-3 in FIG. 21A and the read circuit 2f-4 in FIG. 21B are not limited thereto; for example, the polarities of the transistors can be changed as appropriate, if necessary.

Next, a circuit configuration that can serve the functions of the read circuit 2f is described. The read circuit 2f has a plurality of functions. The circuit configuration of the read circuit 2f varies depending on which function is carried out. In other words, by controlling on/off states of the switches in the function selection portion 5, the read circuit 2f can perform a plurality of functions.

Figure 22A:
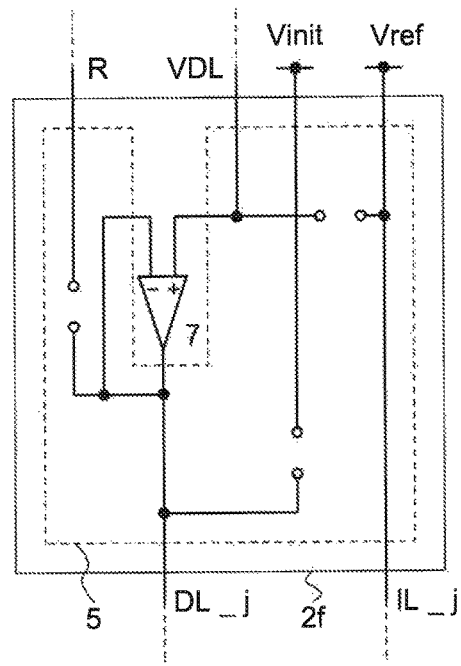
FIGS. 22A to 22C are circuit diagrams showing examples of a semiconductor device of one embodiment of the present invention.

For example, a circuit configuration in a certain operation state in FIG. 19 is illustrated in FIG. 22A. In the configuration, a potential of the wiring VDL can be supplied (or transmitted) to the wiring DL_j or the gate of the transistor 3 included in the pixel 1. A potential of the wiring Vref can be supplied (or transmitted) to the wiring IL_j or a terminal of the source or the drain of the transistor 3 included in the pixel 1. With such a configuration, the read circuit 2f can function as a buffer circuit or the like.

Figure 22B:
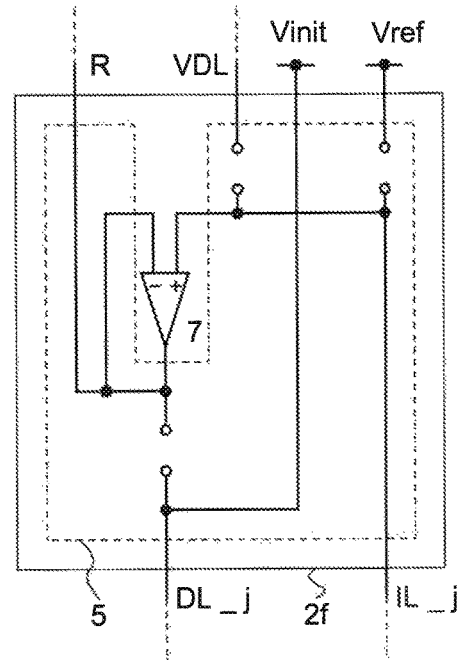

A circuit configuration in another certain operation state in FIG. 19 is illustrated in FIG. 22B. In the configuration, a potential of the wiring IL_j or a terminal of the source or the drain of the transistor 3 included in the pixel 1 can be supplied (or transmitted) to the wiring R. Furthermore, a potential of the wiring Vinit can be supplied (or transmitted) to the wiring DL_j or the gate of the transistor 3 included in the pixel 1. For example, in the case where a potential based on the threshold voltage of the transistor 3 is output from the pixel 1 to the wiring IL_j, the potential of the wiring IL_j, i.e., the potential based on the threshold voltage of the transistor 3, can be read out by the read circuit 2f With such a configuration, the read circuit 2f can function as a read out circuit or the like.

Figure 22C:
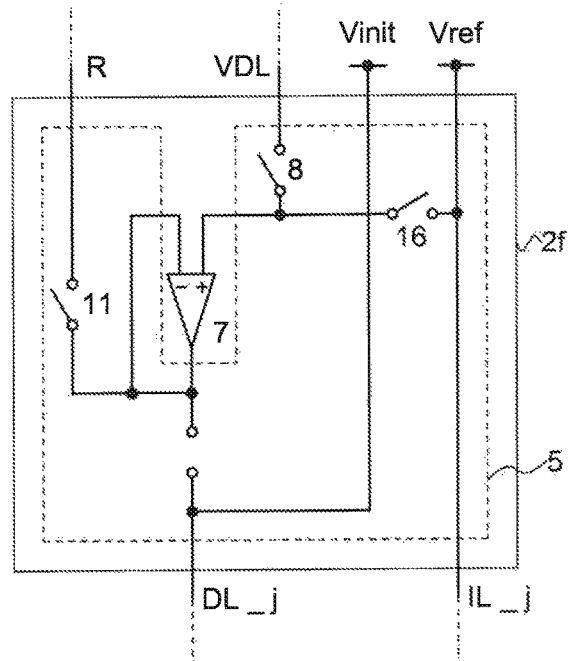

There is a case where a potential of the transistor 3 included in the pixel 1 is initialized to a predetermined potential before a potential based on the threshold voltage of the transistor is read out. In that case, a circuit configuration shown in FIG. 22C is employed. Note that the switches 8 and 11 may be in either an on state or an off state. Note that when the switch 8 is in an on state, the switch 16 is in an off state. Thus, a potential from the wiring Vinit can be supplied (or transmitted) to the wiring DL_j or the gate of the transistor 3 included in the pixel 1. Furthermore, control is performed so that the wiring Vinit has the potential for initialization, whereby the potential of the wiring Vinit can be supplied (transmitted) to the gate of the transistor 3 included in the pixel 1. By the initialization, an absolute value of a voltage between the gate and the source of the transistor 3 included in the pixel 1 can be larger than an absolute value of the threshold voltage of the transistor 3, for example. That is, by the initialization, the transistor 3 included in the pixel 1 can be turned on, for example.

Note that transistors such as switches (e.g., the switches 8 to 11 and the like) included in the read circuit 2f are not necessarily provided to have the connection relations illustrated in FIG. 19, FIG. 20A, FIG. 20B, FIG. 21A, FIG. 21B, or the like. The operation of the transistors is also not limited to the aforementioned method. Any connection relation or method may be used, as long as the circuit configuration in FIG. 22A, the circuit configuration in FIG. 22B, and the circuit configuration in FIG. 22C are obtained depending on an operation state or the function of a circuit. That is, a switch or a transistor is provided as appropriate so that the circuit configuration in FIG. 22A, the circuit configuration in FIG. 22B, or the circuit configuration in FIG. 22C can be selected by controlling on/off states of the switch or the transistor.

Figure 23A:
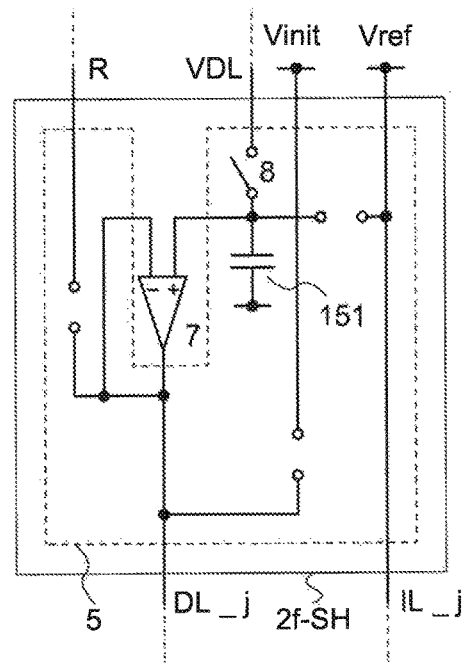
FIGS. 23A to 23C are circuit diagrams showing examples of a semiconductor device of one embodiment of the present invention.
Figure 23B:
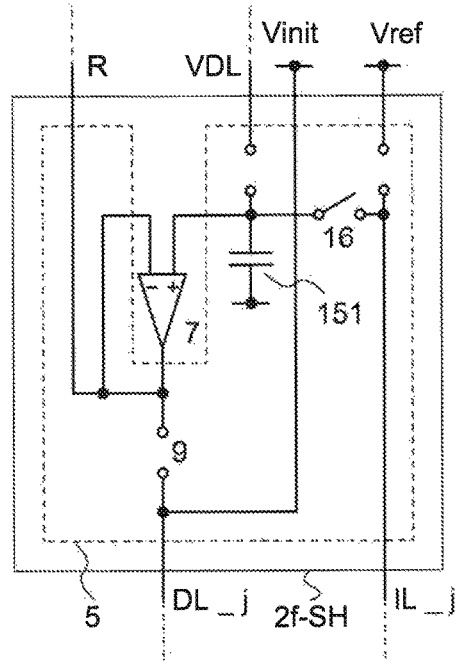
Figure 23C:
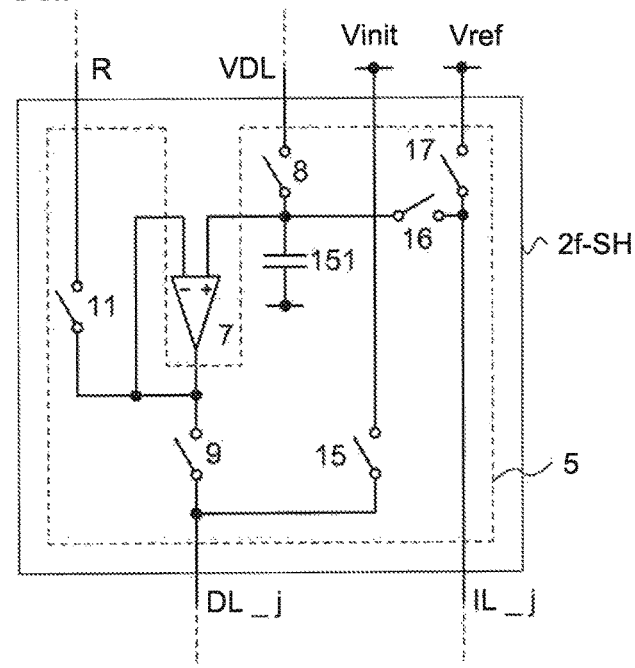

A circuit which samples and holds the potential of the wiring VDL or the potential of the wiring IL_j may be provided. A circuit configuration in the case where such a circuit is provided in FIG. 22A is shown in FIG. 23A as a read circuit 2f-SH. The switch 8 is turned on, and the potential of the wiring VDL is held in a capacitor 151. Then, the switch 8 is turned off. Consequently, the potential of the wiring VDL can be sampled and held. Thus, even when the potential of the wiring VDL is changed after the sample-and-hold operation, the operational amplifier 7 can operate without any problem. Similarly, a configuration in the case where such a circuit is provided in FIG. 22B is shown in FIG. 23B as the read circuit 2f-SH. The switch 16 is turned on, and the potential of the wiring IL_j is held in the capacitor 151. Then, the switch 16 is turned off. Consequently, the potential of the wiring IL_j can be sampled and held. Thus, even when the potential of the wiring IL_j is changed after the sample-and-hold operation, the operational amplifier 7 can operate without any problem. In the case of FIG. 19, the capacitor 151 is added as shown in the read circuit 2f-SH in FIG. 23C. Note that in the case where parasitic capacitance in the non-inverting input terminal of the operational amplifier 7 is large, the capacitor 151 is not necessarily provided. In the case where the capacitor 151 is provided, one of terminals of the capacitor 151 is connected to the non-inverting input terminal of the operational amplifier 7 and the other of the terminals of the capacitor 151 is connected to a dedicated wiring. Note that the other of the terminals of the capacitor 151 may be connected to another wiring.

Configuration Example 7

Next, an example of a read circuit of a case different from that of FIG. 19 will be described with reference to FIG. 24. A read circuit 2g in FIG. 24 includes the operational amplifier 7 and the function selection portion 5. The function selection portion 5 includes the switch 9, the switch 11, the switch 12, the switch 17, a switch 18, and the capacitor 14. The non-inverting input terminal of the operational amplifier 7 is electrically connected to the wiring VDL. The inverting input terminal of the operational amplifier 7 is electrically connected to the wiring IL_j through the switch 18. The inverting input terminal of the operational amplifier 7 is electrically connected to the output terminal of the operational amplifier 7 through the switch 12. The inverting input terminal of the operational amplifier 7 is electrically connected to the output terminal of the operational amplifier 7 through the capacitor 14. The output terminal of the operational amplifier 7 is electrically connected to the wiring DL_j through the switch 9. The output terminal of the operational amplifier 7 is electrically connected to the wiring R through the switch 11. The wiring IL_j is connected to the wiring Vref through the switch 17.

The wiring DL_j and the wiring IL_j are electrically connected to the pixel 1 as shown in FIG. 1B, and the transistor 3 included in the pixel 1 is electrically connected to the wiring DL_j and the wiring IL_j. The wiring DL_j and the wiring IL_j are connected not to the same terminal of the transistor 3 but to different terminals thereof. In the case of the read circuit 2g in FIG. 24, the wiring DL_j is connected to the gate of the transistor 3, and the wiring IL_j is connected to the source or the drain of the transistor 3. The connection between the wiring DL_j, the wiring IL_j, and the transistor 3 is not limited to the above and may be changed as appropriate depending on a purpose, an operation, or the like.

The read circuit 2g can operate in the following manner, for example. For example, the switches 9, 12, and 17 can be in an on state and the switches 11 and 18 can be in an off state, a potential of the wiring VDL is supplied (transmitted) to the non-inverting input terminal of the operational amplifier 7. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2g operates as a voltage follower circuit, and therefore, the output terminal of the operational amplifier 7 outputs a potential of the wiring VDL. Thus, the potential of the wiring VDL is supplied to the wiring DL_j or the gate of the transistor 3 included in the pixel 1, and a potential of the wiring Vref is supplied to the wiring IL_j or a terminal of the source or the drain of the transistor 3 included in the pixel 1. For example, a potential of a video signal, an initialization signal, a precharge signal, or the like is supplied to the wiring VDL; hence, the potential of the video signal, the initialization signal, the precharge signal, or the like is supplied to the pixel 1. Since the operational amplifier 7 has high input impedance and low output impedance, the read circuit 2g can function as an impedance converter circuit. Alternatively, since the operational amplifier 7 has high current drive capability, the read circuit 2g can function as a buffer circuit or an amplifier circuit. The read circuit 2g functioning as described above can charge the wiring DL_j at high speed. That is, a signal can be written into the terminal of the pixel 1 connected to the wiring DL_j at high speed by the read circuit 2g. Note that the wiring Vinit is supplied with a predetermined potential such as an initialization signal or a precharge potential.

In another operation state, for example, the switches 9, 12, and 17 can be in an off state, and the switches 11 and 18 can be in an on state. In that case, the read circuit 2g has a configuration of a feedback circuit. Due to the connections between the operational amplifier 7 and the capacitor 14, the read circuit 2g operates as an integrator circuit. Thus, the circuit operates so that the potential of the inverting input terminal of the operational amplifier 7 is equal to the potential of the non-inverting input terminal of the operational amplifier 7. Thus, the potential of the wiring IL_j is approximately equal to the potential of the wiring VDL. A current flowing through the wiring IL_j is accumulated in the capacitor 14 as charges based on the measurement time, and a potential difference is generated between electrodes of the capacitor 14 in accordance with the accumulated charges. In other words, a voltage of the output terminal of the operational amplifier 7 which is supplied to the wiring R can be obtained by integrating the current flowing through the wiring IL_j with respect to the measurement time. Consequently, the total amount of the current flowing through the wiring IL_j can be read out. In that case, data on the current characteristics of the transistor 3, e.g., a current flowing through the transistor 3, is supplied from the pixel 1. Therefore, data on the pixel 1 can be read from the pixel 1 to the wiring R. Then, the level of the video signal to be supplied to the pixel 1 is corrected on the basis of the data read from the pixel 1. As a result, variation in transistor 3 in the pixel 1 or adverse effects due to deterioration can be reduced. That is, the use of the pixel 1 can achieve display of an image with less image retention or unevenness.

Note that in the case where the read circuit 2g operates as an integrator circuit, the potential of the wiring IL_j can be controlled by controlling the potential of the wiring VDL. Thus, the pixel 1 connected to the wiring IL_j or the potential of a terminal of the source or the drain of the transistor 3 connected to the IL_j can also be controlled by controlling the potential of the wiring VDL, in a period in which the read circuit 2g operates as an integrator circuit. Therefore, an operation state for the case where a current flows through the pixel 1 or the transistor 3 can be brought into an appropriate state by controlling the potential of the wiring VDL. For example, the potential of the light-emitting element 4 is controlled so that a current does not flow through the light-emitting element 4, by controlling the potential of the wiring VDL in a period in which the read circuit 2g operates as an integrator circuit.

Note that in the case where the read circuit 2g operates as an integrator circuit, the switch 12 may be turned on to reset or initialize charges stored in the capacitor 14. For example, the switch 12 may be turned on immediately before the amount of current is measured in the case where the read circuit 2g operates as an integrator circuit.

Figure 25A:
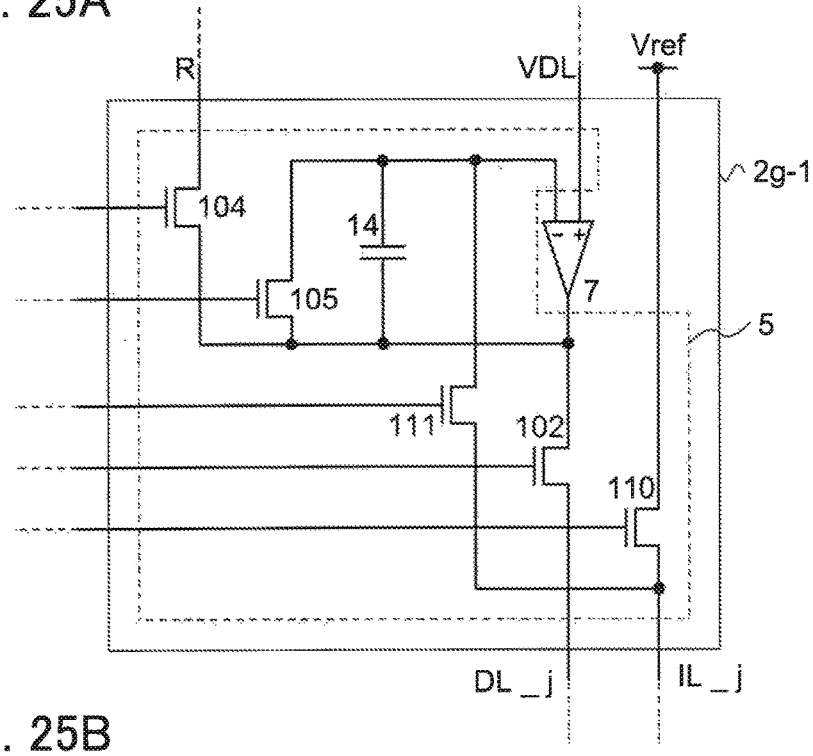
FIGS. 25A and 25B are circuit diagrams showing examples of a semiconductor device of one embodiment of the present invention.
Figure 25B:
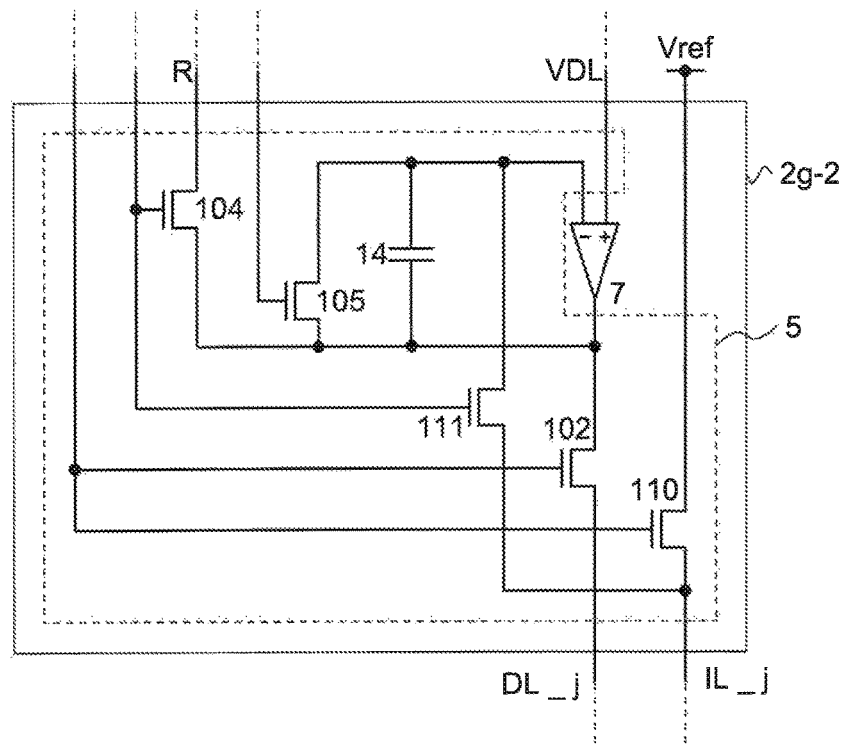

As switches such as the switches 9, 11, 12, 17, and 18, electrical switches, mechanical switches, MEMS elements, or the like may be used. For example, transistors described later are preferably used as electrical switches. FIGS. 25A and 25B are circuit diagrams in the case where transistors are used.

Figure 24:
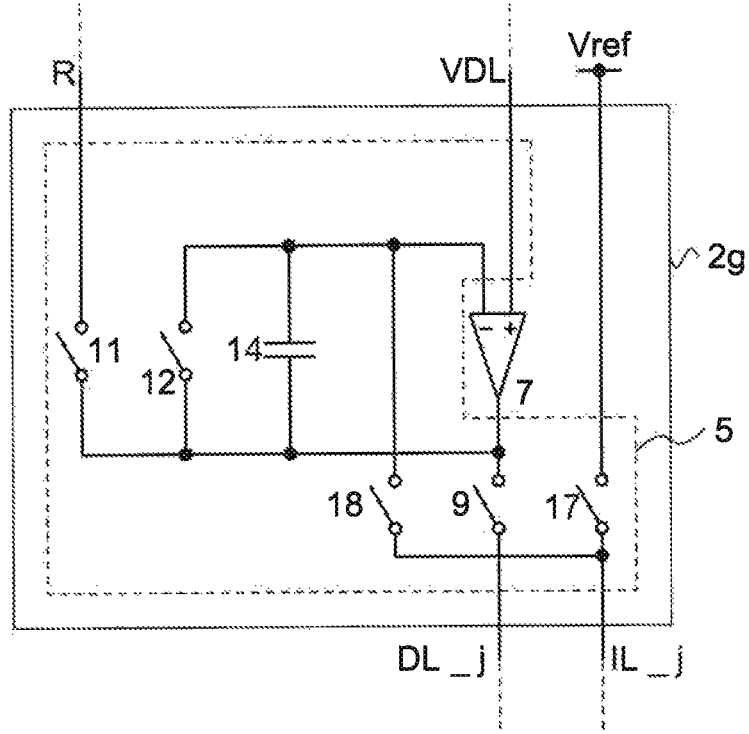
FIG. 24 is a circuit diagram showing an example of a semiconductor device of one embodiment of the present invention.

A read circuit 2g-1 in FIG. 25A is the read circuit 2g in FIG. 24 in which the transistor 102, the transistor 104, the transistor 105, the transistor 110, and a transistor 111 are used as the switch 9, the switch 11, the switch 12, the switch 17, and the switch 18, respectively.

A read circuit 2g-2 in FIG. 25B is the read circuit 2g-1 in FIG. 25A in which the gate of the transistor 102 and the gate of the transistor 110 are electrically connected to each other and the gate of the transistor 104 and a gate of the transistor 111 are electrically connected to each other. Thus, the read circuit 2g-2 can operate such that the transistors 102 and 110 operate in synchronization with each other and the transistors 104 and 111 operate in synchronization with each other.

Figure 26A:
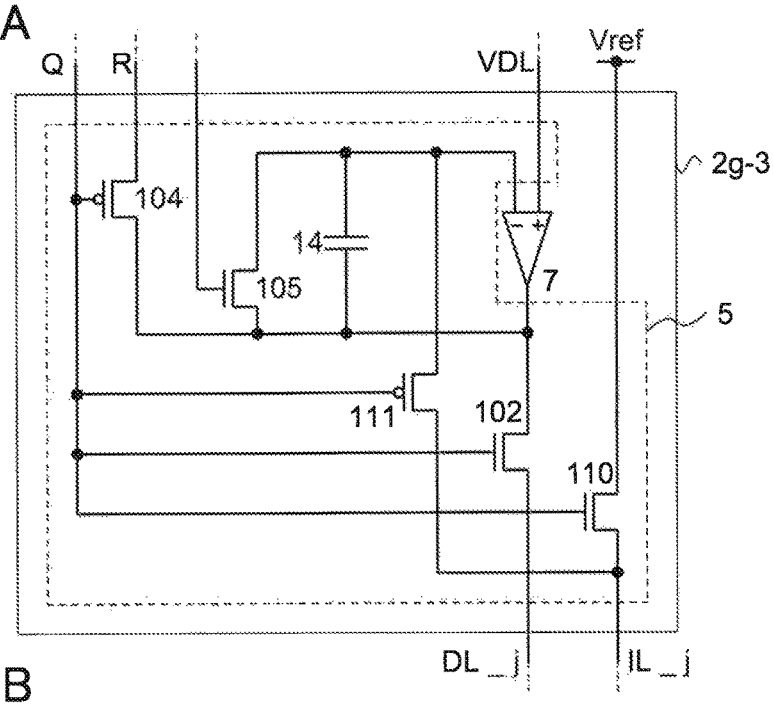
FIGS. 26A and 26B are circuit diagrams showing examples of a semiconductor device of one embodiment of the present invention.
Figure 26B:
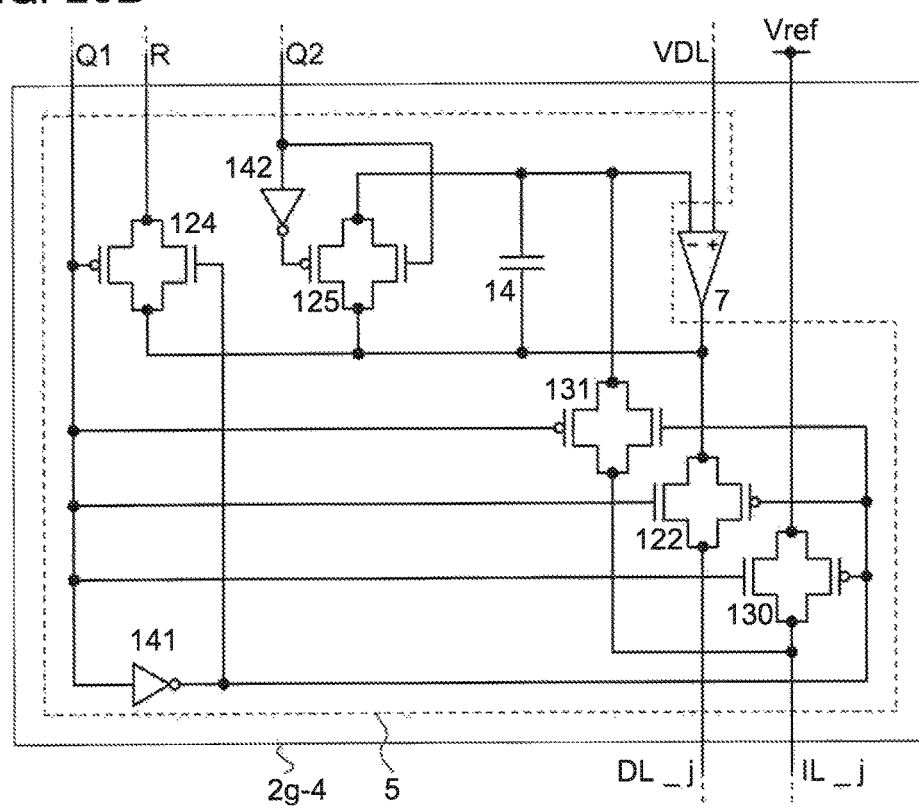

By selecting the polarities of the transistors, a CMOS structure may be formed. FIGS. 26A and 26B and the like illustrate examples of that case.

A read circuit 2g-3 in FIG. 26A is the read circuit 2g-1 in FIG. 25A in which the transistors 102, 105, and 110 are n-channel transistors and the transistors 104 and 111 are p-channel transistors. The wiring Q is electrically connected to the gate of the transistor 102, the gate of the transistor 104, the gate of the transistor 110, and the gate of the transistor 111. Thus, the read circuit 2g-3 can operate by collectively controlling switching of the transistors 102, 104, 110, and 111 using a signal transmitted through the wiring Q. For example, the read circuit 2g-3 can operate such that, in a pair of the transistors 102 and 110 and the pair of the transistors 104 and 111, one of the pairs is in an off state while the other is in an on state. The transistors 102, 105, and 110 may be p-channel transistors and the transistors 104 and 111 may be n-channel transistors.

A read circuit 2g-4 in FIG. 26B is the read circuit 2g in FIG. 24 in which the analog switch 122, the analog switch 124, the analog switch 125, the analog switch 130, and an analog switch 131 are used as the switch 9, the switch 11, the switch 12, the switch 17, and the switch 18, respectively. The analog switches 122, 124, 125, 130, and 131 each have a configuration where a source and a drain of an n-channel transistor and a source and a drain of a p-channel transistor are connected in parallel. The wiring Q1 is electrically connected to the gate of the n-channel transistor of the analog switch 122, the gate of the n-channel transistor of the analog switch 130, the gate of the p-channel transistor of the analog switch 124, and a gate of the p-channel transistor of the analog switch 131. These gates are electrically connected to the gate of the p-channel transistor of the analog switch 122, the gate of the p-channel transistor of the analog switch 130, the gate of the n-channel transistor of the analog switch 124, and the gate of the n-channel transistor of the analog switch 131 through the inverter 141. The wiring Q2 is electrically connected to the gate of the n-channel transistor of the analog switch 125, and the gate of the p-channel transistor of the analog switch 125 is electrically connected to the gate of the n-channel transistor of the analog switch 125 through the inverter 142. With the above-described configuration, the read circuit 2g-4 can operate by collectively controlling switching of the analog switches 122, 124, 130, and 131 using a signal transmitted through the wiring Q1. For example, the read circuit 2g-4 can operate such that, in a pair of the analog switches 122 and 130 and the pair of the analog switches 124 and 131, one of the pairs is in an off state while the other is in an on state. Furthermore, the on/off states of the analog switch 125 can be controlled using a signal transmitted through the wiring Q2, regardless of on/off states of the analog switches 122, 124, 130, and 131.

Note that the read circuits 2g-3 in FIG. 26A and the read circuit 2g-4 in FIG. 26B are not limited thereto; for example, the polarities of the transistors can be changed as appropriate, if necessary.

Next, a circuit configuration that can serve the functions of the read circuit 2g is described. The read circuit 2g has a plurality of functions. The circuit configuration of the read circuit 2g varies depending on which function is carried out. In other words, by controlling on/off states of the switches in the function selection portion 5, the read circuit 2g can perform a plurality of functions.

Figure 27A:
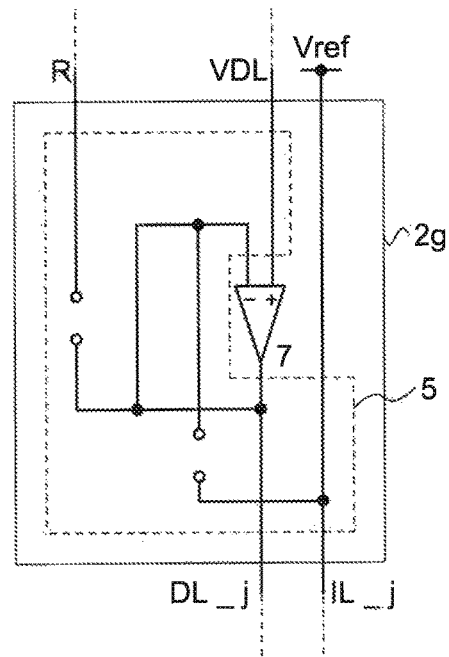
FIGS. 27A to 27C are circuit diagrams showing examples of a semiconductor device of one embodiment of the present invention.
Figure 27B:
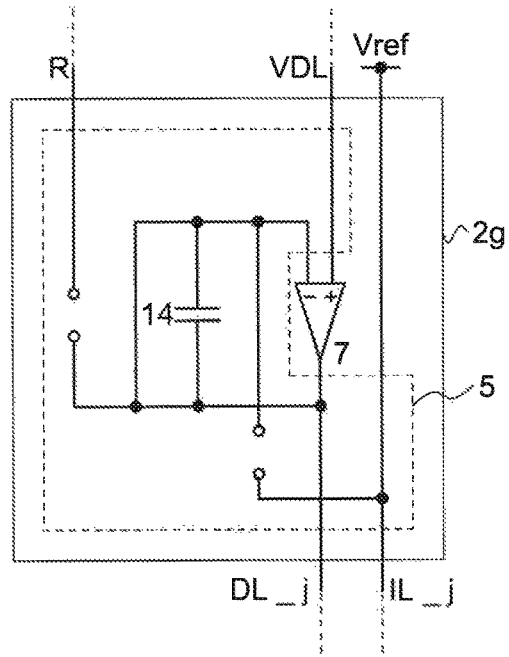

For example, circuit configurations in certain operation states in FIG. 24 are illustrated in FIGS. 27A and 27B. In the configurations, a potential of the wiring VDL can be supplied (or transmitted) to the wiring DL_j or the gate of the transistor 3 included in the pixel 1. With such a configuration, the read circuit 2g can function as a buffer circuit or the like. Furthermore, the potential of the wiring Vref can be supplied (or transmitted) to the wiring IL_j or a terminal of the source or the drain of the transistor 3 included in the pixel 1.

Figure 27C:
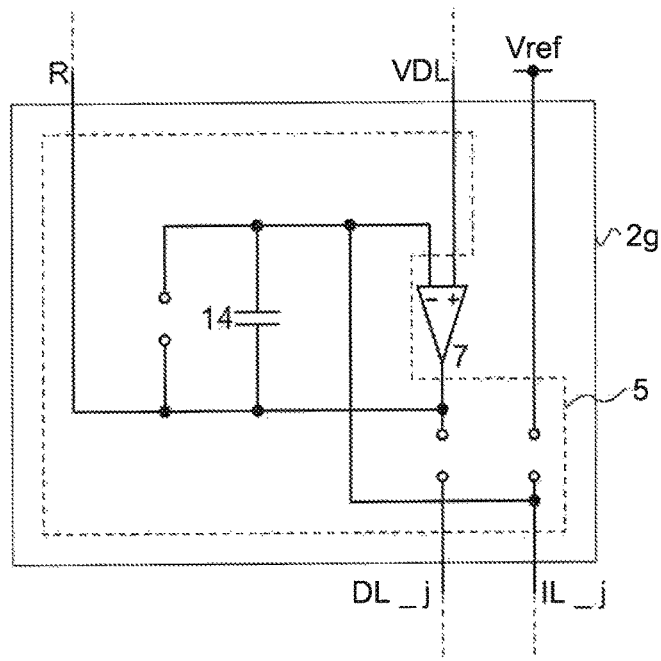

A circuit configuration in another certain operation state in FIG. 24 is illustrated in FIG. 27C. In the configuration, a current from the wiring IL_j or the transistor 3 included in the pixel 1 can be integrated, and a potential based on it can be supplied (or transmitted) to the wiring R. For example, in the case where a current flows from the transistor 3 included in the pixel 1 to the wiring IL_j, a current flowing through the wiring IL_j, i.e., a current flowing through the transistor 3 can be integrated and read out by the read circuit 2g. With this configuration, the read circuit 2g can function as a read out circuit or the like.

Note that transistors such as switches (e.g., the switches 9, 11, 12, 17, 18 and the like) included in the read circuit 2g are not necessarily provided to have the connection relations illustrated in FIG. 24, FIG. 25A, FIG. 25B, FIG. 26A, FIG. 26B, or the like. The operation of the transistors is also not limited to the aforementioned method. Any connection relation or method may be used, as long as the circuit configurations in FIGS. 27A and 27B and the circuit configuration in FIG. 27C are obtained depending on an operation state or the function of a circuit. That is, a switch or a transistor is provided as appropriate so that the circuit configurations in FIGS. 27A and 27B or the circuit configuration in FIG. 27C can be selected by controlling on/off states of the switch or the transistor.

Figure 28A:
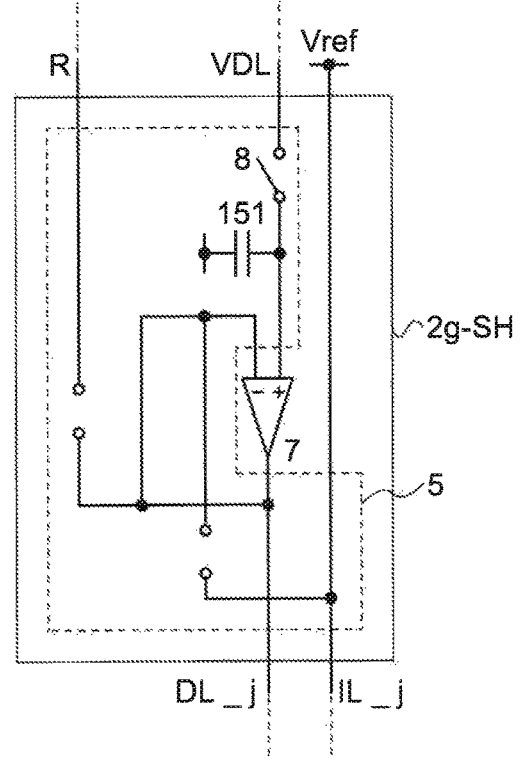
FIGS. 28A and 28B are circuit diagrams showing examples of a semiconductor device of one embodiment of the present invention.
Figure 28B:
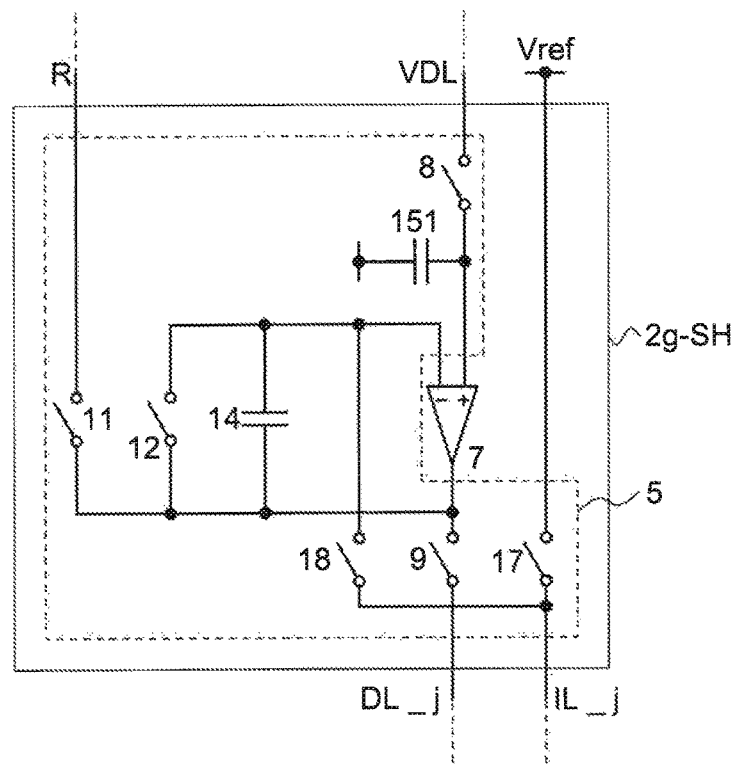

A circuit which samples and holds the potential of the wiring VDL may be provided. A circuit configuration in the case where such a circuit is provided in FIG. 27A is shown in FIG. 28A as a read circuit 2g-SH. The switch 8 is turned on, and the potential of the wiring VDL is held in a capacitor 151. Then, the switch 8 is turned off. Consequently, the potential of the wiring VDL can be sampled and held. Thus, even when the potential of the wiring VDL is changed after the sample-and-hold operation, the operational amplifier 7 can operate without any problem. In the case of FIG. 24, the capacitor 151 and the switch 8 are added as shown in the read circuit 2g-SH in FIG. 28B. Note that in the case where parasitic capacitance in the non-inverting input terminal of the operational amplifier 7 is large, the capacitor 151 is not necessarily provided. In the case where the capacitor 151 is provided, one of terminals of the capacitor 151 is connected to the non-inverting input terminal of the operational amplifier 7 and the other of the terminals of the capacitor 151 is connected to a dedicated wiring. Note that the other of the terminals of the capacitor 151 may be connected to another wiring.

Figure 29:
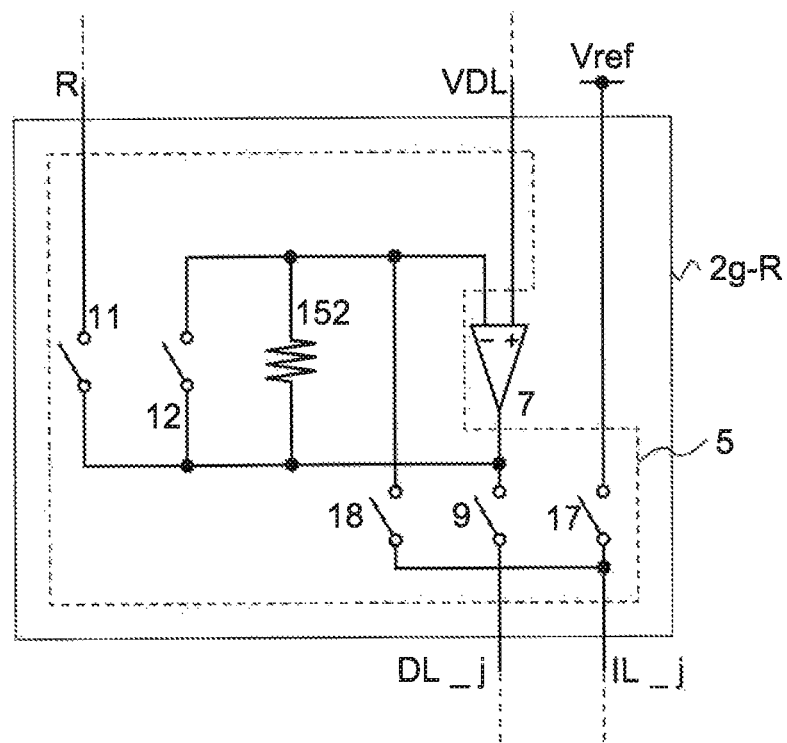
FIG. 29 is a circuit diagram showing an example of a semiconductor device of one embodiment of the present invention.
Figure 30A:
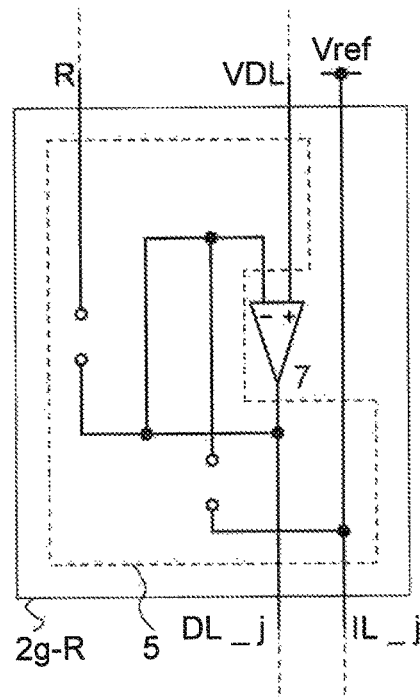
FIGS. 30A to 30C are circuit diagrams showing examples of a semiconductor device of one embodiment of the present invention.
Figure 30B:
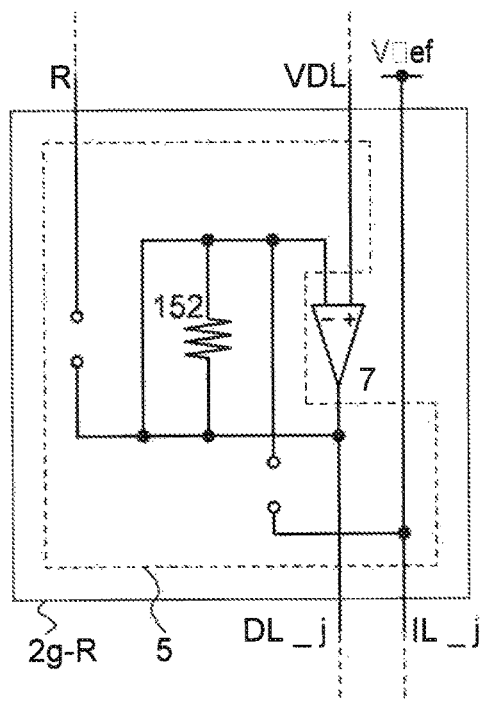
Figure 30C:
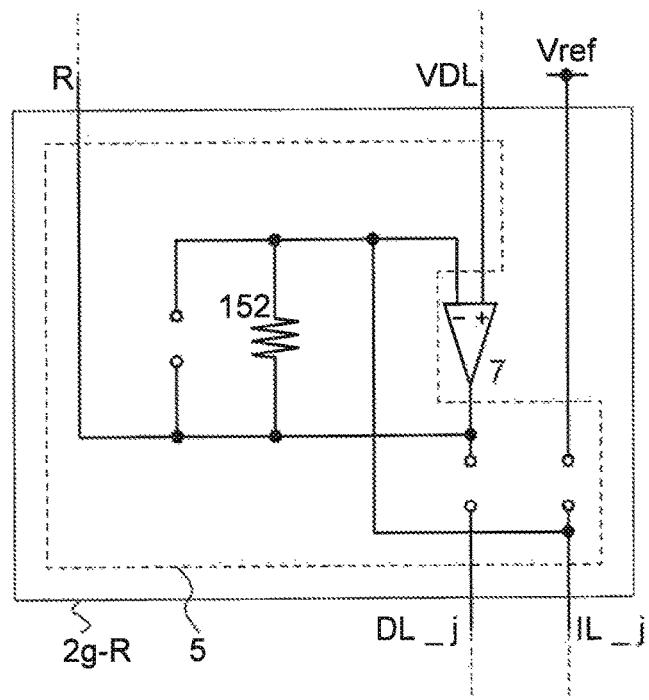

The example of the read circuit including the capacitor 14 to operate as an integrator circuit is described, but one embodiment of the present invention is not limited thereto. A passive element other than the capacitor, e.g., a resistor may be provided. An example of the case where a resistor 152 is provided instead of the capacitor 14 in FIG. 24 is shown as a read circuit 2g-R in FIG. 29. Similarly, an example of the case in FIG. 27A is shown as the read circuit 2g-R in FIG. 30A, an example of the case in FIG. 27B is shown as the read circuit 2g-R in FIG. 30B, and an example of the case in FIG. 27C is shown as the read circuit 2g-R in FIG. 30C. By the replacement of the capacitor 14 with the resistor 152 as described above, a current-voltage conversion circuit can be formed.

Note that, not only in FIG. 29 and FIGS. 30A to 30C but also in other drawings, the capacitor 14 can be replaced with the resistor 152, so that a current-voltage conversion circuit can be formed.

Figure 31:
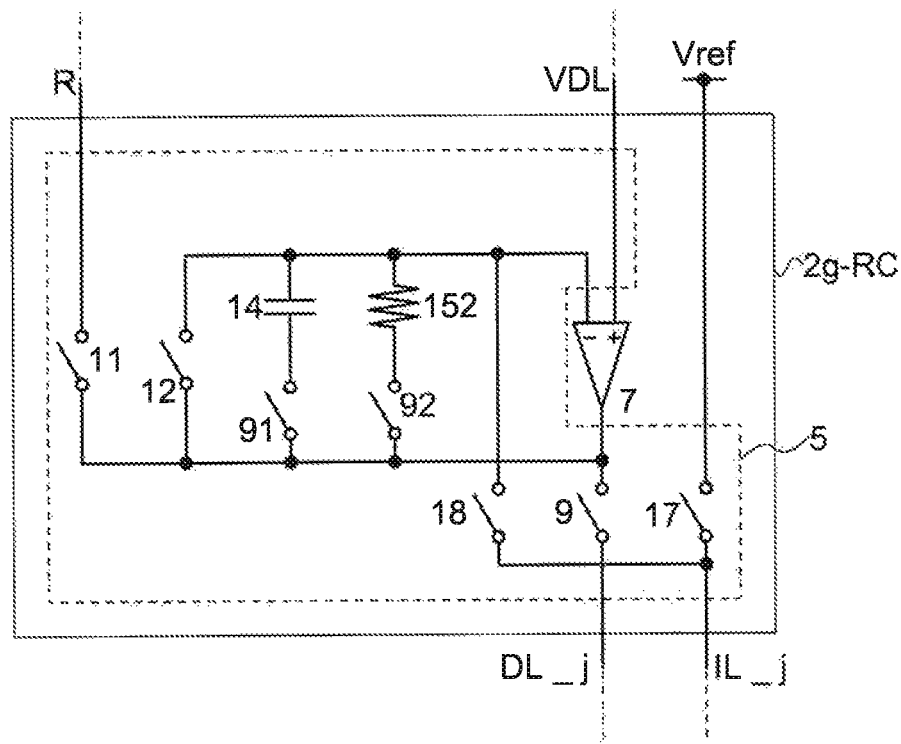
FIG. 31 is a circuit diagram showing an example of a semiconductor device of one embodiment of the present invention.

Note that instead of replacing the capacitor 14 with the resistor 152, both the capacitor 14 and the resistor 152 may be provided; in that case, they operate by switching. FIG. 31 shows a read circuit including both the capacitor 14 and the resistor 152. The switch 91 is electrically connected between the capacitor 14 and the output terminal of the operational amplifier 7. The switch 92 is electrically connected between the resistor 152 and the output terminal of the operational amplifier. The switch 91 and the capacitor 14 are connected in series, and the switch 92 and the resistor 152 are connected in series. By controlling on/off states of the switches 91 and 92, a read circuit 2g-RC in FIG. 31 can operate with the same function as the read circuit 2g in FIG. 24 or the read circuit 2g-R in FIG. 29. For example, in the case where the switch 91 is in an on state and the switch 92 is in an off state, the read circuit 2g-RC in FIG. 31 has a configuration similar to the read circuit 2g in FIG. 24. In the case where the switch 91 is in an off state and the switch 92 is in an on state, the read circuit 2g-RC in FIG. 31 has a configuration similar to the read circuit 2g-R in FIG. 29.

As described above, the capacitor 14 can be replaced with the resistor 152, or the capacitor 14 can be replaced with the resistor 152 and the switch. Alternatively, the resistor 152 may be provided and connected in parallel to the capacitor 14, or the resistor 152, the switch, and the like may be provided and connected in parallel to the capacitor 14, for example.

Configuration Example 8

Next, an example of a read circuit of a case different from those of FIG. 19 and FIG. 24 will be described with reference to FIG. 32. A read circuit 2h in FIG. 32 includes the operational amplifier 7 and the function selection portion 5. The function selection portion 5 includes the switch 8, the switch 9, the switch 11, the switch 12, the switch 17, the switch 18, a switch 19, and the capacitor 14. The non-inverting input terminal of the operational amplifier 7 is electrically connected to the wiring VDL through the switch 8. The non-inverting input terminal of the operational amplifier 7 is electrically connected to the wiring Vref through the switch 19. The inverting input terminal of the operational amplifier 7 is electrically connected to the wiring IL_j through the switch 18. The inverting input terminal of the operational amplifier 7 is electrically connected to the output terminal of the operational amplifier 7 through the switch 12. The inverting input terminal of the operational amplifier 7 is electrically connected to the output terminal of the operational amplifier 7 through the capacitor 14. The output terminal of the operational amplifier 7 is electrically connected to the wiring DL_j through the switch 9. The output terminal of the operational amplifier 7 is electrically connected to the wiring R through the switch 11. The wiring IL_j is connected to the wiring Vref through the switch 17.

The wiring DL_j and the wiring IL_j are electrically connected to the pixel 1 as shown in FIG. 1B, and the transistor 3 included in the pixel 1 is electrically connected to the wiring DL_j and the wiring IL_j. The wiring DL_j and the wiring IL_j are connected not to the same terminal of the transistor 3 but to different terminals thereof. In the case of the read circuit 2h in FIG. 32, the wiring DL_j is connected to the gate of the transistor 3, and the wiring IL_j is connected to the source or the drain of the transistor 3. The connection between the wiring DL_j, the wiring IL_j, and the transistor 3 is not limited to the above and may be changed as appropriate depending on a purpose, an operation, or the like.

The read circuit 2h can operate in the following manner, for example. For example, the switches 8, 9, 12, and 17 can be in an on state and the switches 11, 18, and 19 can be in an off state. In such a case, a potential of the wiring VDL is supplied (transmitted) to the non-inverting input terminal of the operational amplifier 7. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2h operates as a voltage follower circuit, and therefore, the output terminal of the operational amplifier 7 outputs a potential of the wiring VDL. Thus, the potential of the wiring VDL is supplied to the wiring DL_j or the gate of the transistor 3 included in the pixel 1, and a potential of the wiring Vref is supplied to the wiring IL_j or a terminal of the source or the drain of the transistor 3 included in the pixel 1. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2h can function as an impedance converter circuit. Alternatively, since the operational amplifier 7 has high current drive capability, the read circuit 2h can function as a buffer circuit or an amplifier circuit. The read circuit 2h functioning as described above can charge the wiring DL_j at high speed. That is, a signal can be written into the terminal of the pixel 1 connected to the wiring DL_j at high speed by the read circuit 2h.

In another operation state, for example, the switches 8, 9, 12, and 17 can be in an off state, and the switches 11, 18, and 19 can be in an on state. In that case, the read circuit 2h has a configuration of a feedback circuit. Due to the connections between the operational amplifier 7 and the capacitor 14, the read circuit 2h operates as an integrator circuit. Thus, the circuit operates so that the potential of the inverting input terminal of the operational amplifier 7 is equal to the potential of the non-inverting input terminal of the operational amplifier 7. Thus, the potential of the wiring IL_j is approximately equal to the potential of the wiring Vref. A current flowing through the wiring IL_j is accumulated in the capacitor 14 as charges based on the measurement time, and a potential difference is generated between electrodes of the capacitor 14 in accordance with the accumulated charges. In other words, a voltage of the output terminal of the operational amplifier 7 which is supplied to the wiring R can be obtained by integrating the current flowing through the wiring IL_j with respect to the measurement time. Consequently, the total amount of the current flowing through the wiring IL_j can be read out. In that case, data on the current characteristics of the transistor 3, e.g., a current flowing through the transistor 3, is supplied from the pixel 1. Therefore, data on the pixel 1 can be read from the pixel 1 to the wiring R. Then, the level of the video signal to be supplied to the pixel 1 is corrected on the basis of the data read from the pixel 1. As a result, variation in transistor 3 in the pixel 1 or adverse effects due to deterioration can be reduced. That is, the use of the pixel 1 can achieve display of an image with less image retention or unevenness.

Note that in the case where the read circuit 2h operates as an integrator circuit, the switch 12 may be turned on to reset or initialize charges stored in the capacitor 14. For example, the switch 12 may be turned on immediately before the amount of current is measured in the case where the read circuit 2h operates as an integrator circuit.

Figure 33A:
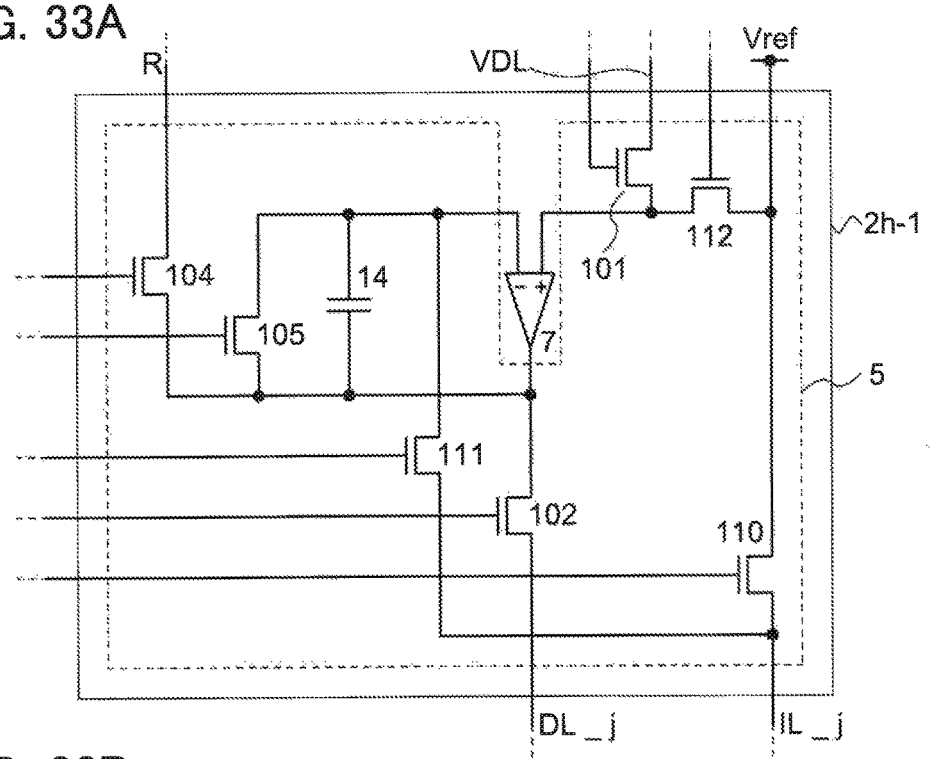
FIGS. 33A and 33B are circuit diagrams showing examples of a semiconductor device of one embodiment of the present invention.
Figure 33B:
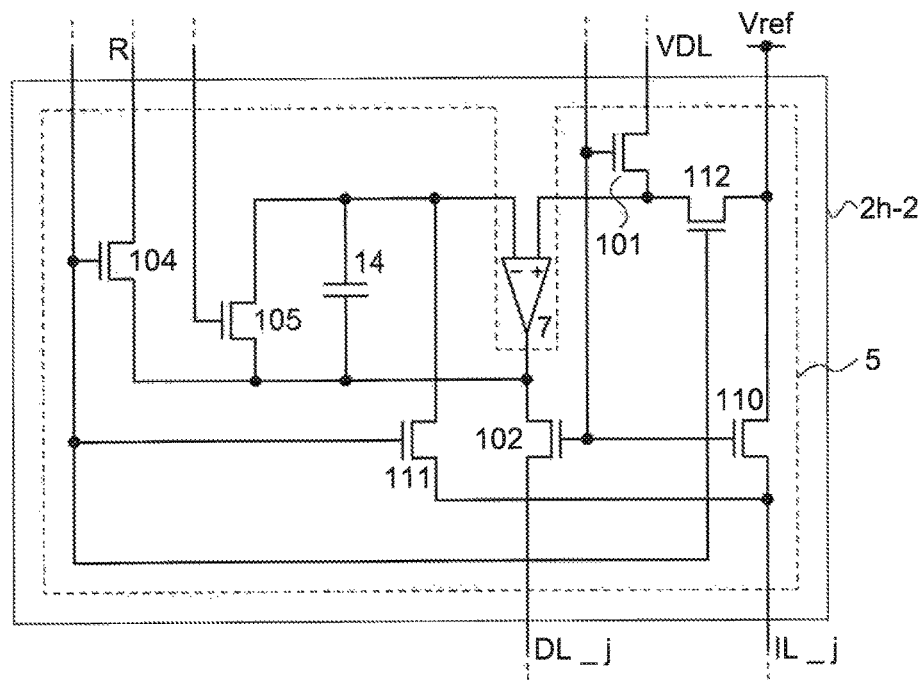

As switches such as the switches 8, 9, 11, 12, 17, 18, and 19, electrical switches, mechanical switches, MEMS elements, or the like may be used. For example, transistors described later are preferably used as electrical switches. FIGS. 33A and 33B are circuit diagrams in the case where transistors are used.

Figure 32:
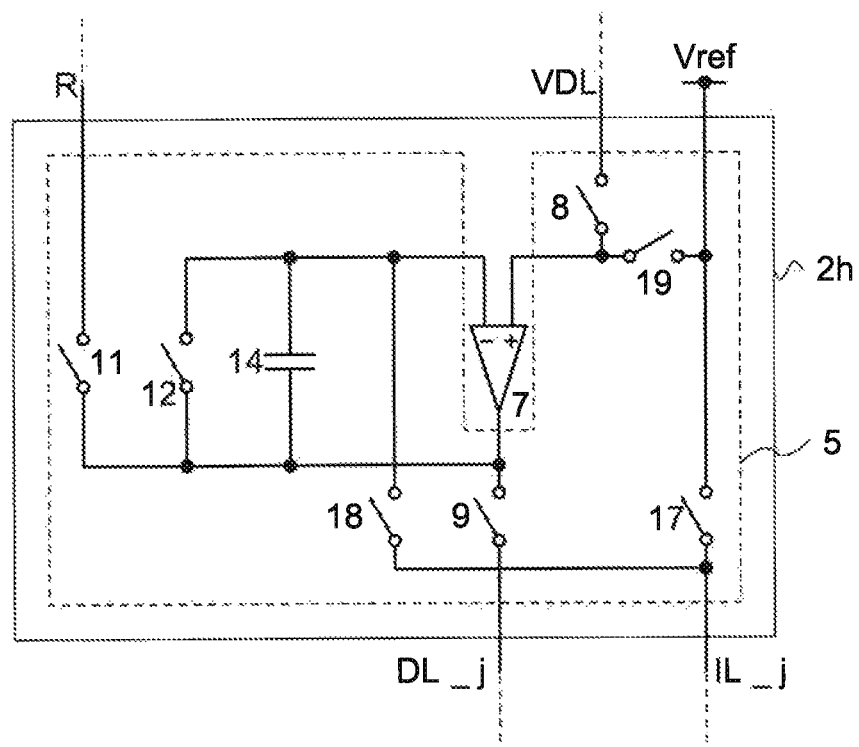
FIG. 32 is a circuit diagram showing an example of a semiconductor device of one embodiment of the present invention.

A read circuit 2h-1 in FIG. 33A is the read circuit 2h in FIG. 32 in which the transistor 101, the transistor 102, the transistor 104, the transistor 105, the transistor 110, the transistor 111, and a transistor 112 are used as the switch 8, the switch 9, the switch 11, the switch 12, the switch 17, the switch 18, and the switch 19, respectively.

A read circuit 2h-2 in FIG. 33B is the read circuit 2h-1 in FIG. 33A in which the gate of the transistor 101, the gate of the transistor 102, and the gate of the transistor 110 are electrically connected to each other and the gate of the transistor 104, the gate of the transistor 111, and a gate of the transistor 112 are electrically connected to each other. Thus, the read circuit 2h-2 can operate such that the transistors 101, 102, and 110 operate in synchronization with each other and the transistors 104, 111, and 112 operate in synchronization with each other.

Figure 34A:
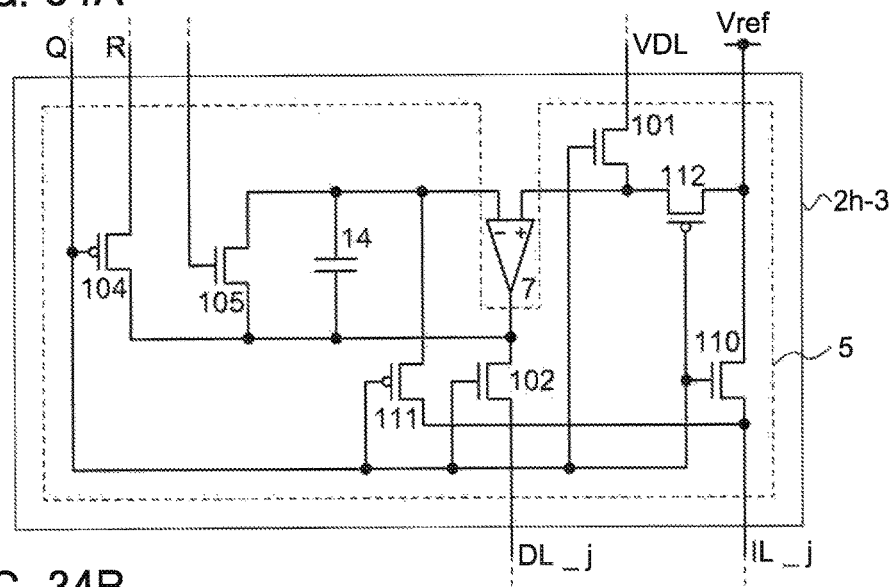
FIGS. 34A and 34B are circuit diagrams showing examples of a semiconductor device of one embodiment of the present invention.
Figure 34B:
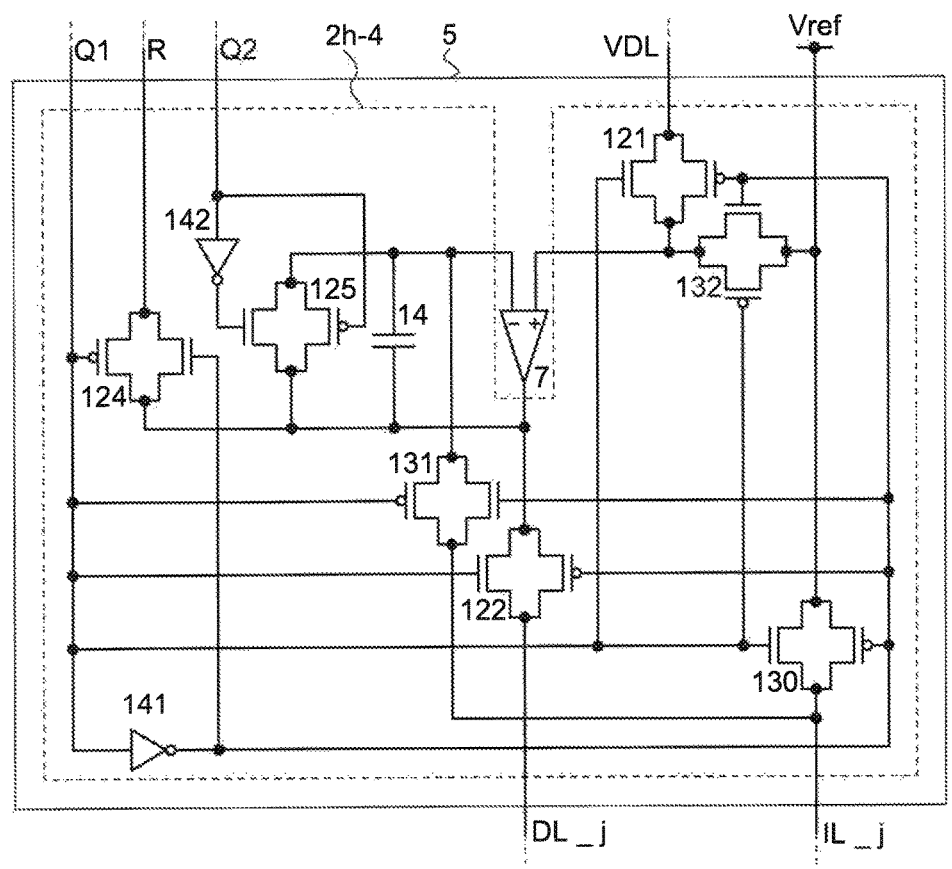

By selecting the polarities of the transistors, a CMOS structure may be formed. FIGS. 34A and 34B and the like illustrate examples of that case.

A read circuit 2h-3 in FIG. 34A is the read circuit 2h-1 in FIG. 33A in which the transistors 101, 102, 105, and 110 are n-channel transistors and the transistors 104, 111, and 112 are p-channel transistors. The wiring Q is electrically connected to the gate of the transistor 101, the gate of the transistor 102, the gate of the transistor 104, the gate of the transistor 110, the gate of the transistor 111, and the gate of the transistor 112. Thus, the read circuit 2h-3 can operate by collectively controlling switching of the transistors 101, 102, 104, 110, 111, and 112 using a signal transmitted through the wiring Q. For example, the read circuit 2h-3 can operate such that, in a group of the transistors 101, 102, and 110 and a group of the transistors 104, 111, and 112, one of the groups is in an off state while the other is in an on state. The transistors 101, 102, 105, and 110 may be p-channel transistors and the transistors 104, 111, and 112 may be n-channel transistors.

A read circuit 2h-4 in FIG. 34B is the read circuit 2h in FIG. 32 in which the analog switch 121, the analog switch 122, the analog switch 124, the analog switch 125, the analog switch 130, the analog switch 131, and an analog switch 132 are used as the switch 8, the switch 9, the switch 11, the switch 12, the switch 17, the switch 18, and the switch 19, respectively. The analog switches 121, 122, 124, 125, 130, 131, and 132 each have a configuration where a source and a drain of an n-channel transistor and a source and a drain of a p-channel transistor are connected in parallel. The wiring Q1 is electrically connected to the gate of the n-channel transistor of the analog switch 121, the gate of the n-channel transistor of the analog switch 122, the gate of the n-channel transistor of the analog switch 130, the gate of the p-channel transistor of the analog switch 124, the gate of the p-channel transistor of the analog switch 131, and a gate of the p-channel transistor of the analog switch 132. These gates are electrically connected to the gate of the p-channel transistor of the analog switch 121, the gate of the p-channel transistor of the analog switch 122, the gate of the p-channel transistor of the analog switch 130, the gate of the n-channel transistor of the analog switch 124, a gate of the n-channel transistor of the analog switch 131, and a gate of the n-channel transistor of the analog switch 132 through the inverter 141. The wiring Q2 is electrically connected to the gate of the p-channel transistor of the analog switch 125, and the gate of the n-channel transistor of the analog switch 125 is electrically connected to the gate of the p-channel transistor of the analog switch 125 through the inverter 142. With the above-described configuration, the read circuit 2h-4 can operate by collectively controlling switching of the analog switches 121, 122, 124, 130, 131, and 132 using a signal transmitted through the wiring Q1. For example, the read circuit 2h-4 can operate such that, in a group of the analog switches 121, 122, and 130 and a group of the analog switches 124, 131, and 132, one of the pairs is in an off state while the other is in an on state. Furthermore, the on/off states of the analog switch 125 can be controlled using a signal transmitted through the wiring Q2, regardless of on/off states of the analog switches 121, 122, 124, 130, 131, and 132.

Note that the read circuits 2h-3 in FIG. 34A and the read circuit 2h-4 in FIG. 34B are not limited thereto; for example, the polarities of the transistors can be changed as appropriate, if necessary.

Next, a circuit configuration that can serve the functions of the read circuit 2h is described. The read circuit 2h has a plurality of functions. The circuit configuration of the read circuit 2h varies depending on which function is carried out. In other words, by controlling on/off states of the switches in the function selection portion 5, the read circuit 2h can perform a plurality of functions.

Figure 35A:
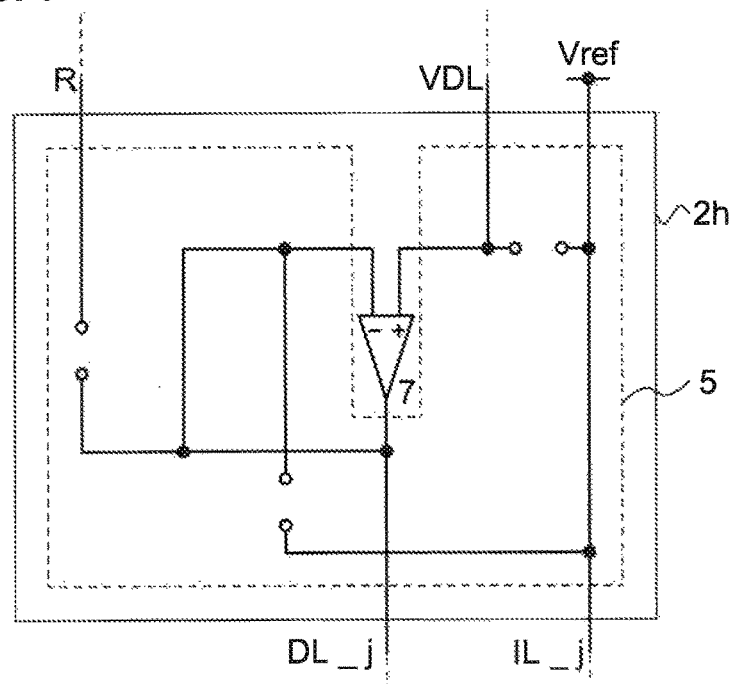
FIGS. 35A and 35B are circuit diagrams showing examples of a semiconductor device of one embodiment of the present invention.
Figure 35B:
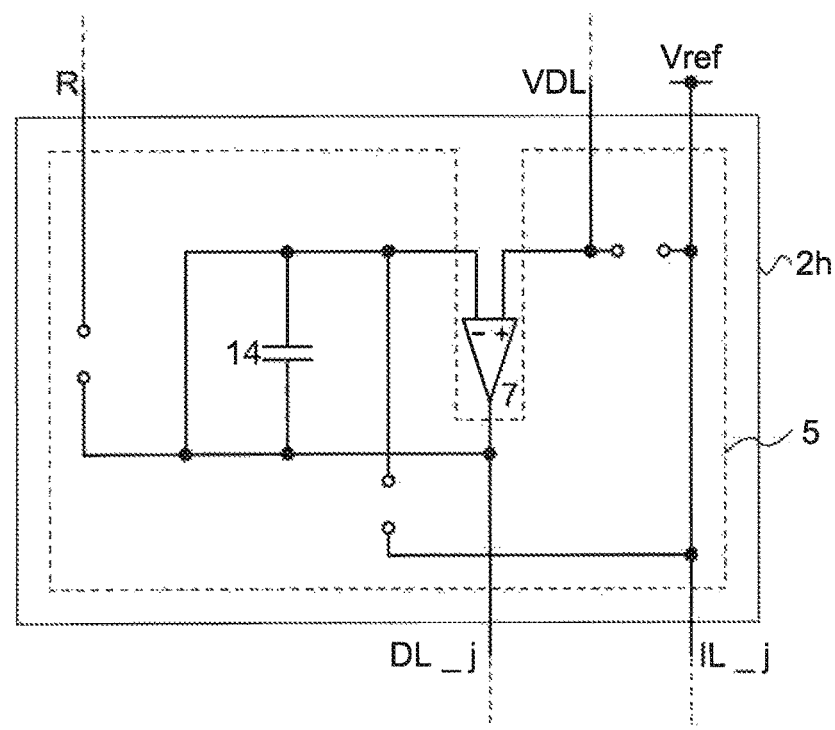

For example, circuit configurations in certain operation states in FIG. 32 are illustrated in FIGS. 35A and 35B. In the configurations, a potential of the wiring VDL can be supplied (or transmitted) to the wiring DL_j or the gate of the transistor 3 included in the pixel 1. Furthermore, the potential of the wiring Vref can be supplied (or transmitted) to the wiring IL_j or a terminal of the source or the drain of the transistor 3 included in the pixel 1. With such a configuration, the read circuit 2h can function as a buffer circuit or the like.

Figure 36:
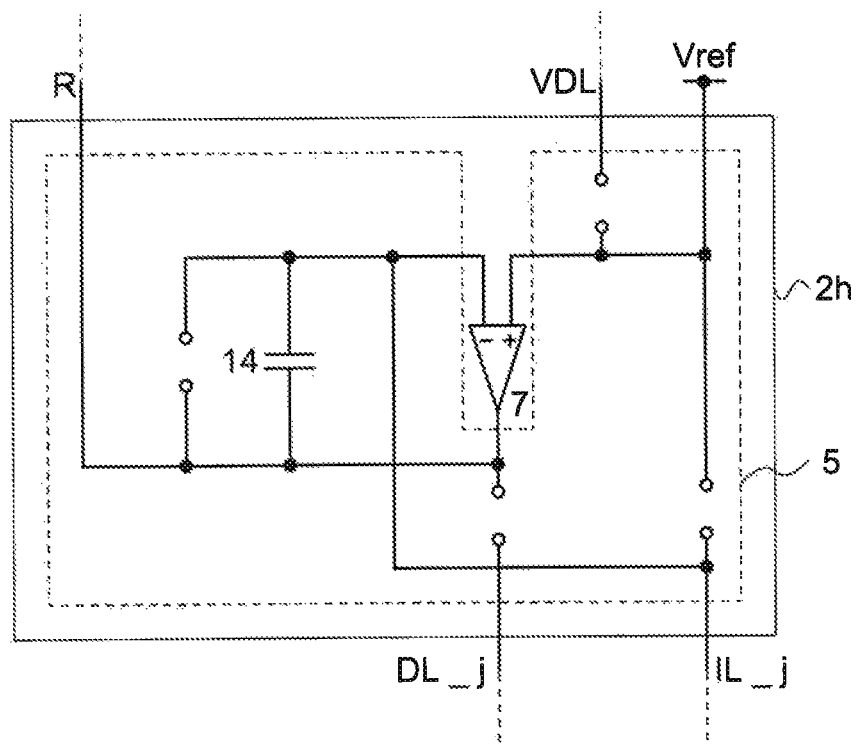
FIG. 36 is a circuit diagram showing an example of a semiconductor device of one embodiment of the present invention.

A circuit configuration in another certain operation state in FIG. 32 is illustrated in FIG. 36. In the configuration, a current from the wiring IL_j or the transistor 3 included in the pixel 1 can be integrated, and a potential based on it can be supplied (or transmitted) to the wiring R. For example, in the case where a current flows from the transistor 3 included in the pixel 1 to the wiring IL_j, a current flowing through the wiring IL_j, i.e., a current flowing through the transistor 3 can be integrated and read out by the read circuit 2h. With this configuration, the read circuit 2h can function as a read out circuit or the like.

Note that transistors such as switches (e.g., the switches 8, 9, 11, 12, 17, 18, 19, and the like) included in the read circuit 2h are not necessarily provided to have the connection relations illustrated in FIG. 32, FIG. 33A, FIG. 33B, FIG. 34A, FIG. 34B, or the like. The operation of the transistors is also not limited to the aforementioned method. Any connection relation or method may be used, as long as the circuit configurations in FIGS. 35A and 35B and the circuit configuration in FIG. 36 are obtained depending on an operation state or the function of a circuit. That is, a switch or a transistor is provided as appropriate so that the circuit configurations in FIGS. 35A and 35B or the circuit configuration in FIG. 36 can be selected by controlling on/off states of the switch or the transistor.

Figure 37A:
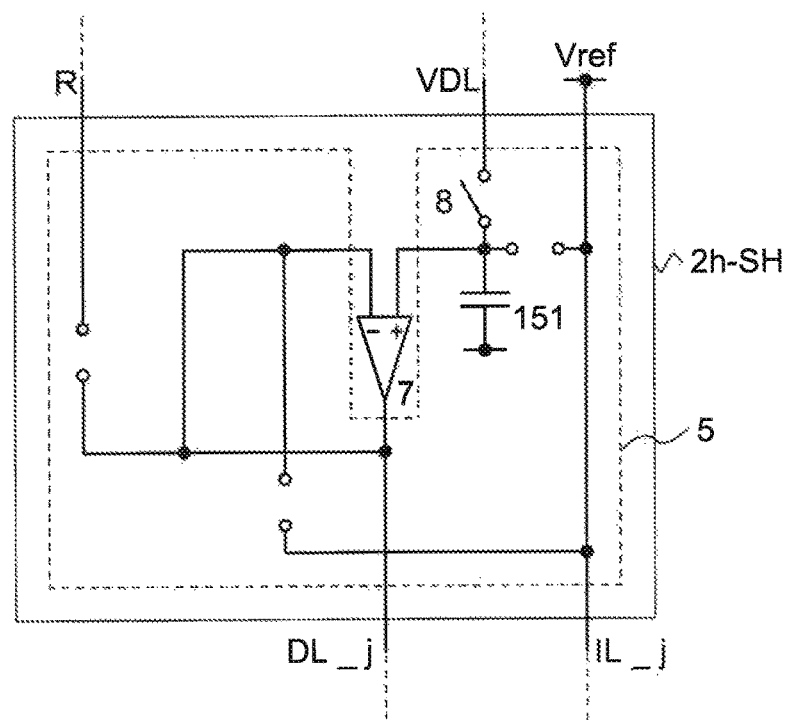
FIGS. 37A and 37B are circuit diagrams showing examples of a semiconductor device of one embodiment of the present invention.
Figure 37B:
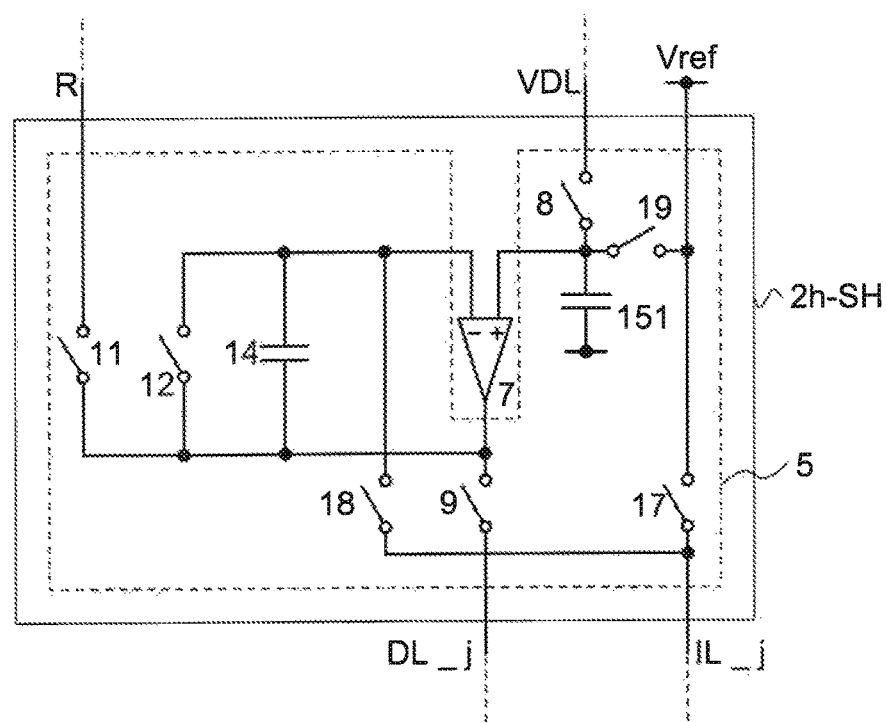

A circuit which samples and holds the potential of the wiring VDL or the potential of the wiring IL_j may be provided. A circuit configuration in the case where such a circuit is provided in FIG. 35A is shown in FIG. 37A as a read circuit 2h-SH. The switch 8 is turned on, and the potential of the wiring VDL is held in a capacitor 151. Then, the switch 8 is turned off. Consequently, the potential of the wiring VDL can be sampled and held. Thus, even when the potential of the wiring VDL is changed after the sample-and-hold operation, the operational amplifier 7 can operate without any problem. In the case of FIG. 32, the capacitor 151 is added as shown in the read circuit 2h-SH in FIG. 37B. Note that in the case where parasitic capacitance in the non-inverting input terminal of the operational amplifier 7 is large, the capacitor 151 is not necessarily provided. In the case where the capacitor 151 is provided, one of terminals of the capacitor 151 is connected to the non-inverting input terminal of the operational amplifier 7 and the other of the terminals of the capacitor 151 is connected to a dedicated wiring. Note that the other of the terminals of the capacitor 151 may be connected to another wiring.

Figure 38A:
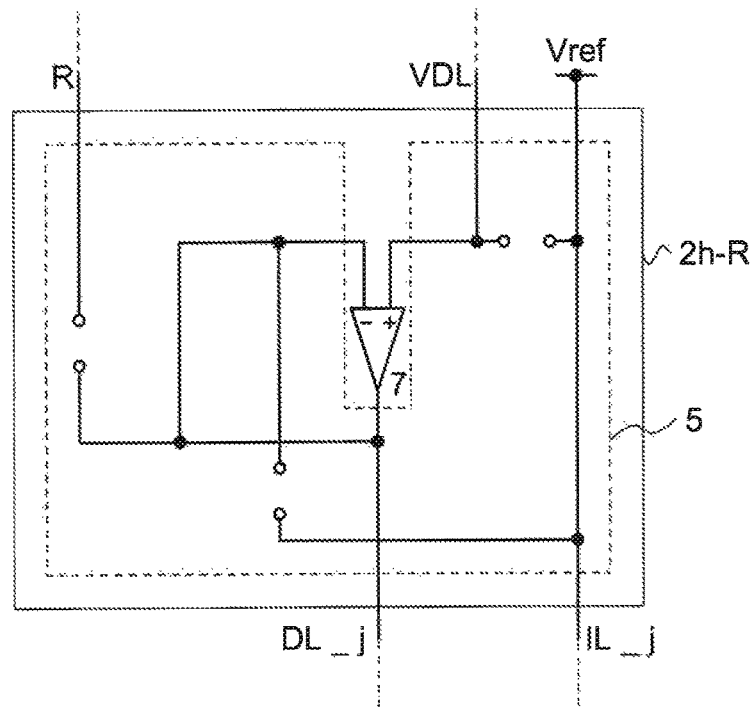
FIGS. 38A and 38B are circuit diagrams showing examples of a semiconductor device of one embodiment of the present invention.
Figure 38B:
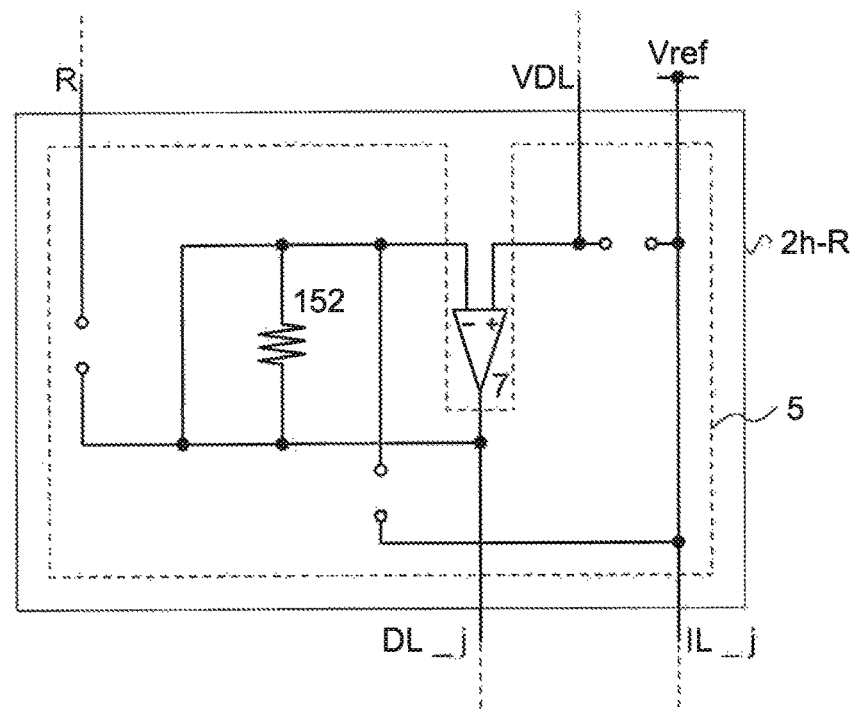
Figure 39A:
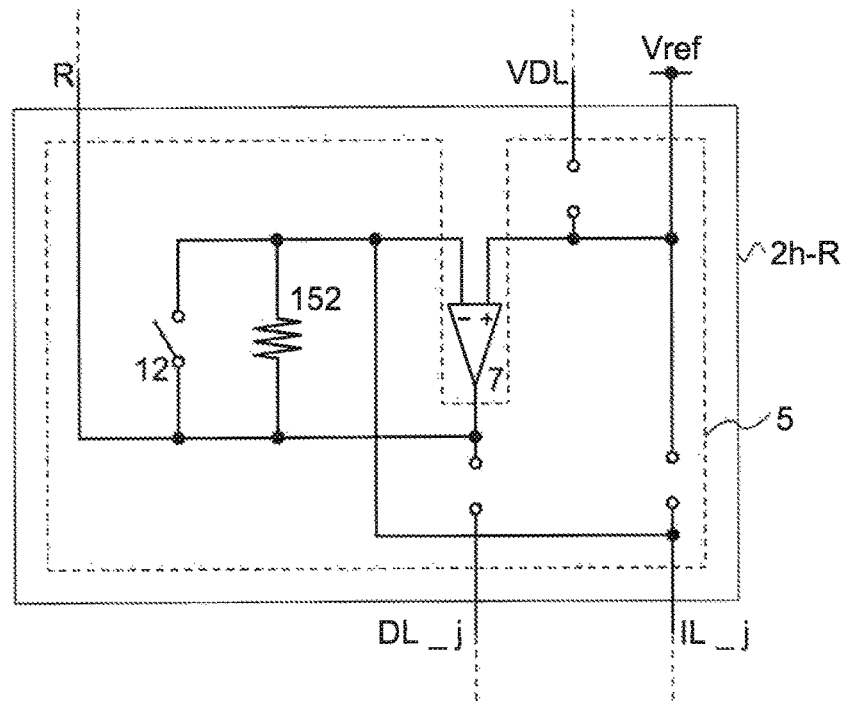
FIGS. 39A and 39B are circuit diagrams showing examples of a semiconductor device of one embodiment of the present invention.
Figure 39B:
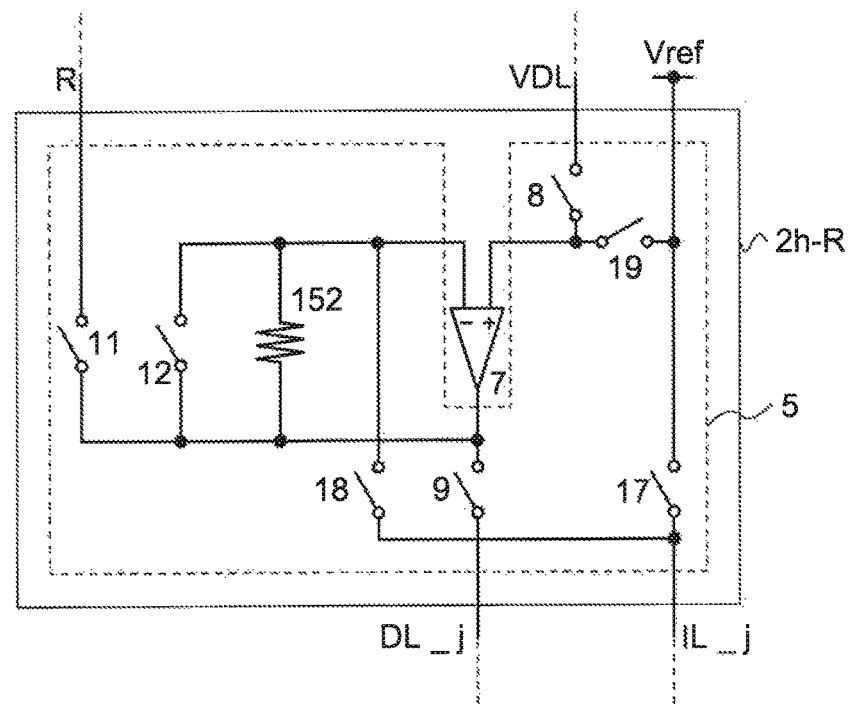

The example of the read circuit including the capacitor 14 to operate as an integrator circuit is described, but one embodiment of the present invention is not limited thereto. A passive element other than the capacitor, e.g., a resistor may be provided. An example of the case where a resistor 152 is provided instead of the capacitor 14 in FIG. 32 is shown as a read circuit 2h-R in FIG. 39B. Similarly, an example of the case in FIG. 35A is shown as the read circuit 2h-R in FIG. 38A, an example of the case in FIG. 35B is shown as the read circuit 2h-R in FIG. 38B, and an example of the case in FIG. 36 is shown as the read circuit 2h-R in FIG. 39A. By the replacement of the capacitor 14 with the resistor 152 as described above, a current-voltage conversion circuit can be formed.

Note that, not only in FIG. 39B, FIGS. 38A and 38B, and FIG. 39A but also in other drawings, the capacitor 14 can be replaced with the resistor 152, so that a current-voltage conversion circuit can be formed.

Figure 40:
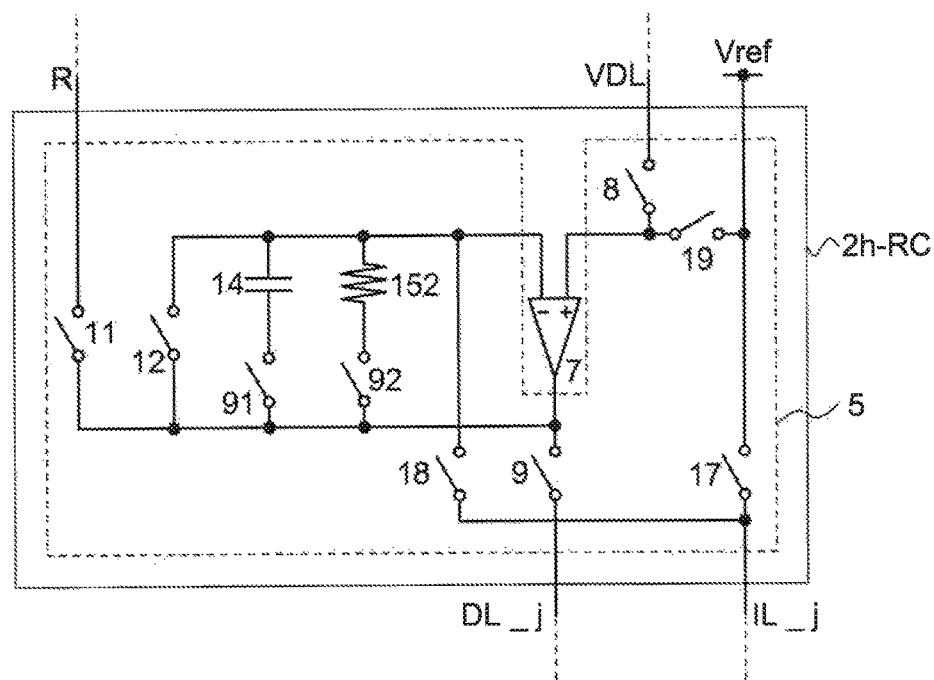
FIG. 40 is a circuit diagram showing an example of a semiconductor device of one embodiment of the present invention.

Note that instead of replacing the capacitor 14 with the resistor 152, both the capacitor 14 and the resistor 152 may be provided; in that case, they operate by switching. FIG. 40 shows a read circuit including both the capacitor 14 and the resistor 152. The switch 91 is electrically connected between the capacitor 14 and the output terminal of the operational amplifier 7. The switch 92 is electrically connected between the resistor 152 and the output terminal of the operational amplifier. The switch 91 and the capacitor 14 are connected in series, and the switch 92 and the resistor 152 are connected in series. By controlling on/off states of the switches 91 and 92, a read circuit 2h-RC in FIG. 40 can operate with the same function as the read circuit 2h in FIG. 32 or the read circuit 2h-R in FIG. 39B. For example, in the case where the switch 91 is on and the switch 92 is off, the read circuit 2h-RC in FIG. 40 has a configuration similar to the read circuit 2h in FIG. 32. In the case where the switch 91 is in an off state and the switch 92 is in an on state, the read circuit 2h-RC in FIG. 40 has a configuration similar to the read circuit 2h-R in FIG. 39B.

As described above, the capacitor 14 can be replaced with the resistor 152, or the capacitor 14 can be replaced with the resistor 152 and the switch. Alternatively, the resistor 152 may be provided and connected in parallel to the capacitor 14, or the resistor 152, the switch, and the like may be provided and connected in parallel to the capacitor 14, for example.

Configuration Example 9

The examples of the circuit configuration are shown in FIG. 19, FIG. 24, FIG. 32, and the like, but one embodiment of the present invention is not limited thereto. For example, the circuit diagrams described so far can be combined to form another circuit configuration. In the case where data is read from the pixel 1, a plurality of pieces of data may be read, or a voltage and a current may each be read from the pixel 1, for example.

A read circuit shown in FIG. 41A will be described as an example of a circuit diagram in which FIG. 19, FIG. 24, and FIG. 32 are combined. A read circuit 2k in FIG. 41A includes the operational amplifier 7 and the function selection portion 5. The function selection portion 5 includes the switch 8, the switch 9, the switch 11, the switch 12, the switch 15, the switch 16, the switch 17, the switch 18, the switch 19, and the capacitor 14. The non-inverting input terminal of the operational amplifier 7 is electrically connected to the wiring VDL through the switch 8. The non-inverting input terminal of the operational amplifier 7 is electrically connected to the wiring IL_j through the switch 16. The non-inverting input terminal of the operational amplifier 7 is electrically connected to the wiring Vref through the switch 19. The inverting input terminal of the operational amplifier 7 is electrically connected to the wiring IL_j through the switch 18. The inverting input terminal of the operational amplifier 7 is electrically connected to the output terminal of the operational amplifier 7 through the switch 12. The inverting input terminal of the operational amplifier 7 is electrically connected to the output terminal of the operational amplifier 7 through the capacitor 14. The output terminal of the operational amplifier 7 is electrically connected to the wiring DL_j through the switch 9. The output terminal of the operational amplifier 7 is electrically connected to the wiring R through the switch 11. The wiring IL_j is connected to the wiring Vref through the switch 17. The wiring DL_j is connected to the wiring Vinit through the switch 15.

The wiring DL_j and the wiring IL_j is electrically connected to the pixel 1 as shown in FIG. 1B, and the transistor 3 included in the pixel 1 is electrically connected to the wiring DL_j and the wiring IL_j. The wiring DL_j and the wiring IL_j are connected not to the same terminal of the transistor 3 but to different terminals thereof. In the case of the read circuit 2k in FIGS. 41A and 41B, the wiring DL_j is connected to a gate of the transistor 3, and the wiring IL_j is connected to a source or a drain of the transistor 3. The connection between the wiring DL_j, the wiring IL_j, and the transistor 3 is not limited to the above and may be changed as appropriate depending on a purpose, an operation, or the like.

The read circuit 2k can operate in the following manner, for example. For example, the switches 8, 9, 12, and 17 can be in an on state and the switches 11, 15, 16, 18, and 19 can be in an off state. In such a case, a potential of the wiring VDL is supplied (transmitted) to the non-inverting input terminal of the operational amplifier 7. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2k operates as a voltage follower circuit, and therefore, the output terminal of the operational amplifier 7 outputs a potential of the wiring VDL. Thus, the potential of the wiring VDL is supplied to the wiring DL_j or the gate of the transistor 3 included in the pixel 1. The potential of the wiring Vref is supplied to the wiring IL_j or a terminal of the source or the drain of the transistor 3 included in the pixel 1. For example, a potential of a video signal, a precharge signal, an initialization signal, or the like is supplied to the wiring VDL; hence, the potential of the video signal, the precharge signal, the initialization signal, or the like is supplied to the pixel 1. Since the operational amplifier 7 has high input impedance and low output impedance, the read circuit 2k can function as an impedance converter circuit. Alternatively, since the operational amplifier 7 has high current drive capability, the read circuit 2k can function as a buffer circuit or an amplifier circuit. The read circuit 2k functioning as described above can charge the pixel 1 or the wiring DL_j at high speed. That is, a signal can be written into the pixel 1 or the wiring DL_j at high speed by the read circuit 2k.

In another operation state, for example, the switch 8, the switch 9, and the switches 17 to 19 can be in an off state and the switch 11, the switch 12, the switch 15, and the switch 16 can be in an on state. In such a case, a potential of the wiring Vinit is supplied (transmitted) to the wiring DL_j or the gate of the transistor 3 included in the pixel 1 and a potential of the wiring IL_j or a terminal of the source or the drain of the transistor 3 included in the pixel 1 is supplied (transmitted) to the non-inverting input terminal of the operational amplifier 7 in the read circuit 2k. The operational amplifier 7 has a configuration of a negative feedback circuit and therefore operates so that a potential of the non-inverting input terminal of the operational amplifier 7 is equal to a potential of the inverting input terminal of the operational amplifier 7. That is, the read circuit 2k operates as a voltage follower circuit, and therefore, the output terminal of the operational amplifier 7 outputs the potential of the wiring IL_j or a terminal of the source or the drain of the transistor 3 included in the pixel 1. Thus, the potential of the wiring IL_j or a terminal of the source or the drain of the transistor 3 included in the pixel 1 is supplied to the wiring R. In that case, data on the current characteristics of the transistor 3, e.g., a voltage depending on the threshold voltage of the transistor 3, is supplied from the pixel 1. Therefore, data on the pixel 1 can be read from the pixel 1 to the wiring R. Since the operational amplifier 7 has high input impedance and low output impedance, the read circuit 2k can function as an impedance converter circuit. Alternatively, since the operational amplifier 7 has high current drive capability, the read circuit 2k can function as a buffer circuit or an amplifier circuit. The read circuit 2k functioning as described above enables a potential of the wiring IL_j or the transistor 3 included in the pixel 1 to be output to the wiring R without adversely affecting the potential of the wiring IL_j or the transistor 3 included in the pixel 1. That is, a signal can be read from the wiring IL_j or the transistor 3 included in the pixel 1 at high speed by the read circuit 2k.

In another operation state, for example, the switches 9, 12, 19, 15, 16, and 17 can be in an off state, and the switches 8, 11, and 18 can be in an on state. In that case, the read circuit 2k has a configuration of a feedback circuit. Due to the connections between the operational amplifier 7 and the capacitor 14, the read circuit 2k operates as an integrator circuit. Thus, the circuit operates so that the potential of the inverting input terminal of the operational amplifier 7 is equal to the potential of the non-inverting input terminal of the operational amplifier 7. Thus, the potential of the wiring IL_j is approximately equal to the potential of the wiring VDL. A current flowing through the wiring IL_j is accumulated in the capacitor 14 as charges based on the measurement time, and a potential difference is generated between electrodes of the capacitor 14 in accordance with the accumulated charges. In other words, a voltage of the output terminal of the operational amplifier 7 which is supplied to the wiring R can be obtained by integrating the current flowing through the wiring IL_j with respect to the measurement time. Consequently, the total amount of the current flowing through the wiring IL_j can be read out. In that case, data on the current characteristics of the transistor 3, e.g., a current flowing through the transistor 3, is supplied from the pixel 1. Therefore, data on the pixel 1 can be read from the pixel 1 to the wiring R. Then, the level of the video signal to be supplied to the pixel 1 is corrected on the basis of the data read from the pixel 1. As a result, variation in transistor 3 in the pixel 1 or adverse effects due to deterioration can be reduced. That is, the use of the pixel 1 can achieve display of an image with less image retention or unevenness.

Note that in the case where the read circuit 2k operates as an integrator circuit, the potential of the wiring IL_j can be controlled by controlling the potential of the wiring VDL. Thus, the pixel 1 connected to the wiring IL_j or the potential of a terminal of the source or the drain of the transistor 3 connected to the IL_j can also be controlled by controlling the potential of the wiring VDL, in a period in which the read circuit 2k operates as an integrator circuit. Therefore, an operation state for the case where a current flows through the pixel 1 or the transistor 3 can be brought into an appropriate state by controlling the potential of the wiring VDL. For example, the potential of the light-emitting element 4 is controlled so that a current does not flow through the light-emitting element 4, by controlling the potential of the wiring VDL in a period in which the read circuit 2k operates as an integrator circuit.

Note that in the case where the read circuit 2k operates as an integrator circuit, the switch 12 may be turned on to reset or initialize charges stored in the capacitor 14. For example, the switch 12 may be turned on immediately before the amount of current is measured in the case where the read circuit 2k operates as an integrator circuit.

Next, a circuit configuration that can serve the functions of the read circuit 2k is described. The read circuit 2k has a plurality of functions. The circuit configuration of the read circuit 2k varies depending on which function is carried out. In other words, by controlling on/off states of the switches in the function selection portion 5, the read circuit 2k can perform a plurality of functions.

Figure 41A:
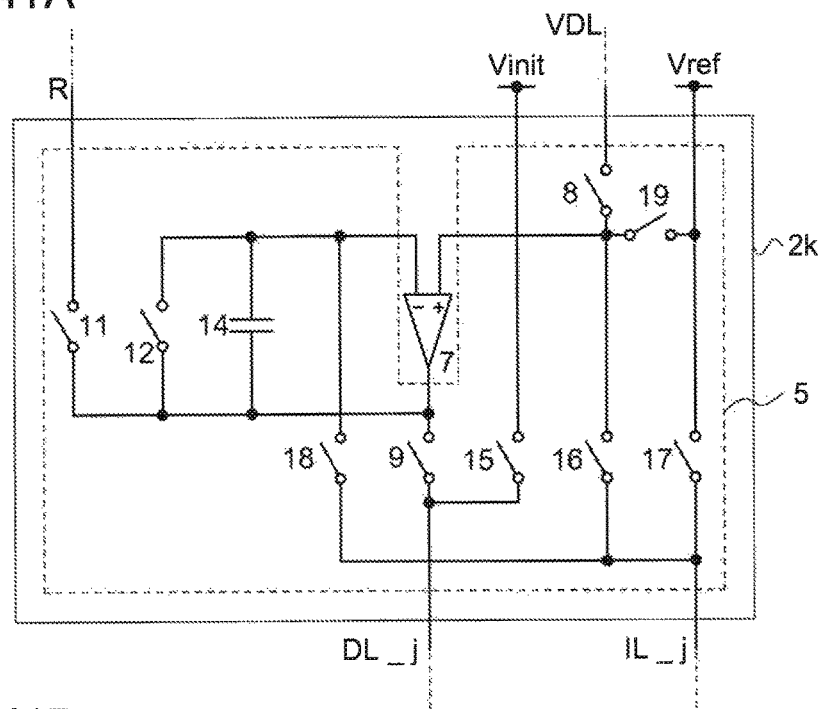
FIGS. 41A and 41B are circuit diagrams showing examples of a semiconductor device of one embodiment of the present invention.

For example, a circuit configuration in a certain operation state in FIG. 41A is illustrated in FIG. 22A, FIG. 27A, FIG. 27B, FIG. 35A, or FIG. 35B. In the configuration, a potential of the wiring VDL can be supplied (or transmitted) to the wiring IL_j or a terminal of the source or the drain of the transistor 3 included in the pixel 1. With such a configuration, the read circuit 2k can function as a buffer circuit or the like.

A circuit configuration in another certain operation state in FIG. 41A is illustrated in FIG. 22C. In the configuration, a potential of the wiring IL_j or a terminal of the source or the drain of the transistor 3 included in the pixel 1 can be supplied (or transmitted) to the wiring R. For example, in the case where a potential based on the threshold voltage of the transistor 3 is output from the pixel 1 to the wiring IL_j, the potential of the wiring IL_j, i.e., the potential based on the threshold voltage of the transistor 3, can be read out by the read circuit 2k. With such a configuration, the read circuit 2k can function as a read out circuit or the like.

Circuit configurations in another certain operation states in FIG. 41A is illustrated in FIG. 27C and FIG. 36. In the configurations, a current from the wiring IL_j or the transistor 3 included in the pixel 1 can be integrated, and a potential based on it can be supplied (or transmitted) to the wiring R. For example, in the case where a current flows from the transistor 3 in the pixel 1 to the wiring IL_j, a current flowing through the wiring IL_j, i.e., a current flowing through the transistor 3 can be integrated and read out by the read circuit 2k. With this configuration, the read circuit 2k can function as a read out circuit or the like.

As described above, a plurality of pieces of data can be read from the pixel 1. As a result, current characteristics of the transistor 3 can be corrected more appropriately. In particular, in the case where current characteristics of a driving transistor are not current characteristics of a desired transistor, by obtaining a plurality of kinds of data, variation in current characteristics of the driving transistor can be corrected more accurately. An example of a desired transistor includes a transistor in which gradual channel approximation is made. For example, in the case where the transistor is a thin film transistor, the transistor does not have current characteristics of a desired transistor in many cases; therefore, the reading out method according to one embodiment of the present invention is useful.

Note that transistors such as switches (e.g., the switch 8, the switch 9, the switch 11, the switch 12, the switch 15, the switch 16, the switch 17, the switch 18, the switch 19, and the like) included in the read circuit 2k are not necessarily provided to have the connection relations illustrated in FIG. 41A or the like. The operation of the transistors is also not limited to the aforementioned method. Any connection relation or method may be used, as long as the circuit configuration in FIG. 22A or the like, the circuit configuration in FIG. 22C, and the circuit configuration in FIG. 27C are obtained depending on an operation state or the function of a circuit. That is, a switch or a transistor is provided as appropriate so that the circuit configuration in FIG. 22A or the like, the circuit configuration in FIG. 22C, or the circuit configuration in FIG. 27C can be selected by controlling on/off states of the switch or the transistor.

Figure 41B:
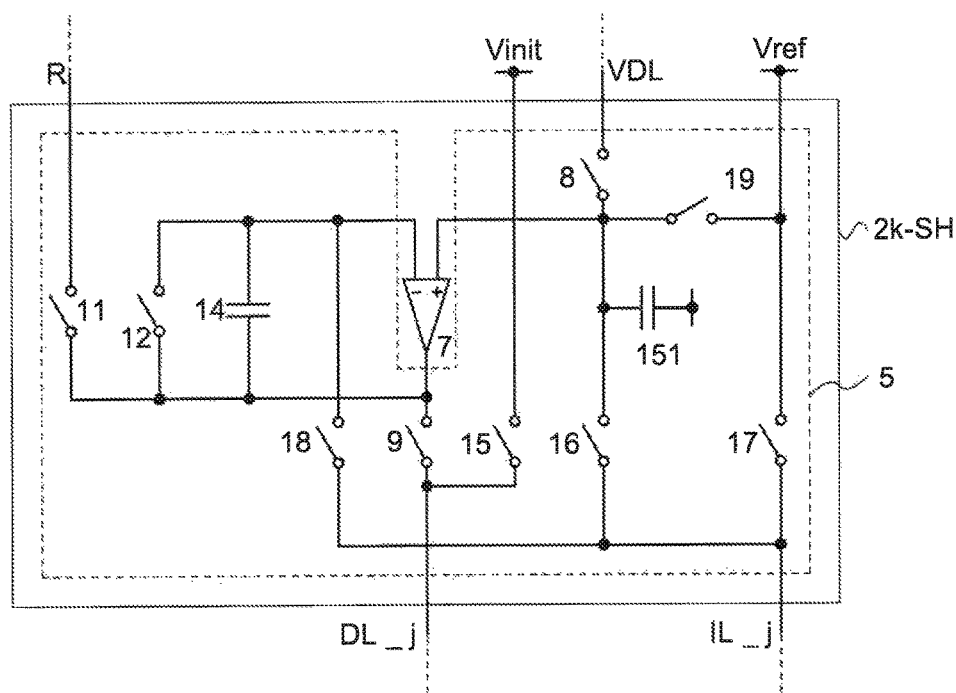

In FIG. 18A, a sample-and-hold capacitor may be provided as in FIGS. 23A to 23C, FIGS. 28A and 28B, FIGS. 37A and 37B, and the like. A circuit diagram in that case is shown in FIG. 41B as a read circuit 2k-SH.

<Structure of Display Device>

A specific configuration example of the display device of one embodiment of the disclosed invention will be described using a block diagram of FIG. 42B and a circuit diagram of FIG. 44A. FIG. 42B shows an example of a block diagram of a pixel portion 23 including (m×n) pixels 1 (m and n are each an integer of 2 or more) and peripheral circuits.

The display device shown in FIG. 42B includes a driver circuit 20, a driver circuit 21, a circuit portion 22, the pixel portion 23, wirings SL_1 to SL_m (m is an integer greater than or equal to 2), wirings GL_1 to GL_m, wirings DL_1 to DL_n (n is an integer greater than or equal to 2), and wirings IL_1 to IL_m. In the pixel portion 23, pixels 1 of FIGS. 1A and 1B are arranged in a matrix of m×n (m rows and n columns). Note that pixels 35_(i, j) shown in FIG. 44B can be used as the pixels 1 of FIGS. 1A and 1B. The wirings SL_1 to SL_m and the wirings GL_1 to GL_m extend in the row direction. The wirings DL_1 to DL_n and the wirings IL_1 to IL_m extend in the column direction.

The driver circuit 20 is electrically connected to the wirings SL_1 to SL_m and the wirings GL_1 to GL_m. The driver circuit 20 is configured to select a pixel or a row. The driver circuit 20 is configured to sequentially select a pixel or a row, row by row. The driver circuit 20 is configured to select a specific row or a pixel in a specific row. The driver circuit 20 is configured to output a selection signal or a non-selection signal to a pixel. Thus, the driver circuit 20 has a function as a gate line driver circuit or a scan line driver circuit.

The driver circuit 21 is electrically connected to the wirings DL_1 to DL_n. The driver circuit 21 is configured to supply a video signal to a pixel. The driver circuit 21 is configured to supply a reading signal to a pixel. Thus, the driver circuit 21 has a function as a source line driver circuit, a data line driver circuit, or a video signal line driver circuit.

The circuit portion 22 (hereinafter also referred as a read circuit portion) is electrically connected to the wirings IL_1 to IL_n. Furthermore, the circuit portion 22 is electrically connected to the wirings DL_1 to DL_n. The circuit portion 22 includes a plurality of read circuits described in this embodiment. For example, a read circuit is provided for each pair of the wirings IL and DL extending in the same column direction, and n read circuits 2 are provided in total (not shown). By the read circuits 2, data on current characteristics can be read from the transistor 31 of the pixels 35_(i, j). Thus, the circuit portion 22 has a function of reading out data that is output from the pixels. Alternatively, the circuit portion 22 has a function of reading out the potential of a terminal in each pixel.

The read circuit 2 can be appropriately selected from, for example, the read circuits given as the specific configuration examples, depending on the kinds of data on current characteristics of the transistor from which data is read out.

The driver circuit 20, the driver circuit 21, and the circuit portion 22 except the pixel portion 23 in the display device are collectively referred to as a driver circuit portion in some cases. In the display device of this embodiment, the number of operational amplifiers is reduced and the area occupied by the operational amplifiers can be reduced in the read circuit 2 of the circuit portion 22 as described above. Thus, since the area occupied by the driver circuit portion where the read circuit 2 is provided can be reduced, the frame of the display device can be narrowed.

Note that the read circuit 2 may be provided not only in the circuit portion 22 of the display device but also in a flexible printed circuit (FPC) connected to the display device, or a display module.

Figure 44A:
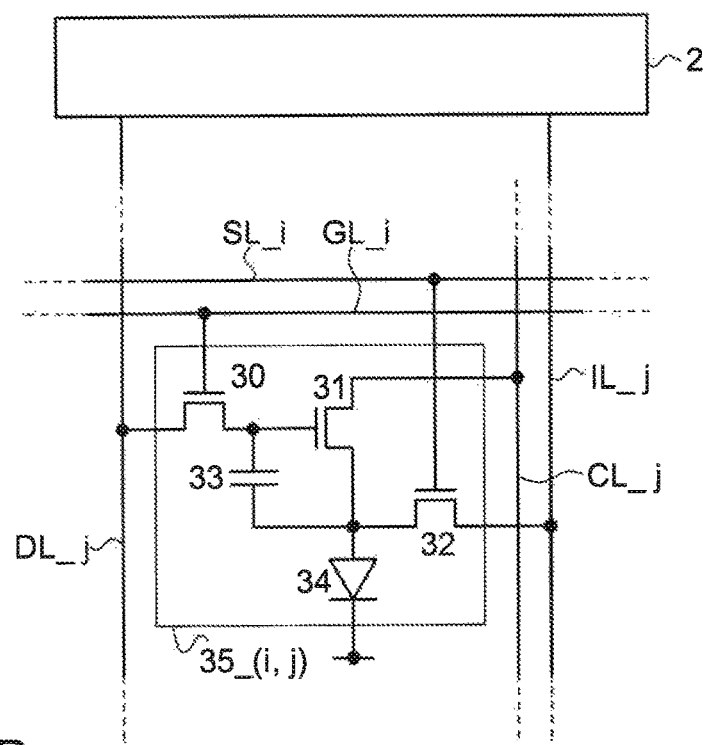
FIGS. 44A and 44B are block diagrams showing examples of a pixel of one embodiment of the present invention.

Next, a configuration of the pixel 35_(i, j) shown in FIG. 44A is described. The pixel 35_(i, j) is located in the i-th row (i is an integer greater than or equal to 1 and less than or equal to m) and the j-th column (j is an integer greater than or equal to 1 and less than or equal to n). The pixel 35_(i, j) includes a transistor 30, a transistor 31, a transistor 32, a light-emitting element 34, and a capacitor 33. Note that each of the transistors may have a multi-gate structure, that is, a structure in which a plurality transistors are connected in series. Note that each of the transistors may have a structure in which gate electrodes are formed above and below a channel. These elements included in the pixel 35_(i, j) are electrically connected to the wirings GL_i, SL_i, DL_j, CL_j, and IL_j. Wirings CL_1 to CL_n are provided so as to extend in the column direction (not shown in FIG. 42B). The wiring CL_j extends in the column direction in FIG. 44A, but a configuration example of the pixel is not limited thereto. The direction in which the wiring CL_j extends may be changed as appropriate. For example, the wiring CL may be provided to extend in the column direction.

A specific connection relation in the pixel 35_(i, j) is described. A gate of the transistor 30 is electrically connected to the wiring GL_i. One of a source and a drain of the transistor 30 is electrically connected to the wiring DL_j. The other of the source and the drain of the transistor 30 is electrically connected to a gate of the transistor 31. One of a source and a drain of the transistor 31 is electrically connected to one of a source and a drain of the transistor 32 and one of electrodes (hereinafter also referred to as a pixel electrode) of the light-emitting element 34. The other of the source and the drain of the transistor 31 is electrically connected to the wiring CL_j. A gate of the transistor 32 is electrically connected to the wiring SL_i. The other of the source and the drain of the transistor 32 is electrically connected to the wiring IL_j. A common potential is supplied to the other of the electrodes (hereinafter also referred to as a common electrode) of the light-emitting element 34.

One of electrodes of the capacitor 33 is electrically connected to the other of the source and the drain of the transistor 30 and the gate of the transistor 31, and the other of the electrodes of the capacitor 33 is electrically connected to the one of the source and the drain of the transistor 31, the one of the source and the drain of the transistor 32, and the pixel electrode of the light-emitting element 34. With the capacitor 33 provided as described above, more charge can be held in the gate of the transistor 31, and a holding period of image data can be made longer.

Note that the capacitor 33 is not necessarily provided. For example, a high parasitic capacitance of the transistor 31 can be an alternative to the capacitor 33.

The driver circuit 20 can control the on/off states of the transistor 30 by transmitting a signal to the gate of the transistor 30 through the wiring GL. The driver circuit 20 can control the on/off states of the transistor 32 by transmitting a signal to the gate of the transistor 32 through the wiring SL.

The driver circuit 21 can supply a video signal or a reading signal to the gate of the transistor 31 via the wiring DL and the transistor 30.

The wiring CL has a function as a high potential power supply line which supplies current to the light-emitting element 34.

The structures of the driver circuit 20, the driver circuit 21, and the circuit portion 22 are not limited to that described above. The positions of the driver circuit 20, the driver circuit 21, and the circuit portion 22 may be changed; alternatively, functions of the plurality of driver circuits may be combined into one driver circuit. For example, in FIG. 42A, the driver circuit 20 is provided on only one side of the pixel portion 23; however, the driver circuit 20 may be divided and provided on both sides of the pixel portion 23. Furthermore, in FIG. 42A, the driver circuit 21 and the circuit portion 22 are separately provided; however, they may be combined as one driver circuit portion.

Figure 44B:
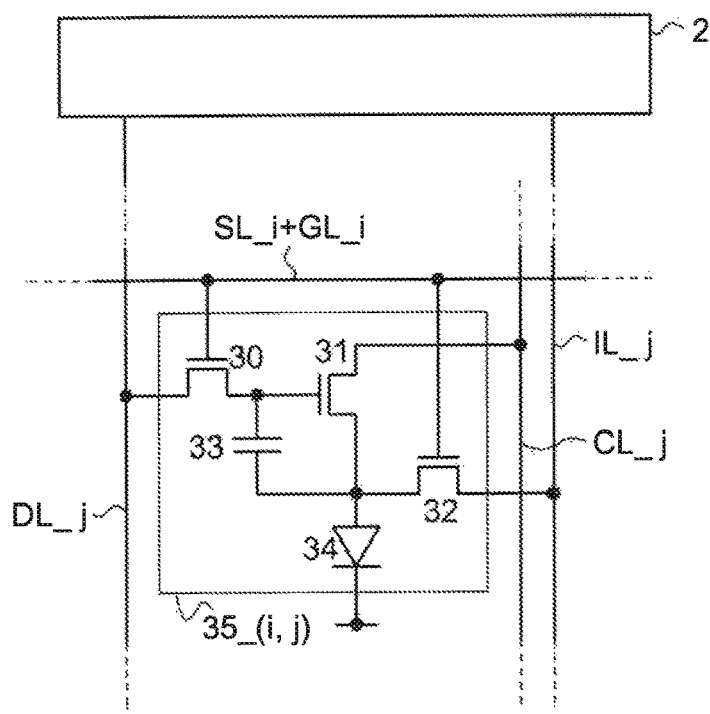

The directions in which the wiring GL, the wiring SL, the wiring DL, the wiring IL, and the wiring CL extend, the number of the wirings, and the like can be appropriately changed in accordance with changes in structures such as positions and functions of the driver circuit 20, the driver circuit 21, and the circuit portion 22. For example, the wiring IL may extend in the row direction. Alternatively, for example, the wiring GL and the wiring SL may be combined into one wiring. FIG. 44B shows a circuit diagram in that case. In FIG. 44B, the wiring GL and the wiring SL are combined into one wiring SL_i+GL_i. In the case where the wiring GL and the wiring SL are combined into one wiring, the wiring acts similarly to the case where the wiring GL and the wiring SL are brought into an on state or an off state at the same time. Thus, in the case where a driving method in which the wiring GL and the wiring SL are brought into an on state or an off at the same time is employed, the wiring GL and the wiring SL can be combined into one wiring.

The amount of current flowing through the light-emitting element 34 is controlled by the transistor 31 that is controlled in accordance with a video signal input to the pixel 35_(i, j). The luminance of the light-emitting element 34 depends on the amount of current flowing between the pixel electrode and the common electrode. For example, in the case where an OLED (an organic light-emitting diode) is used as the light-emitting element 34, one of an anode and a cathode serves as the pixel electrode and the other thereof serves as the common electrode. FIG. 44A illustrates a configuration of the pixel 35_(i, j) in which the anode of the light-emitting element 34 is used as the pixel electrode and the cathode of the light-emitting element 34 is used as the common electrode.

Figure 45:
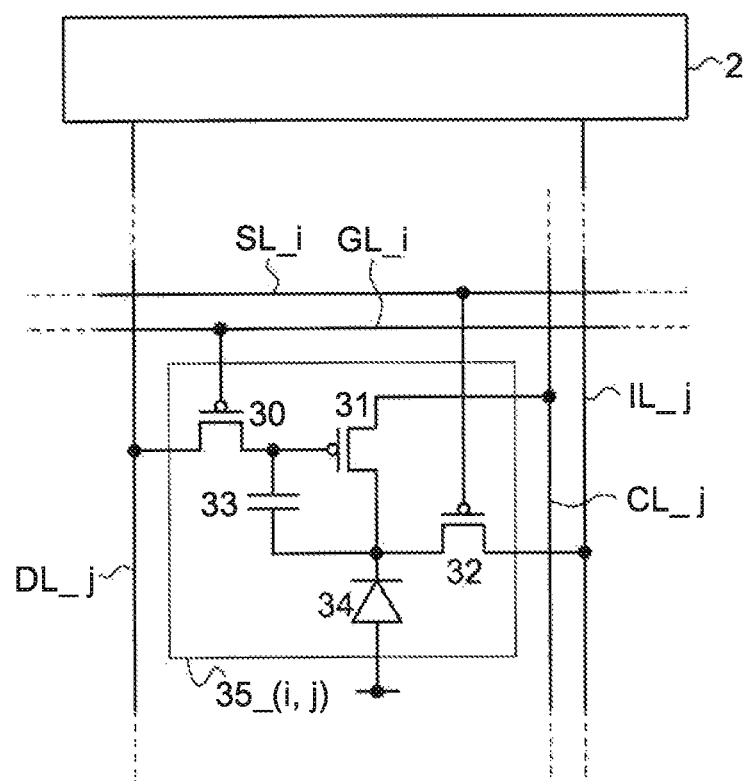
FIG. 45 is a block diagram showing an example of a pixel of one embodiment of the present invention.

Operation can be performed with a circuit configuration in which the polarity of the transistors, the orientation of the light-emitting element, the potential of the wirings, the potential of the signals, or the like is changed. FIG. 45 illustrates a variation example of the structure in FIG. 44A. In FIG. 45, the transistors 30 to 32 are p-channel transistors, and the direction of the light-emitting element 34 is opposite to that in FIG. 44A. Without limitation to the pixel circuit in FIG. 44A, a circuit can be formed similarly.

In at least one of the transistors 30 to 32 and another transistor included in the pixel 35_(i, j), an oxide semiconductor can be used. Alternatively, an amorphous, microcrystalline, polycrystalline, or single crystal semiconductor can be used. As a material of such a semiconductor, silicon, germanium, or the like can be used. Specifically, when the transistor 30 includes an oxide semiconductor in a channel formation region, the off-state current of the transistor 30 can be extremely low. Furthermore, when the transistor 30 having the above-described structure are used in the pixels 35_(i, j), leakage of charge accumulated in the gate of the transistor 31 or the capacitor 33 can be prevented effectively as compared with the case where a transistor including a normal semiconductor such as silicon or germanium is used as the transistor 30.

Accordingly, for example, in the case where video signals each having the same image information are written to the pixel portion 23 for some consecutive frame periods, like the case of displaying a still image, display of an image can be maintained even when driving frequency is low, in other words, the number of writing operations of a video signal to the pixel portion 23 for a certain period is reduced. For example, a purified oxide semiconductor in which impurities serving as electron donors (donors), such as moisture or hydrogen, are reduced and oxygen vacancies are reduced is used for a semiconductor film of the transistor 30, whereby the interval between the operations of writing video signals can be set to 10 seconds or longer, preferably 30 seconds or longer, or further preferably one minute or longer. As the interval between writings of video signals is made longer, power consumption can be further reduced.

In addition, since the potential of the video signal can be held for a longer period, the quality of an image to be displayed can be prevented from being lowered even when the capacitor 33 for holding the potential of the gate of the transistor 31 is not provided in the pixel 35_(i, j).

The transistors each have the gate electrode on at least one side of a semiconductor film; alternatively, the transistors may each have a pair of gate electrodes with a semiconductor film positioned therebetween.

FIG. 44A illustrates the case where the transistors are all n-channel transistors. When the transistors in the pixel 35_(i, j) have the same channel type, it is possible to omit some of steps for fabricating the transistors, for example, a step of adding an impurity element imparting one conductivity type to the semiconductor film. Note that in the display device, not all the transistors in the pixel 35_(i, j) are necessarily n-channel transistors. For example, the transistor 30 and the transistor 32 may be p-channel transistors.

Instead of the transistors 30 and 32, an electrical switch, a mechanical switch, a MEMS element, or the like can be used.

<Driving Method of Display Device>

Figure 47A:
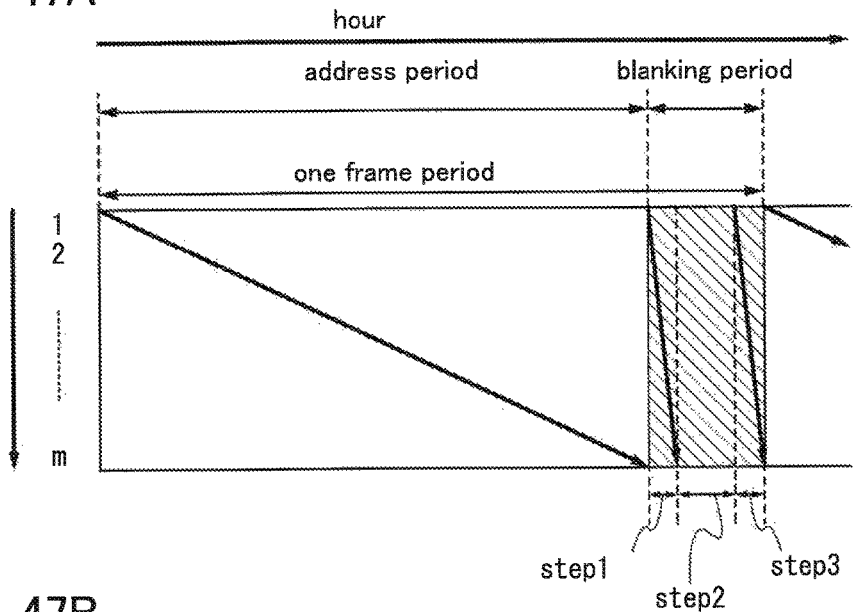
FIGS. 47A and 47B are a timing chart and a flow chart of a display device of one embodiment of the present invention.

FIG. 47A is a timing chart illustrating an example of a driving method of a display device. In the timing chart in FIG. 47A, the horizontal direction indicates elapsed time and the vertical direction indicates the row on which scanning is performed.

As shown in FIG. 47A, in the display device of this embodiment, an image is displayed by sequentially scanning pixels row by row from the first row to the m-th row and repeating this scanning operation. The period of time from the start of the scanning in the first row through the scanning of the m-th row and time up to but not including the next scanning is referred to as one frame period. In the one frame period, there is a period called a blanking period in which scanning for displaying an image is not performed, which starts after the scanning of the m-th row and ends before the next scanning of the first row. The period of time for scanning from the first row to the m-th row is sometimes called an address period or a signal writing period. That is, the one frame period includes the address period and the blanking period. However, the one frame period may include a plurality of sub-frame periods. In that case, each sub-frame period may include an address period. Furthermore, a period from an input of a video signal to a selected row until an input of a new signal to the row in the next frame period may be referred to as a display period. That is, in a pixel, a period during which one gray scale level is substantially displayed may be referred to as a display period. Note that the length of the display period is the same in all the rows; however, timing of the start and the end of the display period may varies depending on the row.

When current characteristics of the driving transistor is read out while scanning for displaying an image is performed, display of the image may be disturbed by an input of a signal for reading data. However, in the case of reading current characteristics by selecting a row in which all the pixel are displayed in black in the blanking period, the current characteristics can be read out without disturbance of the black display in that row. Specifically, for example, in the case where all the pixels in one row are displayed in black, current characteristics can be easily read out from that row. Note that a black display state may be referred to as a non-display state. Alternatively, the black display state may be referred to as a display state of a zero gray level. The state where display is performed with any gray levels except black may be referred to as a display state. Alternatively, the state where display is performed with any gray levels except black may be referred to as a state where a gray level is higher than zero. The state where display is performed with the highest gray level may be referred to as a white display state. Alternatively, the state where display is performed with the highest gray level may be referred to as a state where display is performed with the highest gray level.

As an example of the driving method of the display device, description is made below on a driving method of a display device, in which variation in current characteristics of driving transistors is corrected by reading data on the current characteristics of the driving transistors in one row in which all the pixels are displayed in black in a blanking period.

An example of a driving method of the display device shown in FIG. 1B, FIG. 42B, and FIG. 44A is described with reference to FIGS. 47A and 47B. Specifically, explanation is made focusing on the pixel 35_(i, j) in the i-th row and the j-th column in FIG. 44A. Note that explanation is made in the case where all the pixels 35_(i, j) in the i-th row are in black display.

First, a method of driving the display device in an address period is described. When an address period of one frame period starts, as shown in FIG. 47A, pixels are sequentially scanned row by row from the first row to the m-th row. When the pixels 35_(i, j) in the i-th row are selected, a selection signal is input to the wiring SL_i and the transistor 32 is turned on. When the transistor 32 is turned on, the wiring IL_j and the one of the source and the drain of the transistor 31 (hereinafter also referred to as the source of the transistor 31) are electrically connected to each other, and the potential of the wiring IL_j is supplied to the source of the transistor 31. Note that the potential of the wiring IL_j is a potential at which the light-emitting element 34 does not emit light. For example, the potential of the wiring IL_j is the same potential as the potential of the common electrode of the light-emitting element 34.

Here, in FIG. 1B, the operational amplifier 6 used in the read circuit 2 operates so that the potential of the non-inverting input terminal is equal to the potential of the inverting input terminal. In the case where the wiring IL_j is electrically connected to the inverting input terminal of the operational amplifier 6, the potential of the IL_j can be controlled by the potential of the non-inverting input terminal. Thus, it can be said that the reading circuit 2 is configured to control the potential of the wiring IL_j. Therefore, also in the above, the potential of the wiring IL_j may be controlled by the read circuit 2.

After that, or at the same time, the selection signal is input to the wiring GL_i, whereby the transistor 30 is turned on. When the transistor 30 is turned on, the wiring DL_j is electrically connected to the gate of the transistor 31. Here, a video signal of the pixel 35_(i, j) is supplied to the wiring DL_j, so that a potential corresponding to the video signal of the pixel 35_(i, j) is supplied to the gate of the transistor 31. That is, a voltage between the potential of the wiring DL_j and the potential of the wiring IL_j is supplied between the gate and the source of the transistor 31.

Accordingly, a potential difference between the gate and the source of the transistor 31 is stabilized, and current based on the video signal held in the gate of the transistor 31 or the capacitor 33 can be supplied to the light-emitting element 34 via the wiring CL_j.

In the case where the wiring GL_i and the wiring CL_j are combined into one wiring, the wiring operates in a manner similar to that in the case when the wiring GL_i and the wiring CL_j are selected at the same time.

When pixels in the (i+1)th row are selected, the selection signal that has been input is not supplied to the wiring GL_i and the wiring SL_i, and a non-selection signal is supplied to the wiring GL_i and the wiring SL_i. As a result, the transistor 30 and the transistor 32 are turned off. Thus, a potential difference between the gate and the source of the transistor 31 is held, and a light-emitting state or a non-light-emitting state of the light-emitting element 34 is maintained until the pixel 35_(i, j) is selected in the next frame. As a result, current based on the voltage between the gate and the source of the transistor 31 is supplied to the light-emitting element 34 from the transistor 31. Thus, an image corresponding to the video signal can be displayed. In the case where the video signal supplied from the wiring DL_j is a signal for black display, no current flows into the transistor 31; also, no current flows into the light-emitting element 34. As a result, the pixel 35_(i, j) is in black display or a non-display state.

Next, a method of driving the display device in the blanking period in the first frame is described. FIG. 47B is a flow chart showing an example of the method of driving the display device. The method of driving the display device shown in FIG. 47B includes Steps 1 to 3.

First, Step 1 is described. In Step 1, the row in which all the pixels are displayed in black is selected and a signal for reading out data on the current characteristics (hereinafter also referred to as a reading signal) is input to the selected row.

When the blanking period starts, as shown in FIG. 47A, scanning is sequentially performed row by row from the first row to the m-th row. Note that pixels in the rows other than a target row are not selected. That is, the selection signal is not supplied to the rows other than the target row, and the non-selection signal is supplied thereto.

Scanning is sequentially performed from the first row to the m-th row, for example, in the case where a gate line driver circuit includes a shift register circuit. Row-by-row sequential scanning from the first row to the m-th row is performed only in the gate line driver circuit, and a selection signal is not supplied to all pixels from the gate line driver circuit. The selection signal is supplied only to the row in black display. Thus, a signal stored in pixels in the rows other than the row in black display is kept. Note that in the case where a decoder circuit or the like is used as the gate line driver circuit, an arbitrary row can be selected in an arbitrary order. Thus, in that case, the row-by-row sequential scanning from the first row to the m-th row is not necessarily performed in the gate line driver circuit in the blanking period. Without the scanning, only a predetermined row (the row in black display) may be instantly selected, and a reading signal may be input to the pixels. Note that the selected row is desirably only one row, so that signals can be prevented from being mixed.

When the pixels in the i-th row are selected, a selection signal is input to the wiring SL_j, and the transistor 32 is turned on. When the transistor 32 is turned on, the wiring IL_j and the source of the transistor 31 are electrically connected to each other, and the potential of the wiring IL_j is supplied to the source of the transistor 31. Note that the potential of the wiring IL_j can be set by the read circuit 2.

At that time, the potential of the wiring IL_j is preferably lower than the common potential, or at the same level as that of the common potential. The potential of the wiring IL_j is set as described above, so that reverse bias voltage is applied to the light-emitting element 34 or bias voltage is not applied to the light-emitting element 34. Thus, the black display state of the pixels in the i-th row can be maintained. Furthermore, even if forward bias voltage is applied to the light-emitting element 34 so that the black display state of the pixels in the i-th row can be maintained at least until Step 3, the potential difference between the wiring IL_j and the common potential can be suppressed to extremely small. The extremely small potential difference is preferably a potential difference of approximately several volts or lower, for example, 2 volts or lower, further preferably 1 volt or lower. The current flowing in the transistor 31 does not flow in the light-emitting element 34, and becomes ready to flow into the wiring IL_j.

After that, or at the same time, the selection signal is input to the wiring GL_i, whereby the transistor 30 is turned on. When the transistor 30 is turned on, the wiring DL_j and the gate of the transistor 31 are electrically connected to each other. The transistor 31 can be turned on since the wiring DL_j is supplied with the reading signal.

The signal with which the transistor 30 is kept in an off state is input to the wiring GL so that the reading signal is not input to the rows other than the i-th row. Thus, a video signal input in the address period is maintained in the pixels on the rows other than the i-th row.

Next, Step 2 in which data on current characteristics of the transistor 31 (driving transistor) on the selected row is read out by the read circuit is described. After Step 1, since scanning shifts from the i-th row to the (i+1)th row, the supply of the selection signal that has been input to the wiring GL_i is stopped, and the transistor 30 is turned off. Thus, the reading signal that has been input to the gate of the transistor 31 in Step 1 is maintained.

In contrast, the transistor 32 needs to be turned on during Step 2. Thus, as in Step 1, the signal which makes the transistor 32 in an on state needs to be continuously input to the wiring SL_i also in Step 2. For example, a latch circuit is connected to the wiring SL so that the input signal at the time of Step 1 is held also in Step 2.

In the case where a decoder circuit and the like is used in the gate line driver circuit, the selection signal can be continued to be supplied to the wiring SL_j, even without connection of a latch circuit and the like to the wiring SL, by controlling a signal input to the decoder circuit.

The transistor 30 is turned off, and the transistors 31 and 32 are turned on in such a manner, whereby the wiring CL_j and the read circuit 2 are electrically connected to each other via the transistor 31 and the transistor 32. In accordance with the voltage of the reading signal supplied to the transistor 31, current flows into the wiring IL_j and the read circuit 2 from the transistor 31. Thus, data on the current characteristics of the transistor 31 in the pixel 35_(i, j) can be read out by the read circuit 2.

Furthermore, during Step 2, the transistor 30 may remain in an on state, and the reading signal may continue to be supplied to the wiring DL_j. In that case, for example, the potential at which the transistor 31 is turned on is once supplied to the wiring IL_j. After that, the wiring IL_j may be in a floating state. Consequently, the potential of the wiring IL_j is gradually increased. When the potential is set to the level at which the transistor 31 is turned off, that is, when the gate-source voltage of the transistor 31 is close to the threshold voltage of the transistor 31, the transistor 31 is turned off. As a result, a rise of the potential of the wiring IL_j is stopped. The potential of the wiring IL_j at that time, that is, the potential of a source of the transistor 31 may be read out by the read circuit 2. Consequently, the threshold voltage of the transistor 31 can be read out. Note that in the case where the potential of the source of the transistor 31 is read out, the potential just before the transistor 31 is turned off may be read out.

Here, as the data on current characteristics of the transistor 31, any data on variation in current characteristics of the transistors 31 among pixels is available. For example, it may be data on current values of the transistors 31, or may be data on the threshold voltages of the transistors 31. By reading out the current values, how at least one of the threshold voltages, the mobilities, the channel lengths, and the channel widths vary or deteriorate can be known from the current values. For example, in the case where current values are read out as the data, the amount of current depends on the reading signal that is input in Step 1.

Data on current characteristics of a transistor that can be read varies depending on a circuit configuration of the read circuit 2. With the above-described read circuits given as the specific configuration examples, data on current characteristics of the transistor can be obtained by selecting at least two kinds of data. Since these data are related with each other, variation in threshold voltages of the driving transistors can be corrected more accurately by obtaining a plurality of kinds of data.

Next, Step 3 in which a signal for black display is input to the selected row so that black display is obtained is described. The reading signal input in Step 1 is a signal that turns on the transistor 31. When the transistor 32 is turned off with this signal input, forward bias voltage is applied to the light-emitting element 34, which causes a light-emitting state of the light-emitting element 34. To prevent this, in Step 3, a signal for black display is input to the selected row that is selected.

To input the signal for black display, scanning is sequentially performed row by row from the first row to the m-th row again. However, the pixels in the rows other than the target row are not selected. That is, the selection signal is not supplied to the rows other than the target row, and the non-selection signal is supplied thereto.

As in Step 1, for example, in the case where the gate line driver circuit includes a shift register circuit in Step 3, scanning is sequentially performed from the first row to the m-th row. Row-by-row sequential scanning from the first row to the m-th row is performed only in the gate line driver circuit, and a selection signal is not supplied to all pixels from the gate line driver circuit. The selection signal is supplied only to the row in black display. Thus, a signal stored in pixels in the rows other than the row in black display is kept. Note that in the case where a decoder circuit or the like is used as the gate line driver circuit, an arbitrary row can be selected in an arbitrary order. Thus, in that case, the row-by-row sequential scanning from the first row to the m-th row is not necessarily performed in the gate line driver circuit. Without the scanning, only a predetermined row (the row in black display) may be instantly selected, and a signal for black display may be input to the pixels.

When the pixels in the i-th row are selected, a selection signal is input to the wiring GL_i that is the target row, and the transistor 30 is turned on. Since the signal for black display, which turns off the transistor 31, is input to the wiring DL_j, the signal is applied to the gate of the transistor 31, and the transistor 31 is turned off.

Note that at that time, the selection signal to turn on the transistor 32 is supplied to the wiring SL_i. As a result, a voltage at which the transistor 31 is turned off can be supplied between the gate and source of the transistor 31 through the wiring IL_j.

Here, the operational amplifier 6 used in the read circuit 2 operates so that the potential of the non-inverting input terminal is equal to the potential of the inverting input terminal. In the case where the wiring IL_j is electrically connected to the inverting input terminal of the operational amplifier 6, the potential of the IL_j can be controlled by the potential of the non-inverting input terminal. Therefore, also in the above, the potential of the wiring IL_j may be controlled by the read circuit 2.

After that, a non-selection signal to turn off the transistor 32 is supplied to the wiring SL_i to turn off the transistor 32. Similarly, a non-selection signal to turn off the transistor 30 is supplied to the wiring GL_i so that the transistor 30 is turned off. As described above, the non-light-emitting states of the pixels 35_(i, j) in the i-th row can be maintained from Step 3 to scanning of pixels in the next frame.

As shown in FIG. 47A, after Step 3, the display device in FIG. 42B terminates one frame period and starts display of the next frame. Here, in accordance with the data on the current characteristics of the transistor 31 that has been read out in Step 2, a video signal for correcting the variation in the current characteristics of the transistors 31 can be produced and input to a corresponding pixel. As a result, variation in transistors or adverse effects due to deterioration can be reduced.

Figure 47B:
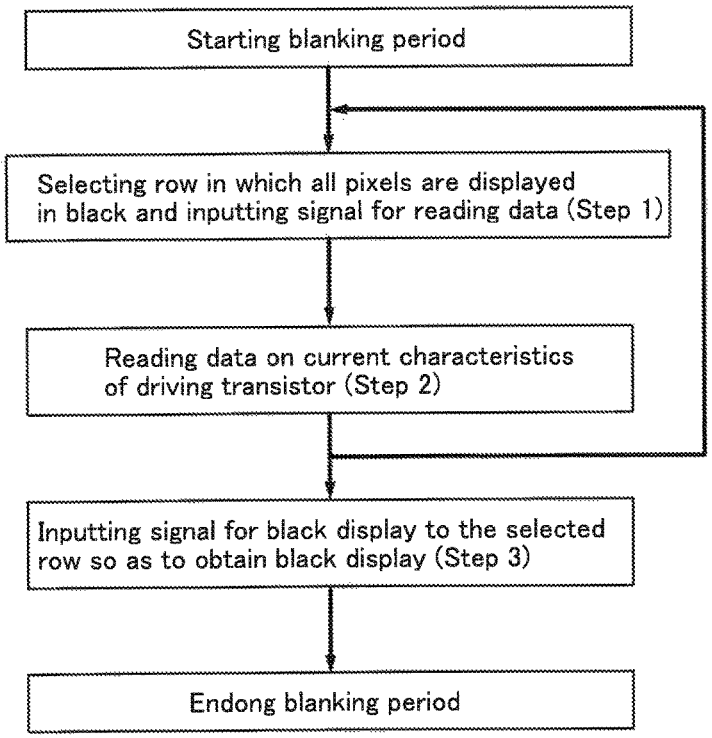

Note that in the case where there are a plurality of rows in each of which all the pixels are displayed in black, other than the i-th row, as shown in FIG. 47B, Step 1 and Step 2 may be repeatedly performed in the blanking period. Alternatively, in one frame period, Step 1 to Step 3 may be performed on only one of the rows as a target. For the other rows, Step 1 to Step 3 may be performed in the next or later frame period.

As for a row in which all the pixels have never been displayed in black since display of an image was started, for example, it is preferable that data on the current characteristics of the transistors 31 in that row be read out on at least one of the following occasions: when the power of the display device is turned off; just after the power of the display device is turned on; when the display device is not used in a predetermined period; at late-night; at early-morning; and the like.

The variation in current characteristics of the driving transistors among pixels of the display device of this embodiment can be corrected by the above-described driving method. In this driving method, the variation in current characteristics of the driving transistors can be corrected in parallel with the display operation of the display device.

A display device with small display unevenness can be provided. A display device capable of performing clear display can be provided. A semiconductor device capable of reducing adverse effects due to variation in transistor characteristics can be provided. A semiconductor device capable of reducing adverse effects due to variation in the threshold voltages of transistors can be provided. A semiconductor device capable of reducing adverse effects due to variation in the mobilities of transistors can be provided.

In a product including the display device described in this embodiment, variation in luminance of pixels of the product can be corrected while display inspection of the product is performed in pre-shipment inspection. Thus, the period of the pre-shipment inspection of the product can be shortened, resulting in cost reduction of the product.

With regard also to a product that has been shipped, the above-described driving method of the display device is performed each time the power is turned on and an image is displayed. Thus, variation in luminance due to deterioration over time and the like after the shipment of the product can be automatically corrected. This enables a longer product lifetime.

Note that in the above-described driving method of the display device, data on the current characteristics is read out in the blanking period; however, the driving method of the display device of this embodiment is not necessarily limited thereto. For example, the data on the current characteristics may be read out when the display screen becomes dark and all the pixels are displayed in black, or when a black picture is inserted so as to improve moving characteristics.

Figure 46A:
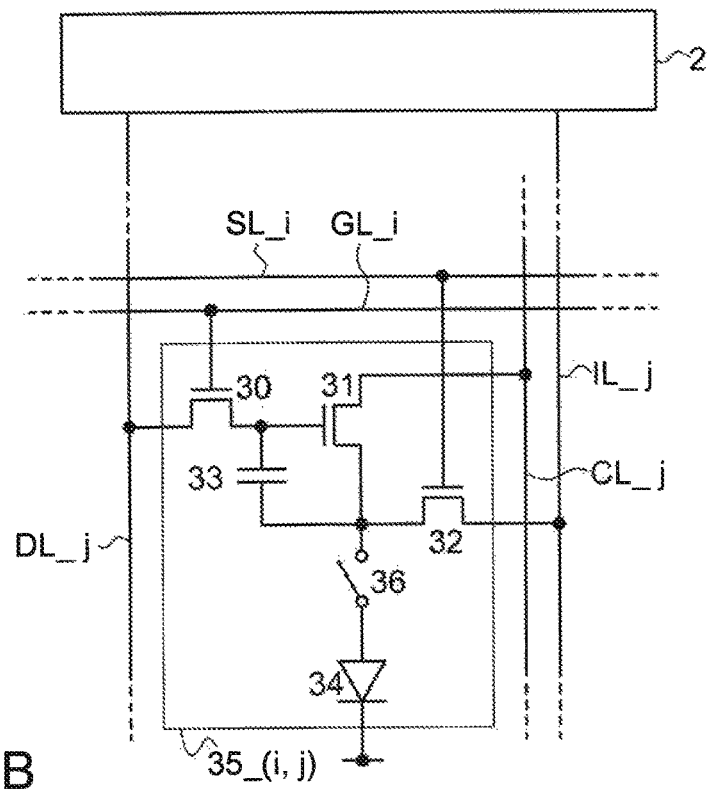
FIGS. 46A and 46B are block diagrams showing examples of a pixel of one embodiment of the present invention.
Figure 46B:
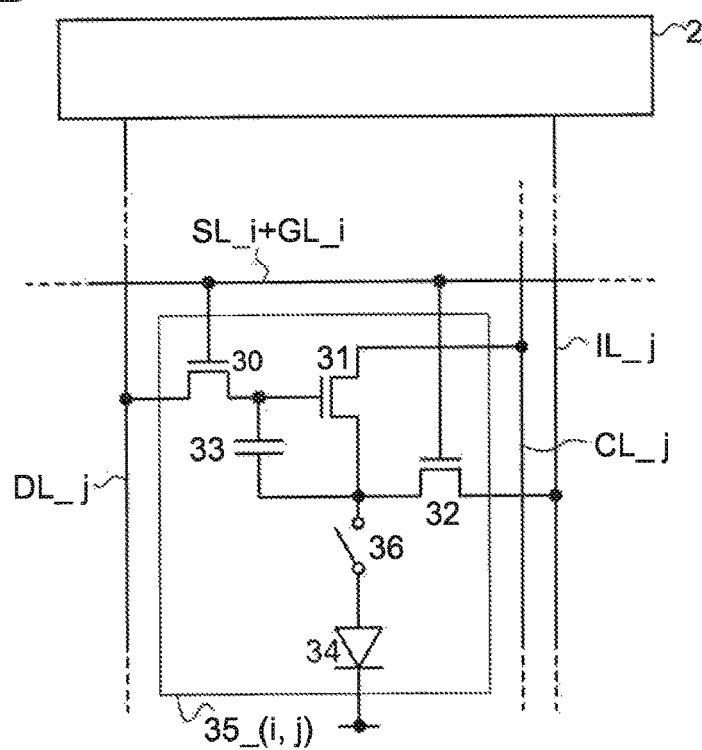

The pixel structure of the display device of this embodiment is not limited to that shown in FIG. 44A. For example, in the pixel 35_(i, j) in FIG. 44A, a switch 36 may be provided between the light-emitting element 34 and the transistor 31. FIGS. 46A and 46B show circuit diagrams in that case. FIG. 46A shows the case where the switch 36 is provided in the structure of FIG. 44A, and FIG. 46B shows the case where the switch 36 is provided in the structure of FIG. 44B. The switch 36 is turned off in Step 1 and Step 2, so that the non-light-emitting state of the light-emitting element 34 can be surely maintained during Step 1 and Step 2.

Figure 42A:
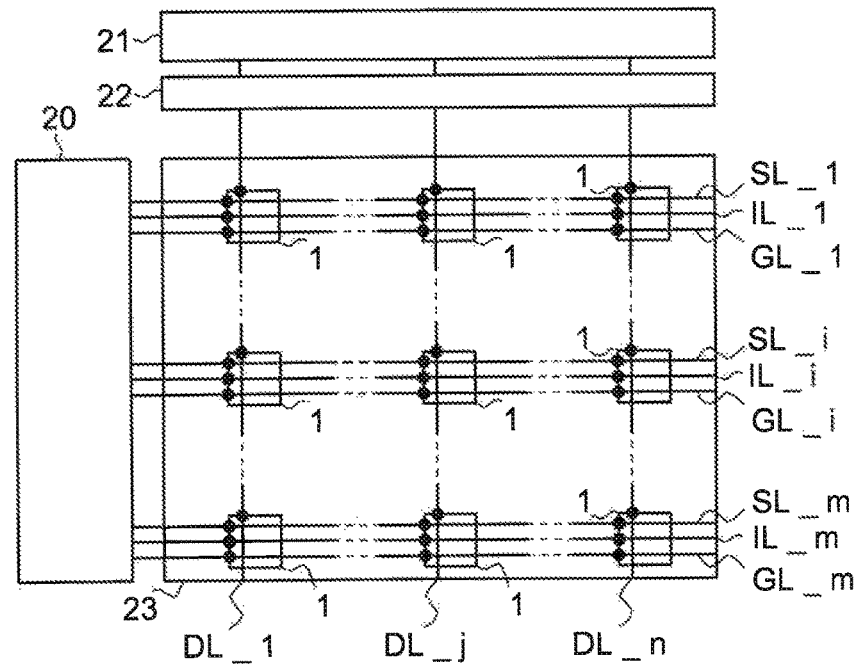
FIGS. 42A and 42B are block diagrams showing examples of a display portion of a display device of one embodiment of the present invention.
Figure 42B:
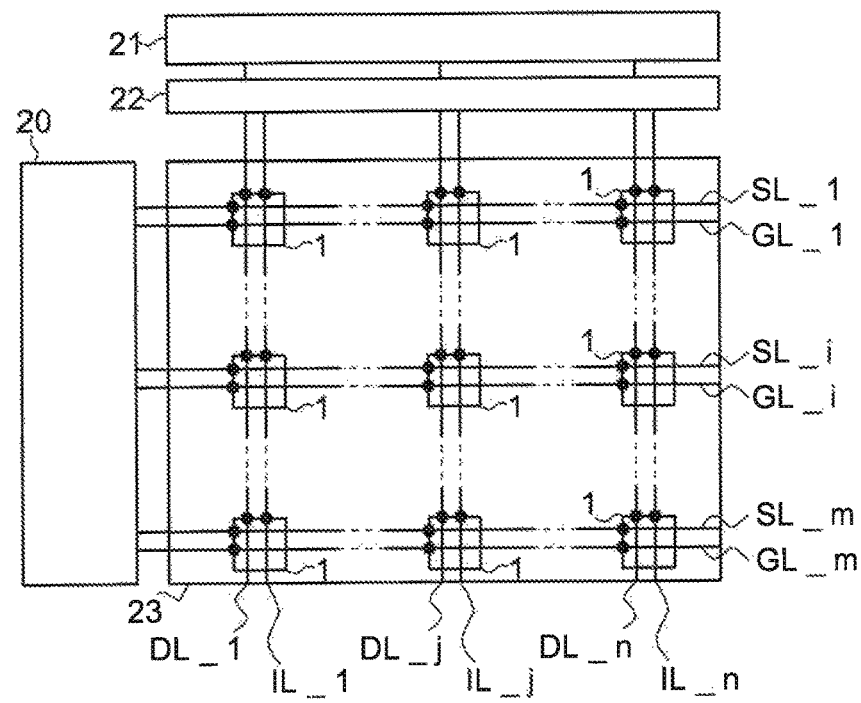
Figure 43A:
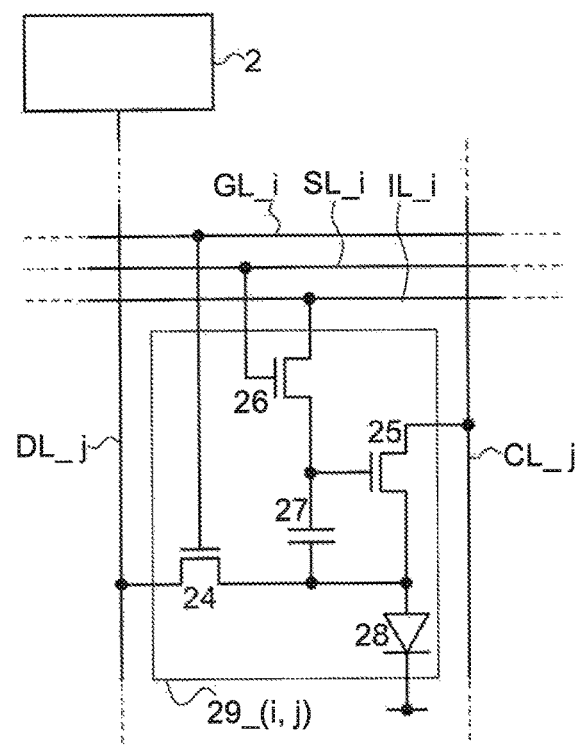
FIGS. 43A and 43B are block diagrams showing examples of a pixel of one embodiment of the present invention.

Configurations shown in FIG. 42A and FIG. 43A in each of which the wiring IL is not connected to the read circuit 2 may be used, for example. Alternatively, a configuration shown in FIG. 43B in which the wirings GL and SL shown in FIG. 43A are combined into one wiring SL_i+GL_i may be used.

Structure Example for Reading Current Characteristics from Pixels with Specific Hue In the driving method of a display device shown in FIG. 42B and FIG. 44A, data on the current characteristics of all the pixels in a selected row is collectively read out; however, the driving method of a display device of this embodiment is not limited thereto, and data on current characteristics can be read out from a specific pixel in the selected row. For example, data on the current characteristics can be read out from a pixel in the same row and in a specific column, or a pixel displaying a specific hue in the same column.

Figure 48:
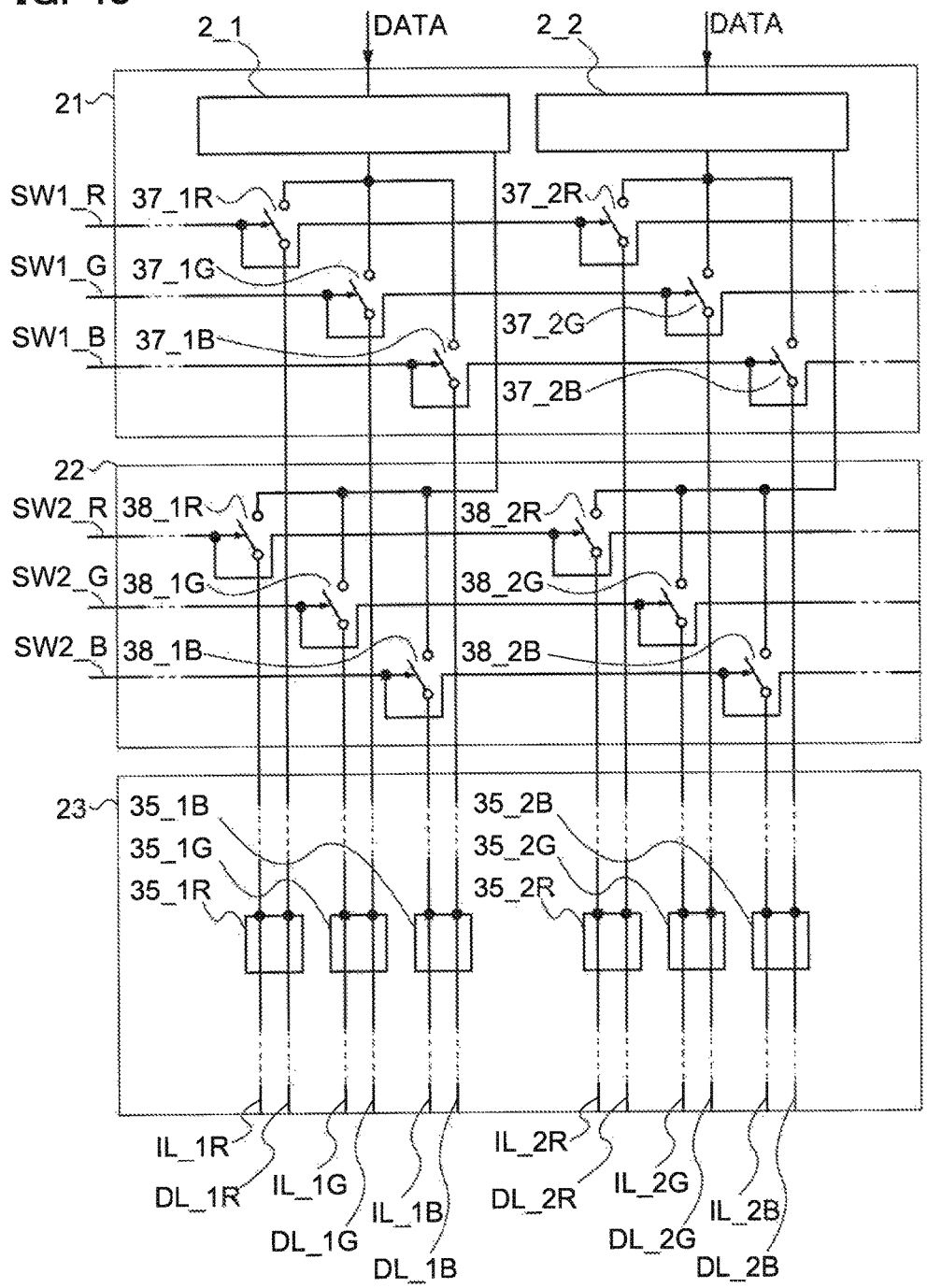
FIG. 48 is a circuit diagram of a configuration example of a display portion and its peripheral circuits in a display device of one embodiment of the present invention.

FIG. 48 illustrates an example of a structure of the driver circuit 21, the circuit portion 22, and the pixel portion 23, in which data on current characteristics can be read out from pixels displaying a specific hue in the same row. FIG. 48 illustrates an example in which each of the wiring DL and the wiring IL is divided into three columns; however, one embodiment of the present invention is not limited thereto. Those wirings may be divided for more columns. In the example illustrated in FIG. 48, the read circuit 2 is provided in the driver circuit 21, but one embodiment of the present invention is not limited thereto.

The display device in FIG. 48 has a structure in which a pixel exhibiting red, a pixel exhibiting green, and a pixel exhibiting blue are provided in the same row in the pixel portion 23 to form one pixel unit that exhibits one color. In the driver circuit 21, a kind of a video signal or a reading signal for one unit is supplied, and is divided into signals corresponding to the pixels of red, green, and blue. In the circuit portion 22, one read circuit 2 is provided for one unit.

To a pixel 35_1R exhibiting red, a signal is input from the driver circuit 21 via a wiring DL_1R and a switch 37_1R, and the pixel 35_1R is electrically connected to a read circuit 2_1 via a wiring IL_1R and a switch 38_1R. Similarly, to a pixel 35_1G exhibiting green, a signal is input from the driver circuit 21 via a wiring DL_1G and a switch 37_1G, and the pixel 35_1G is electrically connected to the read circuit 2_1 via a wiring IL_1G and a switch 38_1G. Similarly, to a pixel 35_1B exhibiting blue, a signal is input from the driver circuit 21 via a wiring DL_1B and a switch 37_1B, and the pixel 35_1B is electrically connected to the read circuit 2_1 via a wiring IL_1B and a switch 38_1B.

A pixel 35_2R, a pixel 35_2G, and a pixel 35_2B provided in the adjacent column of the pixel 35_1R, the pixel 35_1G, and the pixel 35_1B have structures similar to those of the pixel 35_1R, the pixel 35_1G, and the pixel 35_1B. In this case, to the pixel 35_2R exhibiting red, a signal is input from the driver circuit 21 via a wiring DL_2R and a switch 37_2R, and the pixel 35_2R is electrically connected to a read circuit 2_2 via a wiring IL_2R and a switch 38_2R. Similarly, to a pixel 35_2G exhibiting green, a signal is input from the driver circuit 21 via a wiring DL_2G and a switch 37_2G, and the pixel 35_2G is electrically connected to the read circuit 2_2 via a wiring IL_2G and a switch 38_2G. Similarly, to a pixel 35_2B exhibiting blue, a signal is input from the driver circuit 21 via a wiring DL_2B and a switch 37_2B, and the pixel 35_2B is electrically connected to the read circuit 2_2 via a wiring IL_2B and a switch 38_2B.

The switch 37_1R and a switch 37_2R are controlled by a wiring SW1_R which extends in the row direction. The switch 37_1G and a switch 37_2G are controlled by a wiring SW1_G which extends in the row direction. The switch 37_1B and a switch 37_2B are controlled by a wiring SW1_B which extends in the row direction. The switch 38_1R and a switch 38_2R are controlled by a wiring SW2_R which extends in the row direction. The switch 38_1G and a switch 38_2G are controlled by a wiring SW2_G which extends in the row direction. The switch 38_1B and a switch 38_2B are controlled by a wiring SW2_B which extends in the row direction.

Use of the display device with such a structure enables data on the current characteristics to be read out from the pixels displaying a specific hue in the same row. For example, a reading signal is input only to pixels exhibiting red in the same row (the pixels 35_1R and 35_2R in FIG. 48), and data on the current characteristics can be read out only from the pixels exhibiting red in the same row.

With such a structure, a circuit which has been provided in one to one correspondence (e.g., a read circuit or the like) with a pixel may be provided for one unit including three pixels, so that an occupation area of the circuit can be reduced. In FIG. 48, one unit includes three pixels; however, one embodiment of the present invention is not limited thereto. One unit may include more pixels.

Note that in the display device in FIG. 48, the switches are provided for both of the driver circuit 21 and the circuit portion 22 so that processing can be separately performed per pixel with a specific hue; however, the display device of this embodiment is not limited thereto. The switch may be provided for only one of the driver circuit 21 and the circuit portion 22. Furthermore, the wirings which are electrically connected to the same pixel, such as the wiring SW1_R or the wiring SW2_R, may be electrically connected, or its wiring signals may be synchronized.

Configuration Example of Output Control Circuit

Figure 49A:
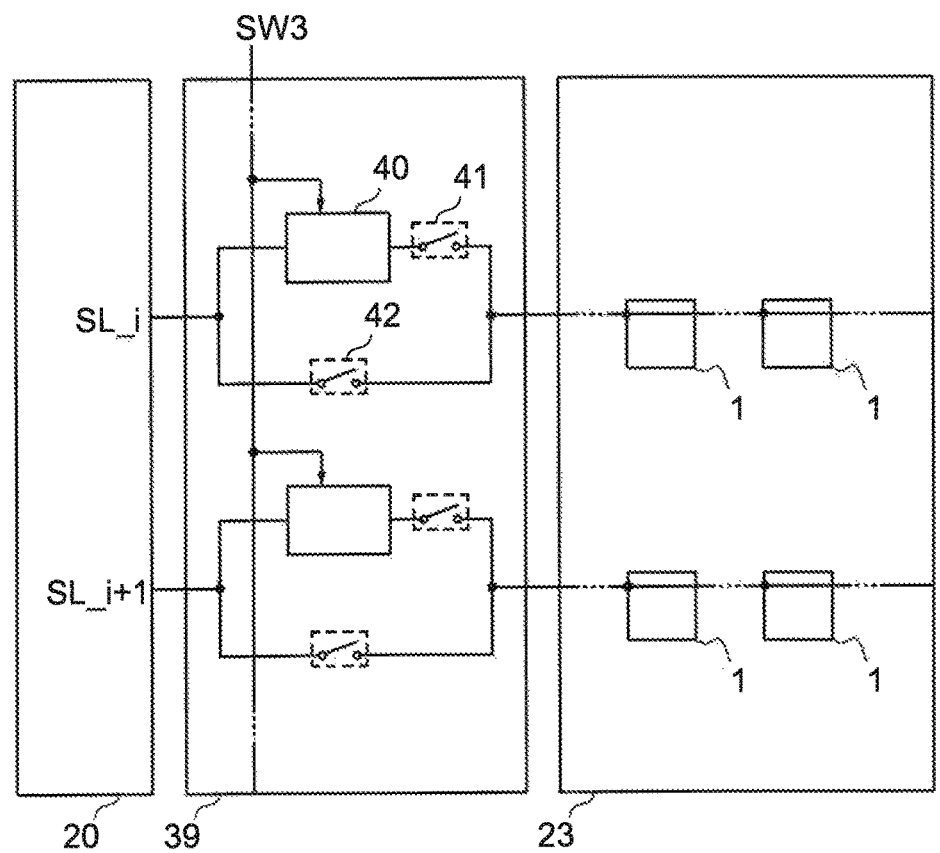
FIGS. 49A and 49B are circuit diagrams of a configuration example of a display portion and its peripheral circuits in a display device of one embodiment of the present invention.
Figure 49B:
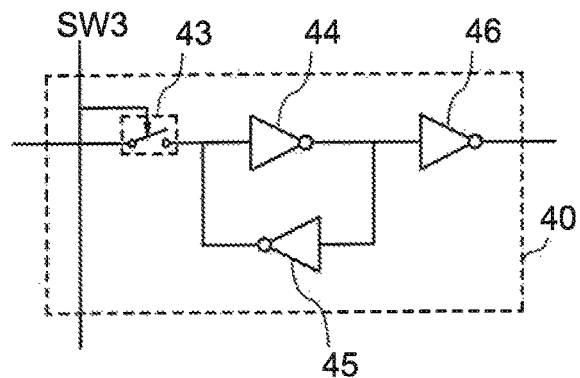

In the driving method of the display device shown in FIG. 42B and FIG. 44A, data on the current characteristics is read out by sequentially performing scanning from the first row and selecting a row in which all the pixels are displayed in black. When such a driving method is employed, an output control circuit which controls a signal output from the driver circuit 20 is preferably provided. An example of a structure of the output control circuit is described with reference to FIGS. 49A and 49B. FIG. 49A shows the driver circuit 20, an output control circuit 39, and the pixel portion 23 of the display device. FIG. 49B shows an example of a structure of a latch circuit 40 shown in FIG. 49A.

The display device in FIG. 49A includes the output control circuit 39 between the driver circuit 20 and the pixel portion 23. The wiring SL_i electrically connected to the driver circuit 20 is branched into two circuits in the output control circuit 39, and one extends in the row direction via the latch circuit 40 and a switch 41, and the other extends in the row direction via a switch 42. The branched wirings SL_i are joined via the switch 41 and the switch 42, and the wiring SL_i extends to the pixel portion 23 in the row direction.

As shown in FIG. 49B, the latch circuit 40 includes a switch 43, an inverter 44, an inverter 45, and an inverter 46. One terminal of the switch 43 is electrically connected to the wiring SL_i and the other terminal is electrically connected to an input terminal of the inverter 44 and an output terminal of the inverter 45. An output terminal of the inverter 44 is electrically connected to an input terminal of the inverter 45 and an input terminal of the inverter 46. An output terminal of the inverter 46 is electrically connected to one terminal of the switch 41. The switch 43 is controlled by the wiring SW3 which extends in the column direction.

In a normal display mode, the switch 41 is turned off and the switch 42 is turned on, so that a signal is output from the driver circuit 20. When a row in which all the pixels are displayed in black is selected, the switch 41 is turned on and the switch 42 is turned off, whereby a signal is output from the driver circuit 20.

Furthermore, when the row in which all the pixels are displayed in black is selected in the blanking period, the switch 43 is turned on by the wiring SW3. Accordingly, in Step 1, a signal input to the wiring SL_i can be held in the latch circuit 40. Thus, when the wiring SL_i+1 is selected and the signal input to the wiring SL_i from the driver circuit 20 is stopped, the transistor 32 can be kept turned on by the signal held in the latch circuit 40 via the wiring SL_i.

In the display device in FIGS. 49A and 49B, an example is illustrated in which a signal is output from the wiring SL via the output control circuit 39; however, the display device of this embodiment is not limited thereto. For example, a signal may be output from the wiring GL, in addition to the wiring SL, via the output control circuit 39.

In the display device of this embodiment, in the case of using the wiring GL, the above driving method can be used without holding a signal using the latch circuit 40; thus, a structure without the latch circuit 40 may be employed.

In the display device of this embodiment, the output control circuit 39 is not necessarily provided. For example, in the case where a signal of the driver circuit 20 can be selectively output to an arbitrary row by using a decoder or the like, the output control circuit 39 is not necessarily provided.

Thus, part or the whole of this embodiment can be freely combined with, applied to, or replaced with part or the whole of another embodiment.

Embodiment 2

Modification Example 1 of Display Device

In this embodiment, a structure of a display device and a driving method thereof which are different from those described in Embodiment 1 will be described.

FIG. 43A shows a pixel structure of the display device of this embodiment. The display device of this embodiment includes, as in the display device in FIG. 42B, the pixel portion 23 including (m×n) pixels 29_(i, j), a variety of peripheral circuits, and a variety of wirings. The same numerals and symbols are used for the peripheral circuits and the wirings.

Because the pixel structure is different from that in Embodiment 1, the structures of the peripheral circuit and the wiring are partly different from those in FIG. 42B. Specifically, as shown in FIG. 42A and FIG. 43A, the different points are that the wiring IL extends in the row direction and the circuit portion 22 is not electrically connected to the wiring IL. Note that the pixel 1 in FIG. 42A is regarded as the pixel 29_(i, j).

FIG. 43A shows a structure of the pixel 29_(i, j) in the i-th row and the j-th column (i is an integer greater than or equal to 1 and less than or equal to m, and j is an integer greater than or equal to 1 and less than or equal to n). The pixel 29_(i, j) includes a transistor 24, a transistor 25, a transistor 26, a light-emitting element 28, and a capacitor 27. Note that these elements included in the pixel 29_(i, j) are electrically connected to the wiring GL_i, the wiring SL_i, the wiring DL_j, the wiring CL_j, and a wiring IL_i. Note that in FIG. 43A, the wiring CL extends in the column direction and the wiring IL extends in the row direction; however the present invention is not limited to this, and the directions of the wirings may be changed as appropriate.

A specific connection relation in the pixel 29_(i, j) is as follows. A gate of the transistor 24 is electrically connected to the wiring GL_i, one of a source and a drain of the transistor 24 is electrically connected to the wiring DL_j, and the other of the source and the drain of the transistor 24 is electrically connected to one of electrodes of the light-emitting element 28 (hereinafter also referred to as a pixel electrode). A gate of the transistor 25 is electrically connected to one of a source and a drain of the transistor 26, one of a source and a drain of the transistor 25 is electrically connected to the wiring CL_j, and the other of the source and the drain of the transistor 25 (hereinafter also referred to as the source of the transistor 25) is electrically connected to the one of electrodes of the light-emitting element 28. A gate of the transistor 26 is electrically connected to the wiring SL_i, and the other of the source and the drain of the transistor 26 is electrically connected to the wiring IL_i. A common potential is supplied to the other of the electrodes (hereinafter also referred to as a common electrode) of the light-emitting element 28.

The wiring DL_j is electrically connected to the read circuit 2 included in the circuit portion 22. One embodiment of the present invention is not limited thereto, and the read circuit 2 may be provided in the driver circuit 21.

One of electrodes of the capacitor 27 is electrically connected to the one of the source and the drain of the transistor 26 and the gate of the transistor 25. The other of the electrodes of the capacitor 27 is electrically connected to the other of the source and the drain of the transistor 25, the other of the source and the drain of the transistor 24, and the pixel electrode of the light-emitting element 28. With the capacitor 27 provided as described above, more charge can be held in the gate of the transistor 25, and a holding period of image data can be made longer.

Note that the capacitor 27 is not necessarily provided. For example, a high parasitic capacitance of the transistor 25 can be an alternative to the capacitor 27.

The wiring CL functions as a high potential power supply line which supplies current to the light-emitting element 28. Furthermore, the potential of the wiring IL may be changed in an analog manner.

Figure 43B:
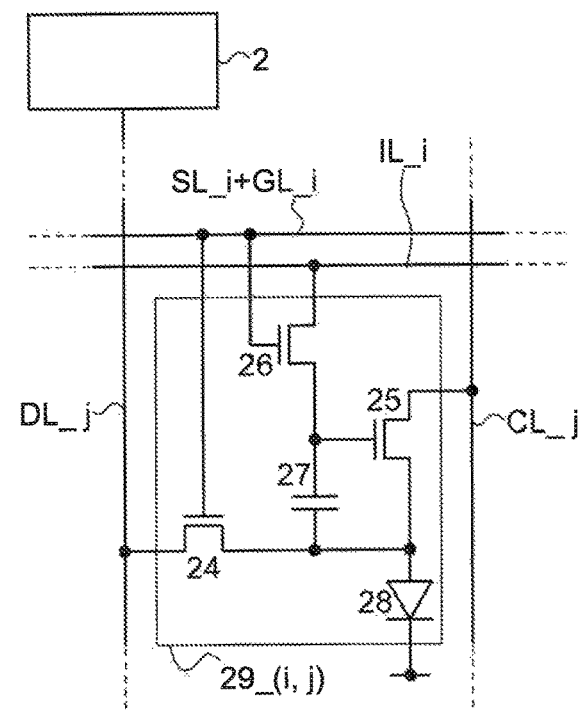

Note that the wiring GL and the wiring SL may be combined into one wiring. FIG. 43B shows a circuit diagram in that case. In the case where the wiring GL and the wiring SL are combined into one wiring, the wiring acts similarly to the case where the wiring GL and the wiring SL are brought into an on state or an off state at the same time. Thus, in the case where a driving method in which the wiring GL and the wiring SL are brought into an on state or an off state at the same time is employed, the wiring GL and the wiring SL can be combined into one wiring.

Note that the description on the transistors 30 to 32 can be referred to for the structures of the transistors 24 to 26. Furthermore, the description on the light-emitting element 34 can be referred to for the structure of the light-emitting element 28.

In this embodiment, the wiring DL is electrically connected to the read circuit 2 and the driver circuit 21 in FIG. 1A and FIG. 42A. As a specific configuration example, a configuration in which the read circuit 2d and the driver circuit 21 are electrically connected to each other is described.

When an image is displayed, the switches 8, 9, and 12 are turned on and the switches 10, 11, and 13 are turned off, whereby a video signal is output from the driver circuit 21 to the wiring DL_j.

This embodiment is not limited to the above-described description. For example, the switches 8, 9, and 13 are turned on and the switches 10, 11, and 12 are turned off to perform display of an image.

When an image is displayed, the operational amplifier 7 operates so that the potential of the non-inverting input terminal is equal to the potential of the inverting input terminal. Thus, the potential of the inverting input terminal of the operational amplifier 7, that is, the potential of the wiring DL_j can be controlled by the potential of the non-inverting input terminal.

In the blanking period, the switches 10, 11, and 12 are turned on and the switches 8, 9, and 13 are turned off to input a reading signal from the wiring DL_j to the read circuit 2d.

The read circuit 2d functions as an integrator circuit when the switches 11 and 13 are on and the switches 8 to 10 and the switch 12 are off. Thus, the read circuit 2d can read out the integral value of the current passing through the wiring DL_j.

The read circuit 2d functions as a current-voltage converter circuit when the capacitor 14 is replaced with a resistor in the above-described switching. Thus, the read circuit 2d converts the current value of the wiring DL_j into a voltage value to be read out.

Since the read circuit 2d can read out a plurality of kinds of data as data on current characteristics of the transistor, variation in threshold voltages can be corrected more accurately. In addition, the read circuit 2d carries out a function of reading a plurality of kinds of data by switching the connection of the operational amplifier 7.

Thus, the accuracy of correcting variation in the threshold voltages can be increased with little increase in the area occupied by the read circuit 2. Accordingly, the area occupied by the driver circuit portion where the read circuit 2 is provided can be reduced, so that the frame of the display device can be narrowed.

As an example of the driving method of the display device having the pixel structure shown in FIG. 43A, operation of the display device in the address period is described with reference to FIGS. 47A and 47B.

First, the wiring GL_i and the wiring SL_i are selected, so that a voltage between the wiring IL_i and the wiring DL_j is input to the capacitor 27, i.e., between the gate and the source of the transistor 25. At this time, the potential of the wiring DL_j changes in accordance with a video signal.

At that time, the wiring DL_j has a potential such that the light-emitting element 28 does not emit light regardless of the video signal. For example, the potential of the wiring DL_j is equal to the potential of the cathode of the light-emitting element 28 even in the case of the highest potential.

The potential of the wiring IL_i becomes lower since the potential of the wiring DL_j is low. For example, the potential of the wiring IL_i is lower than that of the wiring CL_j.

Note that it is not necessary that the wiring GL_i and the wiring SL_i be selected at the same time.

The wiring GL_i and the wiring SL_i are not selected, so that current corresponding to the voltage between the gate and the source of the transistor 25 is supplied from the transistor 25 to the light-emitting element 28, and display operation is performed.

Note that it is not necessary that the wiring GL_i and the wiring SL_i be not selected at the same time.

Such operation is sequentially performed while each row is selected and scanned. Thus, operation of the address period is terminated.

As an example of the driving method of the display device having the pixel structure shown in FIG. 43A, a method for correcting variation in current characteristics in the blanking period is described with reference to FIGS. 47A and 47B. Note that explanation is made on the case where all the pixels 29_(i, j) in the i-th row are displayed in black.

When the blanking period starts, as shown in FIG. 47A, scanning is sequentially performed row by row from the first row to the m-th row. However, the pixels in the rows other than the target row are not selected. That is, the selection signal is not supplied to the rows other than the target row, and the non-selection signal is supplied thereto.

First, Step 1 in which the row in which all the pixels are displayed in black is selected and a reading signal is input thereto is described. When the pixels in the i-th row are selected, a selection signal is input to the wiring SL_i, and the transistor 26 is turned on. When the transistor 26 is turned on, the wiring IL_i and the gate of the transistor 25 are electrically connected to each other, and the potential of the wiring IL_i is supplied to the gate of the transistor 25.

After that, or at the same time, the selection signal is input to the wiring GL_i, and the transistor 24 is turned on. When the transistor 24 is turned on, the wiring DL_j and the source of the transistor 25 are electrically connected to each other. Here, the reading signal is supplied to the wiring DL_j, so that the potential difference between the gate and the source of the transistor 25 is larger than the threshold voltage of the transistor 25, and the transistor 25 can be turned on.

At that time, the potential of the wiring DL_j is preferably lower than the common potential, or at the same level as the common potential. The potential of the wiring DL_j is set as described above, so that reverse bias voltage is applied to the light-emitting element 28 or bias voltage is not applied to the light-emitting element 28. Thus, the black display state of the pixels in the i-th row can be maintained. Furthermore, even if forward bias voltage is applied to the light-emitting element 28 so that the black display state of the pixels in the i-th row can be maintained at least until Step 3, the potential difference between the wiring DL_j and the common potential can be suppressed to extremely small. The extremely small potential difference is preferably approximately several volts, for example, 2 volts or lower, further preferably 1 volt or lower. The current flowing into the transistor 25 does not flow into the light-emitting element 28, and becomes ready to flow into the wiring DL_j.

The signal with which the transistor 24 is kept turned off is input to the wiring GL so that the reading signal is not input to the rows other than the i-th row.

Next, Step 2 in which data on current characteristics of the transistor 25 (driving transistor) is read out is described. After Step 1, scanning shifts from the i-th row to the (i+1)th row, and the supply of the selection signal that has been input to the wiring SL_i is stopped, and the transistor 26 is turned off. Thus, the potential of the wiring IL_i that has been input to the gate of the transistor 25 in Step 1 is maintained.

In contrast, the transistor 24 needs to be turned on during Step 2. Thus, as in Step 1, the signal which makes the transistor 24 in an on state needs to be continuously input to the wiring GL_i also in Step 2. For example, a latch circuit is connected to the wiring GL so that the input signal at the time of Step 1 is held also in Step 2.

In the case where a decoder circuit and the like are used in the gate line driver circuit, the selection signal can be continued to be supplied to the wiring GL_i, even without connection of a latch circuit and the like to the wiring GL, by controlling a signal input to the decoder circuit.

Note that the transistor 26 may be on during Step 2.

The transistor 26 is turned off, and the transistors 24 and 25 are turned on in such a manner, so that the wiring CL_j and the read circuit 2 are electrically connected to each other via the transistor 25 and the transistor 24. In accordance with the voltage of the reading signal supplied to the transistor 25, current flows into the wiring DL_j and the read circuit 2 from the transistor 25. Thus, data on the current characteristics of the transistor 25 in the pixel 29_(i, j) can be read out by the read circuit 2.

Also during Step 2, the transistor 26 may remain in an on state. In that case, for example, the potential at which the transistor 25 is turned on is once supplied to the wiring DL_j. After that, the wiring DL_j may be in a floating state. Consequently, the potential of the wiring DL_j is gradually increased. Then, when the potential is set to the level at which the transistor 25 is turned off, that is, when the gate-source voltage of the transistor 25 is close to the threshold voltage of the transistor 25, the transistor 25 is turned off. As a result, a rise of the potential of the wiring DL_j is stopped. The potential of the wiring DL_j at that time, that is, the potential of a source of the transistor 25 may be read out by the read circuit 2. Consequently, the threshold voltage of the transistor 25 can be read out. Note that in the case where the potential of the source of the transistor 25 is read out, the potential just before the transistor 25 is turned off may be read out.

As the data on the current characteristics of the transistor 25, any data on variation in the current characteristics of the transistors 25 among pixels may be taken. For example, it may be the current value of the transistor 25, or may be the threshold voltage of the transistor 25.

Next, Step 3 in which a signal for black display is input to the selected row so as to obtain black display is described. The reading signal input in Step 1 is a signal that turns on the transistor 25. When the transistor 24 is turned off with this signal input, forward bias voltage is applied to the light-emitting element 28, which causes a light-emitting state of the light-emitting element 28.

To prevent this, scanning is sequentially performed row by row from the first row to the m-th row. However, the pixels in the rows other than the target row are not selected. That is, the selection signal is not supplied to the pixels in the rows other than the target row, and the non-selection signal is supplied thereto. When the wiring GL_i that is the target row is selected, the signal for black display, which makes the transistor 25 turned off is input to the wiring DL_j. The signal is supplied to the source of the transistor 25, so that the potential difference between the gate and the source of the transistor 25 is smaller than the threshold voltage of the transistor 25, and the transistor 25 can be turned off.

Note that at that time, a selection signal to turn on the transistor 26 is supplied to the wiring SL_i. As a result, a voltage at which the transistor 25 is turned off can be supplied between the gate and the source of the transistor 25.

As described above, the non-light-emitting state of the pixels 29_(i, j) in the i-th row from Step 3 to scanning of pixels in the next frame can be maintained.

As shown in FIG. 47A, after Step 3, the display device in FIG. 42A terminates one frame period and starts display of the next frame. Here, in accordance with the data on the current characteristics of the transistors 25 that has been read out in Step 2, a video signal for correcting the variation in the current characteristics of the transistors 25 can be produced and input to a corresponding pixel. As a result, variation in transistors or adverse effects of deterioration can be reduced.

Note that in the case where there are a plurality of rows in each of which all the pixels are displayed in black, other than the i-th row, as shown in FIG. 47B, Step 1 and Step 2 may be repeatedly performed in the blanking period. Alternatively, in one frame period, Step 1 to Step 3 may be performed on only one of the rows as a target. For the other rows, Step 1 to Step 3 may be performed in the next or later frame period.

As for a row in which all the pixels have never been displayed in black since the display of an image was started, for example, it is preferable that data on the current characteristics of the transistors 25 in that row be read out on the occasion of turning off the power of the display device.

The variation in current characteristics of the driving transistors among pixels of the display device of this embodiment can be corrected by the above-described driving method. In this driving method, the variation in current characteristics of the driving transistors can be corrected in parallel with the display operation of the display device.

Figure 50A:
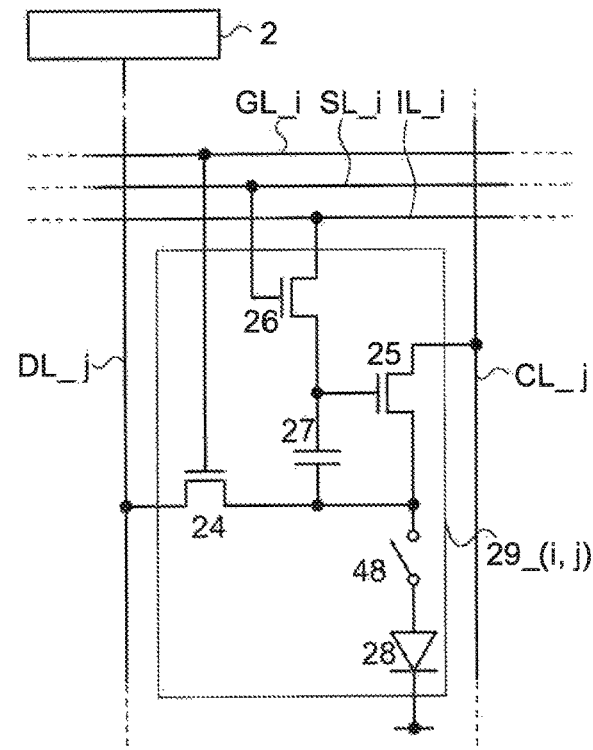
FIGS. 50A and 50B are block diagrams showing examples of a pixel of one embodiment of the present invention.
Figure 50B:
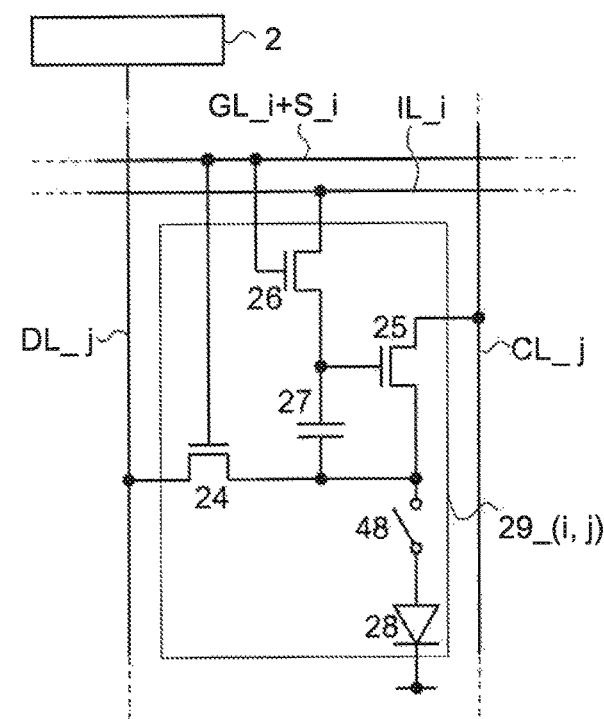

The pixel structure of the display device of this embodiment is not limited to that shown in FIG. 43A. For example, in the pixel 29_(i, j) in FIG. 43A, a switch 48 may be provided between the light-emitting element 28 and the transistor 25. FIGS. 50A and 50B show circuit diagrams in that case. FIG. 50A shows the case where the switch 48 is provided in the structure of FIG. 43A, and FIG. 50B shows the case where the switch 48 is provided in the structure of FIG. 43B. The switch 48 is turned off during Step 1 and Step 2, so that the non-light-emitting state of the light-emitting element 28 can be surely maintained in Step 1 and Step 2.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

Embodiment 3

Modification Example 2 of Display Device

In this embodiment, a structure of a display device and a driving method thereof which are different from those described in Embodiment 1 are described with reference to FIGS. 51A and 51B.

Figure 51A:
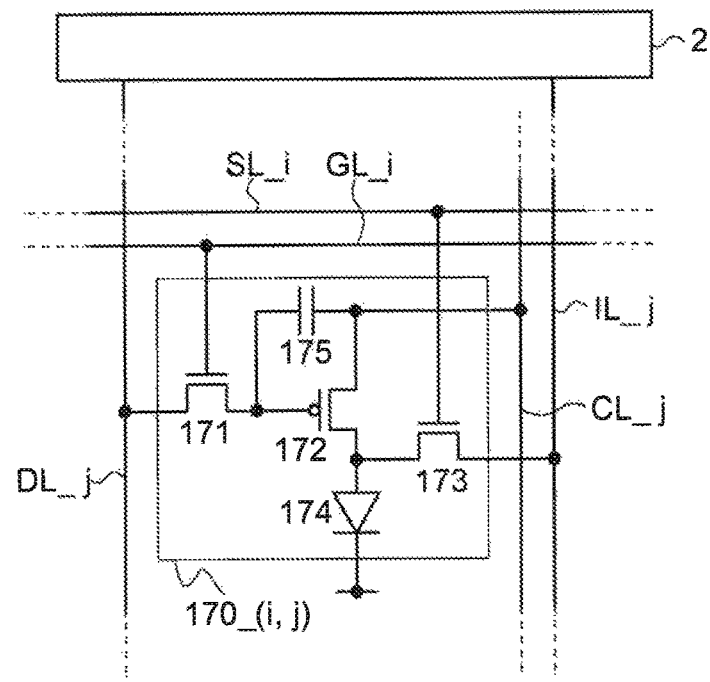
FIGS. 51A and 51B are block diagrams showing examples of a pixel of one embodiment of the present invention.

FIG. 51A shows a pixel structure of the display device of this embodiment. The display device of this embodiment includes, as in the display device in FIG. 42B, the pixel portion 23 including (m×n) pixels 170, a variety of peripheral circuits, and a variety of wirings. The same numerals and symbols are used for the peripheral circuits and the wirings. Note that the pixel 1 in FIG. 42B is regarded as the pixel 170_(i, j).

FIG. 51A shows a structure of the pixel 170_(i, j) in the i-th row and the j-th column (i is an integer greater than or equal to 1 and less than or equal to m, and j is an integer greater than or equal to 1 and less than or equal to n). The pixel 170_(i, j) includes an n-channel transistor 171, a p-channel transistor 172, an n-channel transistor 173, a light-emitting element 174, and a capacitor 175. Note that these elements included in the pixel 170_(i, j) are electrically connected to the wiring GL_i, the wiring SL_i, the wiring DL_j, the wiring CL_j, and the wiring IL_j.

A specific connection relation in the pixel 170_(i, j) is as follows. A gate of the transistor 171 is electrically connected to the wiring GL_i, one of a source and a drain of the transistor 171 is electrically connected to the wiring DL_j, and the other of the source and the drain of the transistor 171 is electrically connected to a gate of the transistor 172. One of a source and a drain of the transistor 172 is electrically connected to one of a source and a drain of the transistor 173 and one of electrodes of the light-emitting element 174 (hereinafter also referred to as a pixel electrode), and the other of the source and the drain of the transistor 172 (hereinafter also referred to as the source of the transistor 172) is electrically connected to the wiring CL_j. A gate of the transistor 173 is electrically connected to the wiring SL_i and the other of the source and the drain of the transistor 173 is electrically connected to the wiring IL_j. A common potential is supplied to the other of the electrodes (hereinafter also referred to as a common electrode) of the light-emitting element 174.

The wiring IL_j is electrically connected to the read circuit 2 included in the circuit portion 22. One embodiment of the present invention is not limited thereto, and the read circuit 2 may be provided in the driver circuit 21.

One of electrodes of the capacitor 175 is electrically connected to the other of the source and the drain of the transistor 171 and the gate of the transistor 172. The other of the electrodes of the capacitor 175 is electrically connected to the other of the source and the drain of the transistor 172. With the capacitor 175 provided as described above, more charge can be held in the gate electrode of the transistor 172, and a holding period of image data can be made longer.

Note that the capacitor 175 is not necessarily provided. For example, a high parasitic capacitance of the transistor 172 can be an alternative to the capacitor 175.

Note that the description on the transistors 30 and 32 can be referred to for the structures of the transistors 171 and 173. Furthermore, the description on the light-emitting element 34 can be referred to for the structure of the light-emitting element 174.

The pixel structure in FIG. 51A is different from the pixel structure in FIG. 44A in the use of a p-channel transistor for the transistor 172 and accordingly in a connection relation of the capacitor 175. The driving method of the display device illustrated in FIG. 51A can be referred to for the driving method of the display device in Embodiment 1, considering a potential of the transistor 172 which is opposite to a potential of the transistor 31.

Figure 51B:
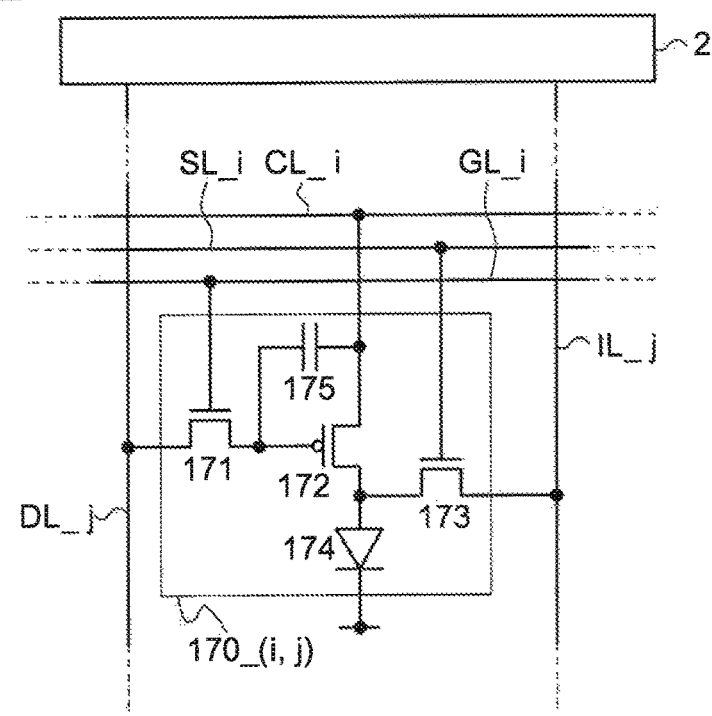

FIG. 51B shows a pixel structure that is different from that in FIG. 51A. The pixel structure in FIG. 51B is different from that in FIG. 51A in that the wiring CL extends in the row direction, and the other structures are similar to those in FIG. 51A.

Here, the potential of the wiring CL may be changed in an analog manner, so that the potential of the wiring CL can be adjusted in accordance with the changes in the potentials of the wiring GL and the wiring SL. For example, in Step 1 and Step 2 in FIG. 47B, the potential of the wiring CL_j in FIG. 51A can be lower than the common potential, or at the same level as the common potential. The potential of the wiring CL_j is set as described above, so that reverse bias is applied to the light-emitting element 174 or bias is not applied to the light-emitting element 174. Thus, the black display state of the pixels in the i-th row can be maintained. Furthermore, even if forward bias is applied to the light-emitting element 174 so that the black display state of the pixels in the i-th row can be maintained at least until Step 3, the potential difference between the wiring CL_j and the common potential can be suppressed to extremely small. The extremely small potential difference is preferably approximately several volts, for example, 2 volts or lower, further preferably 1 volt or lower.

The variation in current characteristics of the driving transistors among pixels of the display device of this embodiment can be corrected by the above-described driving method. In this driving method, the variation in current characteristics of the driving transistors can be corrected in parallel with the display operation of the display device.

Figure 52A:
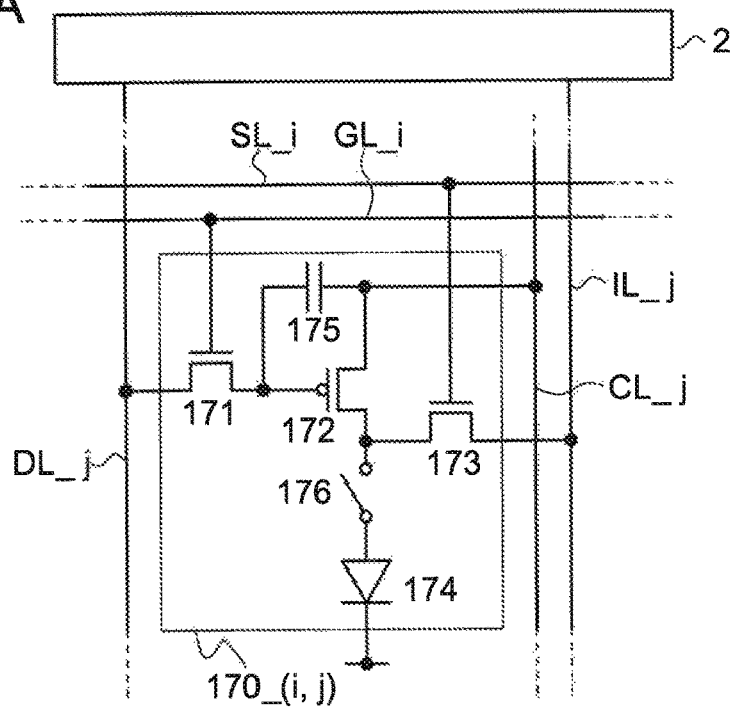
FIGS. 52A and 52B are block diagrams showing examples of a pixel of one embodiment of the present invention.
Figure 52B:
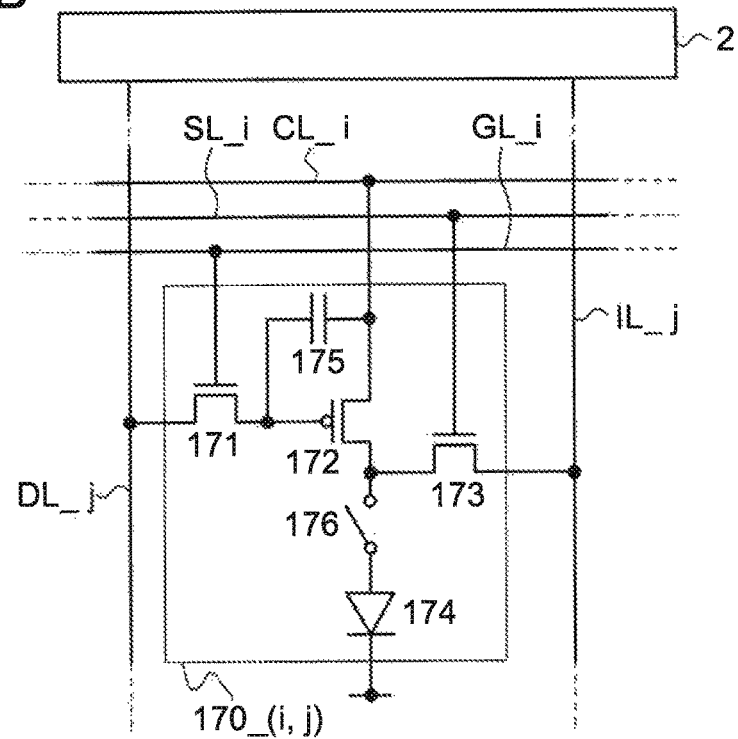

The pixel structure of the display device of this embodiment is not limited to those shown in FIGS. 51A and 51B. For example, in the pixel 170_(i, j) in FIGS. 51A and 51B, a switch 176 may be provided between the light-emitting element 174 and the transistor 172. FIGS. 52A and 52B show circuit diagrams in that case. FIG. 52A shows the case where the switch 176 is provided in the structure of FIG. 51A, and FIG. 52B shows the case where the switch 176 is provided in the structure of FIG. 51B. The switch 176 is turned off during Step 1 and Step 2, so that the non-light-emitting state of the light-emitting element 174 can be surely maintained in Step 1 and Step 2.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

Embodiment 4

Specific Structure Example of Display Device

Figure 53:
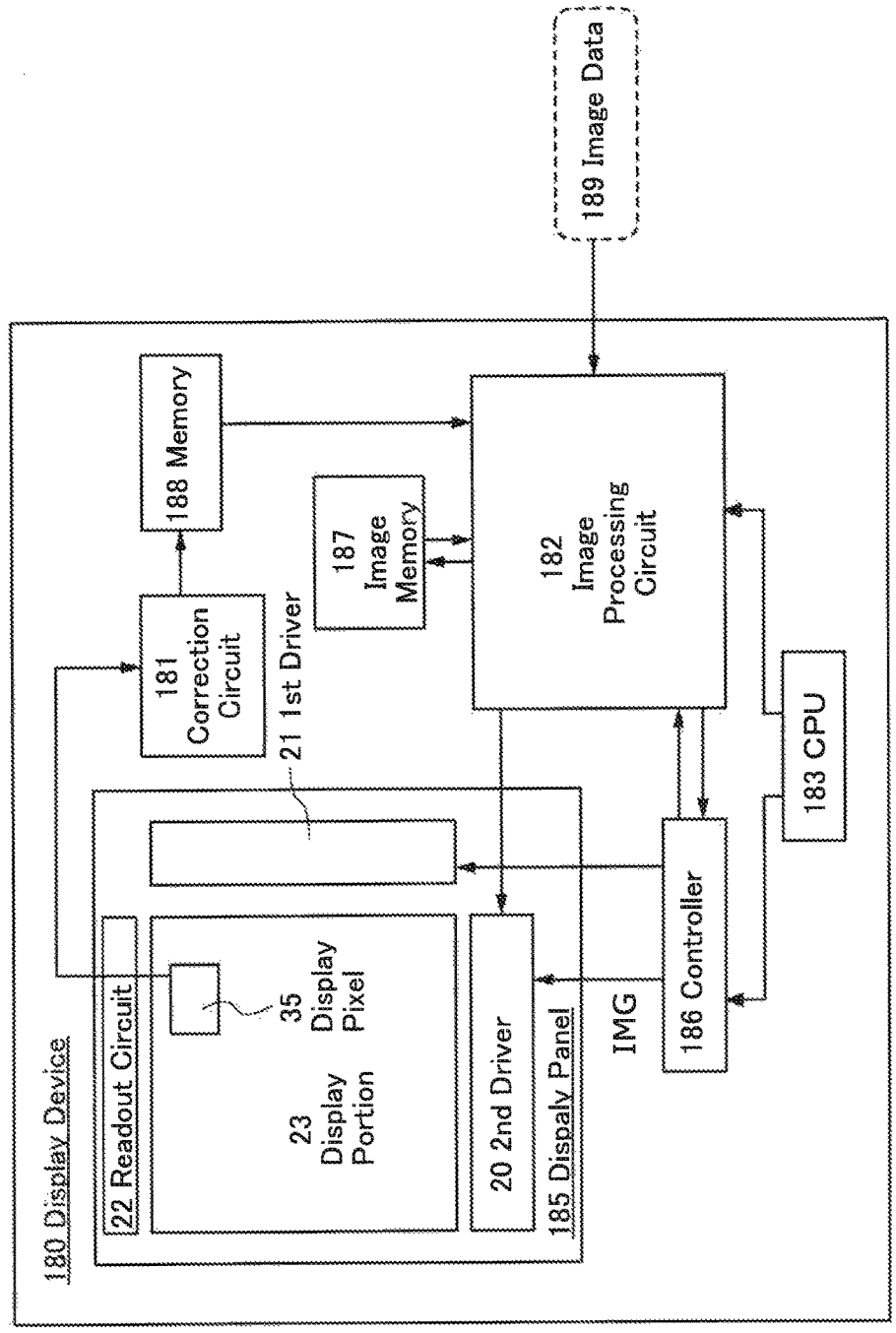
FIG. 53 is a block diagram showing an example of a display device of one embodiment of the present invention.

An example of a structure of a display device is described. FIG. 53 shows a block diagram of a structure of a display device 180. Although the block diagram shows components classified according to their functions in independent blocks, it may be practically difficult to separate the components according to their functions and, in some cases, one component may have a plurality of functions.

The display device 180 illustrated in FIG. 53 includes a panel 185 including the plurality of pixels 35 in the pixel portion 23, a controller 186, a CPU 183, an image processing circuit 182, an image memory 187, a memory 188, and a correction circuit 181. Furthermore, the panel 185 includes the driver circuit 20, the driver circuit 21, and the circuit portion 22. Note that the description in the above embodiments can be referred to for the driver circuit 20, the driver circuit 21, the circuit portion 22, the pixel portion 23, and the pixel 35.

The CPU 183 is configured to decode an instruction input from the outside or an instruction stored in a memory provided in the CPU 183 and execute the instruction by controlling the overall operations of various circuits included in the display device 180.

By the method described in Embodiment 1, the correction circuit 181 generates data for correcting current characteristics on the basis of data on current characteristics of driving transistors included in the respective pixels. The memory 188 is configured to store data for correcting current characteristics.

The image memory 187 is configured to store image data 189 which is input to the display device 180. Note that although just one image memory 187 is provided in the display device 180 in FIG. 53, a plurality of image memories 187 may be provided in the display device 180. For example, in the case where the pixel portion 23 displays a full-color image with the use of three pieces of image data 189 corresponding to hues such as red, blue, and green, the image memory 187 corresponding to each of the pieces of image data 189 may be provided.

As the image memory 187, for example, a memory circuit such as a dynamic random access memory (DRAM) or a static random access memory (SRAM) can be used. Alternatively, as the image memories 187, video RAMs (VRAMs) may be used.

The image processing circuit 182 is configured to write and read the image data 189 to and from the image memory 187 in response to an instruction from the CPU 183 and to generate a video signal from the image data 189. In addition, the image processing circuit 182 is configured to read the data stored in the memory 188 in response to an instruction from the CPU 183 and correct the video signal using the data.

The controller 186 is configured to process the video signal in accordance with the specification of the panel 185 and then supply the processed video signal to the panel 185.

Note that the controller 186 is configured to supply various driving signals used for driving the driver circuit 20, the driver circuit 21, and the like to the panel 185. The driving signal includes a start pulse signal SSP, a clock signal SCK, and a latch signal LP for controlling operation of the driver circuit 21, a start pulse GSP and a clock signal GCK for controlling operation of the driver circuit 20, and the like.

Note that the display device 180 may include an input device which is configured to give data or an instruction to the CPU 183 included in the display device 180. As the input device, a keyboard, a pointing device, a touch panel, a sensor, or the like can be used.

Structure Example 1 of Transistor

In FIGS. 54A and 54B and FIGS. 55A and 55B, transistors each having a top-gate structure are shown as examples of transistors included in a display device.

Figure 54A:
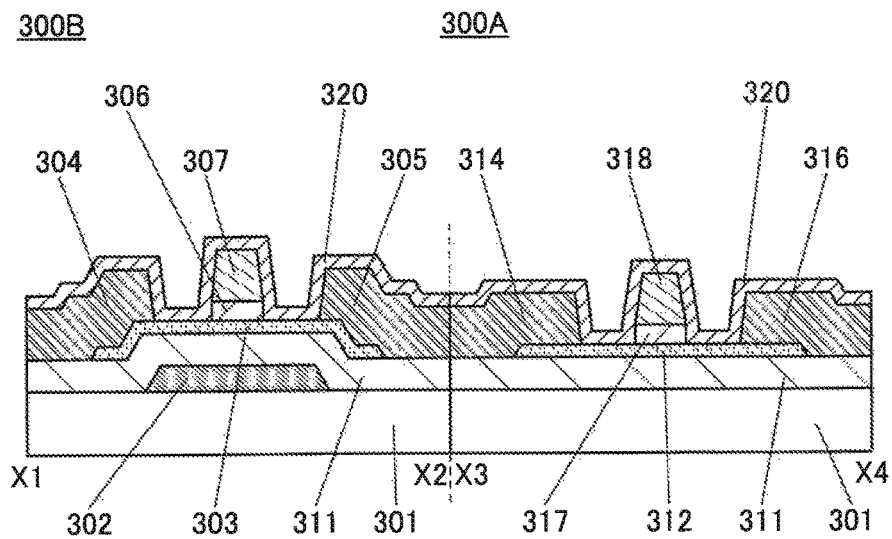
FIGS. 54A and 54B are cross-sectional views of examples of transistors of one embodiment of the present invention.
Figure 54B:
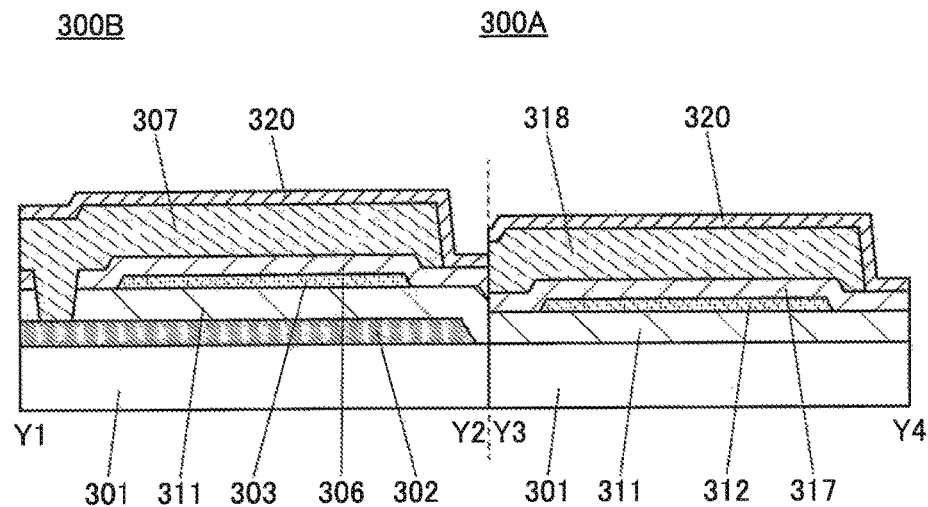
Figure 55A:
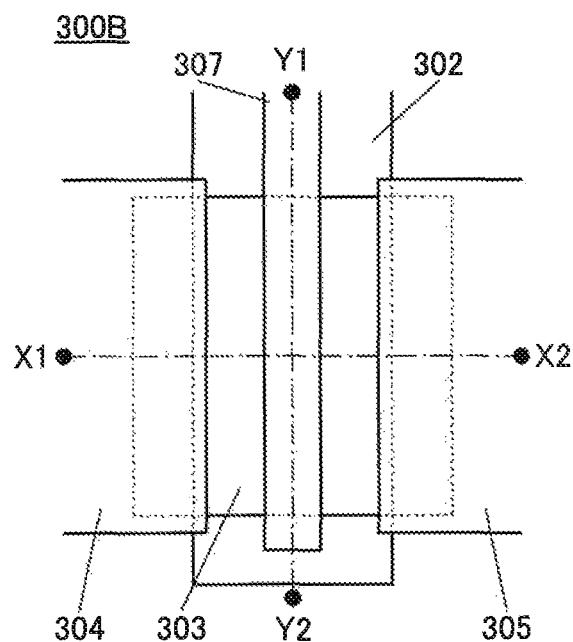
FIGS. 55A and 55B are top views of examples of transistors of one embodiment of the present invention.
Figure 55B:
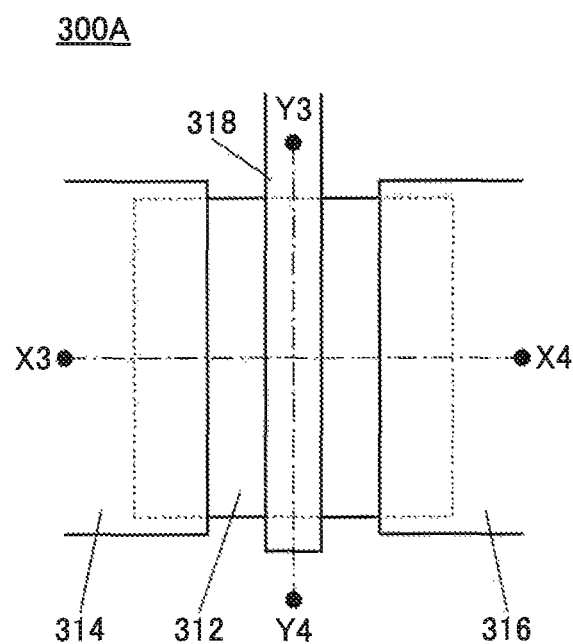

FIGS. 55A and 55B are top views of a transistor 300B provided in the driver circuit portion (e.g., the driver circuit 20, the driver circuit 21, the circuit portion 22, the read circuit 2, or the like) and a transistor 300A provided in the pixel portion 23. FIGS. 54A and 54B are cross sectional views of the transistor 300B and the transistor 300A. FIG. 55A is the top view of the transistor 300B and FIG. 55B is the top view of the transistor 300A. FIG. 54A shows a cross section along the dashed-dotted line X1-X2 in FIG. 55A and a cross section along the dashed-dotted line X3-X4 in FIG. 55B. FIG. 54B shows a cross section along the dashed-dotted line Y1-Y2 in FIG. 55A and a cross section along the dashed-dotted line Y3-Y4 in FIG. 55B. FIG. 54A is a cross-sectional view of the transistors 300A and 300B in a channel length direction, and FIG. 54B is a cross-sectional view of the transistors 300A and 300B in a channel width direction.

In a manner similar to that of the transistors 300A and 300B, some components are not illustrated in some cases in top views of transistors described below. Furthermore, the directions of the dashed-dotted line X1-X2 and the dashed-dotted line X3-X4 may be called a channel length direction, and the direction of the dashed-dotted line Y1-Y2 and the dashed-dotted line Y3-Y4 may be called a channel width direction.

The transistor 300A illustrated in FIGS. 54A and 54B includes an oxide semiconductor film 312 over an insulating film 311 over a substrate 301; a conductive film 314, a conductive film 316, and an insulating film 317 that are in contact with the oxide semiconductor film 312; and a conductive film 318 that overlaps with the oxide semiconductor film 312 with the insulating film 317 placed therebetween. Note that an insulating film 320 is provided over the transistor 300A.

The transistor 300B illustrated in FIGS. 54A and 54B includes an oxide semiconductor film 303 over the insulating film 311 over the substrate 301; a conductive film 304, a conductive film 305, and an insulating film 306 that are in contact with the oxide semiconductor film 303; and a conductive film 307 that overlaps with the oxide semiconductor film 303 with the insulating film 306 placed therebetween. The insulating film 320 is provided over the transistor 300B.

The transistor 300B includes a conductive film 302 that overlaps with the oxide semiconductor film 303 with the insulating film 311 placed therebetween. That is, the conductive film 302 serves as a gate electrode. Furthermore, the transistor 300B is a transistor having a dual-gate structure. The other components of the transistor 300B are the same as those of the transistor 300A and have similar functions as those in the transistor 300A.

The conductive film 302 and the conductive film 307 are supplied with different potentials, whereby the threshold voltage of the transistor 300B can be controlled. Alternatively, as illustrated in FIG. 54B, the conductive film 302 and the conductive film 307 are supplied with the same potential, whereby an increase in the on-state current, a reduction in variation in initial characteristics, a reduction in deterioration in a negative gate bias temperature (−GBT) stress test, and suppression in changes in the rising voltage of on-state current at different drain voltages are possible.

In the display device, the transistor in the driver circuit portion (e.g., the driver circuit 20, the driver circuit 21, the circuit portion 22, the read circuit 2, or the like) and the transistor in the pixel portion 23 have different structures. The transistor included in the driver circuit portion has a dual-gate structure. That is, the transistor included in the driver circuit portion has a higher on-state current than that included in the pixel portion 23.

Furthermore, the transistor in the driver circuit portion and the transistor in the pixel portion 23 may have different channel lengths.

Typically, the channel length of the transistor 300B included in the driver circuit portion can be less than 2.5 μm, or greater than or equal to 1.45 μm and less than or equal to 2.2 μm. The channel length of the transistor 300A included in the pixel portion 23 can be greater than or equal to 2.5 μm, or greater than or equal to 2.5 μm and less than or equal to 20 μm.

When the channel length of the transistor 300B included in the driver circuit portion is less than 2.5 μm, preferably greater than or equal to 1.45 μm and less than or equal to 2.2 μm, as compared with the transistor 300A included in the pixel portion 23, the amount of on-state current can be increased. As a result, a driver circuit portion that can operate at high speed can be formed.

In the oxide semiconductor film 312, an element that forms an oxygen vacancy is included in a region that does not overlap with the conductive film 314, the conductive film 316, and the conductive film 318. In the oxide semiconductor film 303, an element that forms an oxygen vacancy is included in a region that does not overlap with the conductive film 304, the conductive film 305, and the conductive film 307. The elements which form oxygen vacancies are described below as impurity elements. Typical examples of the impurity elements are hydrogen, rare gas elements, and the like. Typical examples of rare gas elements are helium, neon, argon, krypton, and xenon. Furthermore, boron, carbon, nitrogen, fluorine, aluminum, silicon, phosphorus, chlorine, or the like may be contained in the oxide semiconductor film 312 and the oxide semiconductor film 303 as an impurity element.

The insulating film 320 is a film containing hydrogen and is typically a nitride insulating film. The insulating film 320 is in contact with the oxide semiconductor film 312 and the oxide semiconductor film 303; thus, hydrogen contained in the insulating film 320 is diffused into the oxide semiconductor film 312 and the oxide semiconductor film 303. Consequently, much hydrogen is contained in the regions of the oxide semiconductor film 312 and the oxide semiconductor film 303 in contact with the insulating film 320.

When a rare gas element is added as an impurity element to the oxide semiconductor film, a bond between a metal element and oxygen in the oxide semiconductor film is cut, whereby an oxygen vacancy is formed. By interaction between hydrogen and the oxygen vacancy included in the oxide semiconductor film, the conductivity of the oxide semiconductor film is increased. Specifically, hydrogen enters the oxygen vacancies in the oxide semiconductor film, whereby an electron serving as a carrier is produced. As a result, the conductivity is increased.

Figure 56A:
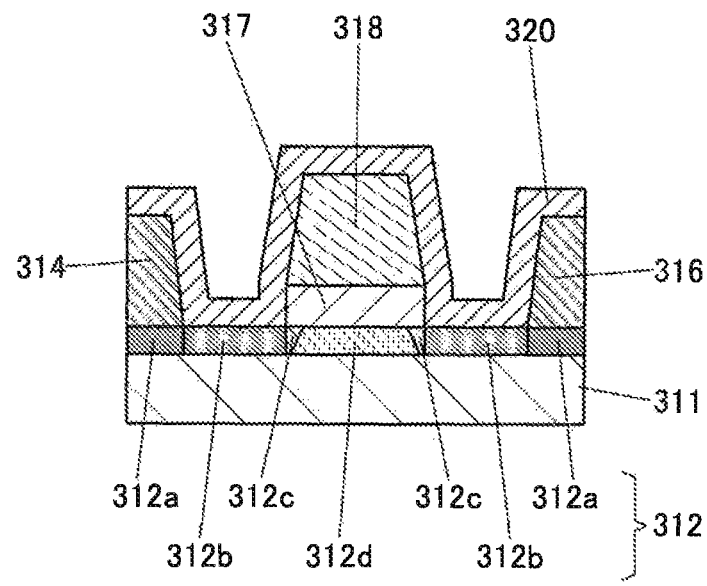
FIGS. 56A and 56B are cross-sectional views of examples of transistors of one embodiment of the present invention.

Here, FIG. 56A is a partial enlarged view of the oxide semiconductor film 312. Note that as typical examples, the description is made with reference to the partial enlarged views of the oxide semiconductor film 312 included in the transistor 300A. As shown in FIG. 56A, the oxide semiconductor film 312 includes a region 312a in contact with the conductive film 314 or the conductive film 316, a region 312b in contact with the insulating film 320, and a region 312d in contact with the insulating film 317. Note that in the case where the conductive film 318 has a tapered side surface, the oxide semiconductor film 312 may include regions 312c overlapping with a tapered portion of the conductive film 318.

The regions 312a serve as a source region and a drain region. In the case where the conductive films 314 and 316 are formed using a conductive material which is easily bonded to oxygen, such as tungsten, titanium, aluminum, copper, molybdenum, chromium, tantalum, an alloy of any of these, or the like, oxygen contained in the oxide semiconductor films is bonded to the conductive material contained in the conductive films 314 and 316, and an oxygen vacancy is formed in the oxide semiconductor film. Furthermore, in some cases, part of constituent elements of the conductive material that forms the conductive films 314 and 316 is mixed into the oxide semiconductor film. As a result, the regions 312a in contact with the conductive film 314 and the conductive film 316 have higher conductivity and serve as a source region and a drain region.

The regions 312b function as low-resistance regions. The regions 312b contain at least a rare gas and hydrogen as the impurity elements. Note that in the case where the side surface of the conductive film 318 has a tapered shape, the impurity element is added to the regions 312c through the tapered portion of the conductive film 318. Therefore, although the regions 312c have a lower concentration of rare gas elements as an example of the impurity element than the regions 312b, the impurity element is contained. With the regions 312c, source-drain breakdown voltage of the transistor can be increased.

In the case where the oxide semiconductor film 312 is formed by a sputtering method, the regions 312a to 312d each contain a rare gas element. In addition, the rare gas element concentration of each of the regions 312b and 312c is higher than that of each of the regions 312a and 312d. This is because a rare gas is used as a sputtering gas to form the oxide semiconductor film 312 by sputtering and is therefore included in the oxide semiconductor film 312, and because a rare gas is intentionally added to the regions 312b and 312c to form an oxygen vacancy. Note that a rare gas element different from that added to the regions 312a and 312d may be added to the regions 312b and 312c.

Since the region 312b is in contact with the insulating film 320, the hydrogen concentration of the region 312b is higher than those of the region 312a and the region 312d. In the case where hydrogen is diffused from the region 312b to the region 312c, the concentration of hydrogen in the region 312c is higher than the concentration of hydrogen in the region 312a and the concentration of hydrogen in the region 312d. Note that the hydrogen concentration of the region 312b is higher than that of the region 312c.

In the regions 312b and 312c, the concentrations of hydrogen measured by secondary ion mass spectrometry (SIMS) can be greater than or equal to $8\times10^{19}$ atoms/cm$^3$, greater than or equal to $1\times10^{20}$ atoms/cm$^3$, or greater than or equal to $5\times10^{20}$ atoms/cm$^3$. Note that in the regions 312a and 312d, the concentration of hydrogen which is measured by SIMS can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

In the case where boron, carbon, nitrogen, fluorine, aluminum, silicon, phosphorus, or chlorine is added to the oxide semiconductor film 312 as an impurity element, only the regions 312b and 312c contain the impurity element. Therefore, the concentrations of the impurity element in the regions 312b and 312c are higher than those in the regions 312a and 312d. Note that, in the region 312b and the region 312c, the impurity element concentration which is measured by SIMS can be higher than or equal to $1\times10^{18}$ atoms/cm$^3$ and lower than or equal to $1\times10^{22}$ atoms/cm$^3$, higher than or equal to $1\times10^{19}$ atoms/cm$^3$ and lower than or equal to $1\times10^{21}$ atoms/cm$^3$, or higher than or equal to $5\times10^{19}$ atoms/cm$^3$ and lower than or equal to $5\times10^{20}$ atoms/cm$^3$.

The regions 312b and 312c have higher hydrogen concentrations than the region 312d and have more oxygen vacancies due to addition of impurity elements than the region 312d. Therefore, the regions 312b and 312c have higher conductivity and serve as low-resistance regions. The resistivity of the regions 312b and 312c can be typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

Note that in the region 312b and the region 312c, when the amount of hydrogen is the same as or smaller than the amount of oxygen vacancies, hydrogen is easily captured by oxygen vacancies and is not easily diffused into the region 312d that serves as a channel. As a result, a normally-off transistor can be manufactured.

The region 312d serves as a channel.

In addition, after the impurity element is added to the oxide semiconductor film 312 using the conductive films 314, 316, and 318 as masks, the area of the conductive film 318 when seen from the above may be reduced. To achieve this, a slimming process is performed on a mask over the conductive film 318 in a step of forming the conductive film 318 so as to obtain a mask with a minuter structure. Then, the conductive film 318 and the insulating film 317 are etched using the mask, so that a conductive film 318a and an insulating film 317a illustrated in FIG. 56B can be formed. As the slimming process, an ashing process using an oxygen radical or the like can be employed, for example.

As a result, an offset region 312e is formed between the region 312c and the region 312d serving as a channel in the oxide semiconductor film 312. Note that the length of the offset region 312e in the channel length direction is set to be less than 0.1 μm, whereby a decrease in the on-state current of the transistor can be suppressed.

The insulating film 317 and the insulating film 306 each function as a gate insulating film.

The conductive film 314 and the conductive film 316 serve as a source electrode and a drain electrode, and the conductive film 304 and the conductive film 305 serve as a source electrode and a drain electrode.

The conductive film 318 and the conductive film 307 each function as a gate electrode.

The transistor 300A and the transistor 300B described in this embodiment each include the region 312b and/or the region 312c that serves as a low-resistance region between the region 312d functioning as a channel and each of the regions 312a functioning as a source region and a drain region. Accordingly, resistance between the channel and each of the source region and the drain region can be reduced, and the transistor 300A and the transistor 300B each have a high on-state current and a high field-effect mobility.

In addition, in the transistor 300A and the transistor 300B, parasitic capacitance between the conductive film 318 and each of the conductive films 314 and 316 can be reduced by forming the conductive film 318 so as not overlap with the conductive films 314 and 316. Moreover, parasitic capacitance between the conductive film 307 and each of the conductive films 304 and 305 can be reduced by forming the conductive film 307 so as not to overlap with the conductive films 304 and 305. As a result, in the case where a large-sized substrate is used as the substrate 301, signal delays in the conductive films 314 and 316 and the conductive film 318, and signal delays in the conductive films 304 and 305 and the conductive film 307 can be reduced.

In the transistor 300A, a region including an oxygen vacancy is formed by adding a rare gas element to the oxide semiconductor film 312 using the conductive films 314, 316, and 318 as masks. In the transistor 300B, the impurity element is added to the oxide semiconductor film 303 using the conductive films 304, 305, and 307 as masks, so that regions having oxygen vacancies are formed. Furthermore, because the region including oxygen vacancies is in contact with the insulating film 320 containing hydrogen, hydrogen contained in the insulating film 320 is diffused into the region including oxygen vacancies, so that a low-resistance region is formed. That is, the low-resistance regions can be formed in a self-aligned manner.

In the transistor 300A and the transistor 300B described in this embodiment, the rare gas is added to the regions 312b to form oxygen vacancies, and furthermore, hydrogen is added thereto. Therefore, the conductivity of the region 312b can be increased and variation in conductivity of the region 312b in each transistor can be reduced. That is, by adding the rare gas and hydrogen to the region 312b, the conductivity of the region 312b can be controlled.

The structures shown in FIGS. 54A and 54B will be described below in detail.

The type of the substrate 301 is not limited to a certain type, and any of a variety of substrates can be used as the substrate 301. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when the transistors are formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Still alternatively, a flexible substrate may be used as the substrate 301, and the transistors may be directly provided on the flexible substrate. Alternatively, a separation layer may be provided between the substrate 301 and each of the transistors. The separation layer can be used when part or the whole of a semiconductor device formed over the separation layer is separated from the substrate 301 and transferred to another substrate. In such a case, the transistors can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistors are transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

The insulating film 311 can be formed with a single layer or a stack using one or more of an oxide insulating film and a nitride insulating film. Note that an oxide insulating film is preferably used as at least a region of the insulating film 311 that is in contact with the oxide semiconductor films 303 and 312, in order to improve characteristics of the interface with the oxide semiconductor films 303 and 312. An oxide insulating film that releases oxygen by being heated is preferably used as the insulating film 311, in which case oxygen contained in the insulating film 311 can be moved to the oxide semiconductor films 303 and 312 by heat treatment.

The thickness of the insulating film 311 can be greater than or equal to 50 nm, greater than or equal to 100 nm and less than or equal to 3000 nm, or greater than or equal to 200 nm and less than or equal to 1000 nm. With the use of the thick insulating film 311, the amount of oxygen released from the insulating film 311 can be increased, and the interface states between the insulating film 311 and each of the oxide semiconductor films 303 and 312 and oxygen vacancies included in the oxide semiconductor film 303 and the region 312d of the oxide semiconductor film 312 can be reduced.

The insulating film 311 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

The oxide semiconductor films 312 and 303 are typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor films 312 and 303 have light-transmitting properties.

Note that in the case of using an In-M-Zn oxide as the oxide semiconductor films 312 and 303, when the summation of In and M is assumed to be 100 atomic %, the proportions of In and Mare preferably set to be greater than or equal to 25 atomic % and less than 75 atomic %, respectively, or greater than or equal to 34 atomic % and less than 66 atomic %, respectively.

The energy gaps of the oxide semiconductor films 312 and 303 are each 2 eV or more, 2.5 eV or more, or 3 eV or more.

The thickness of each of the oxide semiconductor films 312 and 303 can be greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor films 312 and 303 contain an In-M-Zn oxide (M is Mg, Al, Ti, Ga, Y, Zr, La, Ce, Nd, or Hf), it is preferable that the atomic ratio of metal elements of a sputtering target used for forming a film of the In-M-Zn oxide satisfy In≥M and Zn≥M. As the atomic ratio of metal elements of such a sputtering target, In:M: Zn=1:1:1, In:M:Zn=1:1:1.2, In:M:Zn=2:1:1.5, In:M:Zn=2: 1:2.3, In:M:Zn=2:1:3, In:M:Zn=3:1:2, or the like is preferable. Note that the atomic ratios of metal elements in the formed oxide semiconductor films 312 and 303 vary from the above atomic ratio of metal elements of the sputtering target within a range of ±40% as an error.

When silicon or carbon that is one of elements belonging to Group 14 is contained in the oxide semiconductor film 312 and the oxide semiconductor film 303, oxygen vacancies are increased in the oxide semiconductor film 312 and the oxide semiconductor film 303, and the oxide semiconductor film 312 and the oxide semiconductor film 303 become n-type films. Thus, the concentration of silicon or carbon (the concentration measured by SIMS) in the oxide semiconductor film 312 and the oxide semiconductor film 303, in particular, the region 312d, can be lower than or equal to $2\times10^{18}$ atoms/cm$^3$, or lower than or equal to $2\times10^{17}$ atoms/cm$^3$. As a result, the transistor has positive threshold voltage (normally-off characteristics).

Furthermore, the concentration of alkali metal or alkaline earth metal which is measured by SIMS in the oxide semiconductor film 312 and the oxide semiconductor film 303, in particular, the region 312d, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of an alkali metal or an alkaline earth metal in the region 312d. As a result, the transistor has positive threshold voltage (normally-off characteristics).

Furthermore, when nitrogen is contained in the oxide semiconductor film 312 and the oxide semiconductor film 303, in particular, the region 312d, electrons serving as carriers are generated, the carrier density is increased, and the oxide semiconductor films 312 and 303 become n-type films in some cases. Thus, a transistor including an oxide semiconductor film which contains nitrogen is likely to have normally-on characteristics. Therefore, nitrogen is preferably reduced as much as possible in the oxide semiconductor film, particularly the region 312d. The nitrogen concentration, which is measured by SIMS, can be set to, for example, lower than or equal to $5\times10^{18}$ atoms/cm$^3$.

By reducing the impurity elements in the oxide semiconductor film 312 and the oxide semiconductor film 303, in particular, the region 312d, the carrier density of the oxide semiconductor films can be lowered. In the oxide semiconductor film 312 and the oxide semiconductor film 303, in particular, the region 312d, carrier density can be $1\times10^{17}$/cm$^3$ or less, $1\times10^{15}$/cm$^3$ or less, $1\times10^{13}$/cm$^3$ or less, or $1\times10^{11}$/cm$^3$ or less.

An oxide semiconductor film with a low impurity concentration and a low density of defect states can be used for the oxide semiconductor films 312 and 303, in which case the transistors can have more excellent electrical characteristics. Here, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has low density of trap states in some cases. Furthermore, a highly purified intrinsic or substantially highly purified intrinsic oxide semiconductor film has an extremely small off-state current; the off-state current can be smaller than or equal to the measurement limit of a semiconductor parameter analyzer, i.e., smaller than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

In addition, each of the oxide semiconductor films 312 and 303 may have a non-single-crystal structure, for example. The non-single crystal structure includes a c-axis-aligned a-b-plane-anchored crystalline oxide semiconductor (CAAC-OS), a polycrystalline structure, a microcrystalline structure described later, or an amorphous structure described later, for example. Among the non-single crystal structure, the amorphous structure has the highest density of defect states, whereas CAAC-OS has the lowest density of defect states.

Note that each of the oxide semiconductor films 312 and 303 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Note that in some cases, the regions 312b and 312d are different in crystallinity in each of the oxide semiconductor films 312 and 303. In addition, in some cases, the regions 312c and 312d are different in crystallinity in each of the oxide semiconductor films 312 and 303. This is because when an impurity element is added to the region 312b or 312c, the region 312b or 312c is damaged and thus has lower crystallinity.

The insulating films 306 and 317 can be formed with a single layer or a stack using one or more of an oxide insulating film and a nitride insulating film. Note that an oxide insulating film is preferably used as at least regions of the insulating films 306 and 317 that are in contact with the oxide semiconductor films 303 and 312, respectively, in order to improve characteristics of the interface with the oxide semiconductor films 303 and 312. The insulating films 306 and 317 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

Furthermore, it is possible to prevent outward diffusion of oxygen from the oxide semiconductor films 312 and 303 and entry of hydrogen, water, or the like into the oxide semiconductor films 312 and 303 from the outside by providing an insulating film having a blocking effect against oxygen, hydrogen, water, and the like as the insulating films 306 and 317. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating films 306 and 317 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistors can be reduced.

When the insulating films 306 and 317 are formed using an oxide insulating film from which oxygen is released by heating, oxygen contained in the insulating films 306 and 317 can be moved to the oxide semiconductor films 303 and 312 by heat treatment.

In addition, a silicon oxynitride film with few defects can be used as the insulating films 306 and 317. In an ESR spectrum at 100 K or lower of the silicon oxynitride film with few defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/$cm^3$, typically higher than or equal to $1\times10^{17}$ spins/$cm^3$ and lower than $1\times10^{18}$ spins/$cm^3$ In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, or greater than or equal to 1 and smaller than or equal to 2). Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller the amount of nitrogen oxide contained in the silicon oxynitride film is.

In the silicon oxynitride film with few defects, the concentration of nitrogen which is measured by SIMS is lower than or equal to $6\times10^{20}$ atoms/$cm^3$. When the insulating film 317 is formed using the silicon oxynitride film with few defects, nitrogen oxide is unlikely to be generated, so that the carrier traps at the interface between the oxide semiconductor films 312 and 303 and the insulating films can be reduced. Furthermore, a shift of the threshold voltage of the transistor included in the display device can be reduced, which leads to a smaller change in the electrical characteristics of the transistor.

The total thickness of the insulating films 306 and 317 can be greater than or equal to 5 nm and less than or equal to 400 nm, greater than or equal to 5 nm and less than or equal to 300 nm, or greater than or equal to 10 nm and less than or equal to 250 nm.

Each of the conductive film 314, the conductive film 316, the conductive film 318, the conductive film 304, the conductive film 305, the conductive film 302, and the conductive film 307 can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. Furthermore, the conductive film 314, the conductive film 316, the conductive film 318, the conductive film 304, the conductive film 305, the conductive film 302, and the conductive film 307 may have a single-layer structure or a stacked-layer structure including two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

Alternatively, the conductive film 314, the conductive film 316, the conductive film 318, the conductive film 304, the conductive film 305, the conductive film 302, and the conductive film 307 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide including silicon oxide. Alternatively, a stacked-layer structure of the above light-transmitting conductive material and a conductive material containing the above metal element may be employed.

The thicknesses of the conductive films 314 and 316, the conductive film 318, the conductive films 304 and 305, the conductive film 302, and the conductive film 307 each can be greater than or equal to 30 nm and less than or equal to 500 nm, or greater than or equal to 100 nm and less than or equal to 400 nm.

The insulating film 320 is a film containing hydrogen and is typically a nitride insulating film. The nitride insulating film can be formed using silicon nitride, aluminum nitride, or the like.

Structure Example 2 of Transistor

Next, another structure of the transistor included in the display device is described with reference to FIGS. 57A to 57C. Description is made here using a transistor 300C as a modified example of the transistor 300A provided in the pixel portion 23; however, the structure of the insulating film 311 or the structure of the conductive film 314, 316, or 318 of the transistor 300C can be applied as appropriate to the transistor 300B in the driver circuit portion.

Figure 57A:
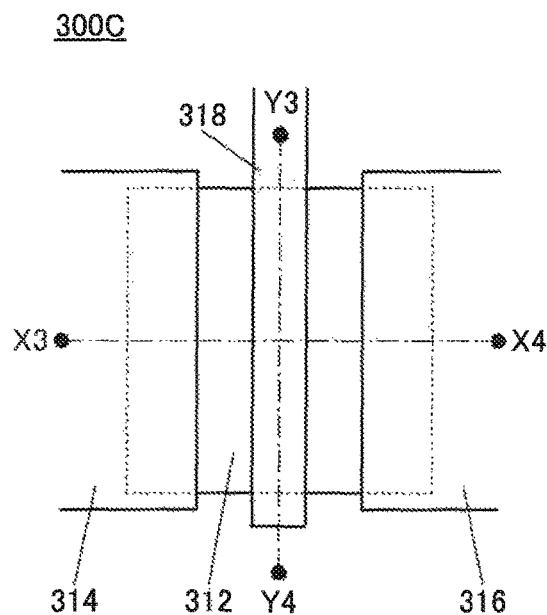
FIGS. 57A to 57C are a top view and cross-sectional views of an example of a transistor of one embodiment of the present invention.
Figure 57B:
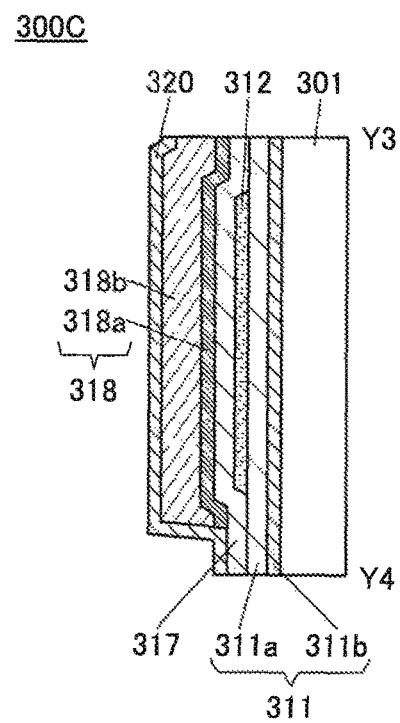
Figure 57C:
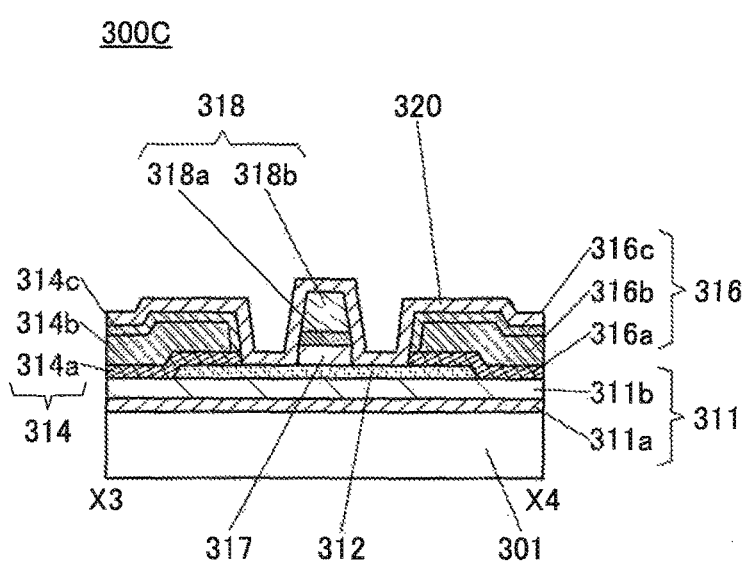

FIGS. 57A to 57C are a top view and cross-sectional views of the transistor 300C included in the display device. FIG. 57A is a top view of the transistor 300C, FIG. 57B is a cross-sectional view taken along dashed-dotted line Y3-Y4 in FIG. 57A, and FIG. 57C is a cross-sectional view taken along dashed-dotted line X3-X4 in FIG. 57A.

The transistor 300C illustrated in FIGS. 57A to 57C has a two- or three-layer structure of the conductive films 314 and 316 and the conductive film 318. In addition, the insulating film 311 has a stacked-layer structure of a nitride insulating film 311a and an oxide insulating film 311b. The other structures are the same as those of the transistor 300A and the effect similar to that in the case of the transistor 300A can be obtained.

First, the conductive films 314 and 316 and the conductive film 318 are described.

In the conductive film 314, conductive films 314a, 314b, and 314c are stacked in this order and the conductive films 314a and 314c cover the surfaces of the conductive film 314b. That is, the conductive films 314a and 314c function as protective films of the conductive film 314b.

In a manner similar to that of the conductive film 314, in the conductive film 316, conductive films 316a, 316b, and 316c are stacked in this order and the conductive films 316a and 316c cover the surfaces of the conductive film 316b. That is, the conductive films 316a and 316c function as protective films of the conductive film 316b.

In the conductive film 318, conductive films 318a and 318b are stacked in this order.

The conductive films 314a and 316a and the conductive film 318a are formed using materials that prevent metal elements contained in the conductive films 314b and 316b and the conductive film 318b, respectively, from diffusing to the oxide semiconductor film 312. The conductive films 314a and 316a and the conductive film 318a can be formed using titanium, tantalum, molybdenum, tungsten, an alloy of any of these materials, titanium nitride, tantalum nitride, molybdenum nitride, or the like. Alternatively, the conductive films 314a and 316a and the conductive film 318a can be formed using Cu—X alloy (X is Mn, Ni, Cr, Fe, Co, Mo, Ta, or Ti) or the like.

The conductive films 314b and 316b and the conductive film 318b are each formed using a low-resistance material. The conductive films 314b and 316b and the conductive film 318b can be formed using copper, aluminum, gold, silver, an alloy of any of these materials, a compound containing any of these materials as a main component, or the like.

When the conductive films 314c and 316c are formed using films in which the metal elements contained in the conductive films 314b and 316b are passivated, the metal elements contained in the conductive films 314b and 316b can be prevented from moving to the oxide semiconductor film 312 in a step of forming the insulating film 328. The conductive films 314c and 316c can be formed using a metal silicide or a metal silicide nitride, typically, $CuSi_x$ (x>0), $CuSi_xN_y$ (x>0, y>0), or the like.

Here, a method for forming the conductive films 314c and 316c is described. Note that the conductive films 314b and 316b are formed using copper. In addition, the conductive films 314c and 316c are formed using $CuSi_xN_y$ (x>0, y>0).

The conductive films 314b and 316b are exposed to plasma generated in a reducing atmosphere such as a hydrogen atmosphere, an ammonia atmosphere, or a carbon monoxide atmosphere and the oxide formed on the surfaces of the conductive films 314b and 316b are reduced.

Next, the conductive films 314b and 316b are exposed to silane while being heated at a temperature higher than or equal to 200° C. and lower than or equal to 400° C. As a result, copper contained in the conductive films 314b and 316b acts as a catalyst, and silane is decomposed into Si and $H_2$, and $CuSi_x$ (x>0) is formed on the surfaces of the conductive films 314b and 316b.

Next, the conductive films 314b and 316b are exposed to plasma generated in an atmosphere containing nitrogen, such as an ammonia atmosphere or a nitrogen atmosphere, whereby $CuSi_x$ (x>0) formed on the surfaces of the conductive films 314b and 316b reacts with nitrogen contained in the plasma and accordingly $CuSi_xN_y$ (x>0, y>0) is formed as the conductive films 314c and 316c.

Note that in the above step, $CuSi_xN_y$ (x>0, y>0) may be formed as the conductive films 314c and 316c in such a manner that the conductive films 314b and 316b are exposed to plasma generated in an atmosphere containing nitrogen, such as an ammonia atmosphere or a nitrogen atmosphere, and then exposed to silane while being heated at a temperature higher than or equal to 200° C. and lower than or equal to 400° C.

Next, the insulating film 311 in which the nitride insulating film 311a and the oxide insulating film 311b are stacked is described.

The nitride insulating film 311a can be formed using silicon nitride, silicon nitride oxide, aluminum nitride, or aluminum nitride oxide, for example. The oxide insulating film 311b can be formed using silicon oxide, silicon oxynitride, aluminum oxide, or the like, for example. The structure in which the nitride insulating film 311a is provided on the substrate 301 side can prevent hydrogen, water, or the like from diffusing into the oxide semiconductor film 312 from the outside.

Structure Example 3 of Transistor

Next, another structure of the transistor included in the display device is described with reference to FIGS. 58A to 58C and FIGS. 59A to 59C. Description is made here using a transistor 300D and a transistor 300E as modified examples of the transistor 300A provided in the pixel portion 23; however, the structure of an oxide semiconductor film 312 included in the transistor 300D or the structure of an oxide semiconductor film 312 included in the transistor 300E can be applied as appropriate to the transistor 300B in the driver circuit portion.

Figure 58A:
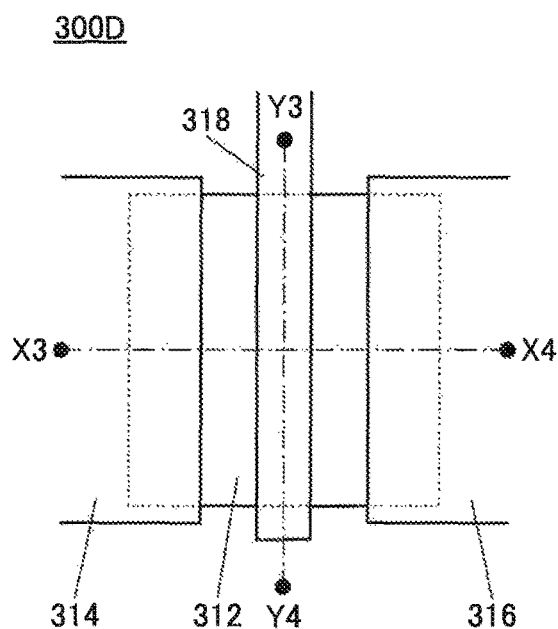
FIGS. 58A to 58C are a top view and cross-sectional views of an example of a transistor of one embodiment of the present invention.
Figure 58B:
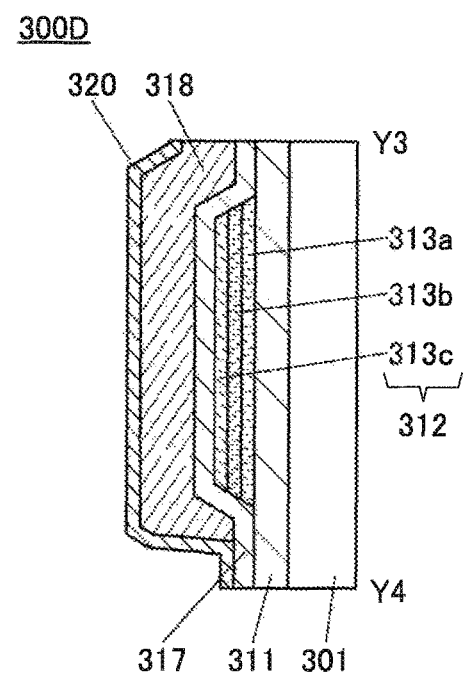
Figure 58C:
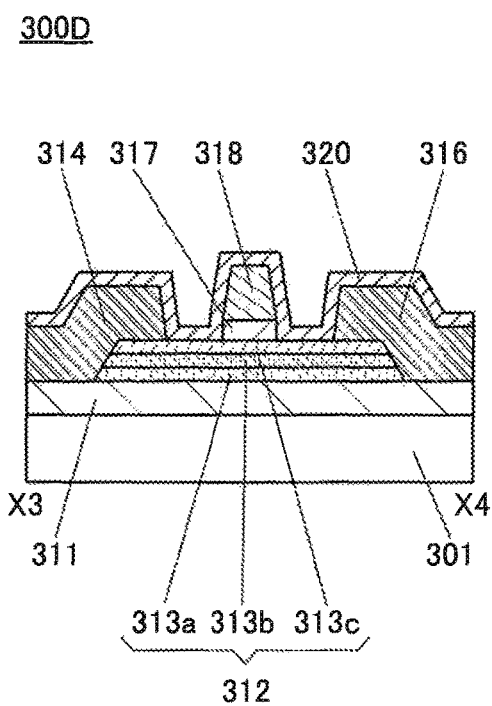

FIGS. 58A to 58C are a top view and cross-sectional views of the transistor 300D included in the display device. FIG. 58A is a top view of the transistor 300D, FIG. 58B is a cross-sectional view taken along dashed-dotted line Y3-Y4 in FIG. 58A, and FIG. 58C is a cross-sectional view taken along dashed-dotted line X3-X4 in FIG. 58A.

The oxide semiconductor film 312 of the transistor 300D illustrated in FIGS. 58A to 58C has a multilayer structure. Specifically, the oxide semiconductor film 312 includes an oxide semiconductor film 313a in contact with the insulating film 311, an oxide semiconductor film 313b in contact with the oxide semiconductor film 313a, and an oxide semiconductor film 313c in contact with the oxide semiconductor film 313b, the conductive films 314 and 316, and the insulating films 317 and 320. The other structures are the same as those of the transistor 300A and the effect similar to that in the case of the transistor 300A can be obtained.

The oxide semiconductor films 313a, 313b, and 313c are typically formed using a metal oxide such as an In—Ga oxide, an In—Zn oxide, or an In-M-Zn oxide (M is Mg, Al, Ti, Ga, Y, Zr, La, Ce, Nd, or Hf).

The oxide semiconductor films 313a and 313c are typically each an In—Ga oxide, an In—Zn oxide, an In—Mg oxide, a Zn—Mg oxide, or an In-M-Zn oxide (M is Mg, Al, Ti, Ga, Y, Zr, La, Ce, Nd, or Hf), and each have the energy at the bottom of the conduction band closer to a vacuum level than that of the oxide semiconductor film 313b. Typically, a difference between the energy at the bottom of the conduction band of the oxide semiconductor film 313b and the energy at the bottom of the conduction band of each of the oxide semiconductor films 313a and 313c is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

In the case where the oxide semiconductor film 313b is an In-M-Zn oxide (M is Mg, Al, Ti, Ga, Y, Zr, La, Ce, Nd, or Hf) and a target having the atomic ratio of metal elements of In:M:Zn=$x_1$:$y_1$:$z_1$ is used for depositing the oxide semiconductor film 313b, $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS film as the oxide semiconductor film 313b is easily formed. As typical examples of the atomic ratio of metal elements of the target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and the like can be given.

In the case where the oxide semiconductor films 313a and 313c are each an In-M-Zn oxide (M is Mg, Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor films 313a and 313c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. Note that when $z_2/y_2$ is greater than or equal to 1 and less than or equal to 6, a CAAC-OS film as the oxide semiconductor films 313a and 313c is easily formed. As typical examples of the atomic ratio of metal elements of the target, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and the like can be given.

Note that a proportion of each atom in the atomic ratio of the oxide semiconductor films 313a, 313b, and 313c varies within a range of ±40% as an error.

The atomic ratio is not limited to the above, and the atomic ratio may be appropriately set in accordance with needed semiconductor characteristics.

The oxide semiconductor film 313a and the oxide semiconductor film 313c may have the same composition. For example, as the oxide semiconductor film 313a and the oxide semiconductor film 313c, an In—Ga—Zn oxide in which the atomic ratio of In to Ga and Zn is 1:3:2, 1:3:4, 1:4:5, 1:4:6, 1:4:7, or 1:4:8 may be used.

Alternatively, the oxide semiconductor films 313a and 313c may have different compositions. For example, an In—Ga—Zn oxide film in which the atomic ratio of In to Ga and Zn is 1:3:2 may be used as the oxide semiconductor film 313a, whereas an In—Ga—Zn oxide film in which the atomic ratio of In to Ga and Zn is 1:3:4 or 1:4:5 may be used as the oxide semiconductor film 313c.

The thickness of each of the oxide semiconductor films 313a and 313c is greater than or equal to 3 nm and less than or equal to 100 nm, or greater than or equal to 3 nm and less than or equal to 50 nm. The thickness of the oxide semiconductor film 313b is greater than or equal to 3 nm and less than or equal to 200 nm, greater than or equal to 3 nm and less than or equal to 100 nm, or greater than or equal to 3 nm and less than or equal to 50 nm. When the thicknesses of the oxide semiconductor films 313a and 313c are made smaller than that of the oxide semiconductor film 313b, the amount of change in the threshold voltage of the transistor can be reduced.

The interface between the oxide semiconductor film 313b and each of the oxide semiconductor films 313a and 313c can be observed by scanning transmission electron microscopy (STEM) in some cases.

Oxygen vacancies in the oxide semiconductor film 313b can be reduced by providing the oxide semiconductor films 313a and 313c in which oxygen vacancies are less likely to be generated than the oxide semiconductor film 313b in contact with the upper surface and the lower surface of the oxide semiconductor film 313b. Furthermore, since the oxide semiconductor film 313b is in contact with the oxide semiconductor films 313a and 313c containing one or more metal elements forming the oxide semiconductor film 313b, the interface state densities between the oxide semiconductor film 313a and the oxide semiconductor film 313b and between the oxide semiconductor film 313b and the oxide semiconductor film 313c are extremely low. Accordingly, oxygen vacancies contained in the oxide semiconductor film 313b can be reduced.

In addition, with the oxide semiconductor film 313a, variation in the electrical characteristics of the transistor, such as a threshold voltage, can be reduced.

Since the oxide semiconductor film 313c containing one or more metal elements forming the oxide semiconductor film 313b is provided in contact with the oxide semiconductor film 313b, scattering of carriers does not easily occur at an interface between the oxide semiconductor film 313b and the oxide semiconductor film 313c, and thus the field-effect mobility of the transistor can be increased.

Furthermore, the oxide semiconductor films 313a and 313c each also serve as a barrier film which suppresses formation of an impurity state due to the entry of the constituent elements of the insulating films 311 and 317 into the oxide semiconductor film 313b.

As described above, in the transistors described in this embodiment, variation in the electrical characteristics, such as a threshold voltage, is reduced. The display device described in the any of the above embodiments is formed using transistors in which variation in the threshold voltage is reduced; thus, variation in the threshold voltage can be corrected easily and effectively.

Figure 59A:
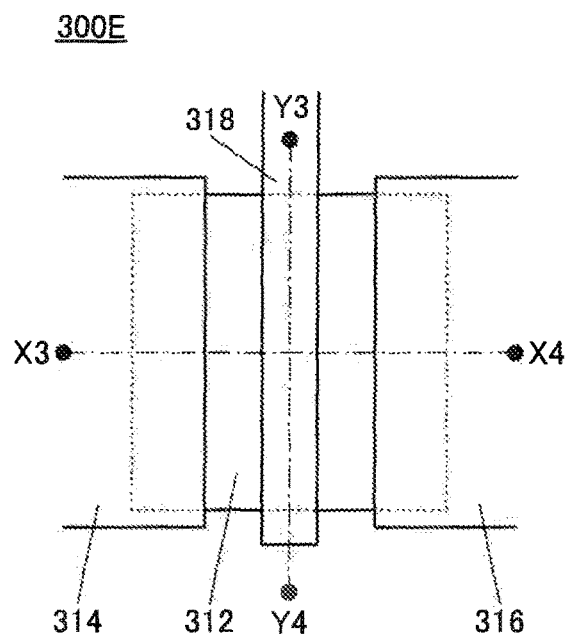
FIGS. 59A to 59C are a top view and cross-sectional views of an example of a transistor of one embodiment of the present invention.
Figure 59B:
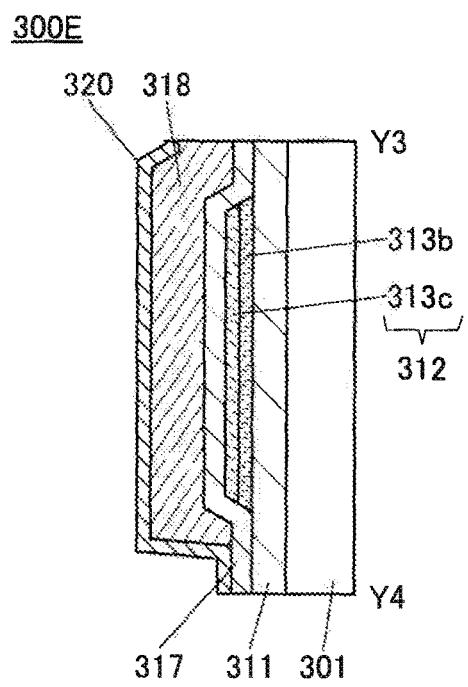
Figure 59C:
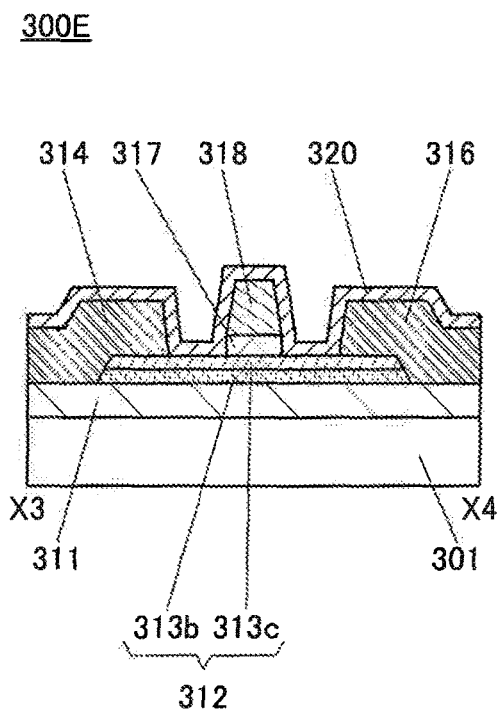

A transistor having a structure different from that in FIGS. 58A to 58C is illustrated in FIGS. 59A to 59C.

FIGS. 59A to 59C are a top view and cross-sectional views of the transistor 300E included in the display device. FIG. 59A is a top view of the transistor 300E, FIG. 59B is a cross-sectional view taken along dashed-dotted line Y1-Y2 in FIG. 59A, and FIG. 59C is a cross-sectional view taken along dashed-dotted line X1-X2 in FIG. 59A. Note that in FIG. 59A, the substrate 301, the insulating films 311, 317, and 320, and the like are omitted for simplicity. FIG. 59B is the cross-sectional view of the transistor 300E in the channel width direction. Moreover, FIG. 59C is the cross-sectional view of the transistor 300E in the channel length direction.

Like the oxide semiconductor film 312 of the transistor 300E illustrated in FIGS. 59A to 59C, the oxide semiconductor film 312 may have a stacked-layer structure of the oxide semiconductor film 313b in contact with the insulating film 311 and the oxide semiconductor film 313c in contact with the oxide semiconductor film 313b and the insulating film 317.

<Band Structure>

Figure 60A:
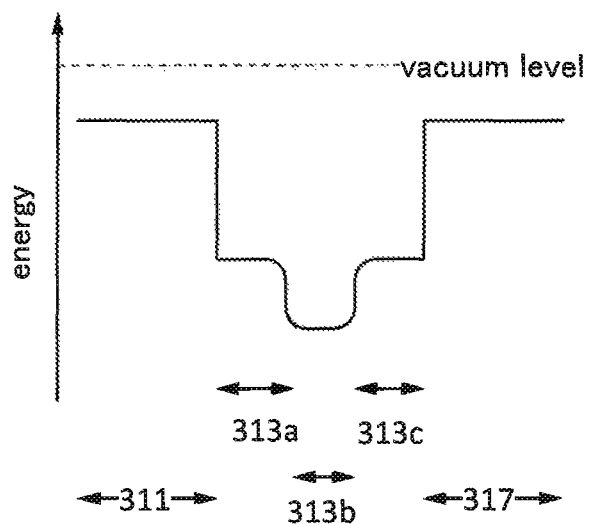
FIGS. 60A and 60B are schematic views of band structures of examples of a transistor of one embodiment of the present invention.
Figure 60B:
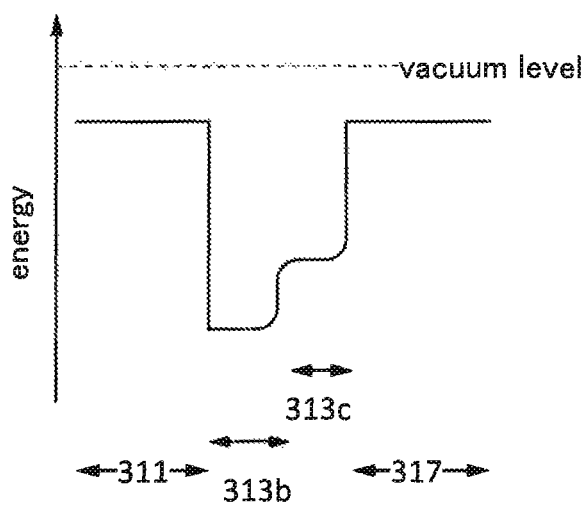

Here, the band structures of the transistor illustrated in FIGS. 58A to 58C and the transistor illustrated in FIGS. 59A to 59C are described. Note that FIG. 60A shows the band structure of the transistor 300D illustrated in FIGS. 58A to 58C, and for easy understanding, the energy (Ec) of the bottom of the conduction band of each of the insulating film 311, the oxide semiconductor film 313a, the oxide semiconductor film 313b, the oxide semiconductor film 313c, and the insulating film 317 is shown. FIG. 60B shows the band structure of the transistor 300E illustrated in FIGS. 59A to 59C, and for easy understanding, the energy (Ec) of the bottom of the conduction band of each of the insulating film 311, the oxide semiconductor film 313b, the oxide semiconductor film 313c, and the insulating film 317 is shown.

As illustrated in FIG. 60A, the energies at the bottoms of the conduction bands are changed continuously in the oxide semiconductor films 313a, 313b, and 313c. This can be understood also from the fact that the constituent elements are common among the oxide semiconductor films 313a, 313b, and 313c and oxygen is easily diffused among the oxide semiconductor films 313a to 313c. Thus, the oxide semiconductor films 313a, 313b, and 313c have a continuous physical property although they are a stack of films having different compositions.

The oxide semiconductor films that are stacked and contain the same main components have not only a simple stacked-layer structure of the layers but also a continuous energy band (here, in particular, a well structure having a U shape in which energies at the bottoms of the conduction bands are changed continuously between layers (U-shaped well)). That is, the stacked-layer structure is formed so that a defect state which serves as a trap center or a recombination center in an oxide semiconductor, or an impurity which inhibits the flow of carriers does not exist at interfaces between the layers. If impurities are mixed between the oxide semiconductor films stacked, the continuity of the energy band is lost and carriers disappear by a trap or recombination.

Note that FIG. 60A illustrates the case where the Ec of the oxide semiconductor film 313a and the Ec of the oxide semiconductor film 313c are equal to each other; however, they may be different from each other.

As illustrated in FIG. 60A, the oxide semiconductor film 313b serves as a well and a channel of the transistor 300D is formed in the oxide semiconductor film 313b. Note that since the energies at the bottoms of the conduction bands are changed continuously in the oxide semiconductor films 313a, 313b, and 313c, a channel in the well structure having a U shape can also be referred to as a buried channel.

As illustrated in FIG. 60B, the energies at the bottoms of the conduction bands are changed continuously in the oxide semiconductor films 313b and 313c.

As illustrated in FIG. 60B, the oxide semiconductor film 313b serves as a well and a channel of the transistor 300E is formed in the oxide semiconductor film 313b.

The transistor 300D illustrated in FIGS. 58A to 58C includes the oxide semiconductor films 313a and 313c containing one or more metal elements forming the oxide semiconductor film 313b; therefore, interface states are not easily formed at the interface between the oxide semiconductor film 313a and the oxide semiconductor film 313b and the interface between the oxide semiconductor film 313c and the oxide semiconductor film 313b. Thus, with the oxide semiconductor films 313a and 313c, variation or change in the electrical characteristics of the transistor, such as a threshold voltage, can be reduced.

The transistor 300E illustrated in FIGS. 59A to 59C includes the oxide semiconductor film 313c containing one or more metal elements forming the oxide semiconductor film 313b; therefore, an interface state is not easily formed at the interface between the oxide semiconductor film 313c and the oxide semiconductor film 313b. Thus, with the oxide semiconductor film 313c, variation or change in the electrical characteristics of the transistor, such as a threshold voltage, can be reduced. The display device described in any of the above embodiments is formed using the transistors in which variation in the threshold voltage is reduced; thus, variation in the threshold voltage can be corrected easily and effectively.

Structure Example 4 of Transistor

Next, another structure of the transistor included in the display device is described with reference to FIGS. 61A to 61D.

Figure 61A:
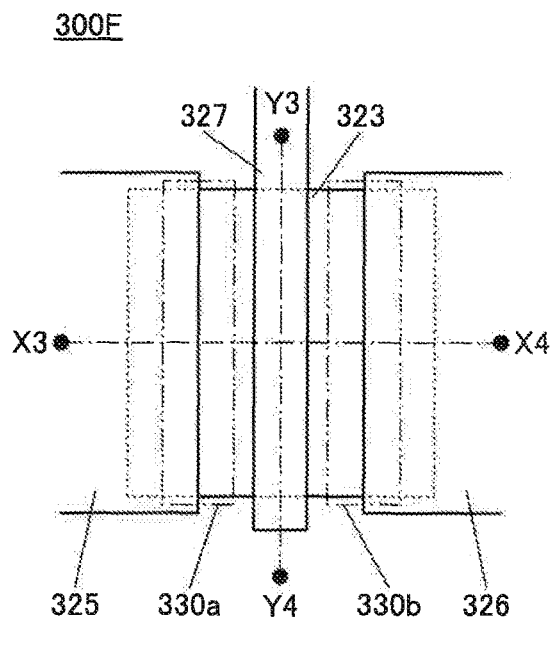
FIGS. 61A to 61D are a top view and cross-sectional views of an example of a transistor of one embodiment of the present invention.
Figure 61B:
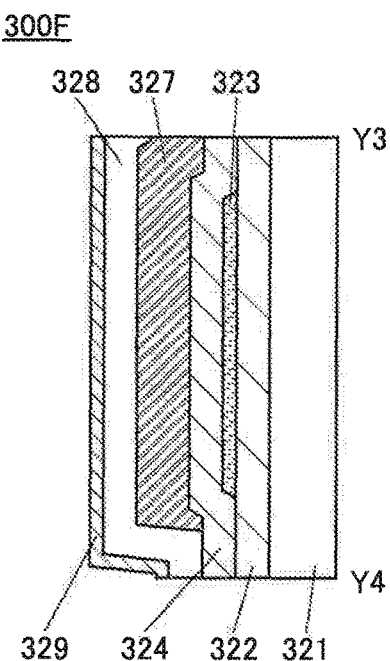
Figure 61C:
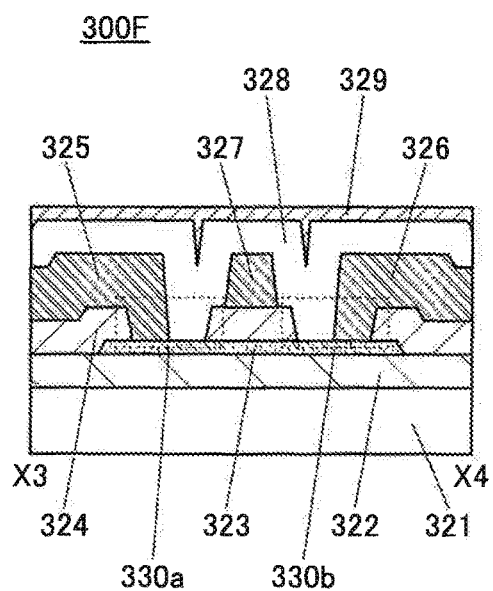

FIGS. 61A to 61C are a top view and cross-sectional views of a transistor 300F included in the display device. FIG. 61A is a top view of the transistor 300F, FIG. 61B is a cross-sectional view taken along dashed-dotted line Y3-Y4 in FIG. 61A, and FIG. 61C is a cross-sectional view taken along dashed-dotted line X3-X4 in FIG. 61A.

The transistor 300F illustrated in FIGS. 61A to 61D includes an oxide semiconductor film 323 over an insulating film 322 formed over a substrate 321, an insulating film 324 in contact with the oxide semiconductor film 323, a conductive film 325 in contact with the oxide semiconductor film 323 in part of an opening 330a formed in the insulating film 324, a conductive film 326 in contact with the oxide semiconductor film 323 in part of an opening 330b formed in the insulating film 324, and a conductive film 327 overlapping with the oxide semiconductor film 323 with the insulating film 324 provided therebetween. Note that insulating films 328 and 329 may be provided over the transistor 300F.

Regions of the oxide semiconductor film 323 not overlapping with the conductive films 325 and 326 and the conductive film 327 each include an element which forms an oxygen vacancy. An element which forms an oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 61D:
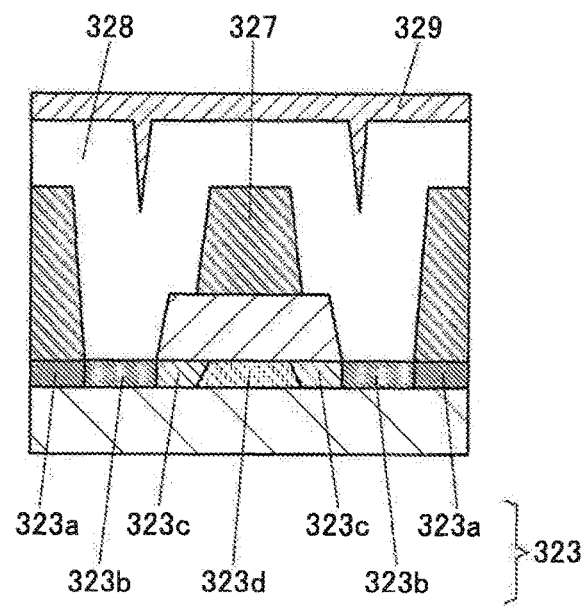

Here, FIG. 61D is a partial enlarged view of the oxide semiconductor film 323. As illustrated in FIG. 61D, the oxide semiconductor film 323 includes regions 323a in contact with the conductive films 325 and 326, regions 323b in contact with the insulating film 328, and regions 323c and a region 323d which overlap with the insulating film 324.

Figure 56B:
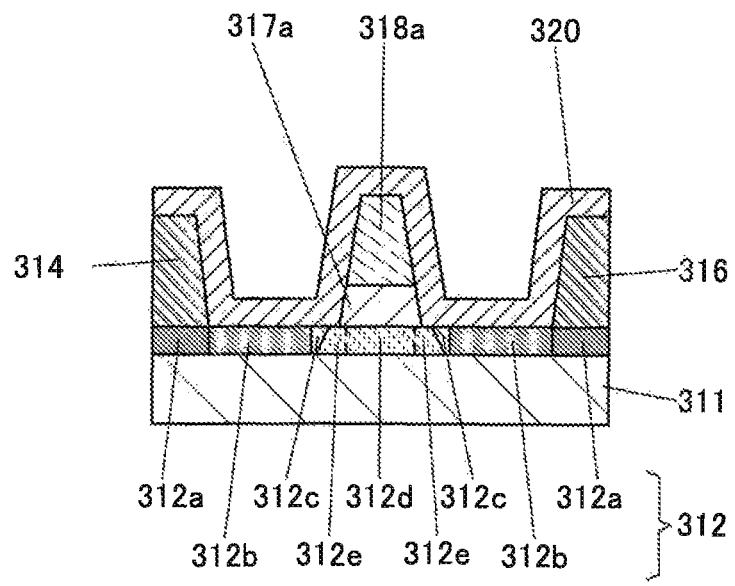

The regions 323a have high conductivity and function as a source region and a drain region in a manner similar to that of the regions 312a illustrated in FIGS. 56A and 56B.

The regions 323b and 323c function as low-resistance regions. The regions 323b and 323c contain an impurity element. Note that the concentrations of the impurity element in the regions 323b are higher than those in the regions 323c. Note that in the case where the conductive film 327 has a tapered side surface, part of the regions 323c may overlap with the conductive film 327.

In the case where a rare gas element is used as the impurity element and the oxide semiconductor film 323 is formed by a sputtering method, the regions 323a to 323d contain the rare gas element, and the concentrations of the rare gas elements in the regions 323b and 323c are higher than those in the regions 323a and 323d. This is due to the fact that in the case where the oxide semiconductor film 323 is formed by a sputtering method, a rare gas is contained in the oxide semiconductor film 323 because the rare gas is used as a sputtering gas and the rare gas is intentionally added to the oxide semiconductor film 323 in order to form oxygen vacancies in the regions 323b and 323c. Note that a rare gas element different from that in the regions 323a and 323d may be added to the regions 323b and 323c.

In the case where the impurity element is boron, carbon, nitrogen, fluorine, aluminum, silicon, phosphorus, or chlorine, only the regions 323b and 323c contain the impurity element. Therefore, the concentrations of the impurity element in the regions 323b and 323c are higher than those in the regions 323a and 323d. Note that the concentrations of the impurity element in the regions 323b and 323c which are measured by SIMS can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The concentrations of hydrogen in the regions 323b and 323c are higher than those in the regions 323a and 323d in the case where the impurity elements are hydrogen. Note that the concentrations of hydrogen in the regions 323b and 323c which are measured by SIMS can be greater than or equal to $8\times10^{19}$ atoms/cm$^3$, greater than or equal to $1\times10^{20}$ atoms/cm$^3$, or greater than or equal to $5\times10^{20}$ atoms/cm$^3$.

Since the regions 323b and 323c contain the impurity elements, oxygen vacancies and carrier densities of the regions 323b and 323c are increased. As a result, the region 323b and the region 323c have higher conductivity and serve as low-resistance regions. By provision of the low-resistance regions in such a manner, the resistance between the channel and the source region and the drain region can be reduced, and the transistor 300F has a high on-state current and high field-effect mobility. Thus, the transistor 300F can be preferably used as the driving transistor (e.g., the transistor 31) described in the above embodiment.

Note that the impurity elements may be a combination of one or more of hydrogen, boron, carbon, nitrogen, fluorine, aluminum, silicon, phosphorus, and chlorine and one or more of rare gases. In that case, due to interaction between oxygen vacancies formed by the rare gas in the regions 323b and 323c and one or more of hydrogen, boron, carbon, nitrogen, fluorine, aluminum, silicon, phosphorus, and chlorine added to the above regions, the conductivity of the regions 323b and 323c might be further increased.

The region 323d serves as a channel.

A region of the insulating film 324 overlapping with the oxide semiconductor film 323 and the conductive film 327 functions as a gate insulating film. In addition, a region of the insulating film 324 overlapping with the oxide semiconductor film 323 and the conductive films 325 and 326 functions as an interlayer insulating film.

The conductive film 325 and the conductive film 326 serve as a source electrode and a drain electrode. The conductive film 327 functions as a gate electrode.

In the manufacturing process of the transistor 300F described in this embodiment, the conductive film 327 functioning as a gate electrode and the conductive films 325 and 326 functioning as a source electrode and a drain electrode are formed at the same time. Therefore, in the transistor 300F, the conductive film 327 does not overlap with the conductive films 325 and 326, and parasitic capacitance formed between the conductive film 327 and each of the conductive films 325 and 326 can be reduced. As a result, in the case where a large-sized substrate is used as the substrate 321, signal delays in the conductive films 325 to 327 can be reduced.

In addition, in the transistor 300F, the impurity element is added to the oxide semiconductor film 323 using the conductive films 325 to 327 as masks. That is, the low-resistance regions can be formed in a self-aligned manner.

The substrate 301 illustrated in FIGS. 54A and 54B can be used as appropriate as the substrate 321.

As the insulating film 322, the insulating film 311 illustrated in FIGS. 54A and 54B can be used as appropriate.

The oxide semiconductor films 303 and 312 illustrated in FIGS. 54A and 54B can be used as appropriate as the oxide semiconductor film 323.

The insulating films 306 and 317 illustrated in FIGS. 54A and 54B can be used as appropriate as the insulating film 324.

Since the conductive films 325 to 327 are formed at the same time, they are formed using the same materials and have the same stacked-layer structures.

The conductive films 314 and 316, the conductive film 318, the conductive films 304 and 305, the conductive film 302, and the conductive film 307 illustrated in FIGS. 54A and 54B can be used as appropriate as the conductive films 325 to 327.

The insulating film 328 can be formed with a single layer or a stack using one or more of an oxide insulating film and a nitride insulating film. Note that an oxide insulating film is preferably used as at least a region of the insulating film 328 that is in contact with the oxide semiconductor film 323, in order to improve characteristics of the interface with the oxide semiconductor film 323. An oxide insulating film that releases oxygen by being heated is preferably used as the insulating film 328, in which case oxygen contained in the insulating film 328 can be moved to the oxide semiconductor film 323 by heat treatment.

The insulating film 328 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

It is preferable that the insulating film 329 be a film functioning as a barrier film against hydrogen, water, or the like from the outside. The insulating film 329 can be formed with a single layer or a stack using, for example, one or more of silicon nitride, silicon nitride oxide, aluminum oxide, and the like.

The thicknesses of the insulating films 328 and 329 each can be greater than or equal to 30 nm and less than or equal to 500 nm, or greater than or equal to 100 nm and less than or equal to 400 nm.

Note that in a manner similar to that of the transistor 300B illustrated in FIGS. 54A and 54B, the transistor 300F can have a dual-gate structure in which a conductive film is provided below the insulating film 322 so as to overlap with the oxide semiconductor film 323.

Structure Example 5 of Transistor

Next, another structure of the transistor included in the display device is described with reference to FIGS. 62A to 62C and FIGS. 63A and 63B.

Figure 62A:
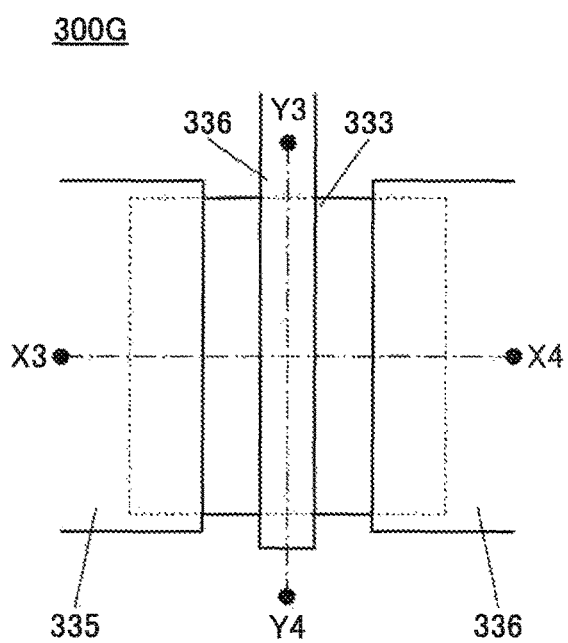
FIGS. 62A to 62C are a top view and cross-sectional views of an example of a transistor of one embodiment of the present invention.
Figure 62B:
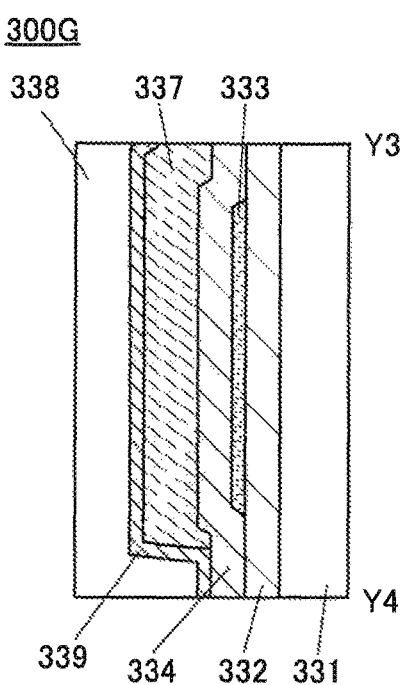
Figure 62C:
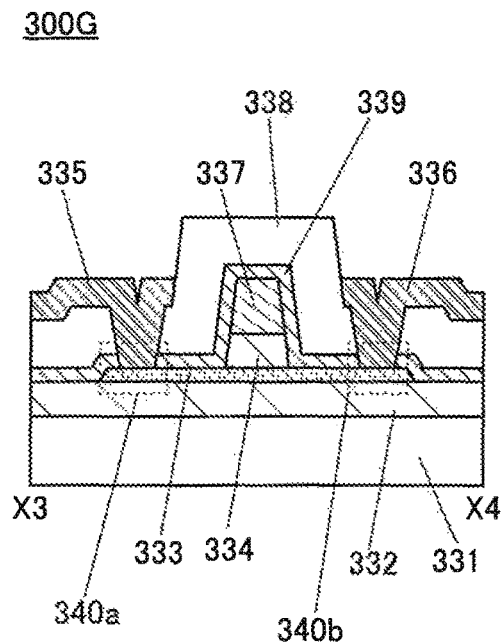

FIGS. 62A to 62C are a top view and cross-sectional views of a transistor 300G included in the display device. FIG. 62A is a top view of the transistor 300G, FIG. 62B is a cross-sectional view taken along dashed-dotted line Y3-Y4 in FIG. 62A, and FIG. 62C is a cross-sectional view taken along dashed-dotted line X3-X4 in FIG. 62A.

The transistor 300G illustrated in FIGS. 62A to 62C includes an oxide semiconductor film 333 over an insulating film 332 formed over a substrate 331, an insulating film 334 in contact with the oxide semiconductor film 333, a conductive film 337 overlapping with the oxide semiconductor film 333 with the insulating film 334 provided therebetween, an insulating film 339 in contact with the oxide semiconductor film 333, an insulating film 338 formed over the insulating film 339, a conductive film 335 in contact with the oxide semiconductor film 333 in an opening 340a formed in the insulating films 338 and 339, and a conductive film 336 in contact with the oxide semiconductor film 333 in an opening 340b formed in the insulating films 338 and 339.

The conductive film 337 of the transistor 300G functions as a gate electrode. The conductive films 335 and 336 function as a source electrode and a drain electrode.

Regions of the oxide semiconductor film 333 which do not overlap with the conductive film 335, the conductive film 336, and the conductive film 337 each include an element which forms an oxygen vacancy. An element which forms an oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 63A:
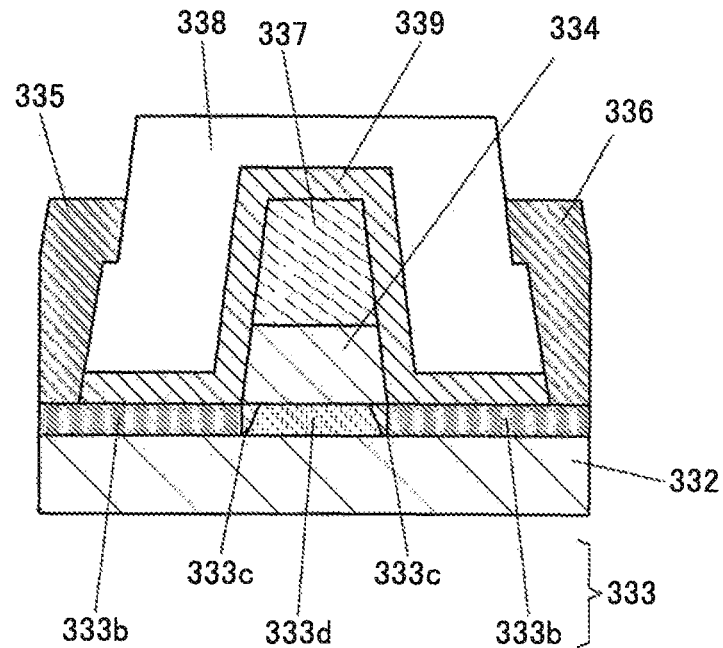
FIGS. 63A and 63B are cross-sectional views of examples of a transistor of one embodiment of the present invention.
Figure 63B:
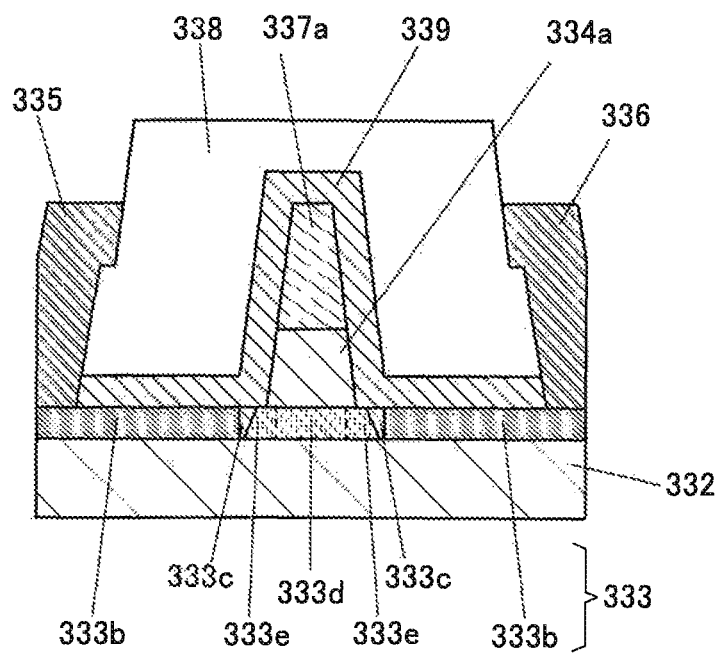

Here, FIG. 63A is a partial enlarged view of the oxide semiconductor film 333. As illustrated in FIG. 63A, the oxide semiconductor film 333 includes regions 333b in contact with the conductive film 335, the conductive film 336, or the insulating film 338 and a region 333d in contact with the insulating film 334. Note that in the case where the conductive film 337 has a tapered side surface, the oxide semiconductor film 333 may include a region 333c overlapping with a tapered portion of the conductive film 337.

The region 333b functions as a low-resistance region. The region 333b contains at least a rare gas element and hydrogen as impurity elements. Note that in the case where the conductive film 337 has a tapered side surface, the impurity element is added to the region 333c through the tapered portion of the conductive film 337; therefore, the region 333c contains the impurity element, though the concentration of the rare gas element which is an example of the impurity element of the region 333c is lower than that in the region 333b. With the regions 333c, source-drain breakdown voltage of the transistor can be increased.

In the case where the oxide semiconductor film 333 is formed by a sputtering method, the regions 333b to 333d each contain the rare gas element, and the concentrations of the rare gas elements in the regions 333b and 333c are higher than those in the region 333d. This is due to the fact that in the case where the oxide semiconductor film 333 is formed by a sputtering method, the rare gas element is contained in the oxide semiconductor film 333 because the rare gas element is used as a sputtering gas and the rare gas element is intentionally added to the oxide semiconductor film 333 in order to form oxygen vacancies in the regions 333b and 333c. Note that a rare gas element different from that in the region 333d may be added to the regions 333b and 333c.

Since the region 333b is in contact with the insulating film 338, the concentration of hydrogen in the region 333b is higher than that in the region 333d. In addition, in the case where hydrogen is diffused from the region 333b into the region 333c, the concentration of hydrogen in the region 333c is higher than that in the region 333d. However, the concentration of hydrogen in the region 333b is higher than that in the region 333c.

In the regions 333b and 333c, the concentrations of hydrogen measured by secondary ion mass spectrometry (SIMS) can be greater than or equal to $8\times10^{19}$ atoms/cm$^3$, greater than or equal to $1\times10^{20}$ atoms/cm$^3$, or greater than or equal to $5\times10^{20}$ atoms/cm$^3$. Note that the concentration of hydrogen in the region 333d which is measured by secondary ion mass spectrometry can be less than or equal to $5\times10^{19}$ atoms/cm$^3$, less than or equal to $1\times10^{19}$ atoms/cm$^3$, less than or equal to $5\times10^{18}$ atoms/cm$^3$, less than or equal to $1\times10^{18}$ atoms/cm$^3$, less than or equal to $5\times10^{17}$ atoms/cm$^3$, or less than or equal to $1\times10^{16}$ atoms/cm$^3$.

In the case where boron, carbon, nitrogen, fluorine, aluminum, silicon, phosphorus, or chlorine is added to the oxide semiconductor film 333 as an impurity element, only the regions 333b and 333c contain the impurity element. Therefore, the concentrations of the impurity element in the regions 333b and 333c are higher than that in the region 333d. Note that the concentrations of the impurity element in the regions 333b and 333c which are measured by secondary ion mass spectrometry can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The regions 333b and 333c have higher concentrations of hydrogen and larger amounts of oxygen vacancies due to addition of the rare gas element than the region 333d. Therefore, the regions 333b and 333c have higher conductivity and function as low-resistance regions. The resistivity of the regions 333b and 333c can be typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

Note that when the amount of hydrogen in each of the regions 333b and 333c is the same as or smaller than the amount of oxygen vacancies therein, hydrogen is easily captured by oxygen vacancies and is less likely to be diffused into the region 333d serving as a channel. As a result, a transistor having normally-off characteristics can be obtained.

The region 333d serves as a channel.

In addition, after the impurity element is added to the oxide semiconductor film 333 using the conductive film 337 as a mask, the area of the conductive film 337 when seen from the above may be reduced. This can be performed in such a manner that a slimming process is performed on a mask over the conductive film 337 in a step of forming the conductive film 337 so as to obtain a mask with a minuter structure. Then, the conductive film 337 and the insulating film 334 are etched using the mask, so that a conductive film 337a and an insulating film 334a illustrated in FIG. 63B can be formed. As the slimming process, an ashing process using an oxygen radical or the like can be employed, for example.

As a result, an offset region 333e is formed between the region 333c and the region 333d serving as a channel in the oxide semiconductor film 333. Note that the length of the offset region 333e in the channel length direction is set to be less than 0.1 μm, whereby a decrease in the on-state current of the transistor can be suppressed.

The substrate 301 illustrated in FIGS. 62A and 62B can be used as appropriate as the substrate 331 illustrated in FIGS. 54A and 54B.

The insulating film 311 illustrated in FIGS. 62A and 62B can be used as appropriate as the insulating film 332 illustrated in FIGS. 54A and 54B.

The oxide semiconductor films 303 and 312 illustrated in FIGS. 62A and 62B can be used as appropriate as the oxide semiconductor film 333 illustrated in FIGS. 54A and 54B.

The insulating films 306 and 317 illustrated in FIGS. 62A and 62B can be used as appropriate as the insulating film 334 illustrated in FIGS. 54A and 54B.

The conductive films 314 and 316, the conductive film 318, the conductive films 304 and 305, the conductive film 302, and the conductive film 307 illustrated in FIGS. 62A and 62B can be used as appropriate as the conductive films 335 and 336 and the conductive film 337 illustrated in FIGS. 54A and 54B.

The thicknesses of the insulating films 337 and 338 each can be greater than or equal to 30 nm and less than or equal to 500 nm, or greater than or equal to 100 nm and less than or equal to 400 nm.

In the transistor 300G, the conductive film 337 does not overlap with the conductive films 335 and 336, and parasitic capacitance formed between the conductive film 337 and each of the conductive films 335 and 336 can be reduced. As a result, in the case where a large-sized substrate is used as the substrate 331, signal delays in the conductive films 335 to 337 can be reduced.

In addition, in the transistor 300G, the impurity element is added to the oxide semiconductor film 333 using the conductive film 337 as a mask. That is, the low-resistance regions can be formed in a self-aligned manner.

Note that in a manner similar to that of the transistor 300B illustrated in FIGS. 54A and 54B, the transistor 300G can have a dual-gate structure in which a conductive film is provided below the insulating film 332 so as to overlap with the oxide semiconductor film 333.

The structure described above in this embodiment can be combined as appropriate with any of the structures described in the other embodiments.

Structure Example 6 of Transistor

Next, another structure of the transistor included in the display device is described.

Figure 70A:
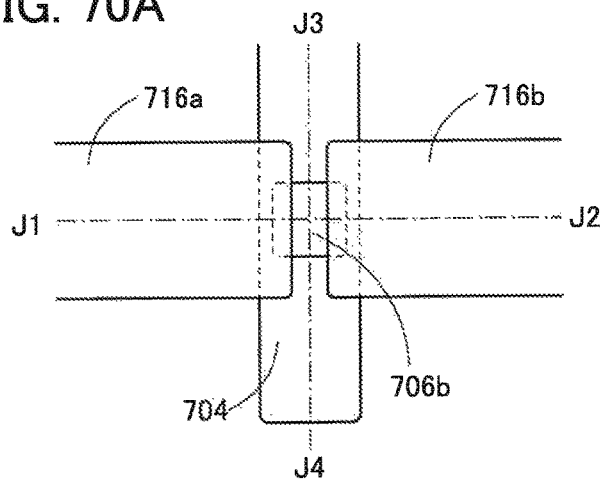
FIGS. 70A to 70C are a top view and cross-sectional views of examples of a transistor of one embodiment of the present invention.
Figure 70B:
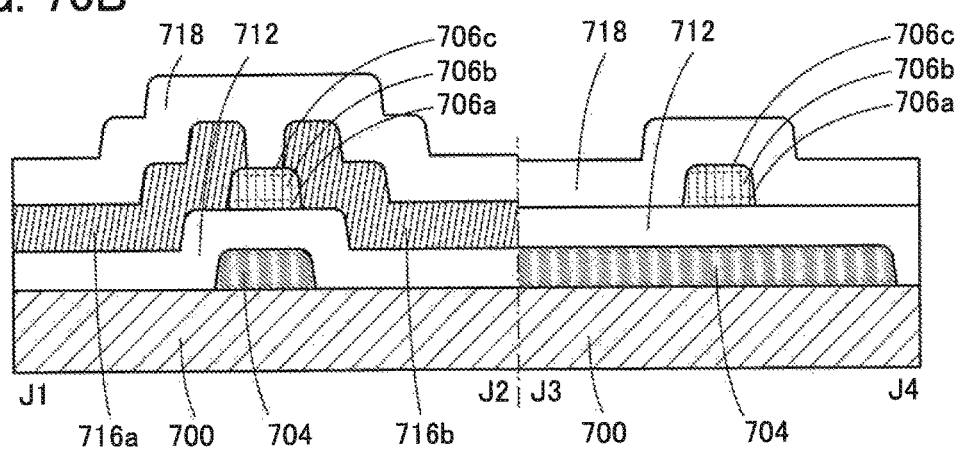

FIGS. 70A and 70B are a top view and a cross-sectional view which illustrate a transistor of one embodiment of the present invention. FIG. 70A is a top view and FIG. 70B is a cross-sectional view taken along dashed-dotted line J1-J2 and dashed-dotted line J3-J4 in FIG. 70A. Note that for simplification of the drawing, some components in the top view in FIG. 70A are not illustrated.

The transistor in FIGS. 70A and 70B includes a conductive film 704 over a substrate 700, an insulating film 712 over the conductive film 704, a semiconductor film 706a over the insulating film 712, a semiconductor film 706b over the semiconductor film 706a, a semiconductor film 706c over the semiconductor film 706b, a conductive film 716a and a conductive film 716b which are in contact with the semiconductor film 706a, the semiconductor film 706b, and the semiconductor film 706c and which are arranged to be apart from each other, and an insulating film 718 over the semiconductor film 706c, the conductive film 716a, and the conductive film 716b. The conductive film 704 faces a bottom surface of the semiconductor film 706b with the insulating film 712 provided therebetween. The insulating film 712 may have a projection. Note that an insulating film may be provided between the substrate 700 and the conductive film 704. For the insulating film, the insulating film 712 or the insulating film 718 which is described later is referred to. Alternatively, the semiconductor film 706a is not necessarily provided. The insulating film 718 is not necessarily provided.

The semiconductor film 706b functions as a channel formation region of the transistor. The conductive film 704 functions as a first gate electrode (also referred to as a front gate electrode) of the transistor. The conductive film 716a and the conductive film 716b function as a source electrode and a drain electrode of the transistor.

The insulating film 712 and the insulating film 718 are each preferably an insulator containing excess oxygen.

As the substrate 700, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate containing silicon carbide, silicon germanium, gallium arsenide, indium phosphide, zinc oxide, or gallium oxide as a material is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 700. As a method of providing the transistor over a flexible substrate, there is a method in which the transistor is formed over a non-flexible substrate and then the transistor is separated and transferred to the substrate 700 which is a flexible substrate. In that case, a separation layer is preferably provided between the non-flexible substrate and the transistor. As the substrate 700, a sheet, a film, or a foil containing a fiber may be used. The substrate 700 may have elasticity. The substrate 700 may have a property of returning to its original shape when bending or pulling is stopped. Alternatively, the substrate 700 may have a property of not returning to its original shape. The thickness of the substrate 700 is, for example, greater than or equal to 5 µm and less than or equal to 700 µm, preferably greater than or equal to 10 µm and less than or equal to 500 µm, or further preferably greater than or equal to 15 µm and less than or equal to 300 µm. When the substrate 700 has a small thickness, the weight of the semiconductor device can be reduced. When the substrate 700 has a small thickness, even in the case of using glass or the like, the substrate 700 may have elasticity or a property of returning to its original shape when bending or pulling is stopped. Therefore, an impact applied to the semiconductor device over the substrate 700, which is caused by dropping or the like, can be reduced. That is, a durable semiconductor device can be provided.

For the substrate 700 which is a flexible substrate, metal, an alloy, resin, glass, or fiber thereof can be used, for example. The flexible substrate 700 preferably has a lower coefficient of linear expansion because deformation due to an environment is suppressed. The flexible substrate 700 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 700 because of its low coefficient of linear expansion.

The conductive film 704 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulating film 712 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 712 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Next, a semiconductor which can be used for the semiconductor film 706a, the semiconductor film 706b, the semiconductor film 706c, or the like is described below.

The semiconductor film 706b is an oxide semiconductor containing indium, for example. An oxide semiconductor can have high carrier mobility (electron mobility) by containing indium, for example. The semiconductor film 706b preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor film 706b preferably contains zinc. When the oxide semiconductor contains zinc, the oxide semiconductor is easily to be crystallized, for example.

Note that the semiconductor film 706b is not limited to the oxide semiconductor containing indium. The semiconductor film 706b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor film 706b, an oxide with a wide energy gap may be used. For example, the energy gap of the semiconductor film 706b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor film 706a and the semiconductor film 706c include one or more elements other than oxygen included in the semiconductor film 706b. Since the semiconductor film 706a and the semiconductor film 706c each include one or more elements other than oxygen included in the semiconductor film 706b, an interface state is less likely to be formed at the interface between the semiconductor film 706a and the semiconductor film 706b and the interface between the semiconductor film 706b and the semiconductor film 706c.

The semiconductor film 706a, the semiconductor film 706b, and the semiconductor film 706c preferably include at least indium. In the case of using an In-M-Zn oxide as the semiconductor film 706a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor film 706b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor film 706c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor film 706c may be an oxide that is a type the same as that of the semiconductor film 706a. Note that at least one of the semiconductor film 706a and the semiconductor film 706c does not necessarily contain indium in some cases. For example, at least one of the semiconductor film 706a and the semiconductor film 706c may be gallium oxide.

As the semiconductor film 706b, an oxide having an electron affinity higher than those of the semiconductor films 706a and 706c is used. For example, as the semiconductor film 706b, an oxide having an electron affinity higher than those of the semiconductor films 706a and 706c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, at least one of the semiconductor films 706a and 706c preferably includes an indium gallium oxide. The gallium atomic ratio [Ga/(In+Ga)] is, for example, higher than or equal to 70%, preferably higher than or equal to 80%, further preferably higher than or equal to 90%.

Figure 71:
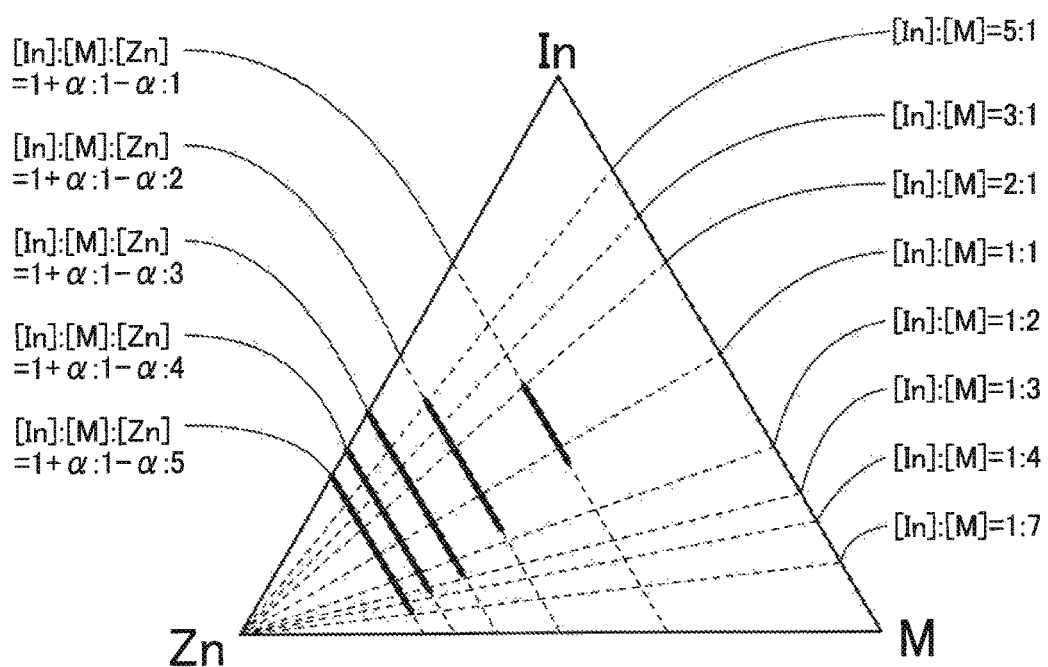
FIG. 71 is a triangular diagram for explaining composition of an In-M-Zn oxide.

Note that the composition of the semiconductor films 706a is preferably in the neighborhood of the composition represented by the bold line in FIG. 71. The composition of the semiconductor films 706b is preferably in the neighborhood of the composition represented by the bold line in FIG. 71. The composition of the semiconductor films 706c is preferably in the neighborhood of the composition represented by the bold line in FIG. 71. When these compositions are employed, the channel formation region of the transistor can have a single crystal structure. Alternatively, the channel formation region, the source region, and the drain region of the transistor can have a single crystal structure in some cases. When the channel formation region of the transistor has a single crystal structure, the transistor can have high frequency characteristics in some cases.

At this time, when a gate voltage is applied, a channel is formed in the semiconductor film 706b having the highest electron affinity in the semiconductor film 706a, the semiconductor film 706b, and the semiconductor film 706c.

Here, in some cases, there is a mixed region of the semiconductor film 706a and the semiconductor film 706b between the semiconductor film 706a and the semiconductor film 706b. Furthermore, in some cases, there is a mixed region of the semiconductor film 706b and the semiconductor film 706c between the semiconductor film 706b and the semiconductor film 706c. The mixed region has a low density of interface states. For that reason, the stack of the semiconductor film 706a, the semiconductor film 706b, and the semiconductor film 706c has a band structure where energy at each interface and in the vicinity of the interface is changed continuously (continuous junction).

At this time, electrons move mainly in the semiconductor film 706b, not in the semiconductor film 706a and the semiconductor film 706c. As described above, when the interface state density at the interface between the semiconductor film 706a and the semiconductor film 706b and the interface state density at the interface between the semiconductor film 706b and the semiconductor film 706c are decreased, electron movement in the semiconductor film 706b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor film 706b (a formation surface; here, the semiconductor film 706a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor film 706b contains oxygen vacancies (Vo), an elemental hydrogen, a hydrogen atom, or a hydrogen ion (also collectively referred to as hydrogen in this specification) might enter sites of the oxygen vacancies to form a donor level (hereinafter, hydrogen entering the sites of oxygen vacancies are also referred to as VoH). Because VoH scatters electrons, it is a factor of decreasing the on-state current of the transistor. Note that the sites of oxygen vacancies become more stable by entry of oxygen than by entry of hydrogen. Thus, by decreasing oxygen vacancies in the semiconductor film 706b, the on-state current of the transistor can be increased in some cases.

To decrease oxygen vacancies in the semiconductor film 706b, for example, there is a method in which excess oxygen in the insulating film 712 is moved to the semiconductor film 706b through the semiconductor film 706a. In this case, the semiconductor film 706a is preferably a layer having an oxygen-transmitting property (a layer through which oxygen passes or is transmitted).

The above three-layer structure is an example. For example, a two-layer structure without the semiconductor film 706a or the semiconductor film 706c may be employed. A four-layer structure in which any one of the semiconductor films described as examples of the semiconductor film 706a, the semiconductor film 706b, and the semiconductor film 706c is provided under or over the semiconductor film 706a or under or over the semiconductor film 706c may be employed. An n-layer structure (n is an integer of 5 or more) in which any one of the semiconductor films described as examples of the semiconductor film 706a, the semiconductor film 706b, and the semiconductor film 706c is provided at two or more of the following positions: over the semiconductor film 706a, under the semiconductor film 706a, over the semiconductor film 706c, and under the semiconductor film 706c.

Each of the conductive film 716a and the conductive film 716b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulating film 718 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 718 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Over the insulating film 718, a display element may be provided. For example, a pixel electrode, a liquid crystal layer, a common electrode, a light-emitting layer, an organic EL layer, an anode electrode, a cathode electrode, or the like may be provided. The display element is connected to the conductive film 716a or the like, for example.

Figure 70C:
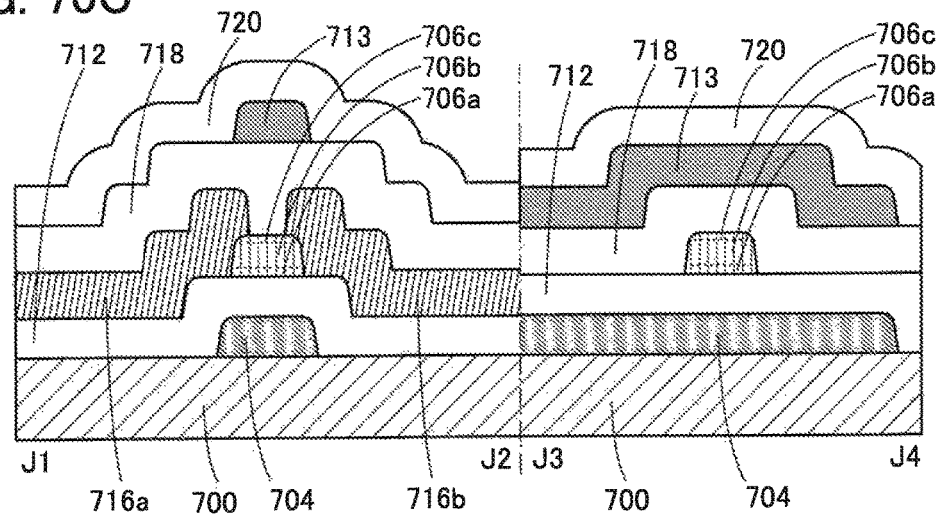

In FIG. 70B, a conductive film 713 may be provided over the insulating film 718. Furthermore, an insulating film 720 may be provided over the conductive film 713. An example in that case is shown in FIG. 70C. A potential or signal which is the same as that supplied to the conductive film 704 or a potential or signal which is different from that supplied to the conductive film 704 may be supplied to the conductive film 713. For example, by supplying a constant potential to the conductive film 713, the threshold voltage of a transistor may be controlled. In other words, the conductive film 713 can function as a second gate electrode. The insulating film 720 is not necessarily provided.

The conductive film 713 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Note that for the insulating film 720, the description of the insulating film 718 is referred to.

The structure described above in this embodiment can be combined as appropriate with any of the structures described in the other embodiments.

Embodiment 5

Figure 64:
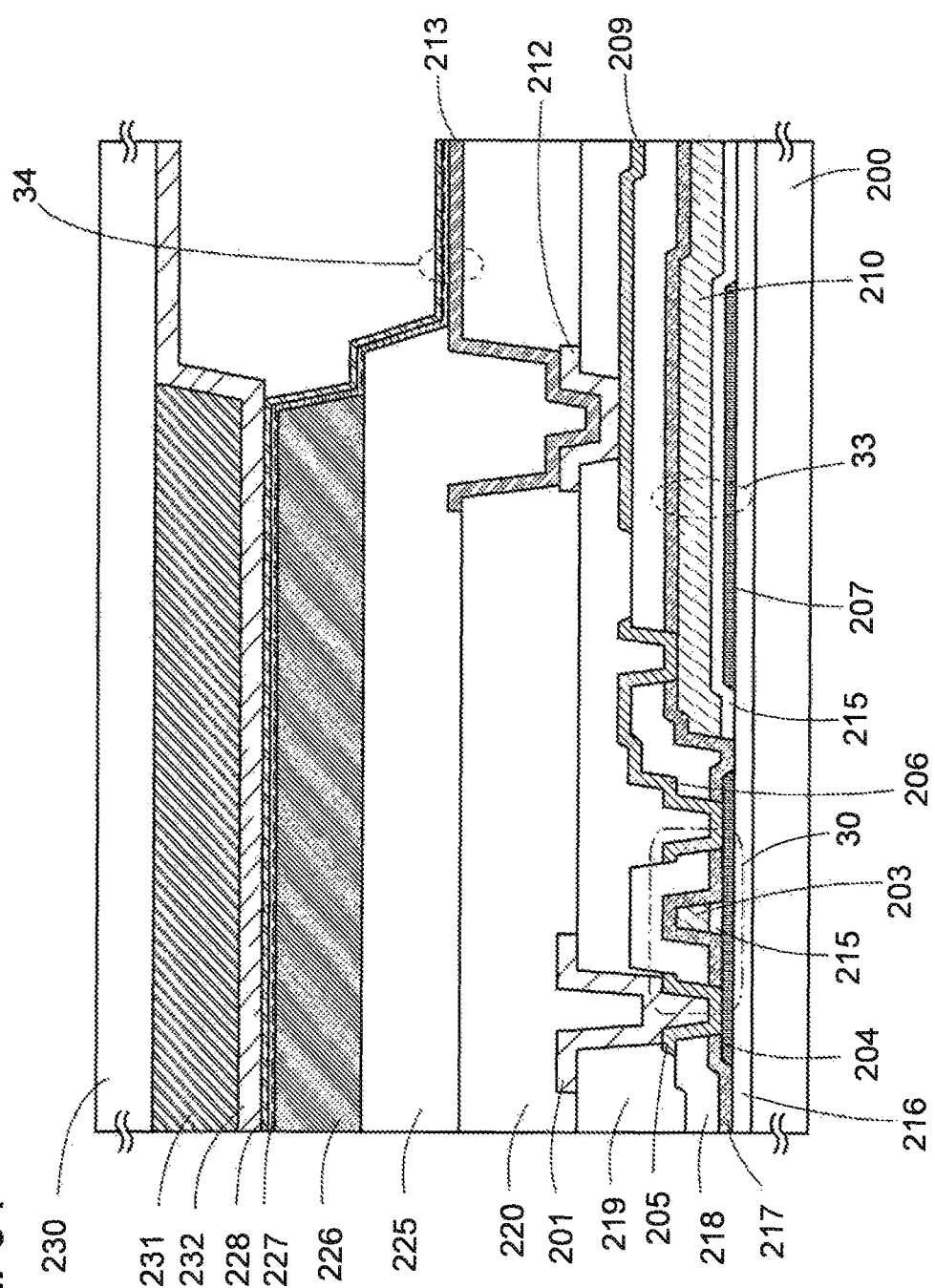
FIG. 64 is a cross-sectional view of an example of a pixel of a display device of one embodiment of the present invention.

An example of a cross-sectional structure of a pixel of a display device will be described in this embodiment. FIG. 64 illustrates the cross-sectional structure of the transistor 30, the capacitor 33, and the light-emitting element 34 of the pixel 35.

Specifically, the display device illustrated in FIG. 64 includes an insulating film 216 over a substrate 200, and the transistor 30 and the capacitor 33 over the insulating film 216. The transistor 30 includes a semiconductor film 204, an insulating film 215 over the semiconductor film 204, a conductive film 203 overlapping with the semiconductor film 204 with the insulating film 215 provided therebetween and functioning as a gate electrode, a conductive film 205 which is in contact with the semiconductor film 204 and is provided in an opening formed in an insulating film 217 and an insulating film 218, and a conductive film 206 which is similarly in contact with the semiconductor film 204 and is provided in an opening formed in the insulating films 217 and 218. Note that the conductive films 205 and 206 function as a source electrode and a drain electrode of the transistor 30.

The capacitor 33 includes a semiconductor film 207 functioning as an electrode, the insulating film 215 over the semiconductor film 207, and a conductive film 210 overlapping with the semiconductor film 207 with the insulating film 215 provided therebetween and functioning as an electrode.

The insulating film 215 may be formed with a single layer or a stack of an insulating film containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In the case where an oxide semiconductor is used for the semiconductor film 204, it is preferable to use a material that can supply oxygen to the semiconductor film 204 for the insulating film 216. By using the material for the insulating film 216, oxygen contained in the insulating film 216 can be moved to the semiconductor film 204, and the amount of oxygen vacancies in the semiconductor film 204 can be reduced. Oxygen contained in the insulating film 216 can be moved to the semiconductor film 204 efficiently by heat treatment performed after the semiconductor film 204 is formed.

The insulating film 217 is provided over the semiconductor film 204 and the conductive films 203 and 210; the insulating film 218 is provided over the insulating film 217; and the conductive films 205 and 206 and a conductive film 209, and an insulating film 219 are provided over the insulating film 218. Conductive films 201 and 212 are provided over the insulating film 219, the conductive film 201 is connected to the conductive film 205 in an opening formed in the insulating film 219, and the conductive film 212 is connected to the conductive film 209 in an opening formed in the insulating film 219.

In the case where an oxide semiconductor is used for the semiconductor film 204, the insulating film 217 is preferably configured to block oxygen, hydrogen, water, an alkali metal, an alkaline earth metal, and the like. It is possible to prevent outward diffusion of oxygen from the semiconductor film 204 and entry of hydrogen, water, or the like into the semiconductor film 204 from the outside by providing the insulating film 217. The insulating film 217 can be formed using a nitride insulating film, for example. As the nitride insulating film, a silicon nitride film, a silicon nitride oxide film, an aluminum nitride film, an aluminum nitride oxide film, and the like can be given. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

An insulating film 220 and a conductive film 213 are provided over the insulating film 219 and the conductive films 201 and 212, and the conductive film 213 is connected to the conductive film 212 in an opening formed in the insulating film 220.

An insulating film 225 is provided over the insulating film 220 and the conductive film 213. The insulating film 225 has an opening in a region overlapping with the conductive film 213. Over the insulating film 225, an insulating film 226 is provided in a region different from the opening of the insulating film 225. An EL layer 227 and a conductive film 228 are sequentially stacked over the insulating films 225 and 226. A portion in which the conductive films 213 and 228 overlap with each other with the EL layer 227 provided therebetween functions as the light-emitting element 34. One of the conductive films 213 and 228 functions as an anode, and the other functions as a cathode.

The light-emitting device includes a substrate 230 that faces the substrate 200 with the light-emitting element 34 provided therebetween. A blocking film 231 having a function of blocking light is provided under the substrate 230, i.e., on a surface of the substrate 230 that is closer to the light-emitting element 34. The blocking film 231 has an opening in a region overlapping with the light-emitting element 34. In the opening overlapping with the light-emitting element 34, a coloring layer 232 that transmits visible light in a specific wavelength range is provided under the substrate 230.

Note that the insulating film 226 is provided to adjust the distance between the light-emitting element 34 and the substrate 230 and may be omitted in some cases.

Although the top-emission structure is employed in this embodiment in which light of the light-emitting element 34 is extracted from the side opposite to the element substrate, a bottom-emission structure in which light of the light-emitting element 34 is extracted from the element substrate side or a dual-emission structure in which light of the light-emitting element 34 is extracted from both the element substrate side and the side opposite to the element substrate can also be applied to embodiments of the present invention.

The structure described above in this embodiment can be combined as appropriate with any of the structures described in the other embodiments.

Embodiment 6

In this embodiment, a display device including a light-emitting element of one embodiment of the present invention and an electronic device in which the display device is provided with an input device will be described with reference to FIGS. 65A and 65B, FIGS. 66A to 66C, and FIGS. 67A and 67B.

<Description 1 of Touch Panel>

In this embodiment, a touch panel 500 including a display device and an input device will be described as an example of an electronic device. In addition, an example in which a touch sensor is used as an input device will be described.

Figure 65A:
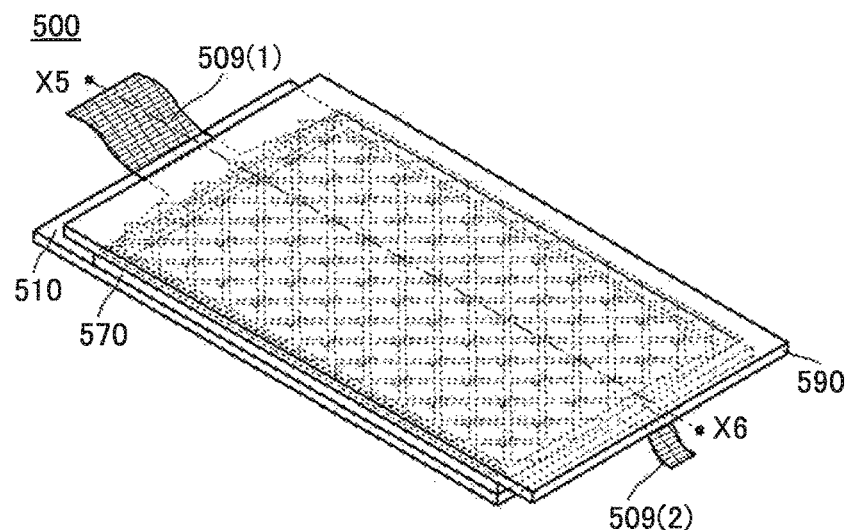
FIGS. 65A and 65B are perspective views of an example of a display device of one embodiment of the present invention.
Figure 65B:
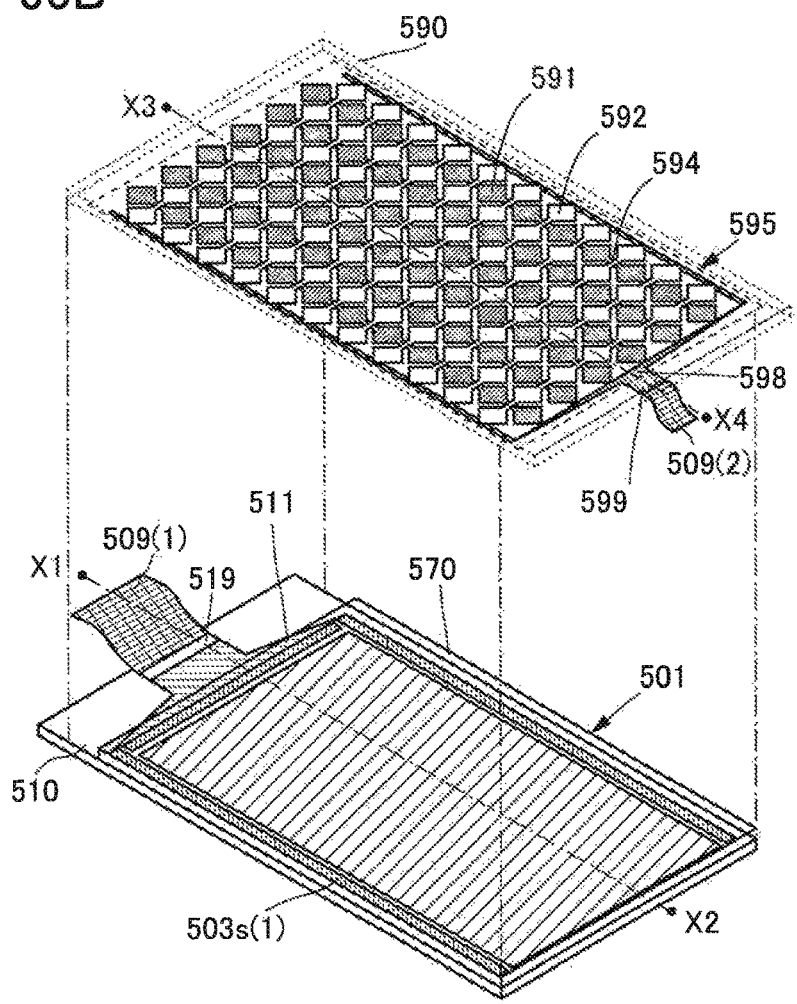

FIGS. 65A and 65B are perspective views of the touch panel 500. Note that FIGS. 65A and 65B illustrate only main components of the touch panel 500 for simplicity.

The touch panel 500 includes a display device 501 and a touch sensor 595 (see FIG. 65B). The touch panel 500 also includes a substrate 510, a substrate 570, and a substrate 590. The substrate 510, the substrate 570, and the substrate 590 each have flexibility. Note that one or all of the substrates 510, 570, and 590 may be inflexible.

The display device 501 includes a plurality of pixels over the substrate 510 and a plurality of wirings 511 through which signals are supplied to the pixels. The plurality of wirings 511 are led to a peripheral portion of the substrate 510, and parts of the plurality of wirings 511 form a terminal 519. The terminal 519 is electrically connected to an FPC 509(1).

The substrate 590 includes the touch sensor 595 and a plurality of wirings 598 electrically connected to the touch sensor 595. The plurality of wirings 598 are led to a peripheral portion of the substrate 590, and parts of the plurality of wirings 598 form a terminal. The terminal is electrically connected to an FPC 509(2). Note that in FIG. 65B, electrodes, wirings, and the like of the touch sensor 595 provided on the back side of the substrate 590 (the side facing the substrate 510) are indicated by solid lines for clarity.

As the touch sensor 595, a capacitive touch sensor can be used. Examples of the capacitive touch sensor are a surface capacitive touch sensor and a projected capacitive touch sensor.

Examples of the projected capacitive touch sensor are a self-capacitive touch sensor and a mutual capacitive touch sensor, which differ mainly in the driving method. The use of a mutual capacitive type is preferable because multiple points can be sensed simultaneously.

Note that the touch sensor 595 illustrated in FIG. 65B is an example of using a projected capacitive touch sensor.

Note that a variety of sensors that can sense proximity or touch of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 65A and 65B.

The electrodes 591 each have a quadrangular shape and are arranged in a direction intersecting with the direction in which the electrodes 592 extend.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing variation in transmittance. As a result, variation in luminance of light passing through the touch sensor 595 can be reduced.

Note that the shapes of the electrodes 591 and the electrodes 592 are not limited thereto and can be any of a variety of shapes. For example, a structure may be employed in which the plurality of electrodes 591 are arranged so that gaps between the electrodes 591 are reduced as much as possible, and the electrodes 592 are spaced apart from the electrodes 591 with an insulating layer interposed therebetween to have regions not overlapping with the electrodes 591. In this case, it is preferable to provide, between two adjacent electrodes 592, a dummy electrode electrically insulated from these electrodes because the area of regions having different transmittances can be reduced.

<Display Device>

Figure 66A:
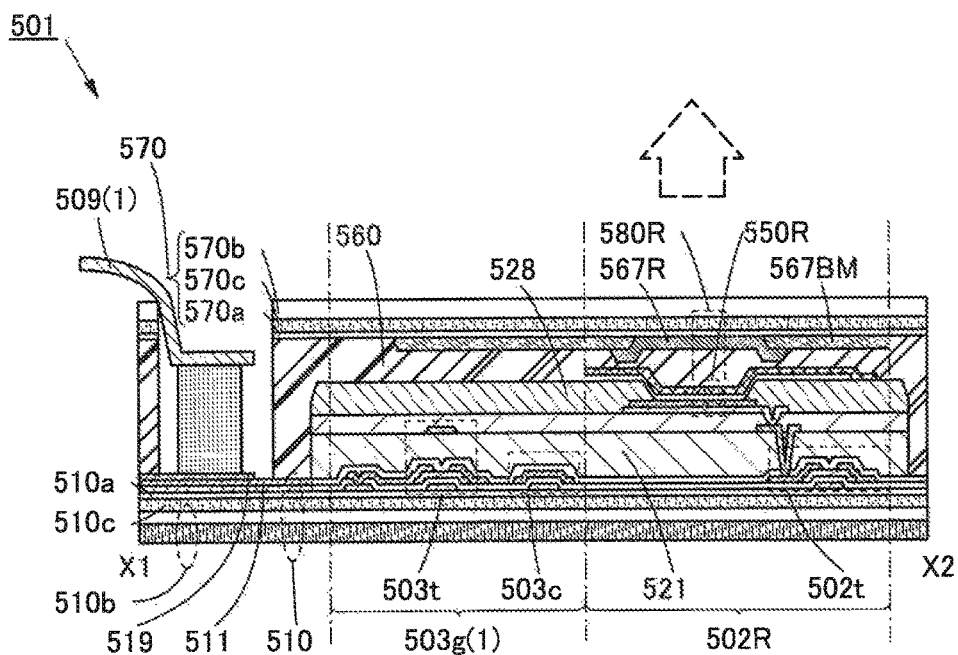
FIGS. 66A to 66C are cross-sectional views of examples of a display device of one embodiment of the present invention.

Next, the display device 501 will be described in detail with reference to FIG. 66A. FIG. 66A corresponds to a cross-sectional view taken along dashed-dotted line X1-X2 in FIG. 65B.

The display device 501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 510 and the substrate 570, for example, a flexible material with a vapor permeability of lower than or equal to $10^{-5}$ g/(m$^2$·day), preferably lower than or equal to $10^{-6}$ g/(m$^2$·day) can be favorably used. Alternatively, materials whose thermal expansion coefficients are substantially equal to each other are preferably used for the substrate 510 and the substrate 570. For example, the coefficients of linear expansion of the materials are preferably lower than or equal to $1\times10^{-3}$/K, further preferably lower than or equal to $5\times10^{-5}$/K, still further preferably lower than or equal to $1\times10^{-5}$/K.

Note that the substrate 510 is a stacked body including an insulating layer 510a for preventing impurity diffusion into the light-emitting element, a flexible substrate 510b, and an adhesive layer 510c for attaching the insulating layer 510a and the flexible substrate 510b to each other. The substrate 570 is a stacked body including an insulating layer 570a for preventing impurity diffusion into the light-emitting element, a flexible substrate 570b, and an adhesive layer 570c for attaching the insulating layer 570a and the flexible substrate 570b to each other.

For the adhesive layer 510c and the adhesive layer 570c, for example, materials that include polyester, polyolefin, polyamide (e.g., nylon, aramid), polyimide, polycarbonate, an acrylic resin, polyurethane, an epoxy resin, or a resin having a siloxane bond such as silicone can be used.

A sealing layer 560 is provided between the substrate 510 and the substrate 570. The sealing layer 560 preferably has a refractive index higher than that of air. In the case where light is extracted to the sealing layer 560 side as illustrated in FIG. 66A, the sealing layer 560 can also serve as an optical adhesive layer.

A sealant may be formed in the peripheral portion of the sealing layer 560. With the use of the sealant, a light-emitting element 550R can be provided in a region surrounded by the substrate 510, the substrate 570, the sealing layer 560, and the sealant. Note that an inert gas (such as nitrogen or argon) may be used instead of the sealing layer 560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display device 501 includes a pixel 502R. The pixel 502R includes a light-emitting module 580R.

The pixel 502R includes the light-emitting element 550R and a transistor 502t that can supply power to the light-emitting element 550R. Note that the transistor 502t functions as part of the pixel circuit. The light-emitting module 580R includes the light-emitting element 550R and a coloring layer 567R.

The light-emitting element 550R includes a lower electrode, an upper electrode, and an EL layer between the lower electrode and the upper electrode. As the light-emitting element 550R, any of the light-emitting elements described in any of the above Embodiments can be used, for example.

A microcavity structure may be employed between the lower electrode and the upper electrode so as to increase the intensity of light having a specific wavelength.

In the case where the sealing layer 560 is provided on the light extraction side, the sealing layer 560 is in contact with the light-emitting element 550R and the coloring layer 567R.

The coloring layer 567R is positioned in a region overlapping with the light-emitting element 550R. Accordingly, part of light emitted from the light-emitting element 550R passes through the coloring layer 567R and is emitted to the outside of the light-emitting module 580R as indicated by an arrow in FIG. 66A.

The display device 501 includes a light-blocking layer 567BM on the light extraction side. The light-blocking layer 567BM is provided so as to surround the coloring layer 567R.

The coloring layer 567R is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 521 is provided in the display device 501. The insulating layer 521 covers the transistor 502t. The insulating layer 521 has a function of covering unevenness caused by the pixel circuit. The insulating layer 521 may have a function of suppressing impurity diffusion. This can prevent the reliability of the transistor 502t or the like from being lowered by impurity diffusion.

The light-emitting element 550R is formed over the insulating layer 521. A partition 528 is provided so as to overlap with an end portion of the lower electrode of the light-emitting element 550R. Note that a spacer for controlling the distance between the substrate 510 and the substrate 570 may be formed over the partition 528.

A gate line driver circuit 503g(1) includes a transistor 503t and a capacitor 503c. Note that the driver circuit can be formed in the same process and over the same substrate as those of the pixel circuits.

The wirings 511 through which signals can be supplied are provided over the substrate 510. The terminal 519 is provided over the wirings 511. The FPC 509(1) is electrically connected to the terminal 519. The FPC 509(1) is configured to supply a video signal, a clock signal, a start signal, a reset signal, or the like. Note that the FPC 509(1) may be provided with a printed wiring board (PWB).

Figure 66B:
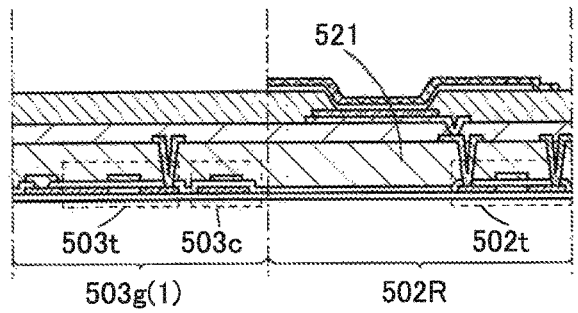

In the display device 501, transistors with any of a variety of structures can be used. FIG. 66A illustrates an example of using bottom-gate transistors; however, the present invention is not limited to this example, and top-gate transistors may be used in the display device 501 as illustrated in FIG. 66B.

The description in the above embodiment can be referred to for the structures of the transistors 502*t* and 503*t*.

<Touch Sensor>

Figure 66C:
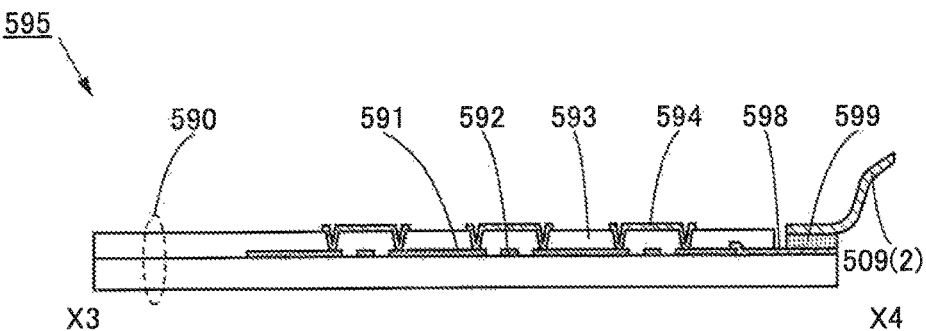

Next, the touch sensor 595 will be described in detail with reference to FIG. 66C. FIG. 66C corresponds to a cross-sectional view taken along dashed-dotted line X3-X4 in FIG. 65B.

The touch sensor 595 includes the electrodes 591 and the electrodes 592 provided in a staggered arrangement on the substrate 590, an insulating layer 593 covering the electrodes 591 and the electrodes 592, and the wiring 594 that electrically connects the adjacent electrodes 591 to each other.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 591 and the electrodes 592 may be formed by, for example, depositing a light-transmitting conductive material on the substrate 590 by a sputtering method and then removing an unnecessary portion by any of various patterning techniques such as photolithography.

Examples of a material for the insulating layer 593 are a resin such as an acrylic resin or an epoxy resin, a resin having a siloxane bond such as silicone, and an inorganic insulating material such as silicon oxide, silicon oxynitride, or aluminum oxide.

Openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and 592 can be favorably used for the wiring 594 because electric resistance can be reduced.

One electrode 592 extends in one direction, and a plurality of electrodes 592 are provided in the form of stripes. The wiring 594 intersects with the electrode 592.

Adjacent electrodes 591 are provided with one electrode 592 provided therebetween. The wiring 594 electrically connects the adjacent electrodes 591.

Note that the plurality of electrodes 591 are not necessarily arranged in the direction orthogonal to one electrode 592 and may be arranged to intersect with one electrode 592 at an angle of more than 0 degrees and less than 90 degrees.

The wiring 598 is electrically connected to any of the electrodes 591 and 592. Part of the wiring 598 functions as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

A connection layer 599 electrically connects the wiring 598 to the FPC 509(2).

As the connection layer 599, any of anisotropic conductive films (ACF), anisotropic conductive pastes (ACP), and the like can be used.

<Description 2 of Touch Panel>

Figure 67A:
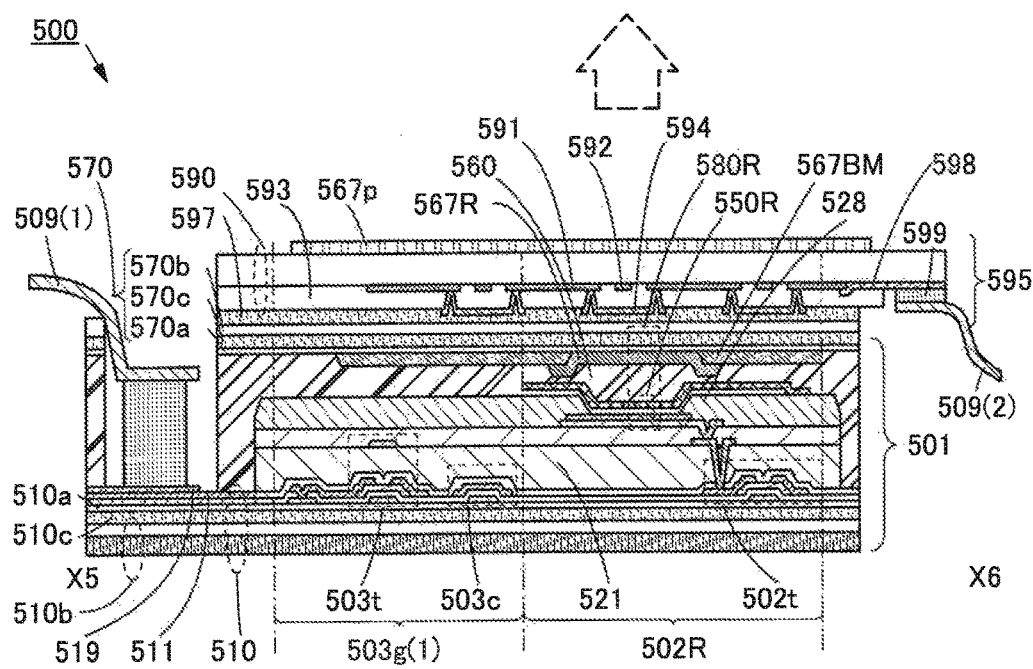
FIGS. 67A and 67B are cross-sectional views of examples of a display device of one embodiment of the present invention.

Next, the touch panel 500 will be described in detail with reference to FIG. 67A. FIG. 67A corresponds to a cross-sectional view taken along dashed-dotted line X5-X6 in FIG. 65A.

In the touch panel 500 illustrated in FIG. 67A, the display device 501 described with reference to FIG. 66A and the touch sensor 595 described with reference to FIG. 66C are attached to each other.

The touch panel 500 illustrated in FIG. 67A includes an adhesive layer 597 and an anti-reflective layer 567*p* in addition to the components described with reference to FIGS. 66A and 66C.

The adhesive layer 597 is provided in contact with the wiring 594. Note that the adhesive layer 597 attaches the substrate 590 to the substrate 570 so that the touch sensor 595 overlaps with the display device 501. The adhesive layer 597 preferably has a light-transmitting property. A heat curable resin or an ultraviolet curable resin can be used for the adhesive layer 597. For example, an acrylic resin, a urethane-based resin, an epoxy-based resin, or a siloxane-based resin can be used.

The anti-reflective layer 567*p* is positioned in a region overlapping with pixels. As the anti-reflective layer 567*p*, a circularly polarizing plate can be used, for example.

Next, a touch panel having a structure different from that illustrated in FIG. 67A will be described with reference to FIG. 67B.

Figure 67B:
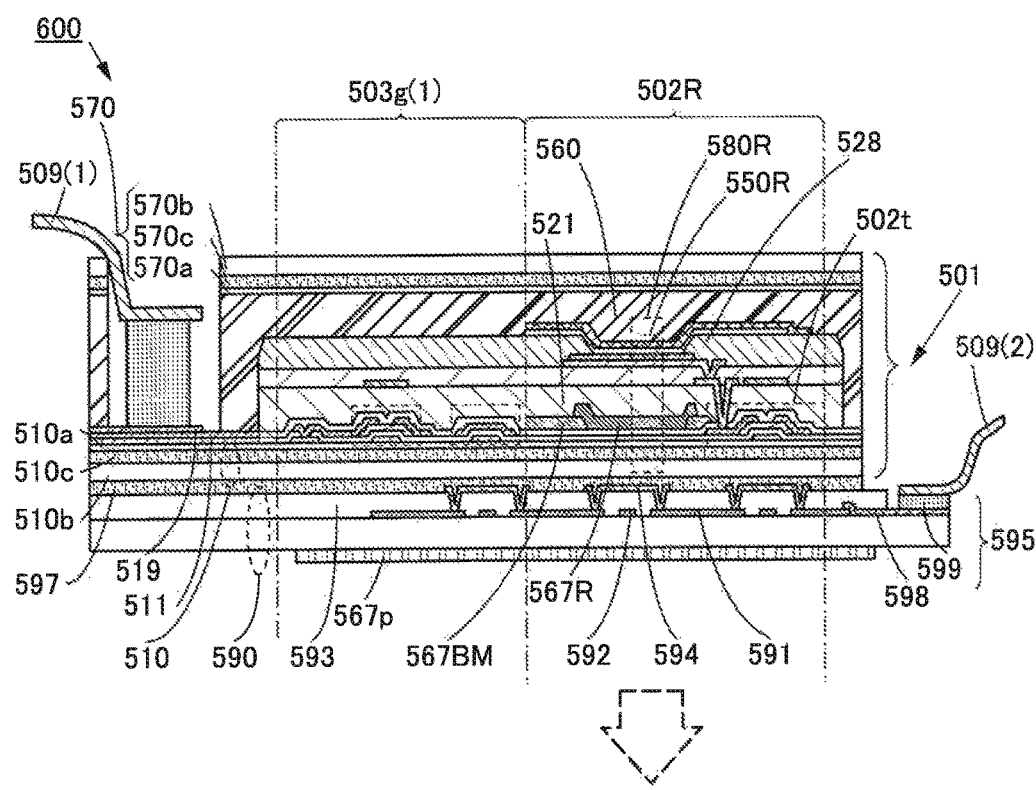

FIG. 67B is a cross-sectional view of a touch panel 600. The touch panel 600 illustrated in FIG. 67B differs from the touch panel 500 illustrated in FIG. 67A in the position of the touch sensor 595 relative to the display device 501. Different parts are described in detail below, and the above description of the touch panel 500 is referred to for the other similar parts.

The coloring layer 567R is positioned in a region overlapping with the light-emitting element 550R. The light-emitting element 550R illustrated in FIG. 67B emits light to the side where the transistor 502*t* is provided. Accordingly, part of light emitted from the light-emitting element 550R passes through the coloring layer 567R and is emitted to the outside of the light-emitting module 580R as indicated by an arrow in FIG. 67B.

The touch sensor 595 is provided on the substrate 510 side of the display device 501.

The adhesive layer 597 is provided between the substrate 510 and the substrate 590 and attaches the touch sensor 595 to the display device 501.

As illustrated in FIG. 67A or 67B, light may be emitted from the light-emitting element to one of upper and lower sides, or both, of the substrate.

The display device and the electronic device described in this embodiment have any structure described in the above embodiments, so that variation in threshold voltages can be corrected more accurately. Thus, the display device with a narrow frame can be obtained. Alternatively, the display device and the electronic device with small variation in luminance and small display unevenness can be obtained. Further alternatively, the display device and the electronic device which are capable of clear display can be obtained.

The structure described in this embodiment can be used in appropriate combination with the structure described in any of the other embodiments.

Embodiment 7

In this embodiment, a display module and an electronic device that can be formed using the display device described in any of the above embodiments are described.

<External View of Display Device>

Figure 68:
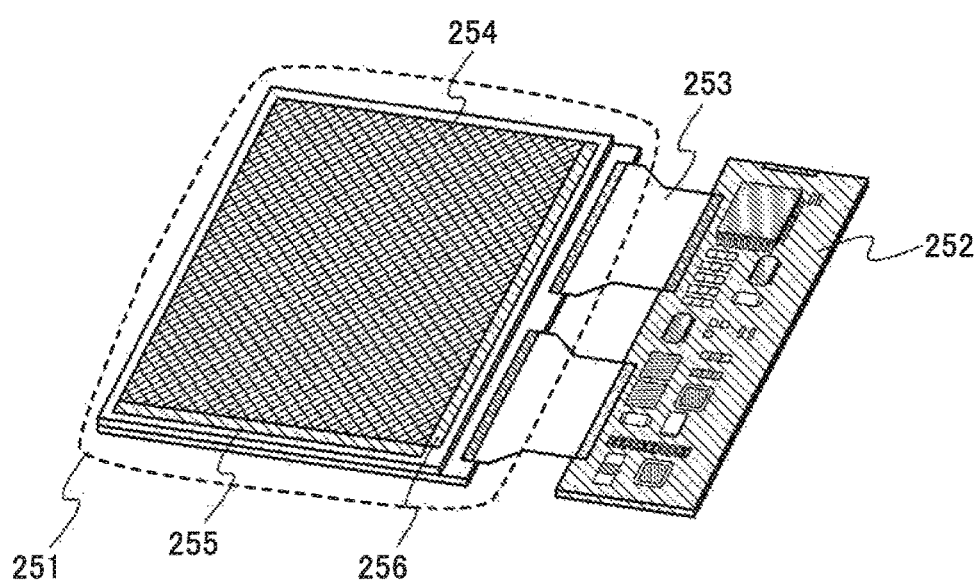
FIG. 68 is a perspective view of an example of a display device of one embodiment of the present invention.

FIG. 68 is a perspective view illustrating an example of an external view of a display device. The display device in FIG. 68 includes a panel 251; a circuit board 252 including a controller, a power supply circuit, an image processing circuit, an image memory, a CPU, and the like; and a connection portion 253. The panel 251 includes a pixel portion 254 including a plurality of pixels, a driver circuit 255 that selects pixels row by row, and a driver circuit 256 that controls input of a video signal to the pixels in a selected row.

A variety of signals and power supply potentials are input from the circuit board 252 to the panel 251 through the connection portion 253. As the connection portion 253, a flexible printed circuit (FPC) or the like can be used. In the case where a COF tape is used as the connection portion 253, part of circuits in the circuit board 252 or part of the driver circuit 255 or the driver circuit 256 included in the panel 251 may be formed on a chip separately prepared, and the chip may be electrically connected to the COF tape by a chip-on-film (COF) method.

<Structural Example of Electronic Device>

The display device described in any of the above embodiments can be used for display devices, laptops, or image reproducing devices provided with recording media (typically devices which reproduce the content of recording media such as DVDs (digital versatile disc) and have displays for displaying the reproduced images). In addition to the above examples, as an electronic device which include the display device according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of such an electronic device are illustrated in FIGS. 69A to 69F.

Figure 69A:
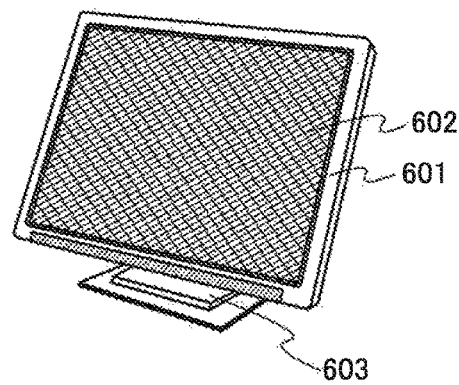
FIGS. 69A to 69F show examples of an electronic device of one embodiment of the present invention.

FIG. 69A illustrates a display device including a housing 601, a display portion 602, a supporting base 603, and the like. The display device described in any of the above embodiments can be used in the display portion 602. Note that a display device includes all display devices for displaying information, such as display devices for personal computers, for receiving television broadcast, and for displaying advertisement, in its category.

Figure 69B:
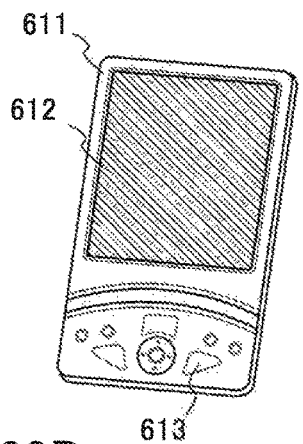

FIG. 69B illustrates a portable information terminal including a housing 611, a display portion 612, an operation key 613, and the like. The display device described in any of the above embodiments can be used in the display portion 612.

Figure 69C:
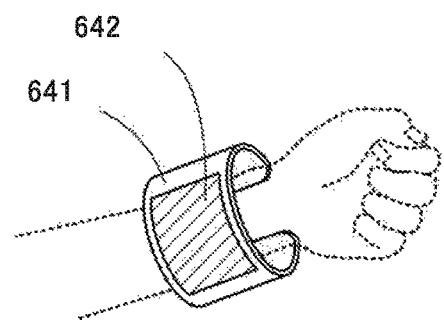

FIG. 69C illustrates a display device, which includes a housing 641 having a curved surface, a display portion 642, and the like. When a flexible substrate is used for the display device described in any of the above embodiments, it is possible to use the display device as the display portion 642 supported by the housing 641 having a curved surface. Consequently, it is possible to provide a user-friendly display device that is flexible and lightweight.

Figure 69D:
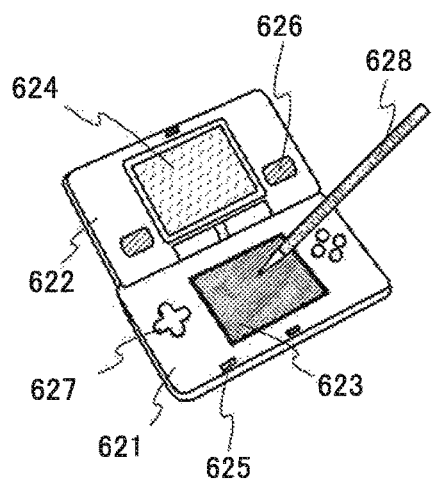

FIG. 69D illustrates a portable game machine including a housing 621, a housing 622, a display portion 623, a display portion 624, a microphone 625, speakers 626, an operation key 627, a stylus 628, and the like. The display device described in any of the above embodiments can be used in the display portion 623 or the display portion 624. When the display device described in any of the above embodiments is used in the display portion 623 or 624, it is possible to provide a user-friendly portable game machine with quality that hardly deteriorates. Note that although the portable game machine illustrated in FIG. 69D includes the two display portions 623 and 624, the number of display portions included in the portable game machine is not limited to two.

Figure 69E:
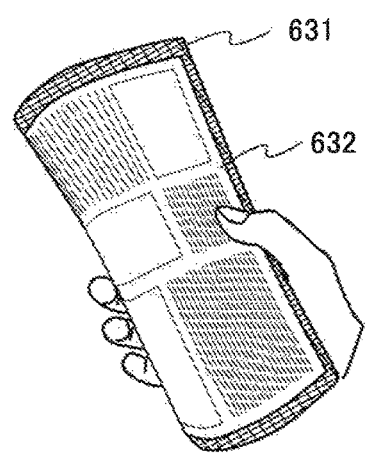

FIG. 69E illustrates an e-book reader, which includes a housing 631, a display portion 632, and the like. The display device described in any of the above embodiments can be used in the display portion 632. When a flexible substrate is used, the display device can have flexibility, so that it is possible to provide a user-friendly e-book reader which is flexible and lightweight.

Figure 69F:
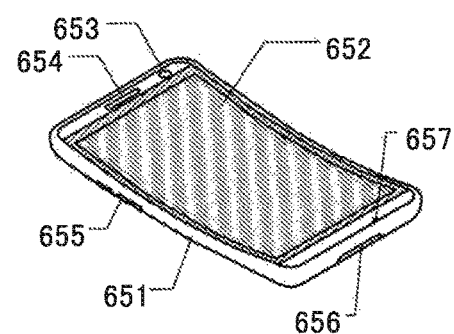

FIG. 69F illustrates a mobile phone which includes a display portion 652, a microphone 657, a speaker 654, a camera 653, an external connection port 656, and an operation button 655 in a housing 651. The display device described in any of the above-described embodiments can be used in the display portion 652. When the display device described in any of the above embodiments is provided over a flexible substrate, the display device can be used in the display portion 652 having a curved surface as illustrated in FIG. 69F.

With the use of the display device described in any of the above embodiments for the electronic device of this embodiment, variation in threshold voltages can be corrected more accurately. Thus, the display device with a narrow frame can be obtained. Alternatively, the electronic device with small variation in luminance and small display unevenness can be obtained. Further alternatively, the electronic device capable of clear display can be obtained.

The structure described above in this embodiment can be combined as appropriate with any of the structures described in the other embodiments.

(Supplementary Notes on the Description in this Specification and the Like)

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiments. For example, a structure in which a light-emitting element is used as an example of a display element is described in the above embodiment; however, one embodiment of the invention is not limited to that structure. Another display element, e.g., a liquid crystal element, may be used depending on conditions. A structure in which data on the threshold voltage is read out in the blanking period is described in the above embodiments; however, one embodiment of the present invention is not limited thereto. Data on transistors may be read out in a period other than the blanking period depending on conditions. Furthermore, a structure in which data on current characteristics of driving transistors in pixels is read out is described in the above embodiments; however, one embodiment of the present invention is not limited thereto. Depending on conditions, data on current characteristics of transistors other than the driving transistor may be read out, for example. Alternatively, depending on circumstances or conditions, data on current characteristics of the transistors is not necessarily read out. Alternatively, depending on circumstances or conditions, external correction is not necessarily performed.

Notes on the Description for Drawings

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In top views (also referred to as plan views or layout views) and perspective views, some of components might not be illustrated for clarity of the drawings.

Notes on Expressions that can be Rephrased

In this specification or the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in the same process.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Notes on Definitions of Terms

The following are definitions of the terms mentioned in the above embodiments.

<<Switch>>

In this specification and the like, a switch is conducting or not conducting (is turned on or off) to determine whether current flows therethrough or not. Alternatively, a switch is configured to select and change a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source electrode and a drain electrode in a region where a semiconductor (or a portion where current flows in a semiconductor when a transistor is on) and a gate electrode overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source electrode and a drain electrode face each other in a region where a semiconductor (or a portion where current flows in a semiconductor when a transistor is on) and a gate electrode overlap with each other, or a region where a channel is formed.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

<<Pixel>>

In this specification and the like, one pixel refers to one element whose brightness can be controlled, for example. Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel.

Note that the number of color elements is not limited to three, and more color elements may be used. For example, RGBW (W: white), RGB added with yellow, cyan, or magenta, and the like may be employed.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source electrode (or a first terminal or the like) of a transistor is electrically connected to X through (or not through) Z1 and a drain electrode (or a second terminal or the like) of the transistor is electrically connected to Y through (or not through) Z2, or the case where a source electrode (or a first terminal or the like) of a transistor is directly connected to one part of Z1 and another part of Z1 is directly connected to X while a drain electrode (or a second terminal or the like) of the transistor is directly connected to one part of Z2 and another part of Z2 is directly connected to Y, can be expressed by using any of the following expressions.

Examples of the expressions include, "X, Y, a source electrode (or a first terminal or the like) of a transistor, and a drain electrode (or a second terminal or the like) of the transistor are electrically connected to each other, and X, the source electrode (or the first terminal or the like) of the transistor, the drain electrode (or the second terminal or the like) of the transistor, and Y are electrically connected to each other in this order", "a source electrode (or a first terminal or the like) of a transistor is electrically connected to X, a drain electrode (or a second terminal or the like) of the transistor is electrically connected to Y, and X, the source electrode (or the first terminal or the like) of the transistor, the drain electrode (or the second terminal or the like) of the transistor, and Y are electrically connected to each other in this order", and "X is electrically connected to Y through a source electrode (or a first terminal or the like) and a drain electrode (or a second terminal or the like) of a transistor, and X, the source electrode (or the first terminal or the like) of the transistor, the drain electrode (or the second terminal or the like) of the transistor, and Y are provided to be connected in this order". When the connection order in a circuit configuration is defined by an expression similar to the above examples, a source electrode (or a first terminal or the like) and a drain electrode (or a second terminal or the like) of a transistor can be distinguished from each other to specify the technical scope.

Other examples of the expressions include, "a source electrode (or a first terminal or the like) of a transistor is electrically connected to X through at least a first connection path, the first connection path does not include a second connection path, the second connection path is a path between the source electrode (or the first terminal or the like) of the transistor and a drain electrode (or a second terminal or the like) of the transistor, Z1 is on the first connection path, the drain electrode (or the second terminal or the like) of the transistor is electrically connected to Y through at least a third connection path, the third connection path does not include the second connection path, and Z2 is on the third connection path" and "a source electrode (or a first terminal or the like) of a transistor is electrically connected to X at least with a first connection path through Z1, the first connection path does not include a second connection path, the second connection path includes a connection path through which the transistor is provided, a drain electrode (or a second terminal or the like) of the transistor is electrically connected to Y at least with a third connection path through Z2, and the third connection path does not include the second connection path." Still another example of the expression is "a source electrode (or a first terminal or the like) of a transistor is electrically connected to X through at least Z1 on a first electrical path, the first electrical path does not include a second electrical path, the second electrical path is an electrical path from the source electrode (or the first terminal or the like) of the transistor to a drain electrode (or a second terminal or the like) of the transistor, the drain electrode (or the second terminal or the like) of the transistor is electrically connected to Y through at least Z2 on a third electrical path, the third electrical path does not include a fourth electrical path, and the fourth electrical path is an electrical path from the drain electrode (or the second terminal or the like) of the transistor to the source electrode (or the first terminal or the like) of the transistor." When the connection path in a circuit configuration is defined by an expression similar to the above examples, a source electrode (or a first terminal or the like) and a drain electrode (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

This application is based on Japanese Patent Application serial no. 2014-265396 filed with Japan Patent Office on Dec. 26, 2014, the entire contents of which are hereby incorporated by reference.

What is claimed is:

1. A semiconductor device comprising:
a first wiring;
a second wiring;
a third wiring;
a fourth wiring;
a fifth wiring;
a sixth wiring;
a first switch;
a second switch;
a third switch;
a fourth switch;
a fifth switch;
a sixth switch; and
an operational amplifier,
wherein the first switch is electrically connected between the first wiring and a non-inverting input terminal of the operational amplifier,
wherein the second switch is electrically connected between the second wiring and an output terminal of the operational amplifier,
wherein the third switch is electrically connected between the third wiring and the output terminal of the operational amplifier,
wherein the fourth switch is electrically connected between the fourth wiring and the non-inverting input terminal of the operational amplifier,
wherein the fifth switch is electrically connected between the fourth wiring and the fifth wiring,
wherein the sixth switch is electrically connected between the second wiring and the sixth wiring, and
wherein an inverting input terminal of the operational amplifier is electrically connected to the output terminal of the operational amplifier.

2. The semiconductor device according to claim 1 further comprising a pixel including a transistor and a display element, wherein the pixel is electrically connected to the second wiring and the fifth wiring.

3. A semiconductor device comprising:
a first wiring;
a second wiring;
a third wiring;
a fourth wiring;
a first switch;
a second switch;
a third switch;
a fourth switch;
a fifth switch;
an operational amplifier; and
a capacitor,
wherein the first switch is electrically connected between an inverting input terminal of the operational amplifier and an output terminal of the operational amplifier,
wherein the second switch is electrically connected between the first wiring and the output terminal of the operational amplifier,
wherein the third switch is electrically connected between the second wiring and the output terminal of the operational amplifier,
wherein the fourth switch is electrically connected between the third wiring and the inverting input terminal of the operational amplifier,
wherein the fifth switch is electrically connected between the third wiring and the fourth wiring, and
wherein the capacitor is electrically connected between the inverting input terminal of the operational amplifier and the output terminal of the operational amplifier.

4. The semiconductor device according to claim 3 further comprising a pixel including a transistor and a display element, wherein the pixel is electrically connected to the first wiring and the third wiring.

5. The semiconductor device according to claim 3, wherein the capacitor is replaced with a resistor.

6. A semiconductor device comprising:
a first wiring;
a second wiring;
a third wiring;
a fourth wiring;
a fifth wiring;
a first switch;
a second switch;
a third switch;
a fourth switch;
a fifth switch;
a sixth switch;
a seventh switch;
an operational amplifier; and
a capacitor,
wherein the first switch is electrically connected between the first wiring and a non-inverting input terminal of the operational amplifier,
wherein the second switch is electrically connected between the second wiring and an output terminal of the operational amplifier,
wherein the third switch is electrically connected between the third wiring and the output terminal of the operational amplifier,
wherein the fourth switch is electrically connected between the fourth wiring and an inverting input terminal of the operational amplifier,
wherein the fifth switch is electrically connected between the fourth wiring and the fifth wiring,
wherein the sixth switch is electrically connected between the inverting input terminal of the operational amplifier and the output terminal of the operational amplifier,
wherein the seventh switch is electrically connected between the fifth wiring and the non-inverting input terminal of the operational amplifier, and
wherein the capacitor is electrically connected between the inverting input terminal of the operational amplifier and the output terminal of the operational amplifier.

7. The semiconductor device according to claim 6 further comprising a pixel including a transistor and a display element, wherein the pixel is electrically connected to the second wiring and the fourth wiring.

8. The semiconductor device according to claim 6, wherein the capacitor is replaced with a resistor.

9. The semiconductor device according to claim 6 further comprising:
- a sixth wiring;
- an eighth switch; and
- a ninth switch,
- wherein the eighth switch is electrically connected between the fourth wiring and the non-inverting input terminal of the operational amplifier, and
- wherein the ninth switch is electrically connected between the second wiring and the sixth wiring.

* * * * *